(12) United States Patent
Huang et al.

(10) Patent No.: US 11,287,605 B2
(45) Date of Patent: Mar. 29, 2022

(54) DRIVING MECHANISM

(71) Applicant: TDK TAIWAN CORP., Taoyuan (TW)

(72) Inventors: Chien-Lun Huang, Taoyuan (TW);
Shao-Chung Chang, Taoyuan (TW);
Wei-Cheng Wang, Taoyuan (TW);
Fu-Yuan Wu, Taoyuan (TW);
Shou-Jen Liu, Taoyuan (TW)

(73) Assignee: TDK Taiwan Corp, Taoyuan (TW)

(*) Notice: Subject to any disclaimer, the term of this patent is extended or adjusted under 35 U.S.C. 154(b) by 418 days.

(21) Appl. No.: 16/522,563

(22) Filed: Jul. 25, 2019

(65) Prior Publication Data

US 2020/0033559 A1 Jan. 30, 2020

Related U.S. Application Data

(60) Provisional application No. 62/741,825, filed on Oct. 5, 2018, provisional application No. 62/703,147, filed on Jul. 25, 2018.

(30) Foreign Application Priority Data

Jul. 23, 2019 (CN) .......................... 201921165339.1

(51) Int. Cl.
| | |
|---|---|
| *G02B 7/09* | (2021.01) |
| *G02B 27/64* | (2006.01) |
| *G03B 5/00* | (2021.01) |
| *G03B 13/36* | (2021.01) |
| *H02K 41/035* | (2006.01) |
| *H05K 1/02* | (2006.01) |

(52) U.S. Cl.
CPC ............. *G02B 7/09* (2013.01); *G02B 27/646* (2013.01); *G03B 5/00* (2013.01); *G03B 13/36* (2013.01); *H02K 41/0354* (2013.01); *H05K 1/0274* (2013.01); *G03B 2205/0069* (2013.01); *H05K 2201/09027* (2013.01); *H05K 2201/10121* (2013.01); *H05K 2201/10151* (2013.01)

(58) Field of Classification Search
CPC .......... G02B 7/09; G02B 27/646; G03B 5/00; G03B 13/36; G03B 2205/0069; H02K 41/0354; H05K 1/0274; H05K 2201/09027; H05K 2201/10121; H05K 2201/10151
See application file for complete search history.

(56) References Cited

U.S. PATENT DOCUMENTS

2018/0234004 A1* 8/2018 Moto ................... G02B 27/646

* cited by examiner

*Primary Examiner* — Cara E Rakowski
(74) *Attorney, Agent, or Firm* — Muncy, Geissler, Olds & Lowe, P.C.

(57) ABSTRACT

A driving mechanism is provided, including a fixed part, a movable part for holding an optical element, a driving assembly, and a circuit board. The driving assembly is used for driving the movable part to move relative to the fixed part. The circuit board is disposed on the fixed part, having a conductive portion exposed to an outer surface of the circuit board and a trace embedded in the circuit board. The conductive portion and the trace partially overlap when viewed in a horizontal direction perpendicular to the optical axis of the optical element.

16 Claims, 134 Drawing Sheets

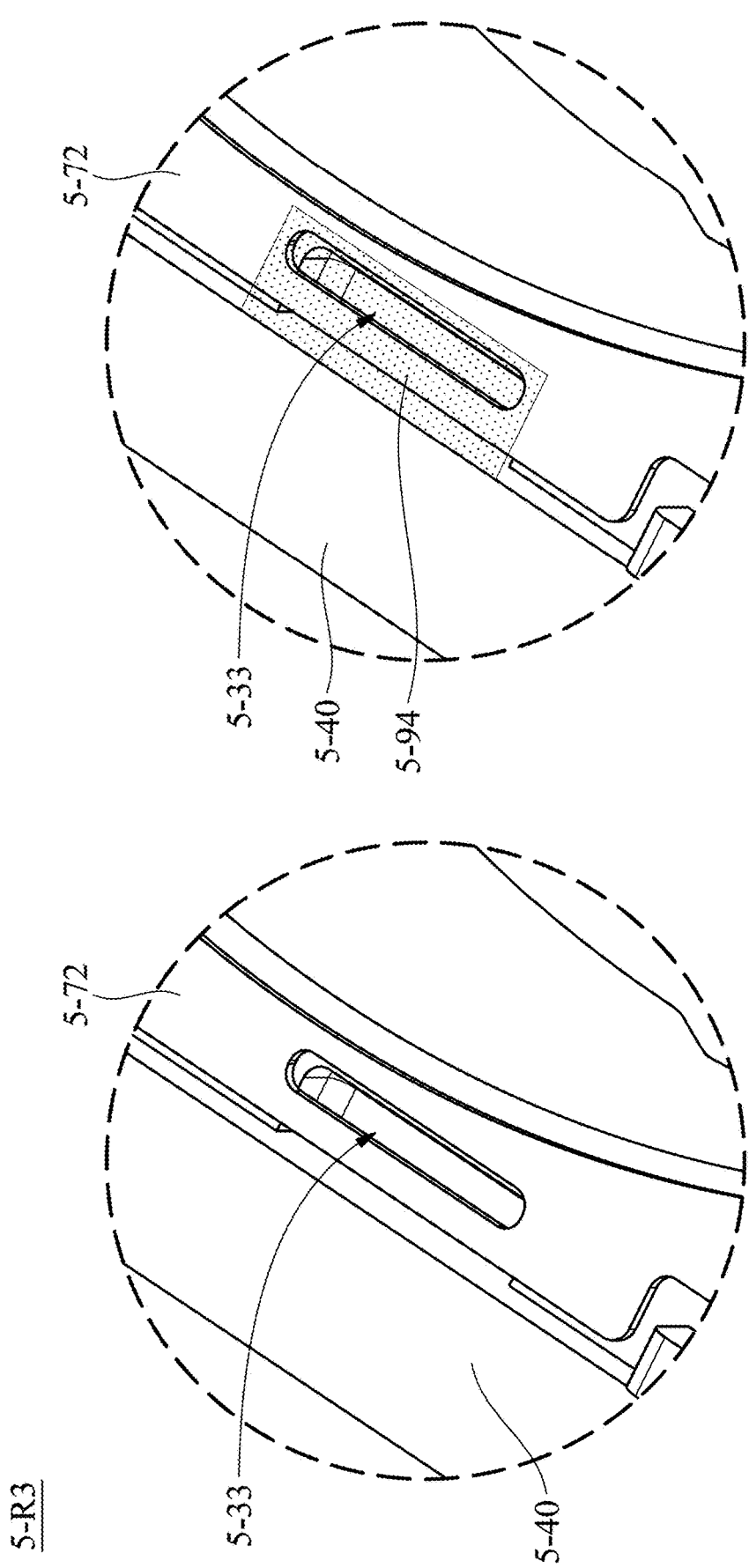

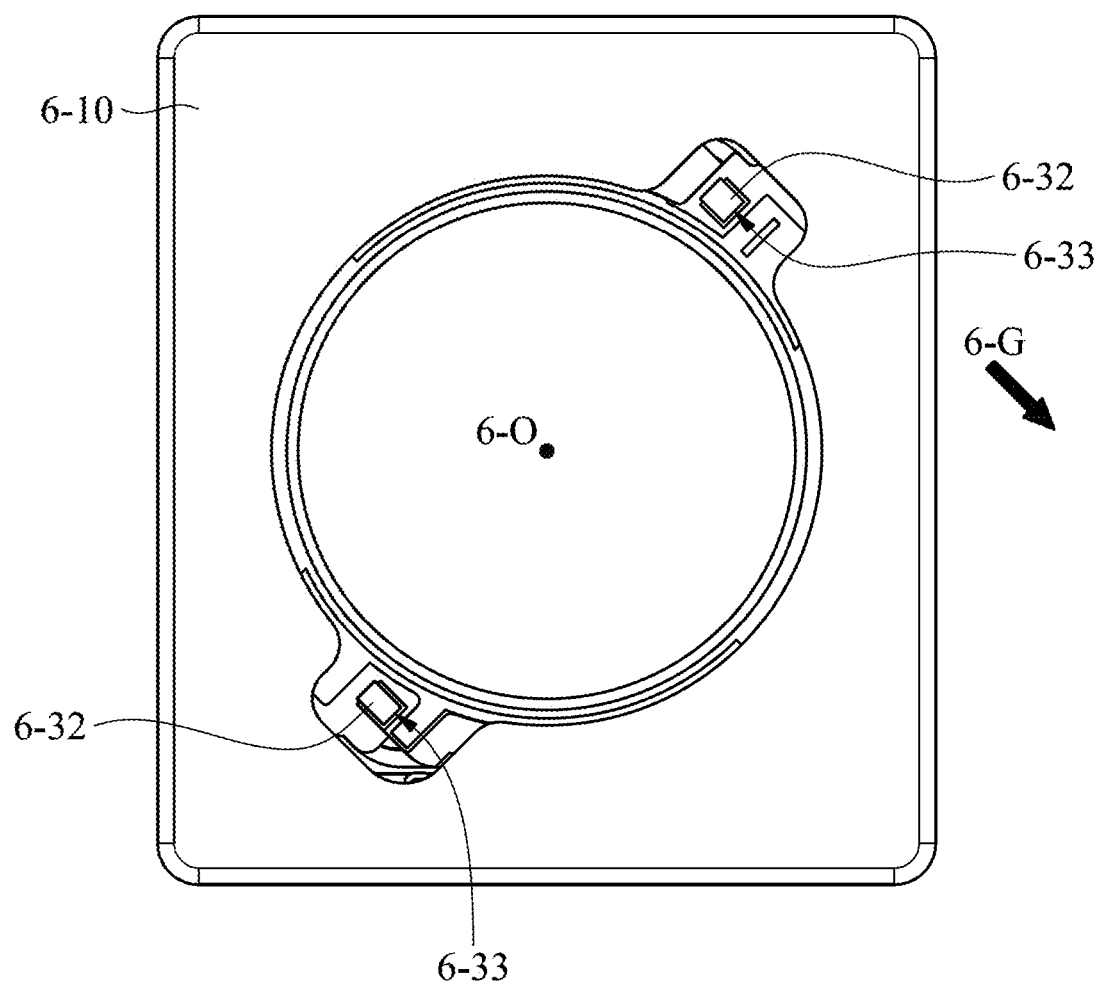
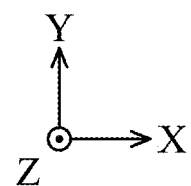
FIG. 80

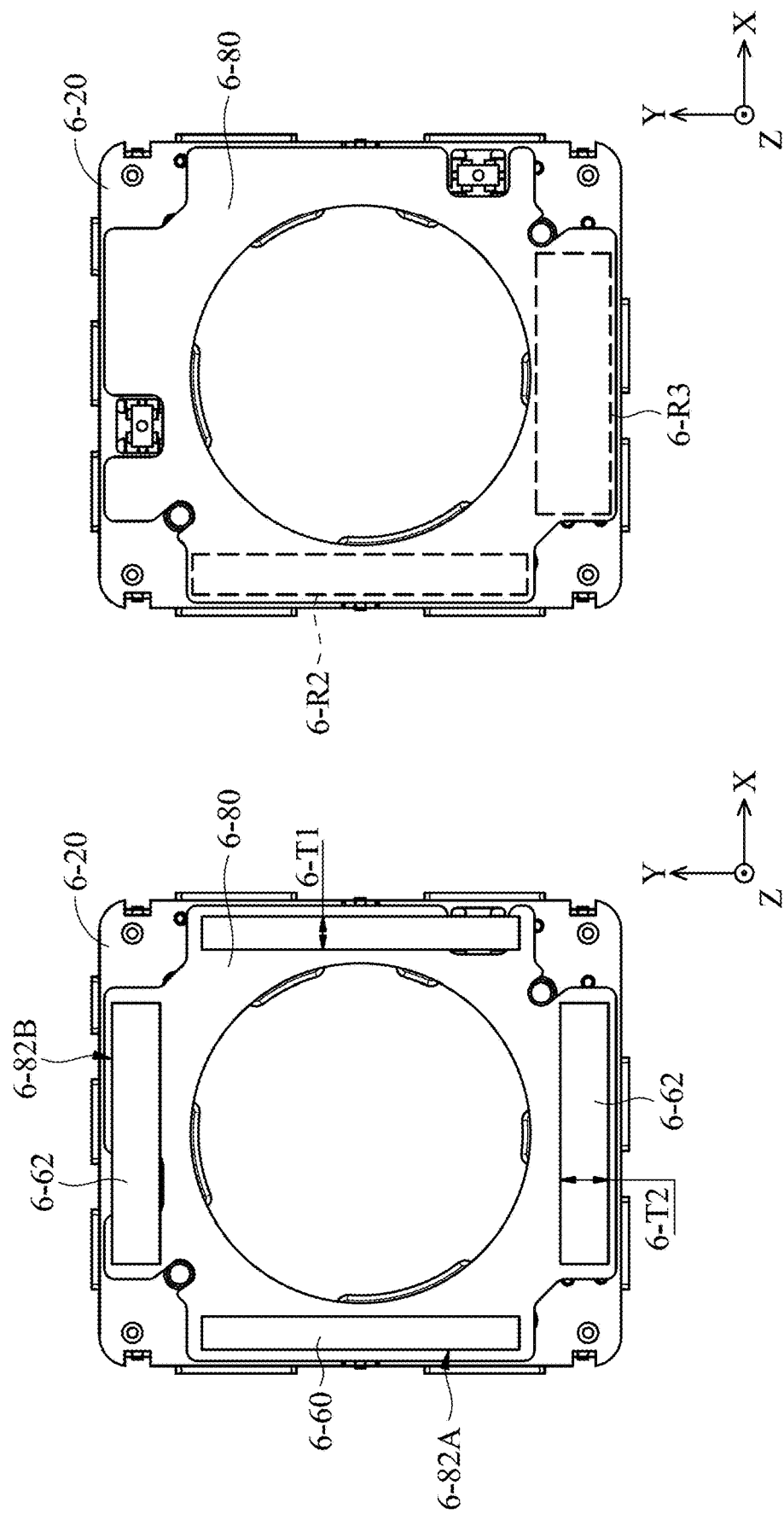

DRIVING MECHANISM

CROSS REFERENCE TO RELATED APPLICATIONS

This Application claims priority of provisional U.S. Patent Application Ser. No. 62/703,147, filed on Jul. 25, 2018, provisional U.S. Patent Application Ser. No. 62/741,825, filed on Oct. 5, 2018, and China Patent Application No. 201921165339.1 filed on Jul. 23, 2019, the entirety of which are incorporated by reference herein.

BACKGROUND OF THE INVENTION

Field of the Invention

The application relates in general to a driving mechanism, and in particular, to a driving mechanism for moving an optical element.

Description of the Related Art

As technology has advanced, a lot of electronic devices (for example, cameras and smartphones) have incorporated the functionality of taking photographs and recording video. These electronic devices have become more commonplace, and have been developed to be more convenient and thin. More and more options are provided for users to choose from.

In some electronic devices, several coils and magnets corresponding thereto are usually used for adjusting the focus of a lens. However, miniaturization of the electronic devices may increase the difficulty of mechanical design, and it may also lead to low reliability and low driving force for moving the lens. Therefore, addressing the aforementioned problems has become a challenge.

BRIEF SUMMARY OF INVENTION

In view of the aforementioned problems, the object of the invention is to provide a driving mechanism that includes a fixed part, a movable part for holding an optical element, a driving assembly, and a circuit board. The driving assembly is used for driving the movable part to move relative to the fixed part. The circuit board is disposed on the fixed part, having a conductive portion exposed to an outer surface of the circuit board and a trace embedded in the circuit board. The conductive portion and the trace partially overlap when viewed in a horizontal direction perpendicular to the optical axis of the optical element.

BRIEF DESCRIPTION OF DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 60 and 61 are enlarged views of the region 5-R3 in FIG. 59.

FIG. 80 is a top view of a driving mechanism according to some embodiments of the present disclosure.

FIGS. 83 and 84 are top views of some elements of the driving mechanism in some embodiments of the present disclosure.

FIG. 132 shows a partial schematic view of an inner electrical connection part and a driving assembly of the optical element driving mechanism according to the present disclosure.

FIG. 133 shows a cross-sectional view of the optical element driving mechanism according to the present disclosure along line 10-A-10-A in FIG. 128.

FIG. 134 shows a cross-sectional view of the optical element driving mechanism according to the present disclosure along line 10-B-10-B in FIG. 128.

FIG. 135 shows a top view of the movable part, a standing wall and a position sensing assembly of the optical element driving mechanism according to the present disclosure.

FIG. 136 shows a perspective view of an optical element driving system according to the present disclosure.

FIG. 137 shows a perspective view of the optical element driving system omitting outer frames and optical elements, according to the present disclosure.

FIG. 138 is a schematic diagram of a portable device according to an embodiment of the present disclosure.

FIG. 139 is a schematic diagram of a portable device according to another embodiment of the present disclosure.

FIG. 140 is a schematic diagram of a portable device according to another embodiment of the present disclosure.

DETAILED DESCRIPTION OF INVENTION

Figure 1:
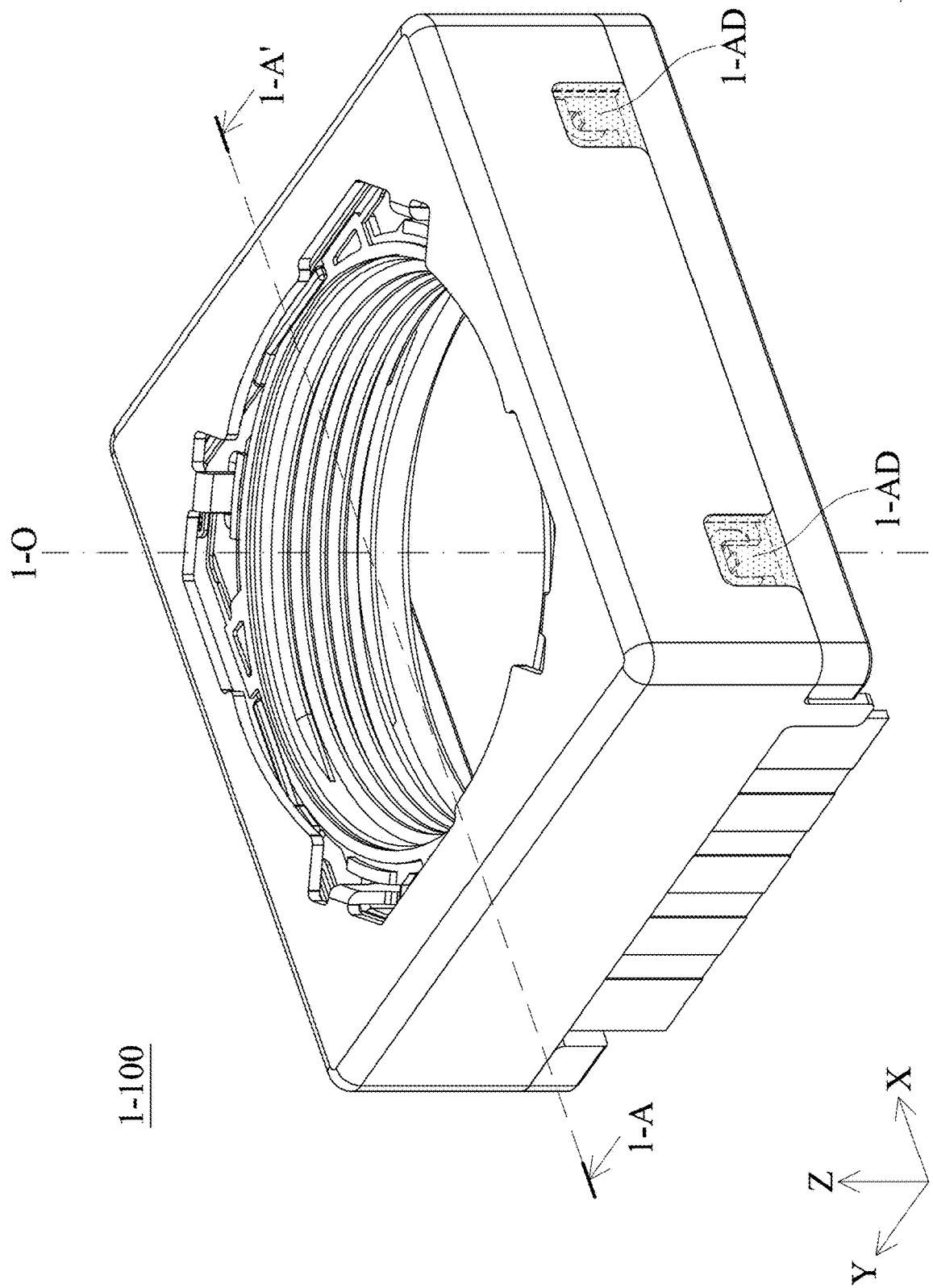
FIG. 1 shows a schematic diagram of an optical component driving mechanism according to an embodiment of the present disclosure.

In the following detailed description, for the purposes of explanation, numerous specific details and embodiments are set forth in order to provide a thorough understanding of the present disclosure. The specific elements and configurations described in the following detailed description are set forth in order to clearly describe the present disclosure. It will be apparent, however, that the exemplary embodiments set forth herein are used merely for the purpose of illustration, and the inventive concept can be embodied in various forms without being limited to those exemplary embodiments. In addition, the drawings of different embodiments can use like and/or corresponding numerals to denote like and/or corresponding elements in order to clearly describe the present disclosure. However, the use of like and/or corresponding numerals in the drawings of different embodiments does not suggest any correlation between different embodiments. The directional terms, such as "up", "down", "left", "right", "front" or "rear", are reference directions for accompanying drawings. Therefore, using the directional terms is for description instead of limiting the disclosure.

In this specification, relative expressions are used. For example, "lower", "bottom", "higher" or "top" are used to describe the position of one element relative to another. It should be appreciated that if a device is flipped upside down, an element at a "lower" side will become an element at a "higher" side.

The terms "about" and "substantially" typically mean +/−20% of the stated value, more typically +/−10% of the stated value and even more typically +/−5% of the stated value. The stated value of the present disclosure is an approximate value. When there is no specific description, the stated value includes the meaning of "about" or "substantially".

Figure 2:
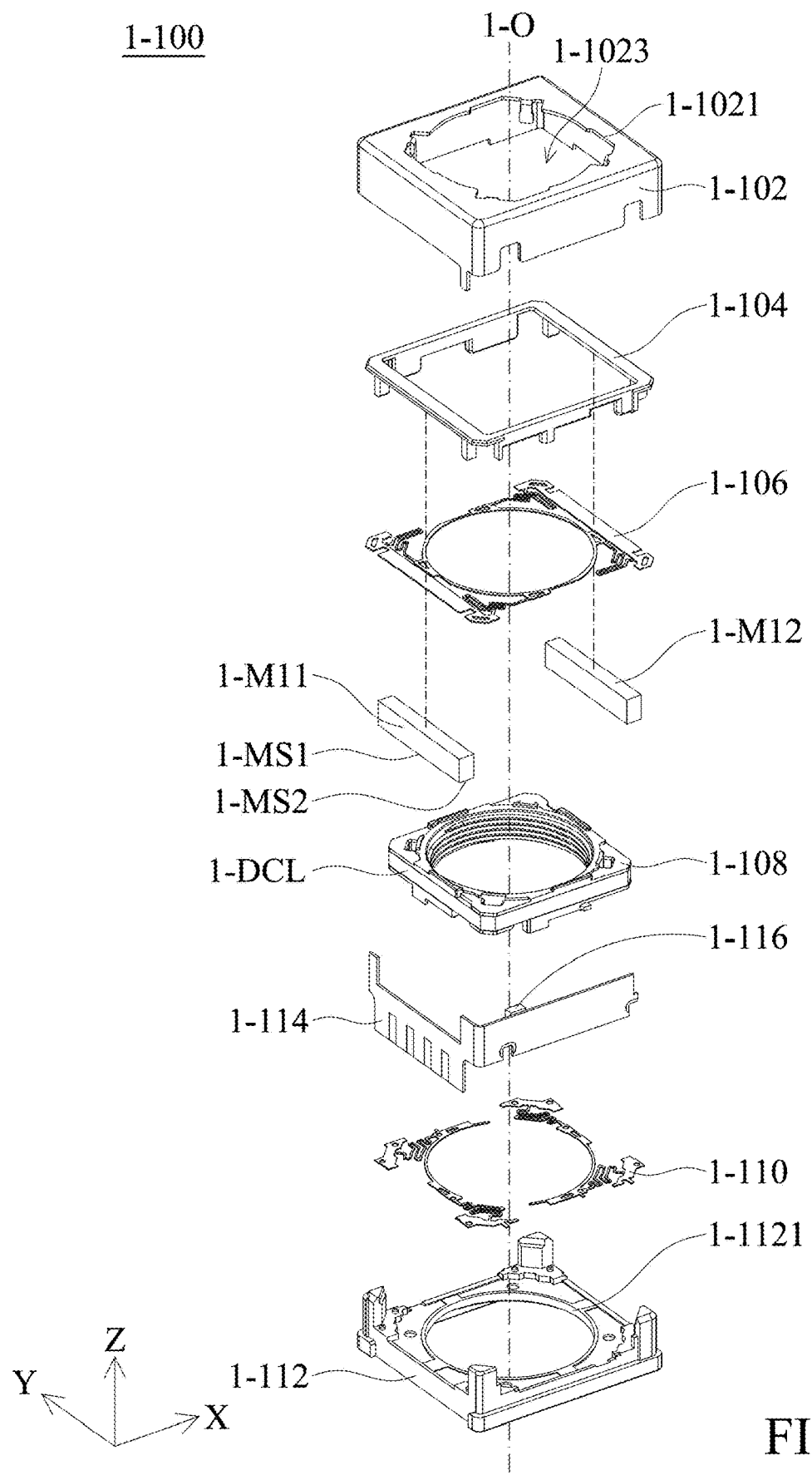
FIG. 2 shows an exploded diagram of the optical component driving mechanism according to the embodiment of the present disclosure.
Figure 3:
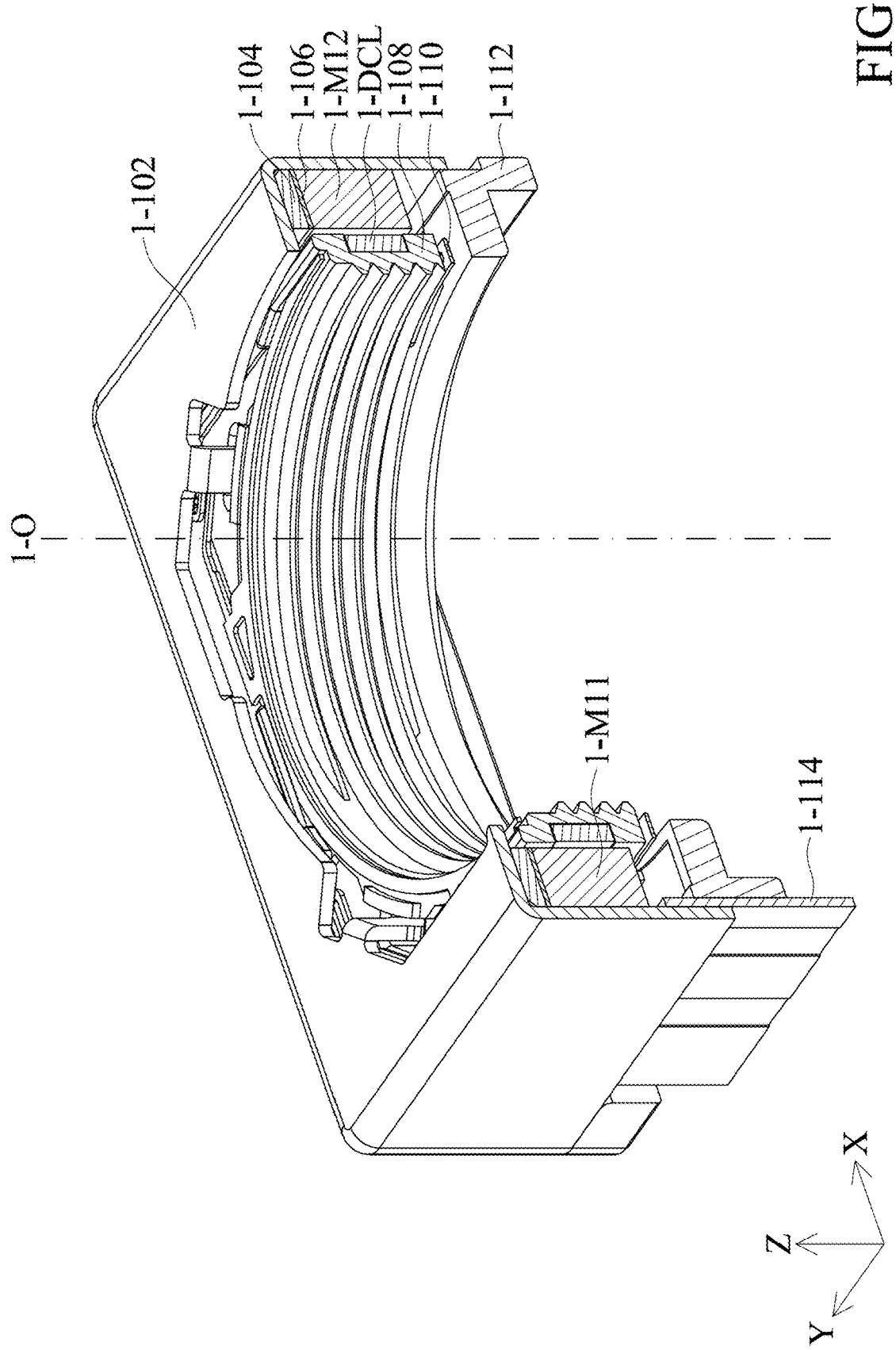
FIG. 3 shows a schematic cross-sectional view along line 1-A-1-A' in FIG. 1 according to the embodiment of the present disclosure.

Please refer to FIG. 1 to FIG. 3. FIG. 1 shows a schematic diagram of an optical component driving mechanism 1-100 according to an embodiment of the present disclosure, FIG. 2 shows an exploded diagram of the optical component driving mechanism 1-100 according to the embodiment of the present disclosure, and FIG. 3 shows a schematic cross-sectional view along line 1-A-1-A' in FIG. 1 according to the embodiment of the present disclosure. The optical component driving mechanism 1-100 can be an optical camera mechanism and can be configured to hold and drive an optical component (not shown in the figures). The optical component driving mechanism 1-100 can be installed in different electronic devices or portable electronic devices, such as a smartphone or a tablet computer, for allowing a user to perform the image capturing function. In this embodiment, the optical component driving mechanism 1-100 can be a voice coil motor (VCM) with an auto-focusing (AF) function, but it is not limited thereto. In other embodiments, the optical component driving mechanism 1-100 can also perform the functions of auto-focusing and optical image stabilization (OIS).

As shown in FIG. 1 to FIG. 3, in the present embodiment, the optical component driving mechanism 1-100 mainly includes a fixed assembly (may include a casing 1-102, a frame 1-104 and a base 1-112), a first elastic member 1-106, a movable assembly (may include a holder 1-108), and a driving assembly (may include a first magnet 1-M11, a second magnet 1-M12, and a driving coil 1-DCL), a second elastic member 1-110, a circuit assembly 1-114 and a sensing component 1-116.

The holder 1-108 is movable relative to the fixed assembly. The holder 1-108 is configured to hold an optical component (not shown), such as a camera lens, and the optical component defines an optical axis 1-O. It should be noted that in other embodiments, the component in the fixed assembly may also be adjusted to be movable (i.e., included in the movable assembly) according to actual needs.

As shown in FIG. 2, the casing 1-102 has a hollow structure, and a casing opening 1-1021 is formed on the casing 1-102. A base opening 1-1121 is formed on the base 1-112. The center of the casing opening 1-1021 corresponds to an optical axis 1-O of the optical component. The base opening 1-1121 corresponds to an image sensing element (now shown in the figures) disposed below the base 1-112. External light can enter the casing 1-102 through the casing opening 1-1021, and then to be received by the image sensing element (not shown) after passing through the optical component and the base opening 1-1121, so as to generate a digital image signal.

In addition, the casing 1-102 may include an accommodating space 1-1023 for accommodating the frame 1-104, the holder 1-108, the first elastic member 1-106, the first magnet 1-M11, the second magnet 1-M12, the driving coil 1-DCL, the circuit assembly 1-114, and so on. In this embodiment, the circuit assembly 1-114 may be a circuit board, and the driving assembly is electrically connected to the circuit assembly 1-114 and can drive the holder 1-108 to move relative to the fixed assembly (for example, to move relative to the base 1-112).

In this embodiment, the optical component driving mechanism 1-100 includes two driving magnetic element (a first magnet 1-M11 and a second magnet 1-M12), and each driving magnetic element may be a long strip-shaped structure, but the number of magnets and their shape are not limited to the above. For example, they may be shaped differently in other embodiments. In addition, the first magnet 1-M11 or the second magnet 1-M12 can be a multi-pole magnet. In one embodiment, the first magnet 1-M11 has a first side MS1 and a second side 1-MS2. The first side MS1 is not parallel to the second side 1-MS2, and both the first side MS1 and the second side 1-MS2 are perpendicular to the optical axis 1-O. In one embodiment, the ratio of the length of the first side MS1 to the length of the second side 1-MS2 is greater than or equal to 8. Because the driving magnetic element has a large volume, it is possible to increase the magnetic force and reduce the problem of thermal demagnetization.

As shown in FIG. 2 and FIG. 3, the frame 1-104 is securely disposed on an inner wall surface of the casing 1-102, and the first magnet 1-M11 and the second magnet 1-M12 can also be securely disposed on the frame 1-104 and the inner wall surface of the casing 1-102. As shown in FIG. 2 and FIG. 3, in this embodiment, the driving coil 1-DCL can be a winding coil and is disposed surround the holder 1-108. In addition, the driving coil 1-DCL corresponds to the first magnet 1-M11 and the second magnet 1-M12. When the driving coil 1-DCL is provided with electricity, the driving coil 1-DCL acts with the first magnet 1-M11 and the second magnet 1-M12 to generate an electromagnetic driving force, to drive the holder 1-108 and the optical component to move along the optical axis 1-O (the Z-axis) relative to the base 1-112.

Furthermore, as shown in FIG. 2 and FIG. 3, in this embodiment, the outer portion of the first elastic member 1-106 is fixed to the frame 1-104. Similarly, the outer portion of the second elastic member 1-110 is fixed to the four corners of the base 1-112. In addition, the inner portions of the first elastic member 1-106 and the second elastic member 1-110 are respectively connected to the upper side and lower side of the holder 1-108 such that the holder 1-108 is movably connected to the frame 1-104 through the first elastic member 1-106 and the second elastic member 1-110. Therefore, the holder 1-108 can be suspended within the frame 1-104 (as shown in FIG. 3). Thus, the driving assembly can drive the holder 1-108 to move relative to the frame 1-104.

Figure 4:
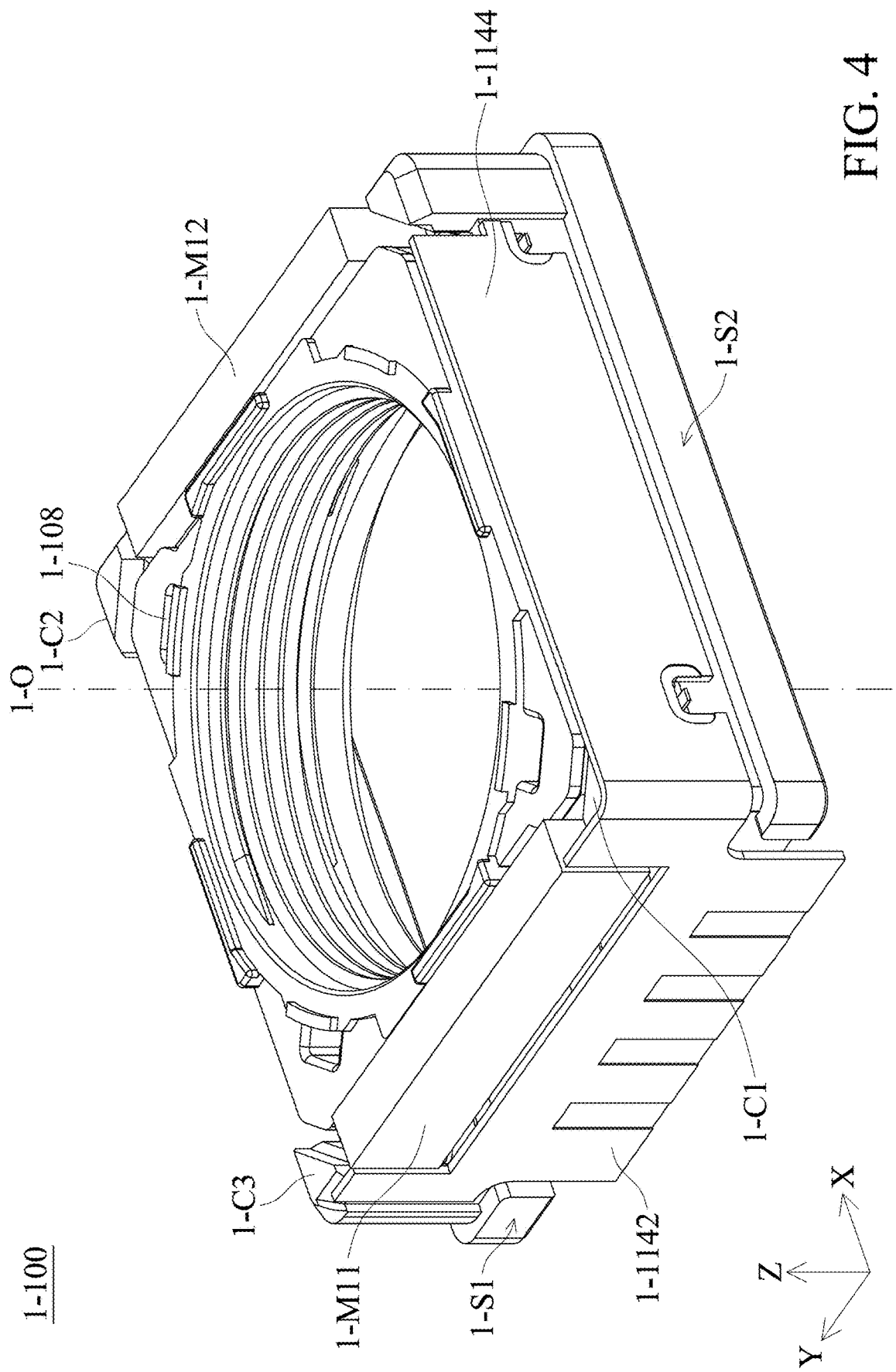
FIG. 4 is a partial structural diagram of the optical component driving mechanism 1-100 according to an embodiment of the present disclosure.
Figure 5:
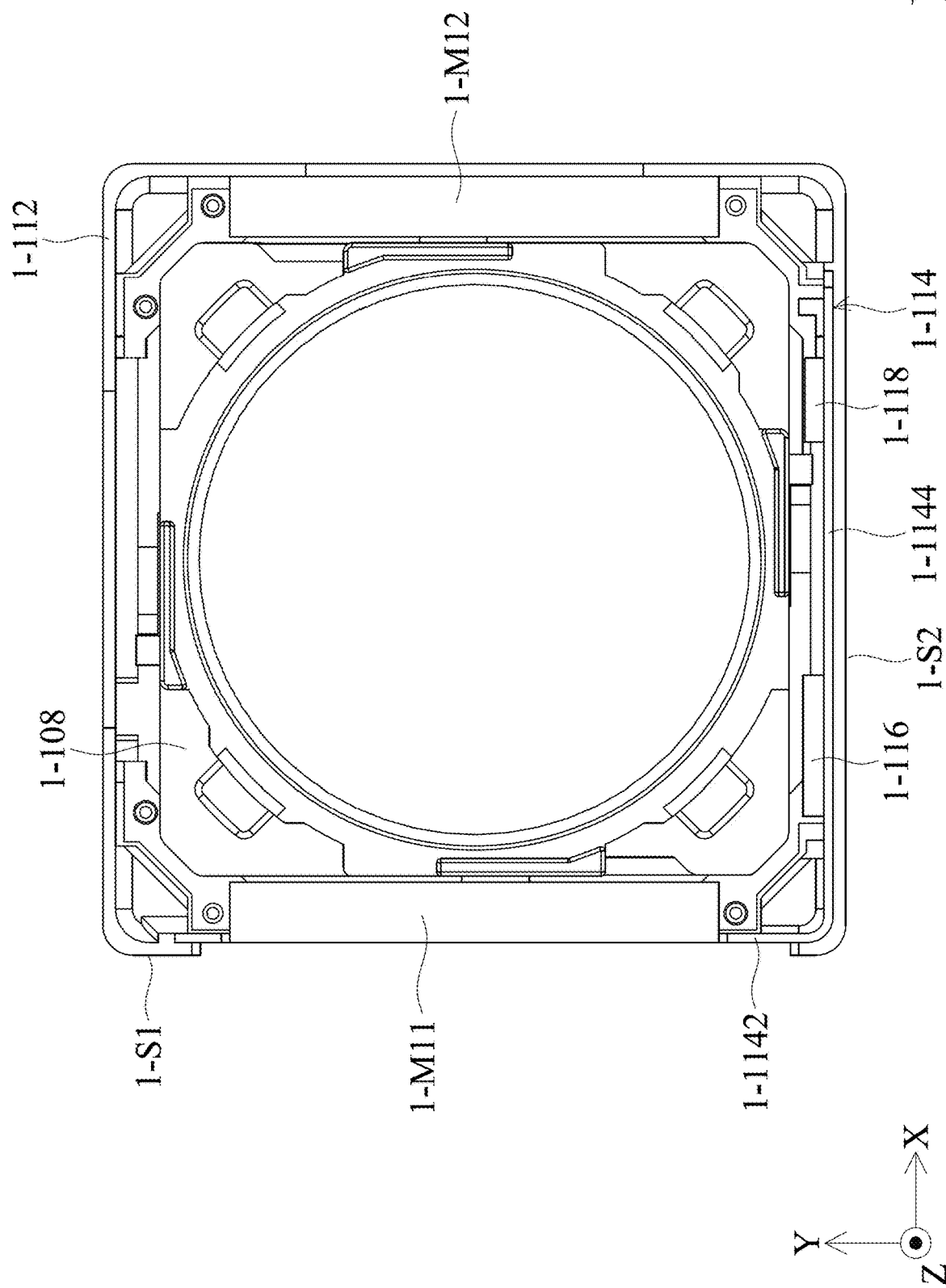
FIG. 5 is a top view of FIG. 4 according to an embodiment of the present disclosure.

Please refer to FIG. 4 and FIG. 5, FIG. 4 is a partial structural diagram of the optical component driving mechanism 1-100 according to an embodiment of the present disclosure, and FIG. 5 is a top view of FIG. 4 according to an embodiment of the present disclosure. As shown in FIG. 4 and FIG. 5, the optical component driving mechanism 1-100 defines a first side 1-S1 and a second side 1-S2. The circuit assembly 1-114 extends in the direction of the optical axis 1-O, and the circuit assembly 1-114 is disposed on the first side 1-S1 and the second side 1-S2 in a flexible manner. The first side 1-S1 and the second side 1-S2 are not parallel. For example, the first side 1-S1 is perpendicular to the second side 1-S2.

Specifically, the circuit assembly 1-114 can include an outer connecting portion 1-1142 and an inner connecting portion 1-1144. The outer connecting portion 1-1142 and the inner connecting portion 1-1144 are respectively located at the first side 1-S1 and the second side 1-S2. Based on such a configuration, the flexibility of the optical component driving mechanism 1-100 to cooperate with other external components can be improved, and it is convenient for assembly.

The driving magnetic element may be disposed on the first side 1-S1 or the second side 1-S2. In this embodiment, as shown in FIG. 5, the first magnet 1-M11 is disposed on the first side 1-S1, and when viewed in the direction of the optical axis 1-O, the first magnet 1-M11 partially overlaps the circuit assembly 1-114, so as to achieve the purpose of miniaturization.

Furthermore, as shown in FIG. 5, when viewed in the direction of the optical axis 1-O, the circuit assembly 1-114 does not overlap the holder 1-108, and the circuit assembly 1-114 partially overlaps the base 1-112, so that the purpose of miniaturization can be further achieved.

It should be noted that, in one embodiment, as shown in FIG. 5, the length of the circuit assembly 1-114 is greater than 40% of the outer circumference length of the optical component driving mechanism 1-100. Based on this design, the stability of the disposing the circuit assembly 1-114 can be improved.

In addition, as shown in FIG. 5, the optical component driving mechanism 1-100 further includes a sensing assembly, the sensing assembly can include the sensing component 1-116 and an electronic component 1-118, and the sensing assembly is disposed on the circuit assembly 1-114 and located between the circuit assembly 1-114 and the movable assembly (the holder 1-108). The sensing component 1-116 is configured to sense a magnetic field of a magnetic component (not shown in the figures) disposed on the holder 1-108 so as to obtain a position of the holder 1-108 relative to the base 1-112. The electronic component 1-118 can be a signal filter, and the sensing component 1-116 is electrically connected to the outer connecting portion 1-1142 via the electronic component 1-118. Because the circuit assembly 1-114 is disposed on the base 1-112 in an L shape, and the driving magnetic element and the sensing assembly are respectively disposed on the first side 1-S1 and the second side 1-S2, it can prevent the sensing assembly from magnetic interference.

Figure 6:
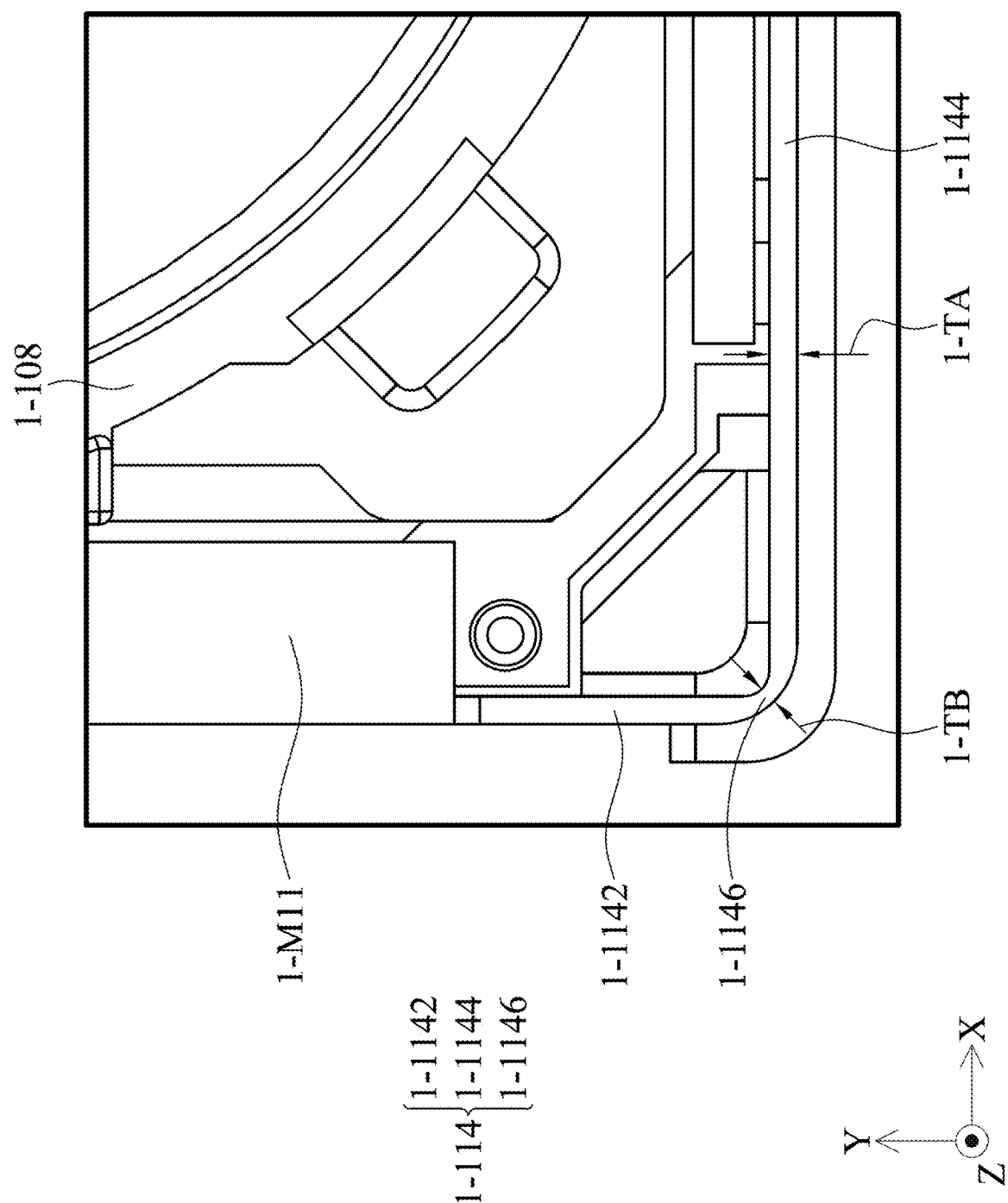
FIG. 6 is a partial enlarged diagram of FIG. 5 according to an embodiment of the present disclosure.

Next, please refer to FIG. 6, which is a partial enlarged diagram of FIG. 5 according to an embodiment of the present disclosure. In this embodiment, the outer connecting portion 1-1142 or the inner connecting portion 1-1144 may be a straight portion of the circuit assembly 1-114. The circuit assembly 1-114 may further include a bent portion 1-1146, and a thickness 1-TB of the bent portion 1-1146 is less than a thickness 1-TA of the outer connecting portion 1-1142 or of the inner connecting portion 1-1144. Therefore, the circuit assembly 1-114 can be bent more easily, and the purpose of miniaturization can also be achieved.

Figure 7:
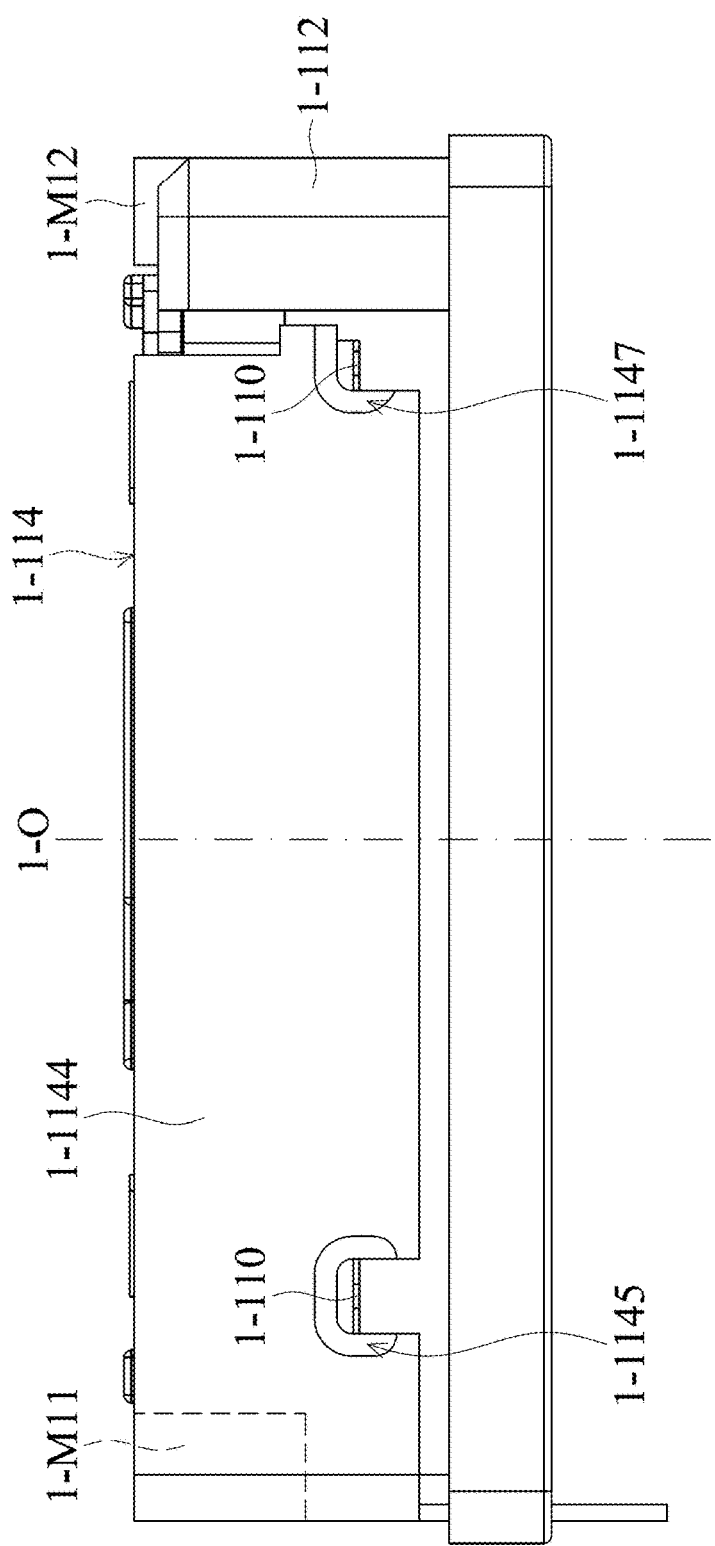
FIG. 7 is a side view of FIG. 4 according to an embodiment of the present disclosure.

Next, please refer to FIG. 7, which is a side view of FIG. 4 according to an embodiment of the present disclosure. In this embodiment, the inner connecting portion 1-1144 is configured to be electrically connected to the second elastic member 1-110. Specifically, the inner connecting portion 1-1144 has a first connecting portion 1-1145 and a second connecting portion 1-1147. The second elastic member 1-110 has a plate-shaped structure, and the surfaces of the first connecting portion 1-1145 and the second connecting portion 1-1147 are not parallel to an extending direction of the second elastic member 1-110 (for example, the X-axis or the Y-axis), so as to reduce the areas of the first connecting portion 1-1145 and the second connecting portion 1-1147, so that the purpose of miniaturization can be achieved.

Furthermore, as shown in FIG. 7, the first connecting portion 1-1145 and the second connecting portion 1-1147 have different structures when viewed in a direction perpendicular to the optical axis 1-O. For example, the first connecting portion 1-1145 is a U-shaped structure, and the second connecting portion 1-1147 is substantially a L-shaped structure, so that the length of the inner connecting portion 1-1144 can be further reduced so as to achieve the purpose of miniaturization.

It should be noted that the second elastic member 1-110 is connected to the first connecting portion 1-1145 and the second connecting portion 1-1147 by using solder (not shown in the figures). After welding, the casing 1-102 may be further fixed to the base 1-112 by glue 1-AD (as shown in FIG. 1), and the glue 1-AD can cover the solder at the first connecting portion 1-1145 and the second connecting portion 1-1147 to avoid short circuits. In addition, dust can also be prevented from entering the optical component driving mechanism 1-100.

Figure 8:
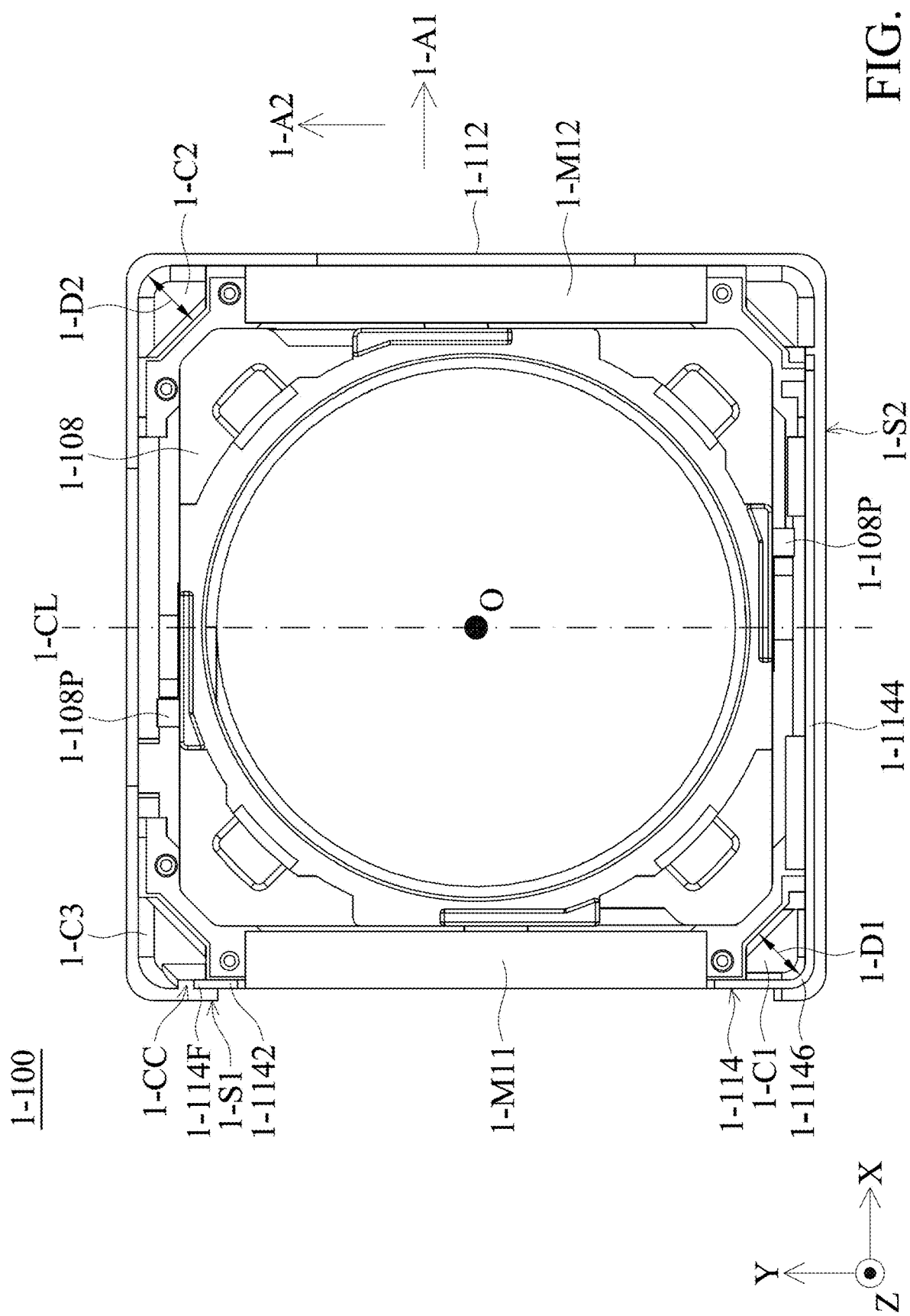
FIG. 8 is a top view of a partial structure of the optical component driving mechanism according to an embodiment of the present disclosure.

Please refer to FIG. 8, which is a top view of a partial structure of the optical component driving mechanism 1-100 according to an embodiment of the present disclosure. In this embodiment, the base 1-112 has a first column 1-C1 and a second column 1-C2. The first column 1-C1 is disposed at the intersection of the first side 1-S1 and the second side 1-S2, and the first column 1-C1 is in contact with the circuit assembly 1-114. The first column 1-C1 and the second column 1-C2 have different sizes when viewed in the direction of the optical axis 1-O. Specifically, as shown in FIG. 8, the first column 1-C1 has a radial length 1-D1, and the second column 1-C2 has a radial length 1-D2. For placing the circuit assembly 1-114, the radial length 1-D1 is designed to be shorter than the radial length 1-D2, to reduce the volume of the first column 1-C1, and therefore it can achieve the purpose of miniaturization at the same time.

Furthermore, the base 1-112 may further have a third column 1-C3, the first column 1-C1 is in contact with the bent portion 1-1146 of the circuit assembly 1-114, and the third column 1-C3 is in contact with the outer connecting portion 1-1142 of the circuit assembly 1-114 (the straight portion). The third column 1-C3 has a receiving recess 1-CC, and a free end 1-114F of the circuit assembly 1-114 is received in the receiving recess 1-CC to assist in positioning the circuit assembly 1-114, to improve the stability of the circuit assembly 1-114 and to achieve the purpose of miniaturization.

In this embodiment, the optical component driving mechanism 1-100 may define a first direction 1-A1 and a second direction 1-A2, the first direction 1-A1 and the second direction 1-A2 are perpendicular to each other, and both the first direction 1-A1 and the second direction 1-A2 are perpendicular to the optical axis 1-O. When viewed in the first direction 1-A1 or the second direction 1-A2, the circuit assembly 1-114 partially overlaps the first column 1-C1, the second column 1-C2, and the third column 1-C3 so as to achieve the purpose of miniaturization.

In addition, as shown in FIG. 7 and FIG. 8, when viewed in the second direction 1-A2 (the Y-axis), the outer connecting portion 1-1142 of the circuit assembly 1-114 (extending along the second direction 1-A2) partially overlaps the driving magnetic element (the first magnet 1-M11).

In addition, as shown in FIG. 8, the optical component driving mechanism 1-100 may define a center line 1-CL which is perpendicular to the optical axis 1-O and passes through the center of the holder 1-108. The holder 1-108 may have one or two protrusions 1-108P. The protrusions 1-108P extend in the direction of the center line 1-CL (the Y-axis), the center line 1-CL is parallel to the first side 1-S1, and the protrusions 1-108P are disposed between the center line and the first side 1-S1 and are closer to the center line 1-CL.

Figure 9:
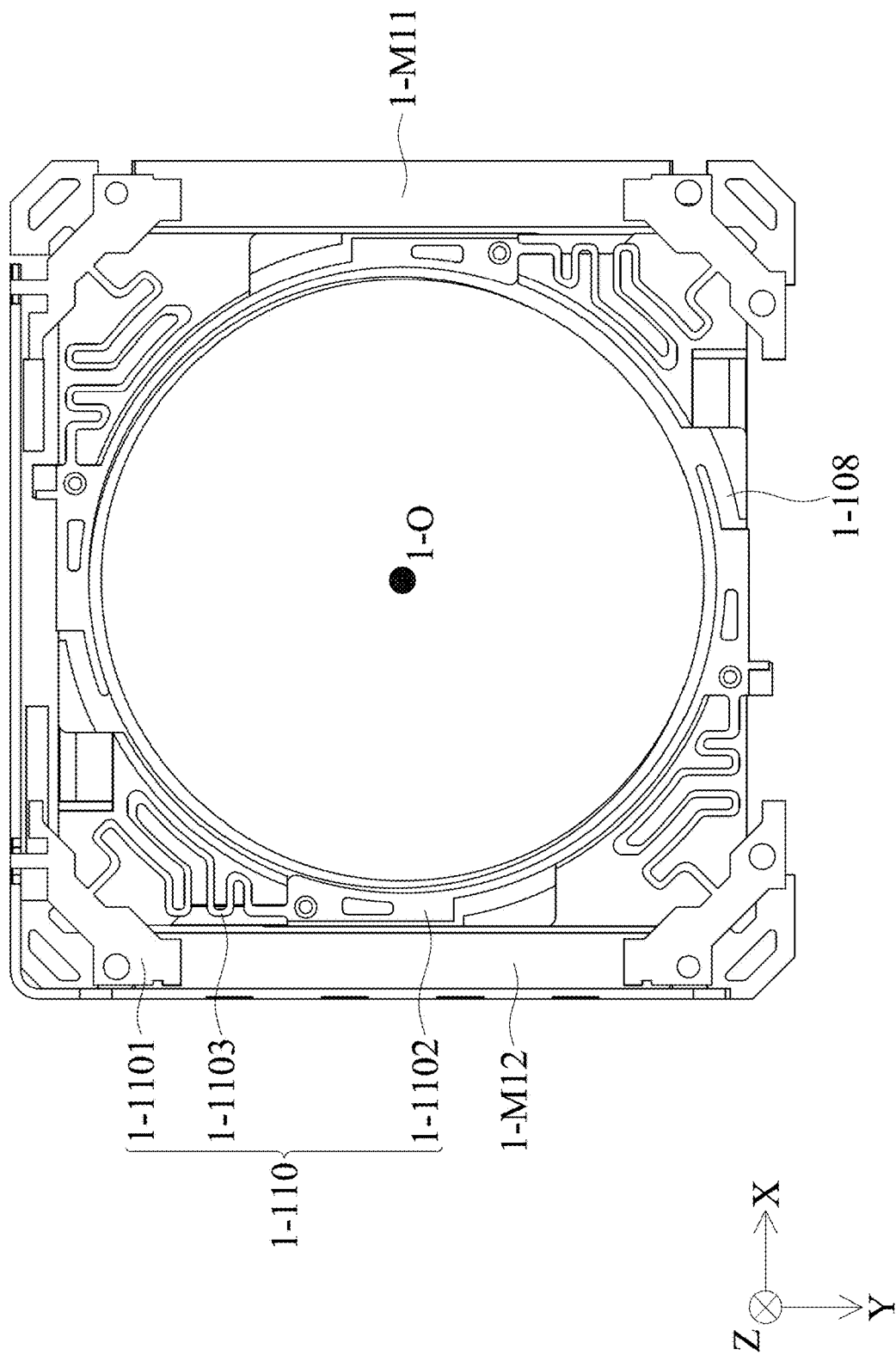
FIG. 9 is a bottom view of a partial structure of the optical component driving mechanism according to an embodiment of the present disclosure.

Please refer to FIG. 9, which is a bottom view of a partial structure of the optical component driving mechanism 1-100 according to an embodiment of the present disclosure. As shown in FIG. 9, the second elastic member 1-110 includes at least one outer connecting portion 1-1101, at least one inner connecting portion 1-1102, and at least one string 1-1103. The outer connecting portion 1-1101 is fixedly connected to the fixed assembly (for example, the frame 1-104), the inner connecting portion 1-1102 is fixedly connected to the holder 1-108, and the outer connecting portion 1-1101 is movably connected to the inner connecting portion 1-1102 through the string 1-1103. When viewed in the direction of the optical axis 1-O, the string 1-1103 does not overlap the first magnet 1-M11 or the second magnet 1-M12 so as to prevent the string 1-1063 from being in contact with the driving magnetic element to cause the problem of short circuit when the optical component driving mechanism 1-100 operates.

Figure 10:
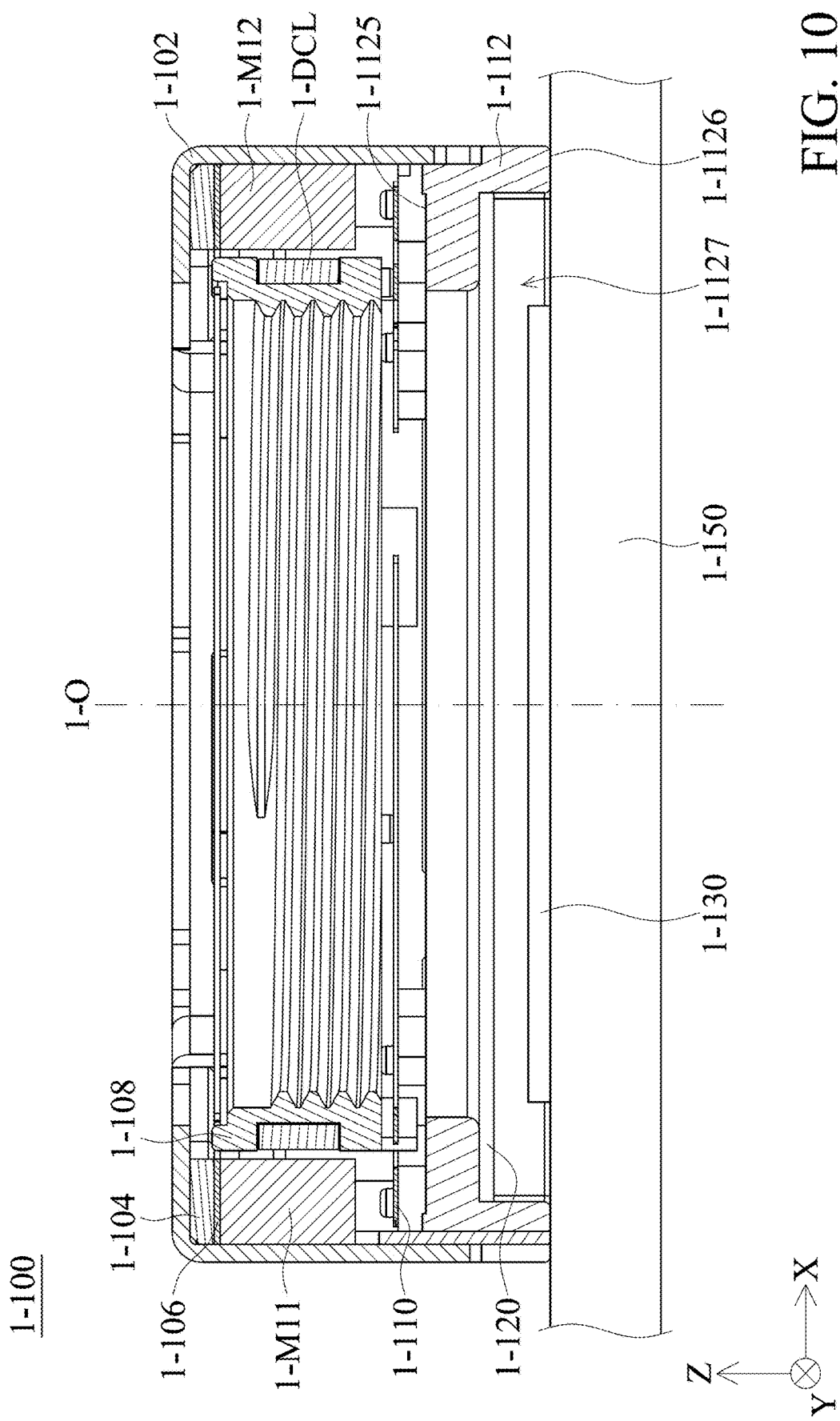
FIG. 10 is a cross-sectional view of the optical component driving mechanism installed on an external circuit board according to an embodiment of the present disclosure.

Please refer to FIG. 10, which is a cross-sectional view of the optical component driving mechanism 1-100 installed on an external circuit board 1-150 according to an embodiment of the present disclosure. As shown in FIG. 10, the base 1-112 has a first surface 1-1125 and a second surface 1-1126. The first surface 1-1125 and the second surface 1-1126 are located on opposite sides of the base 1-112. The first surface 1-1125 faces the holder 1-108, a concave portion 1-1127 is formed on the second surface 1-1126, and when viewed along the optical axis 1-O, the projection of the holder 1-108 on the second surface 1-1126 is located within the concave portion 1-1127.

In addition, as shown in FIG. 10, the optical component driving mechanism 1-100 may further include a transparent plate 1-120 disposed in the concave portion 1-1127, and the transparent plate 1-120 may be a filter plate. When viewed in a direction perpendicular to the optical axis 1-O (the X-axis), the transparent plate 1-120 completely overlaps the concave portion 1-1127. In addition, a photosensitive element 1-130 is disposed on the external circuit board 1-150, and the photosensitive element 1-130 is also received in the concave portion 1-1127.

Based on the structural design described above, the photosensitive element 1-130 and the transparent plate 1-120 can be accommodated in the concave portion 1-1127 without providing an additional protective cover, so that the optical component driving mechanism 1-100 can be further miniaturized.

The present disclosure provides an optical component driving mechanism having a flexible circuit assembly 1-114 configured to be installed on the base 1-112. The circuit assembly 1-114 is bent into an L shape, and the outer connecting portion 1-1142 and the inner connecting portion 1-1144 of the circuit assembly 1-114 are respectively disposed on the first side 1-S1 and the second side 1-S2 of the base 1-112. Based on this structural configuration, the optical component driving mechanism 1-100 can be easily assembled to the external circuit board 1-150 by the outer connecting portion 1-1142.

Furthermore, because the driving magnetic element is disposed on the first side 1-S1, and the sensing component 1-116 on the circuit assembly 1-114 is disposed on the second side 1-S2, the problem of magnetic interference can be reduced.

Figure 11:
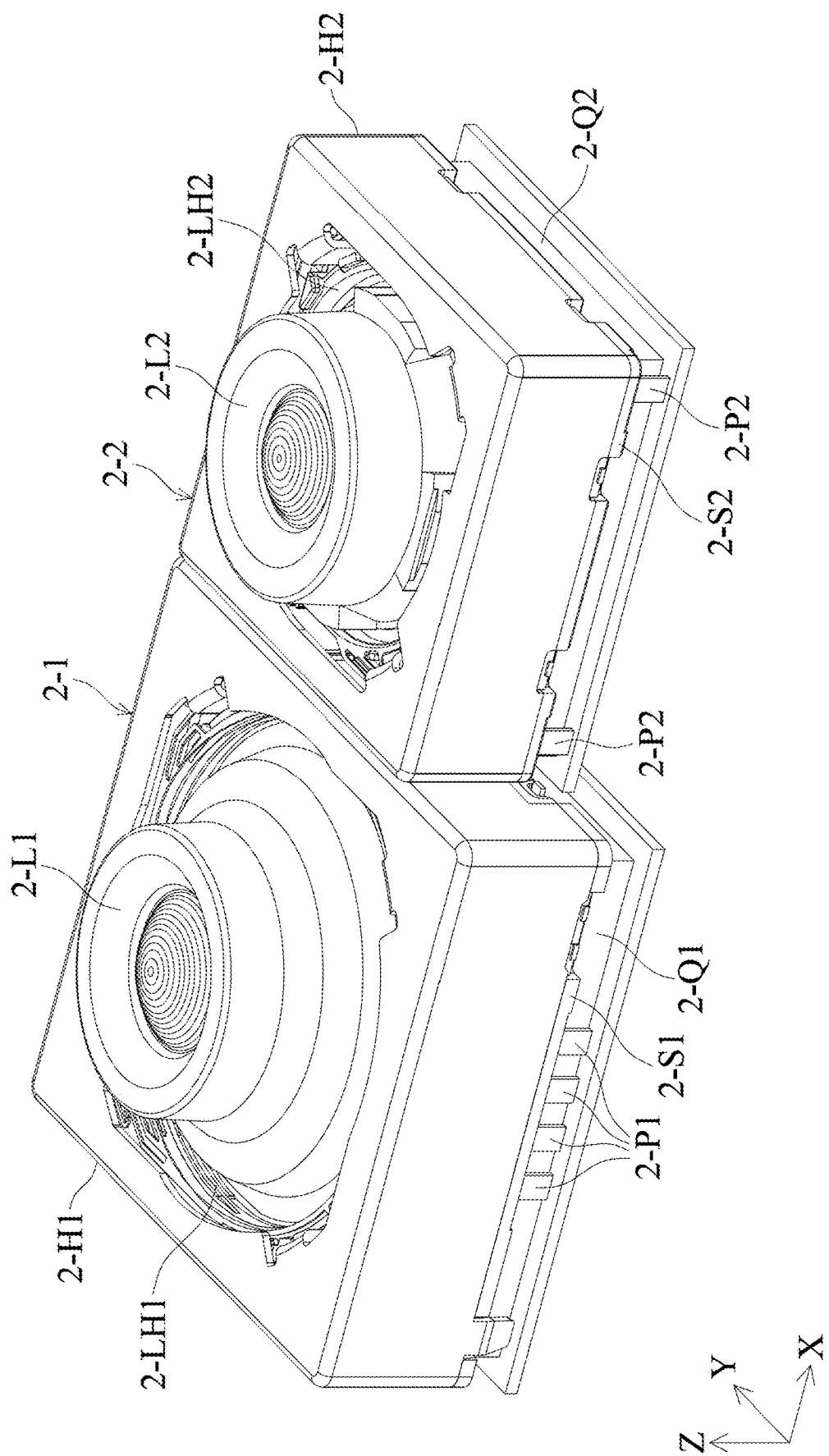
FIG. 11 is a perspective diagram of a first optical element and a second optical element joined with a driving system in accordance with an embodiment of the invention.
Figure 12:
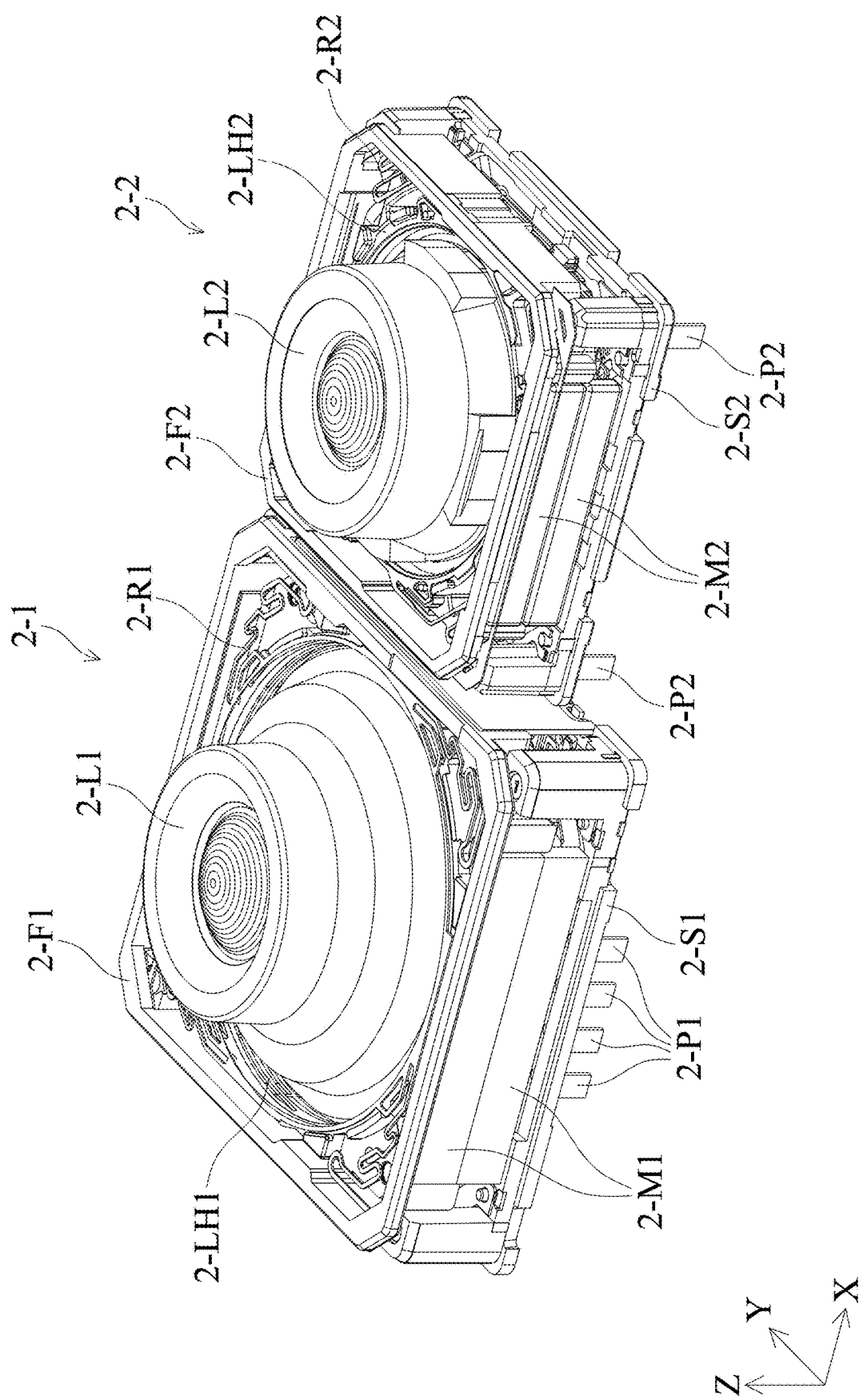
FIG. 12 is a perspective diagram of the driving system in FIG. 11 with the housings and the image sensing units removed therefrom.

Referring to FIGS. 11 and 12, FIG. 11 is a perspective diagram of a first optical element 2-L1 and a second optical element 2-L2 joined with a driving system in accordance with an embodiment of the invention, and FIG. 12 is a perspective diagram of the driving system in FIG. 11 with the housings 2-H1 and 2-H2 and the image sensing units 2-Q1 to 2-Q2 removed therefrom.

As shown in FIGS. 11 and 12, the driving system in this embodiment primarily comprises a first module 2-1 and a second module 2-2 arranged along the X axis (first direction) for respectively holding and moving the first and second optical elements 2-L1-2-L2. In this embodiment, the first and second modules 2-1 and 2-2 have different thicknesses along the Z axis, and two image sensing units 2-Q1 and 2-Q2 are respectively located at the bottom sides of the first and second modules 2-1 and 2-2. The first and second optical elements 2-L1 and 2-L2 may be optical lenses having different focal lengths or optical effective diameters, and they are joined with the first and second modules 2-1 and 2-2 to constitute a dual camera lens system. The dual camera lens system may be disposed in handheld digital products such as mobile phones or tablet PCs for photographing or video recording.

For example, the first and second modules 2-1 and 2-2 may comprise a voice coil motor (VCM) for driving the first and second optical elements 2-L1 and 2-L2 to move. Thus, auto-focusing (AF) or optical image stabilizer (OIS) function of the camera lens system can be achieved, wherein the optical axes of the first and second optical elements 2-L1 and 2-L2 are parallel to the Z axis.

As shown in FIG. 12, two frames 2-F1 and 2-F2 are respectively disposed in the first and second modules 2-1 and 2-2, and the first and second optical elements 2-L1 and 2-L2 are received in the holders 2-LH1 and 2-LH2 of the first and second modules 2-1 and 2-2. During assembly, the frames 2-F1 and 2-F2 are respectively adhered to the inner surfaces of the housings H1 and H2, and two sheet springs 2-R1 and 2-R2 respectively connect the frames 2-F1 and 2-F2 to the holders 2-LH1 and 2-LH2, whereby the holders 2-LH1 and 2-LH2 (first and second movable parts) and the first and second optical elements 2-L1 and 2-L2 received therein can be driven to move relative to the frames 2-F1 and 2-F2 and the housings 2-H1 and 2-H2 (first and second fixed parts).

Additionally, the first and second modules 2-1 and 2-2 respectively have at least a first magnetic element 2-M1 and a second magnetic element 2-M2 adhered to the frames 2-F1 and 2-F2. In this embodiment, the first and second magnetic elements 2-M1 and 2-M2 are magnets, and when an external circuit applies current signals to the coils (not shown) on the holders 2-LH1 and 2-LH2, an electromagnetic force can be generated by the coil on the holder 2-LH1 and the first magnetic element 2-M1 for moving the holder 2-LH1 relative to frame 2-F1 and the housing 2-H1, and another electromagnetic force can be generated by the coil on the holder 2-LH2 and the second magnetic element 2-M2 for moving the holder 2-LH2 relative to frame 2-F2 and the housing 2-H2. Thus, auto-focusing (AF) or optical image stabilizer (OIS) function of the camera lens system can be performed.

Still referring to FIGS. 11 and 12, the first and second modules 2-1 and 2-2 respectively comprise a first terminal 2-P1 and a second terminal 2-P2. The first terminal 2-P1 is located on a first side 2-S1 of the first module 2-1 for electrically connecting the coil on the holder 2-LH1 to an external circuit, and the second terminal 2-P2 is located on a second side 2-S2 of the second module 2-2 for electrically connecting the coil on the holder 2-LH2 to the external circuit.

It should be noted that the first and second terminals 2-P1 and 2-P2 of the first and second modules 2-1 and 2-2 are located on the same side of the driving system. Thus, the first and second terminals 2-P1 and 2-P2 of the first and second modules 2-1 and 2-2 can be electrically connected to the external circuit by a single process (e.g. soldering, welding or conductive glue) without rotation of the driving system, so as to increase assembly efficiency and reduce the production cost.

Figure 13:
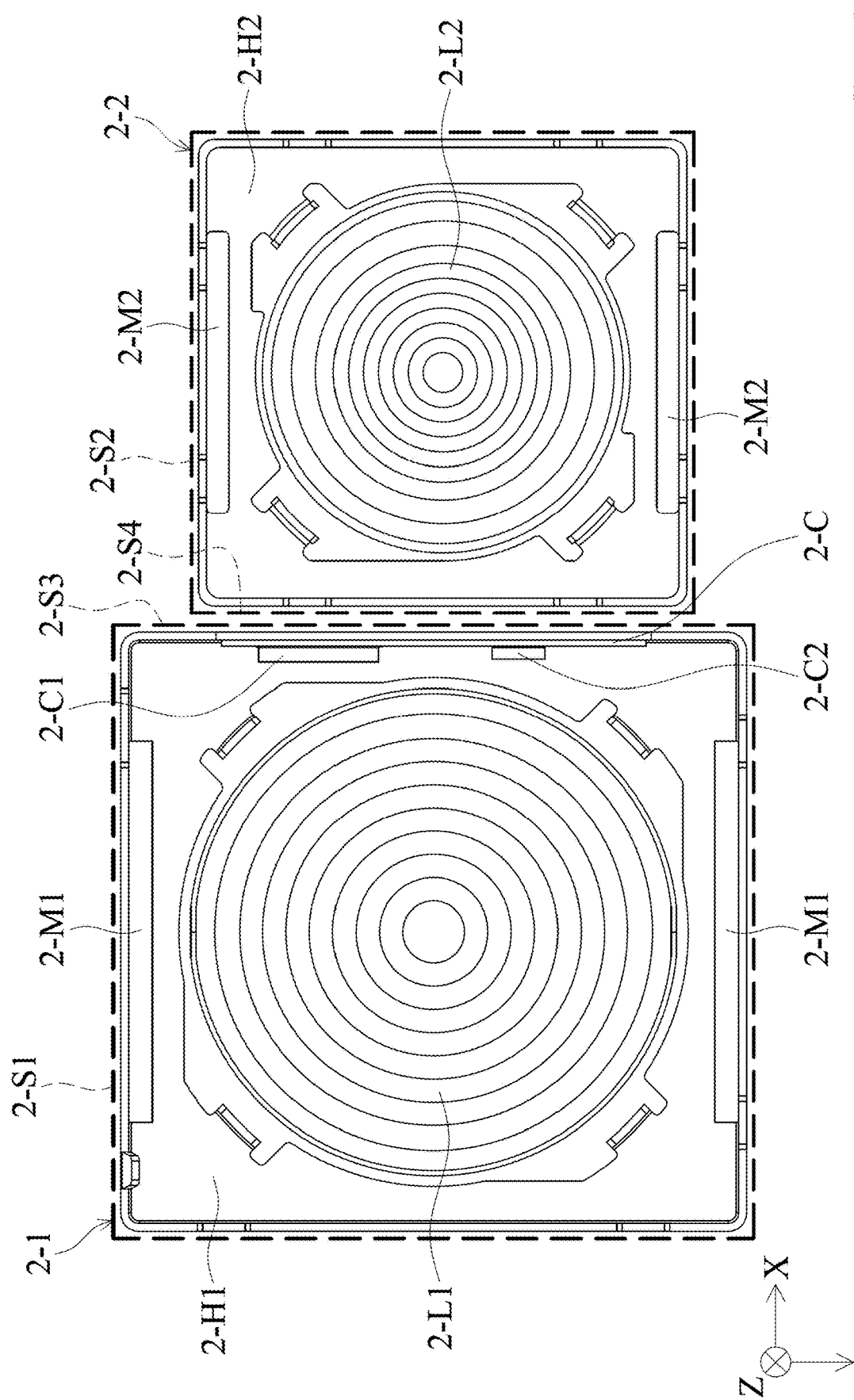
FIG. 13 is a bottom view showing relative position between the first and second optical elements, the housings, and the first and second magnetic elements in the first and second modules after assembly.

FIG. 13 is a bottom view showing relative position between the first and second optical elements 2-L1 and 2-L2, the housings 2-H1 and 2-H2, and the first and second magnetic elements 2-M1 and 2-M2 in the first and second modules 2-1 and 2-2 after assembly. Referring to FIG. 13, at least one first magnetic element 2-M1 and the coil on the holder 2-LH1 of the first module 2-1 can constitute a first driving assembly for driving the holder 2-LH1 and the first optical element 2-L1 to move by magnetic force. Similarly, at least one second magnetic element 2-M2 and the coil on the holder 2-LH2 of the second module 2-2 can constitute a second driving assembly for driving the holder 2-LH2 and the second optical element 2-L2 to move by magnetic force.

In FIG. 13, an L-shaped circuit board 2-C is disposed in the first module 2-1. Moreover, an electronic element 2-C1 and a filter 2-C2 (e.g. capacitor) are disposed on an inner surface of the circuit board 2-C. In this embodiment, the electronic element 2-C1 and the filter 2-C2 are both located on a third side 2-S3 of the first module 2-1.

For example, the electronic element 2-C1 may be a position sensor, an inertial sensor, an integrated circuit or a passive element. In this embodiment, the electronic element 2-C1 comprises a Hall effect sensor for detecting the movement of the holder 2-LH1 (first movable part) relative to the housing 2-H1 (first fixed part). Since the mass of the first optical element 2-L1 is greater than the mass of the second optical element 2-L2, the Hall effect sensor can be disposed in the first module 2-1 to facilitate a precise closed-loop control of the first optical element 2-L1.

In some embodiments, the electronic element 2-C1 may electrically connect to a control circuit (not shown). The control circuit can receive the signal from the electronic element 2-C1 and transmit two different driving signals to the coils on the holder 2-LH1 and 2-LH2, whereby the holder 2-LH1 and 2-LH2 in the first second modules 2-1 and 2-2 can be respectively driven to move relative to the housings 2-H1 and 2-H2.

Here, the third side 2-S3 of the first module 2-1 faces a fourth side 2-S4 of the second module 2-2, two first magnetic elements 2-M1 are disposed on the sides of the first module 2-1 other than the third side 2-S3, and two second magnetic elements 2-M2 are disposed on the sides of the second module 2-2 other than the fourth side 2-S4. Hence, the electronic element 2-C1 can be positioned between the first and second optical elements 2-L1 and 2-L2 to improve space utilization of the driving system. Moreover, the electronic element 2-C1 can also be prevented from magnetic interference by the first and second magnetic elements 2-M1 and 2-M2 or other electronic components outside the driving system.

Figure 14:
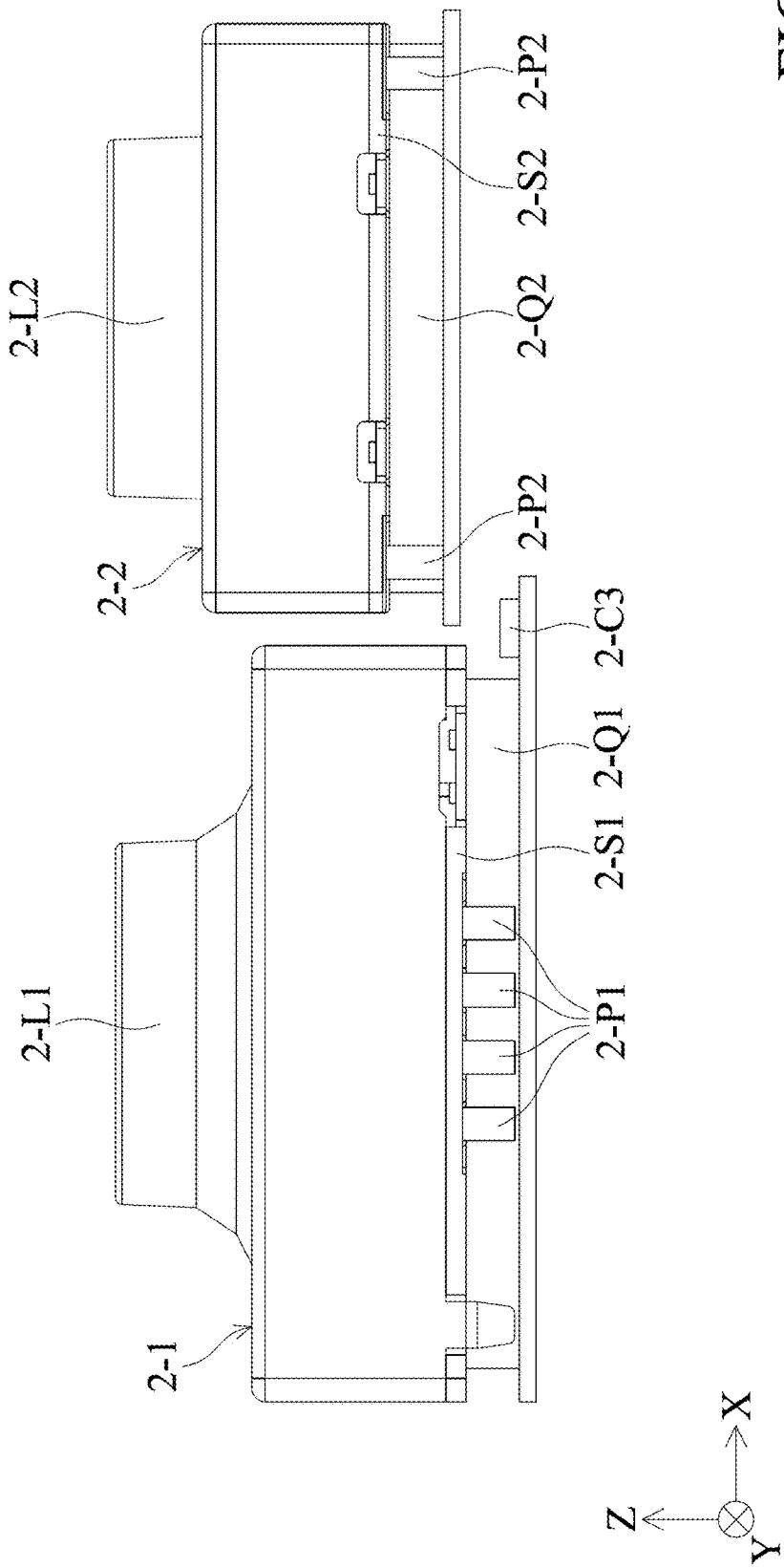
FIG. 14 is a side view of the first and second optical elements joined with a driving system in accordance with another embodiment of the invention.

FIG. 14 is a side view of the first and second optical elements 2-L1 and 2-L2 joined with a driving system in accordance with another embodiment of the invention. As shown in FIG. 14, an electronic element 2-C3 is disposed on and electrically connected to the image sensing unit 2-Q1 under the first module 2-1. When viewed along a horizontal direction (Y direction), the electronic element 2-C3 does not overlap the first and second modules 2-1 and 2-2.

Additionally, when viewed along a vertical direction (Z direction), the electronic element 2-C3 partially overlaps the first module 2-1 or the second module 2-2, so as to improve space utilization under the first module 2-1 or the second module 2-2 and facilitate miniaturization of the driving system. It should be noted that the vertical direction is parallel to the optical axes of the first and second optical elements 2-L1 and 2-L2. For example, the electronic element 2-C3 may be a position sensor (e.g. Hall effect sensor), an inertial sensor, an integrated circuit or a passive element.

Figure 15:
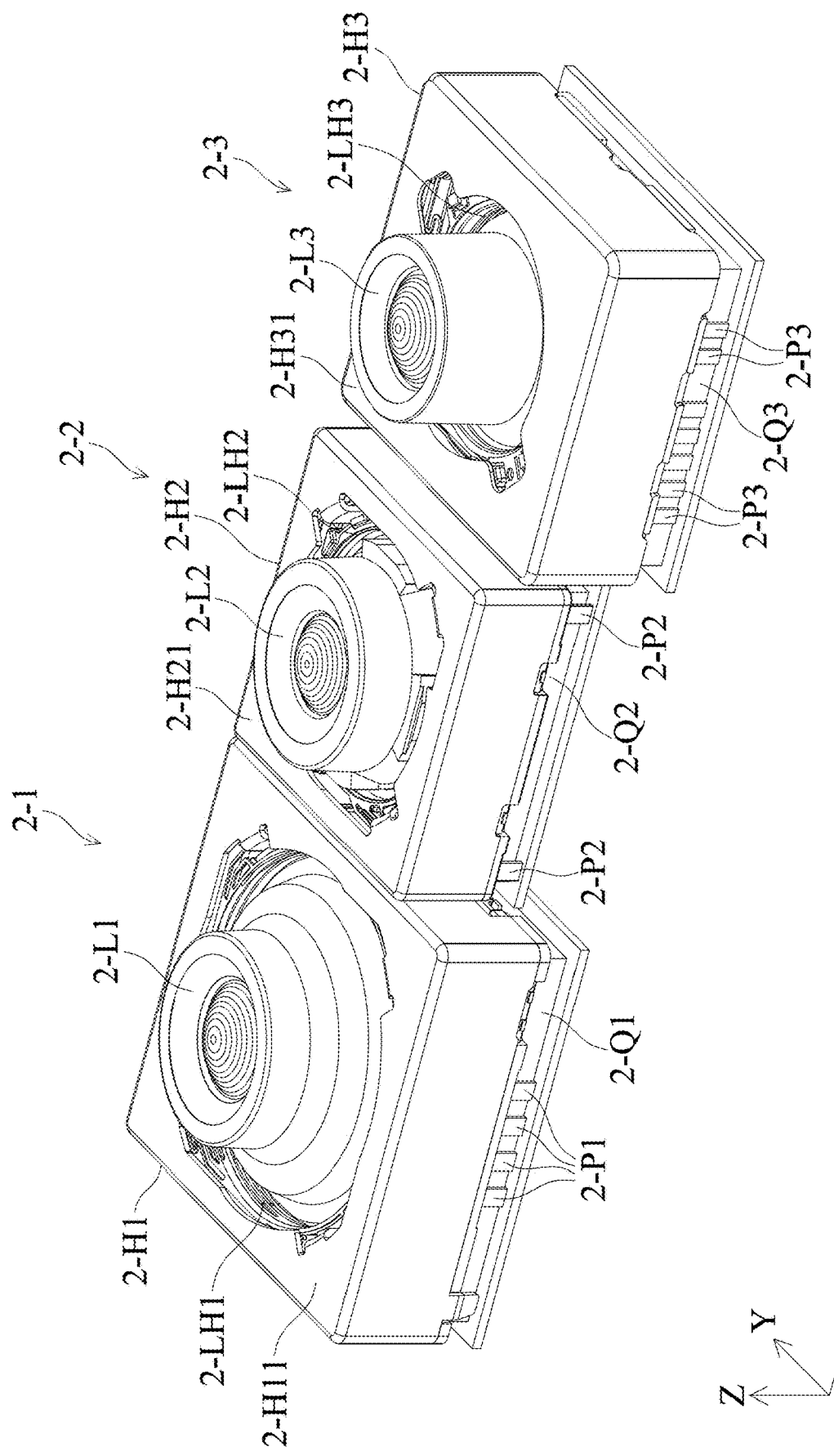
FIG. 15 shows a first optical element, a second optical element and a third optical element joined with a driving system in accordance with another embodiment of the invention.

FIG. 15 shows a first optical element 2-L1, a second optical element 2-L2 and a third optical element 2-L3 joined with a driving system in accordance with another embodiment of the invention. FIG. 15 is different from the embodiment of FIG. 11 in that the driving system further comprises a third module 2-3 for holding and moving a third optical element 2-L3. In this embodiment, the first, second and third modules 2-1 to 2-3 are arranged along the X axis (first direction), and the optical effective diameter of the second optical element 2-L2 is greater than the optical effective diameter of the third optical element 2-L3.

Figure 16:
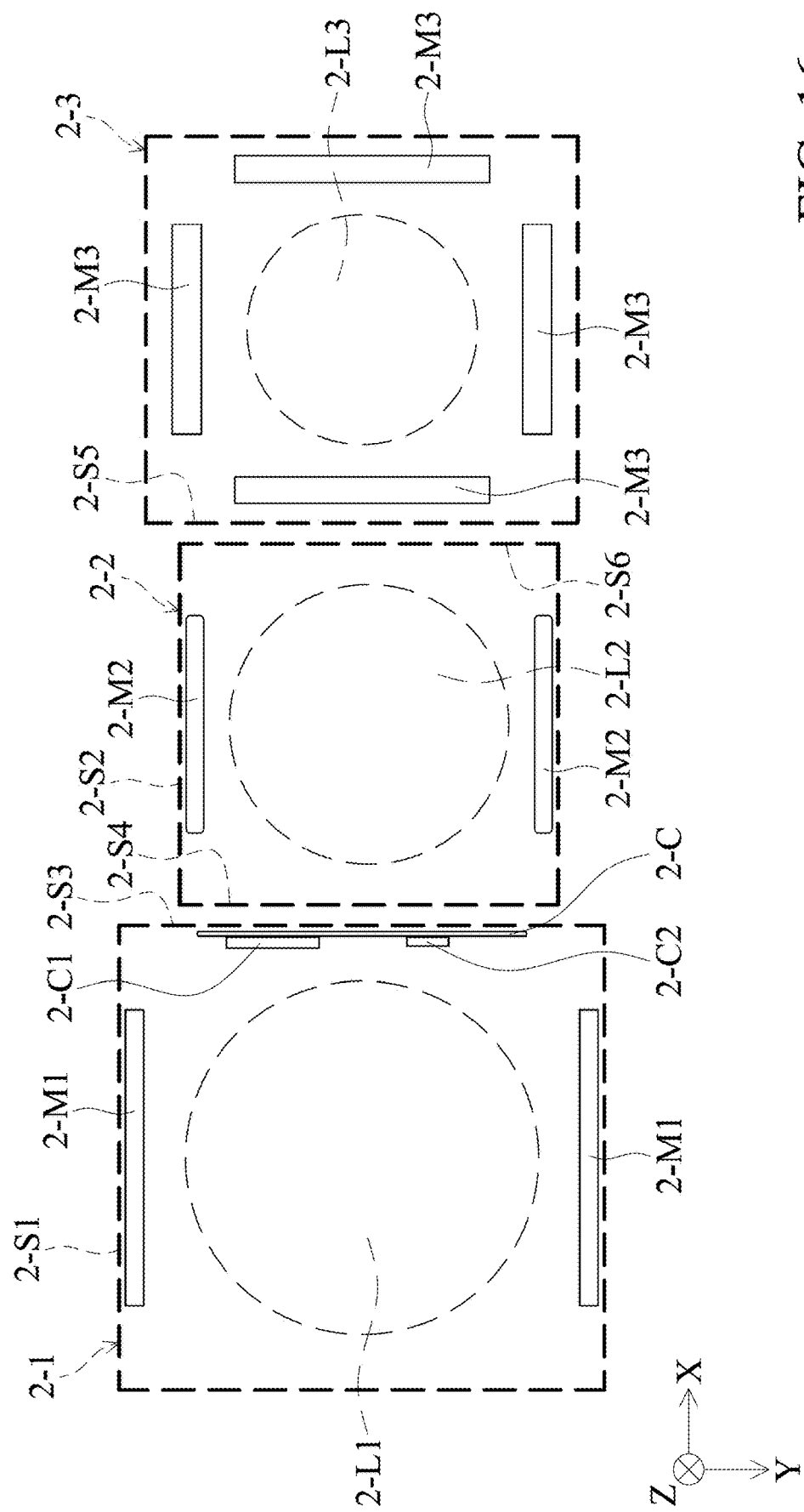
FIG. 16 shows the arrangement of the first, second and third magnetic elements in the first, second and third modules after assembly.

As shown in FIG. 15, the third module 2-3 has a housing 2-H3 and a holder 2-LH3 for holding the third optical element 2-L3, and an image sensing unit 2-Q3 is disposed under the housing 2-H3. The holder 2-LH3 may be connected to the housing 2-H3 via sheet springs, so that the holder 2-LH3 and the third optical element 2-L3 can move relative to the housing 2-H3. Moreover, at least a third magnetic element 2-M3 is disposed in the housing 2-H3 of third module 2-3 (FIG. 16). The third magnetic element 2-M3 and a coil (not shown) disposed on the holder 2-LH3 can constitute a third driving assembly for driving the holder 2-LH3 and the third optical element 2-L3 to move relative to the housing 2-H3.

When the external circuit applies a current signal to the coil on the holders 2-LH3, an electromagnetic force can be generated by the coil and the third magnetic element 2-M3 to move the holder 2-LH3 (third movable part) relative to the housing 2-H3 (third fixed part), whereby auto-focusing (AF) or optical image stabilizer (OIS) function for the third optical element 2-L3 can be performed.

In this embodiment, at least a first terminal 2-P1 is provided on a lateral side of the first module 2-1, at least a second terminal 2-P2 is provided on a lateral side of the second module 2-2, and at least a third terminal 2-P3 provided on a lateral side of the third module 2-3. Since the first, second and third terminals 2-P1 to 2-P3 are located on the same side of the driving system, they can be electrically connected to the external circuit by a single process (e.g. soldering, welding or conductive glue) without rotation of the driving system, so as to increase assembly efficiency and reduce the production cost.

FIG. 16 shows the arrangement of the first, second and third magnetic elements 2-M1 to 2-M3 in the first, second and third modules 2-1 to 2-3 after assembly. As shown in FIG. 16, a third side 2-S3 of the first module 2-1 faces a fourth side 2-S4 of the second module 2-2, and a fifth side 2-S5 of the third module 2-3 faces a sixth side 2-S6 of the second module 2-2. Here, the fifth side 2-S5 of the third module 2-3 is parallel to the third side 2-S3 of the first module 2-1.

In this embodiment, a circuit board 2-C is disposed on the third side 2-S3 of the first module 2-1, wherein an electronic element 2-C1 and a filter 2-C2 (e.g. capacitor) are disposed on an inner surface of the circuit board 2-C. Specifically, two first magnetic elements 2-M1 are disposed on the sides of the first module 2-1 other than the third side 2-S3, so that the electronic element 2-C1 can also be prevented from magnetic interference by the first magnetic elements 2-M1.

Similarly, two second magnetic elements 2-M2 are disposed on the sides of the second module 2-2 other than the fourth side 2-S4. Thus, the electronic element 2-C1 can also be prevented from magnetic interference by the second magnetic elements 2-M2.

In FIG. 16, since there is no magnetic element disposed on the sixth side 2-S6 of the second module 2-2, the third magnetic elements 2-M3 can be disposed on any side of the third module 2-3 (including the fifth side 2-S5). In this embodiment, four third magnetic elements 2-M3 are provided on all the four sides of the third module 2-3, thereby increasing the electromagnetic driving force for moving the holder 2-LH3 and the third optical element 2-L3.

Figure 17:
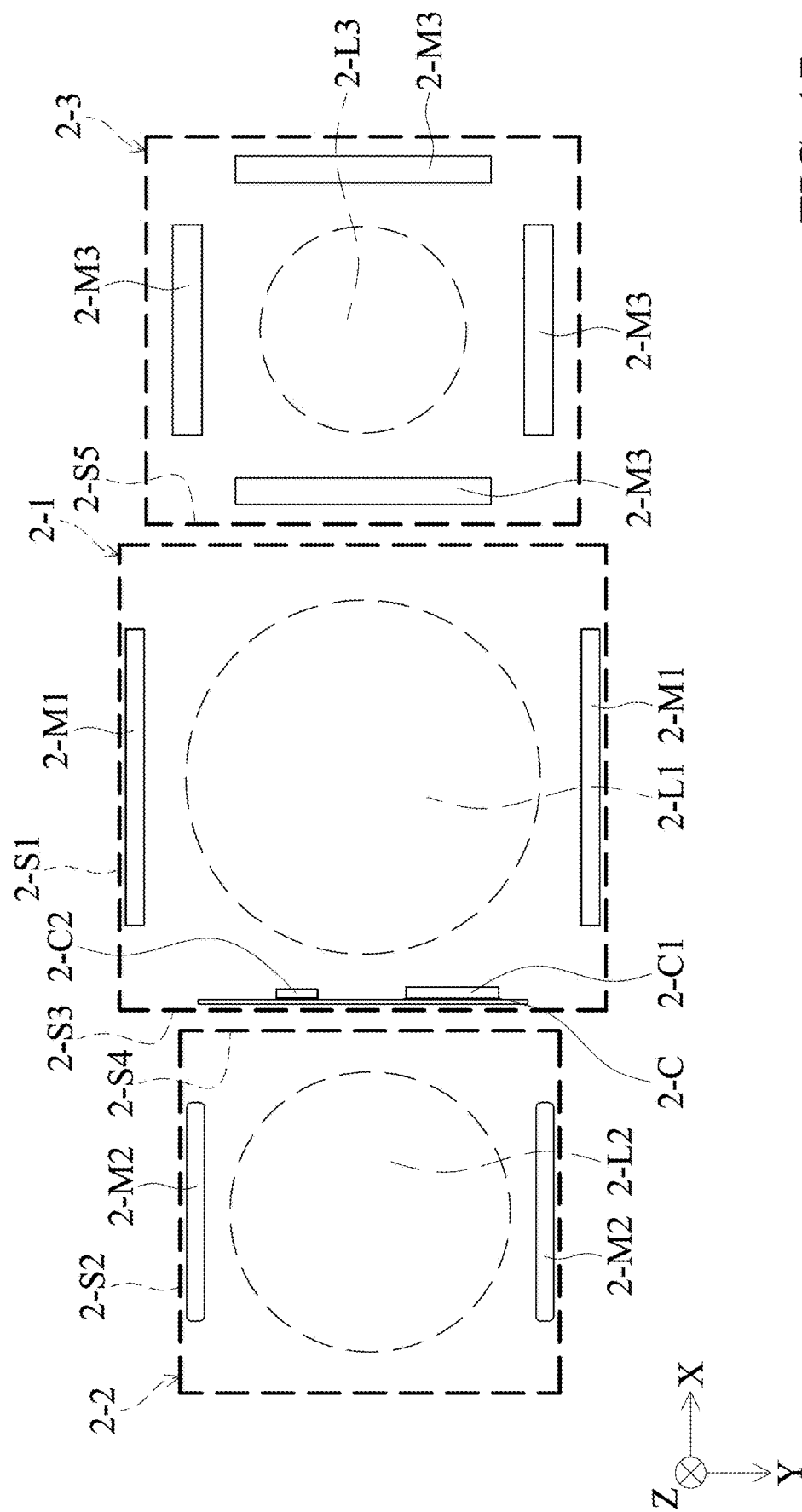
FIG. 17 shows the arrangement of the first, second and third magnetic elements in the first, second and third modules after assembly, in accordance with another embodiment of the invention.

FIG. 17 shows the arrangement of the first, second and third magnetic elements 2-M1 to 2-M3 in the first, second and third modules 2-1 to 2-3 after assembly, in accordance with another embodiment of the invention. FIG. 17 is different from the embodiment of FIG. 11 in that the first module 2-1 is arranged between the second and third modules 2-2 and 2-3. Here, the electronic element 2-C1, the filter 2-C2 and the circuit board 2-C are disposed on the third side 2-S3 of the first module 2-1, wherein the third side 2-S3 faces the fourth side 2-S4 of the second module 2-2.

As shown in FIG. 17, since the first magnetic elements 2-M1 are not disposed on the third side 2-S3 of the first module 2-1, and the second magnetic elements 2-M2 are not disposed on the fourth side 2-S4 of the second module 2-2, the circuit board 2-C can be prevented from magnetic interference by the first and second magnetic elements 2-M1 and 2-M2. Moreover, one of the third magnetic elements 2-M3 can be disposed on the fifth side 2-S5 that faces the first module 2-1 without magnetic interference from the first magnetic elements 2-M1.

Figure 18:
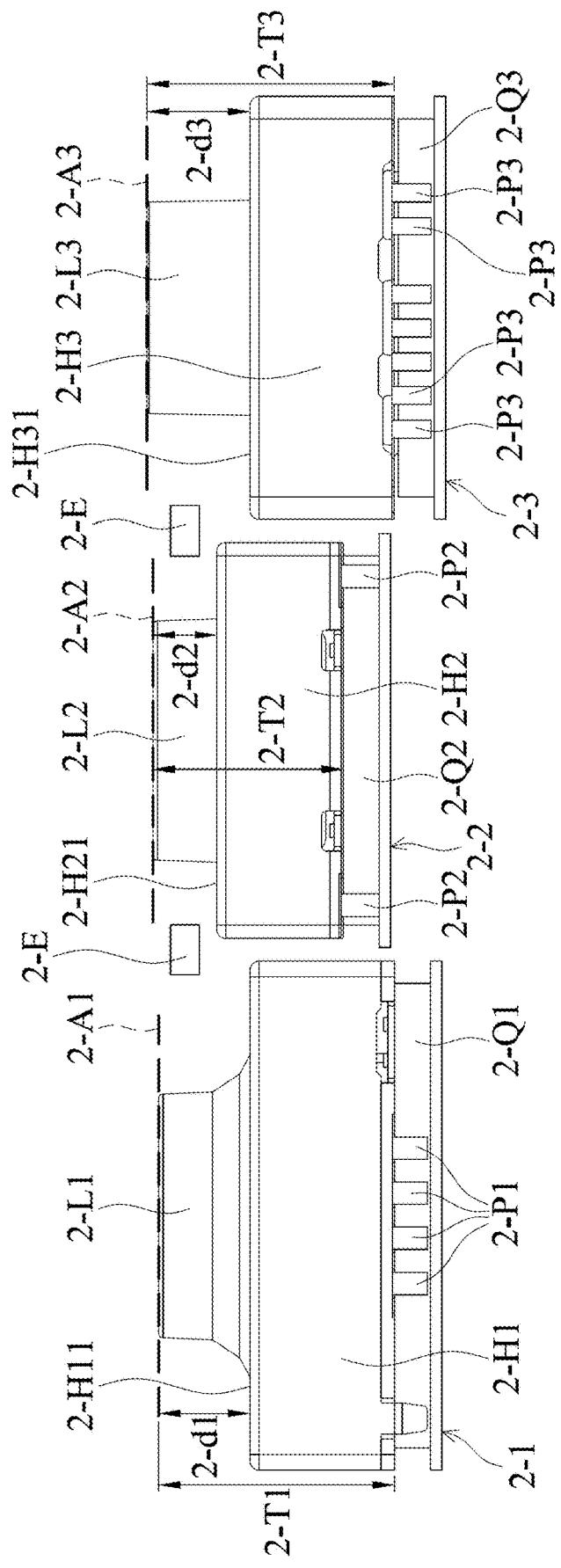
FIG. 18 is a side view of a first optical element, a second optical element and a third optical element joined with a driving system in accordance with another embodiment of the invention, wherein at least an electronic element is disposed between the first and second optical elements or between the second and third optical elements, so as to improve space utilization of the camera lens system.

FIG. 18 shows a side view of a first optical element 2-L1, a second optical element 2-L2 and a third optical element 2-L3 joined with a driving system in accordance with another embodiment of the invention, wherein at least an electronic element 2-E is disposed between the first and second optical elements 2-L1 and 2-L2 or between the second and third optical elements 2-L2 and 2-L3, so as to improve space utilization of the camera lens system.

In this embodiment, the electronic element 2-E at least partially overlaps the first optical element 2-L1, the second optical element 2-L2 or a third optical element 2-L3 when viewed along the X axis (first direction). For example, the electronic element 2-E may be a position sensor (e.g. Hall effect sensor), an inertial sensor, an integrated circuit, a light emitting element (e.g. flash light) or a passive element.

The image sensing units 2-Q1 to 2-Q3 are respectively affixed to the bottoms of the housings 2-H1 to 2-H3, corresponding to the first, second and third optical elements 2-L1 to 2-L3. In FIG. 18, the end surfaces 2-A1 to 2-A3 of the optical elements 2-L1 to 2-L3 respectively protrude from the top surfaces 2-H11 to 2-H31 of the housings 2-H1 to 2-H3, and are located at substantially the same height along the Z axis (vertical direction). In this embodiment, the end surfaces 2-A1 to 2-A3 have a height difference less than 0.5 mm along the Z axis.

Still referring to FIG. 18, the optical elements 2-L1 to 2-L3 have different lengths 2-T1, 2-T2 and 2-T3 along the Z axis, and the image sensing units 2-Q1 to 2-Q3 under the housings 2-H1 to 2-H3 are at different heights along the Z axis. With the end surfaces 2-A1 to 2-A3 of the optical elements 2-L1 to 2-L3 aligned to each other at substantially the same height along the Z axis, aberration of the camera lens system can be efficiently reduced.

Moreover, FIG. 18 also shows that the top surfaces 2-H11 to 2-H31 of the housings 2-H1 to 2-H3 are at different heights along the Z axis. In FIG. 18, a first distance 2-d1 is formed between the end surface 2-A1 of the first optical element 2-L1 and the top surface 2-H11 of the first module 2-1, a second distance 2-d2 is formed between the end surface 2-A2 of the second optical element 2-L2 and the top surface 2-H21 of the second module 2-2, and a third distance 2-d3 is formed between the end surface 2-A3 of the third optical element 2-L3 and the top surface 2-H31 of the third module 2-3, wherein 2-d2<2-d1<2-d3.

Figure 19:
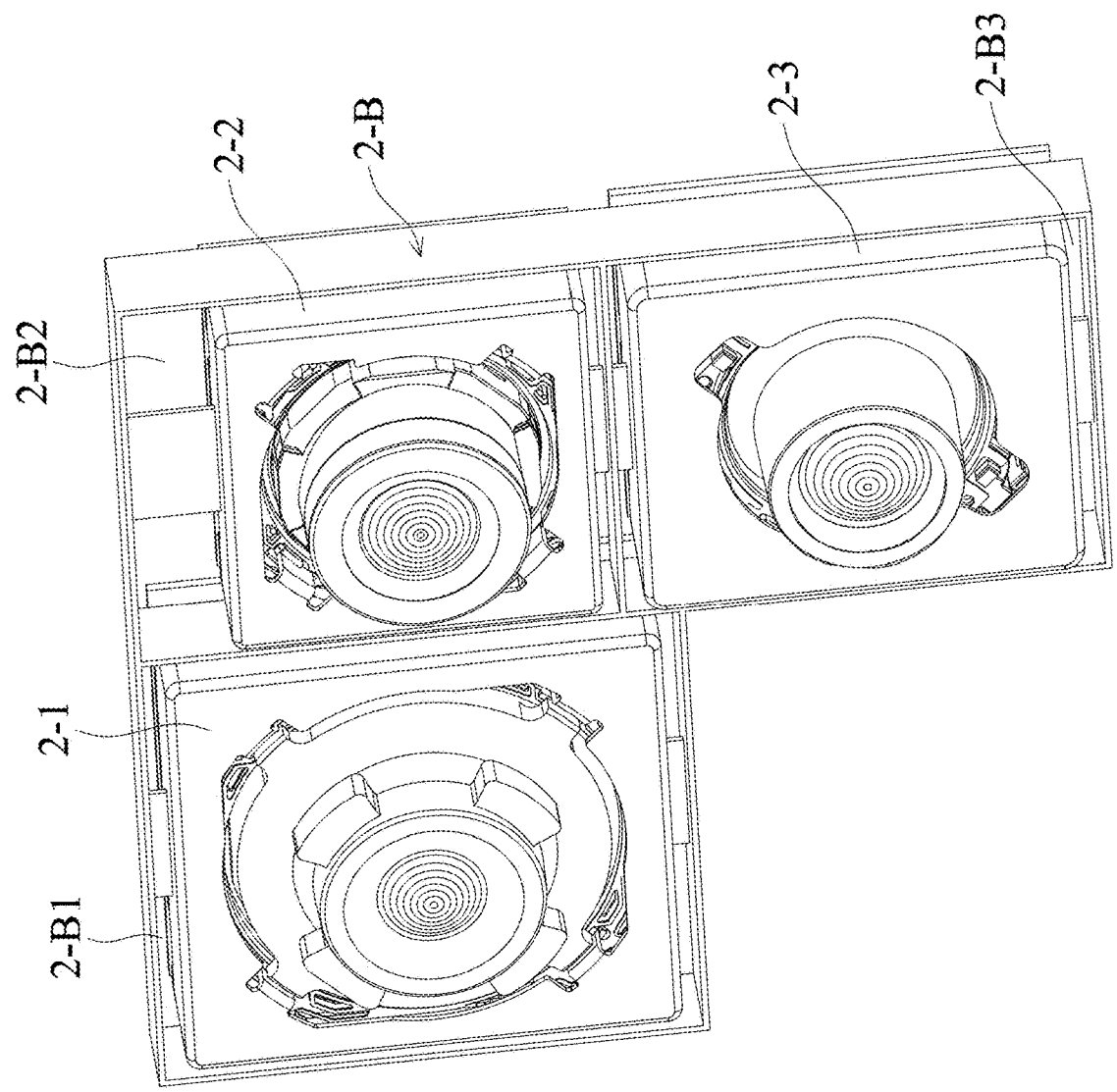
FIG. 19 is a perspective diagram of a chassis surrounding the first, second and third modules and the first, second and third optical elements, in accordance with another embodiment of the invention.
Figure 20:
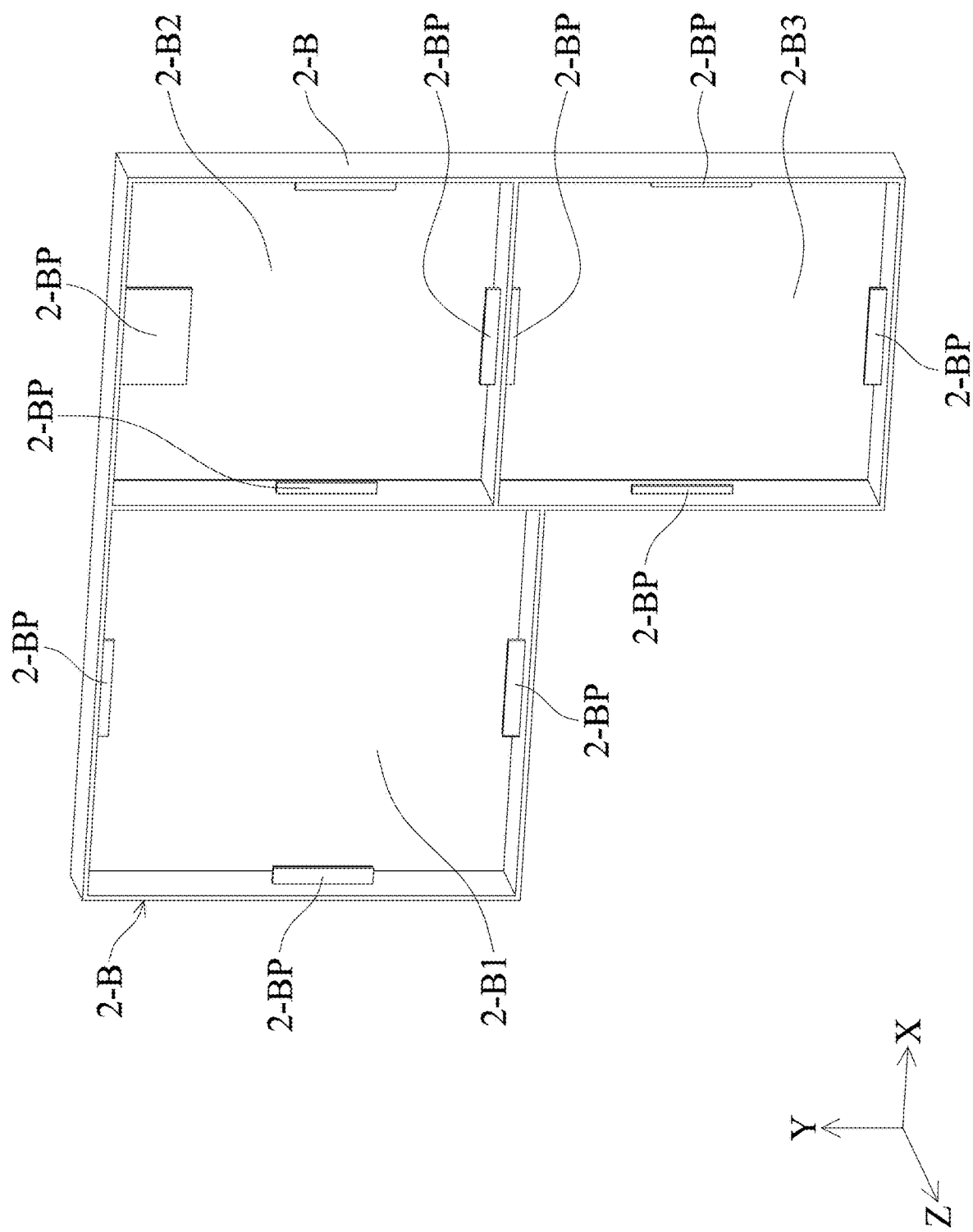
FIG. 20 is a perspective diagram of the chassis in FIG. 19.

FIG. 19 is a perspective diagram of a chassis 2-B surrounding the first, second and third modules 2-1 to 2-3 and the first, second and third optical elements 2-L1 to 2-L3, in accordance with another embodiment of the invention, and FIG. 20 is a perspective diagram of the chassis 2-B in FIG. 19.

As shown in FIG. 19, the first, second and third modules 2-1 to 2-3 are arranged in an L-shaped manner. Specifically, a chassis 2-B forms a first frame body surrounding the first module 2-1, a second frame body surrounding the second module 2-2, and a third frame body surrounding the third module 2-3. Moreover, a first gap 2-B1 is formed between the first frame body and the first module 2-1, a second gap 2-B2 is formed between the second frame body and the second module 2-2, and a third gap 2-B3 is formed between the third frame body and the third module 2-3.

During assembly, the first, second and third modules 2-1 to 2-3 are respectively placed in the first, second and third frame bodies of the chassis 2-B, and the image sensing surfaces of the three image sensing units 2-Q1 to 2-Q3 are then calibrated to be parallel to each other. Subsequently, the glue can be applied to the first, second and third gaps 2-B1 to 2-B3, so that the first, second and third modules 2-1 to 2-3 can be firmly affixed in the chassis 2-B, thereby ensuring the quality of the images captured by the three image sensing units 2-Q1 to 2-Q3.

Figure 21:
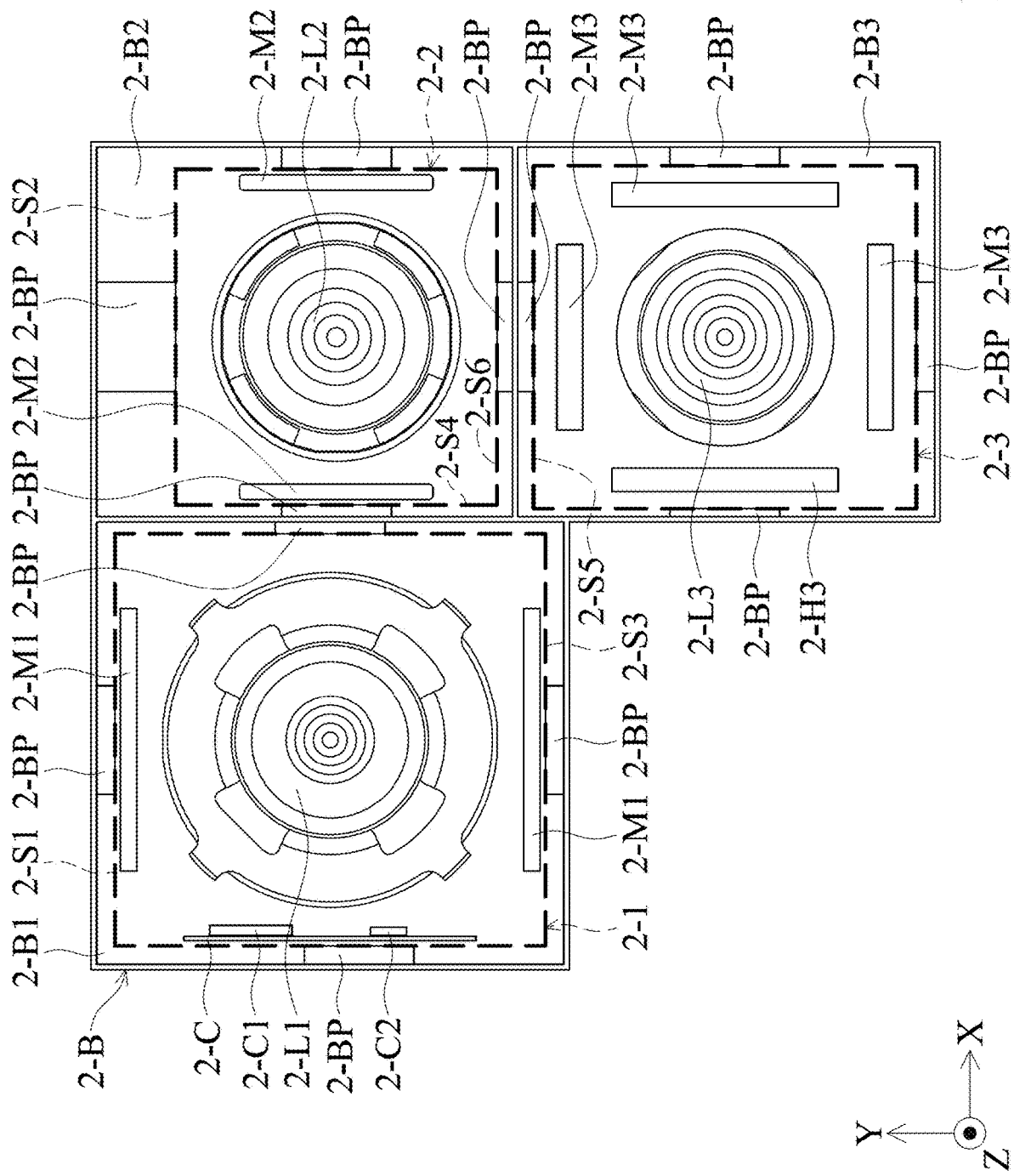
FIG. 21 is a top view showing relative positions of the magnetic elements, the circuit board in the first, second and third modules and the chassis of FIG. 20 after assembly.

FIG. 21 is a top view showing relative positions of the magnetic elements 2-M1 to 2-M3, the circuit board 2-C in the first, second and third modules 2-1 to 2-3 and the chassis 2-B of FIG. 20 after assembly. Referring to FIGS. 20 and 21, a plurality of protrusions 2-BP are formed on the inner surfaces of the chassis 2-B and extend toward the first, second and third modules 2-1 to 2-3. During assembly, the protrusions 2-BP may contact the first, second and third modules 2-1 to 2-3 to facilitate positioning of the first, second and third modules 2-1 to 2-3 inside the chassis 2-B.

In this embodiment, an electronic element 2-C1 and a filter 2-C2 (e.g. capacitor) are disposed on a circuit board 2-C in the first module 2-1. The electronic element 2-C1 may be a position sensor for detecting the movement of the holder 2-LH1 (first movable part) relative to the housing 2-H1 (first fixed part).

Specifically, when viewed along a protruding direction of the protrusion 2-BP that extends toward the circuit board 2-C, neither the electronic element 2-C1 nor the filter 2-C2 overlap the edge of the protrusion 2-BP that is parallel to the protruding direction (X direction).

FIG. 21 further shows that the third side 2-S3 of the first module 2-1 faces the fourth side 2-S4 of the second module 2-2, and the fifth side 2-S5 of the third module 2-3 faces the sixth side 2-S6 of the second module 2-2. Here, the electronic element 2-C1, the filter 2-C2 and the circuit board 2-C are disposed on a side of the first module 2-1 far away from the second module 2-2. It should be noted that the first and second terminals 2-P1 and 2-P2 shown in FIG. 11 are respectively provided on the first side 2-S1 of the first module 2-1 and the second side 2-S2 of the second module 2-2, wherein the fifth side 2-S5 is parallel to the first side 2-S1 and the second side 2-S2.

As one of the third magnetic elements 2-M3 is disposed on the fifth side 2-S5 of the third module 2-3, the second magnetic elements 2-M2 are preferably disposed on the sides of the second module 2-2 other than the sixth side 2-S6 (e.g. fourth side 2-S4), so as to prevent magnetic interference between the second and third magnetic elements 2-M2 and 2-M3.

In the aforementioned embodiments of FIGS. 15 to 21, one of the first, second and third modules 2-1 to 2-3 may be omitted to form a dual camera lens system. In some embodiments, the first, second and third modules 2-1 to 2-3 may also be linearly arranged along an axis and affixed in the chassis 2-B.

Figure 22:
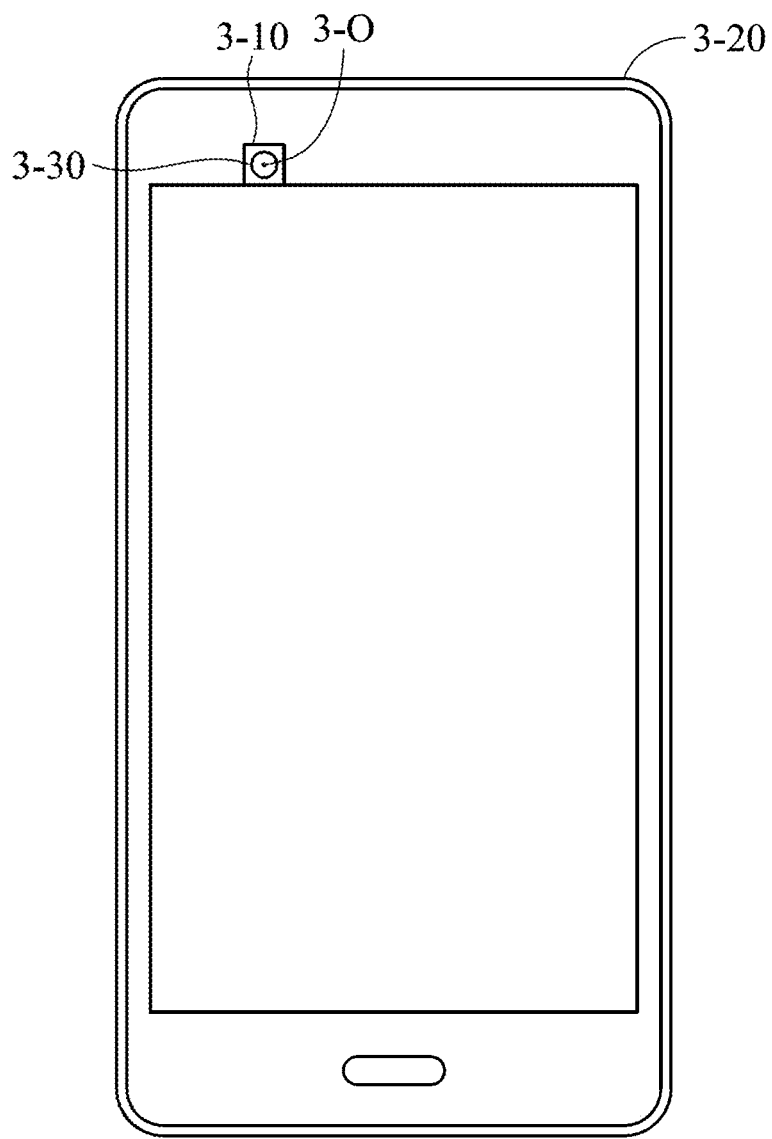
FIG. 22 is a schematic diagram of an electronic device according to an embodiment of the invention.

Referring to FIG. 22, in an embodiment of the invention, the optical member driving mechanism 3-10 can be disposed in an electronic device 3-20 and used to hold and drive a lens 3-30, so that the lens 3-30 can move relative to an image sensor (not shown) in the electronic device 3-20, and the purpose of focus adjustment can be achieved. For example, the electronic device 3-20 can be a digital camera or a smart phone having the function of capturing photographs or making video recordings, and the optical member 3-30 can be a lens. The optical axis 3-O of the optical member 3-30 is substantially parallel to the Z-axis in the drawing, and perpendicular to the image sensor in the electronic device 3-20.

Figure 23:
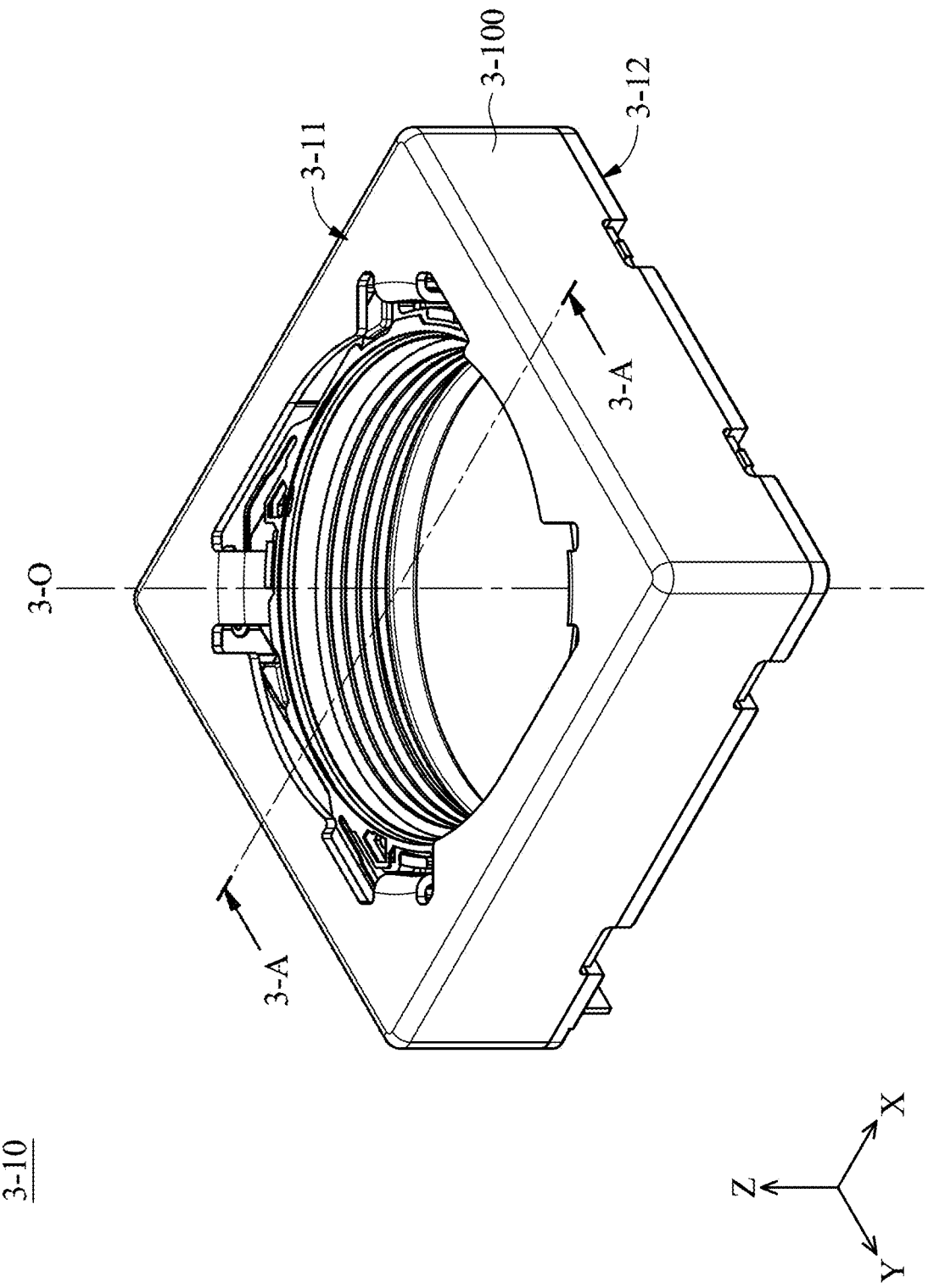
FIG. 23 is a schematic diagram of an optical member driving mechanism according to an embodiment of the invention.
Figure 24:
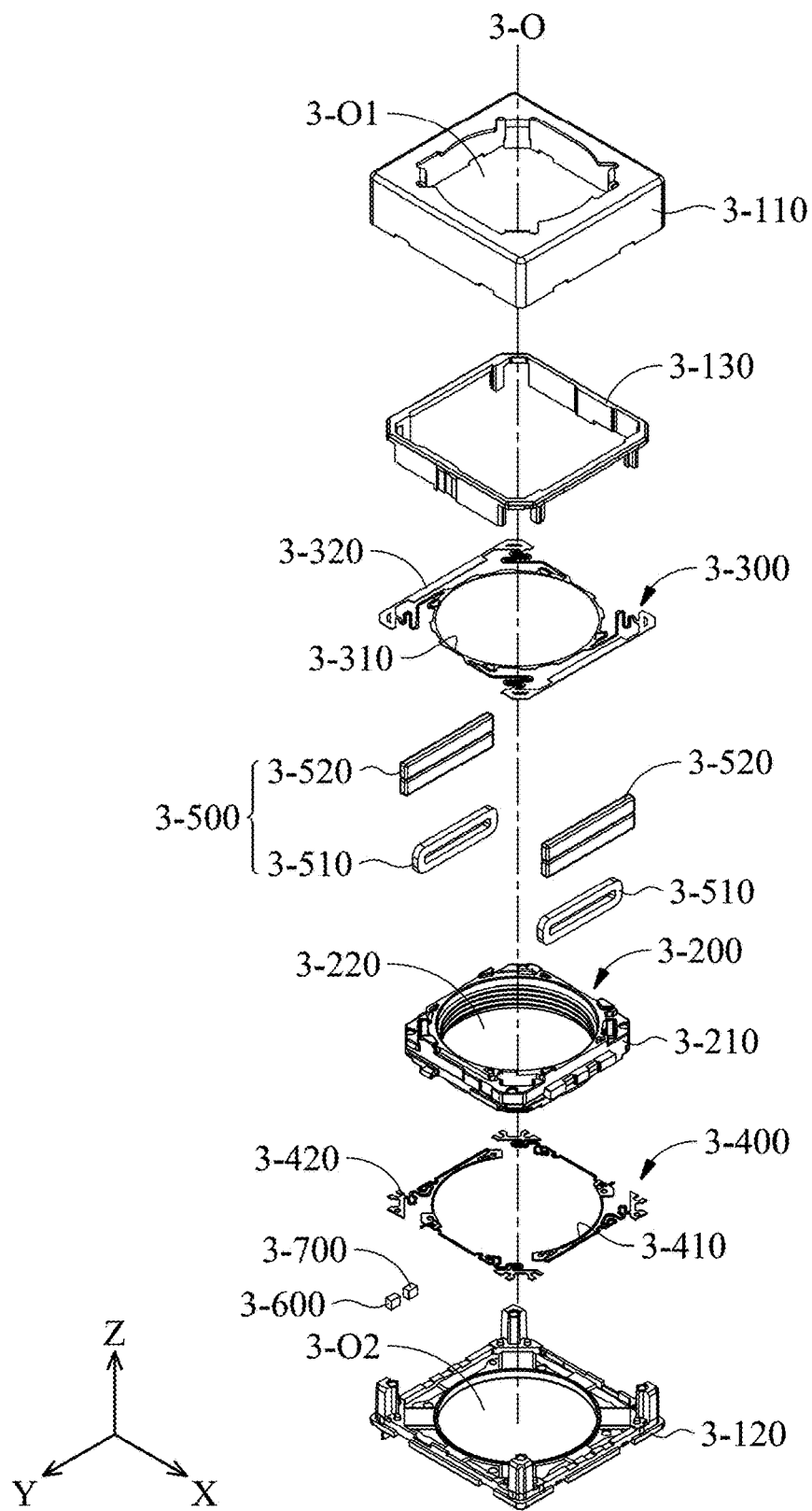
FIG. 24 is an exploded-view diagram of the optical member driving mechanism according to an embodiment of the invention.
Figure 25:
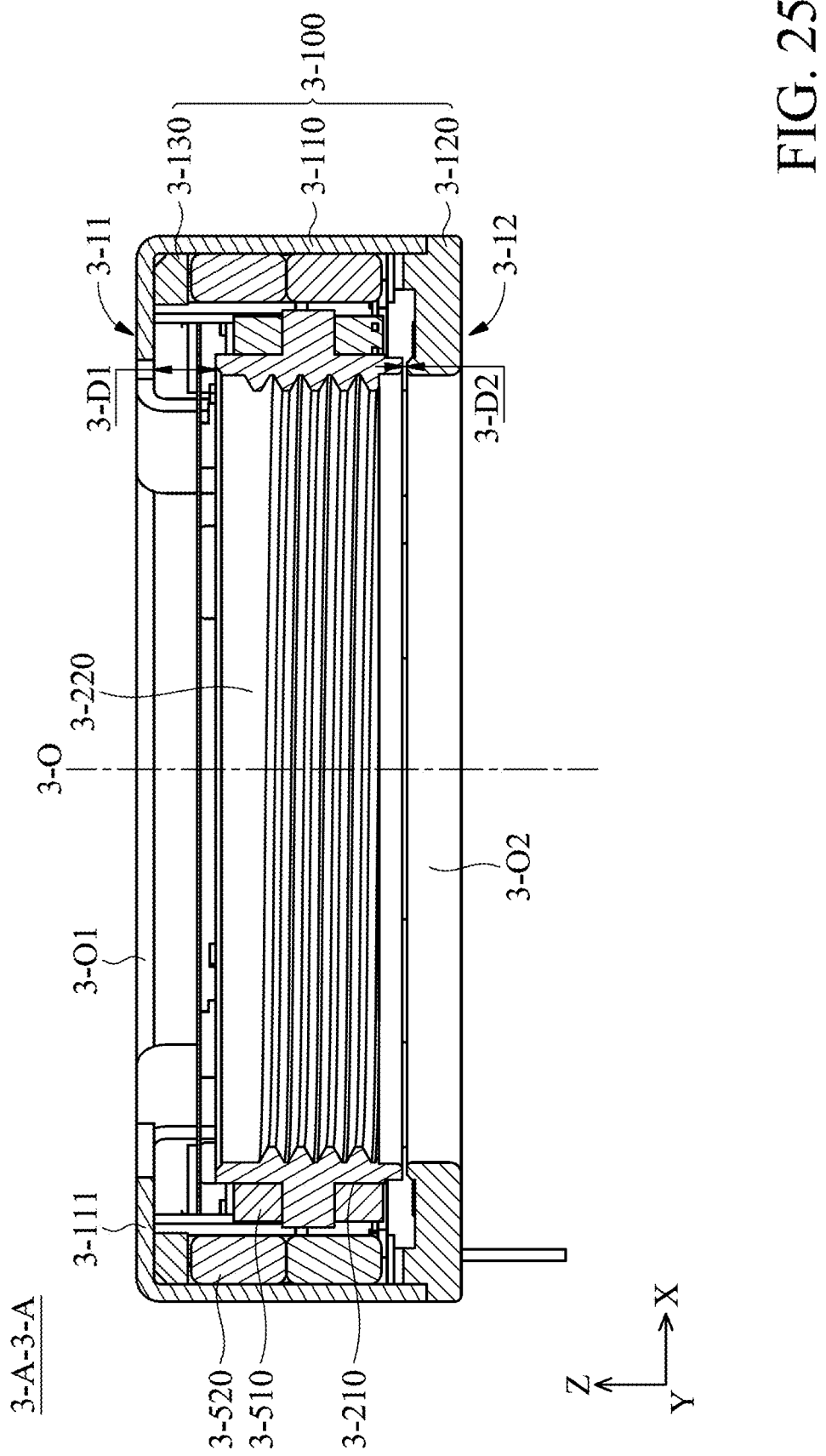
FIG. 25 is a cross-sectional view along the line 3-A-3-A in FIG. 23.

FIG. 23 is a schematic diagram of the optical member driving mechanism 3-10, FIG. 24 is an exploded-view diagram of the optical member driving mechanism 3-10, and FIG. 25 is a cross-sectional view along the line 3-A-3-A in FIG. 23. As shown in FIGS. 23-25, the optical member driving mechanism 3-10 primarily includes a fixed portion 3-100, a movable portion 3-200, a first elastic member 3-300, a second elastic member 3-400, a driving assembly 3-500, a control module 3-600, and an inertia detecting member 3-700.

The fixed portion 3-100 includes a case 3-110, a base 3-120, and a frame 3-130. The frame 3-130 is affixed to the base 3-120, and the case 3-110 and the base 3-120 can be assembled and form a hollow box. The frame 3-130, the movable portion 3-200, the first elastic member 3-300, the second elastic member 3-400, the driving assembly 3-500, the control module 3-600, and the inertia detecting member 3-700 can be accommodated in the hollow box.

The movable portion 3-200 includes an optical member holder 3-210. An accommodating hole 3-220 is formed on the center of the optical member holder 3-210, and the optical member 3-30 can be fixedly disposed in the accommodating hole 3-220. The case 3-110 and the base 3-120 of the fixed portion 3-100 respectively has an optical hole 3-O1 and an optical hole 3-O2 corresponding to the accommodating hole 3-220. Thus, an external light can move from the light-entering side 3-11 of the optical driving mechanism 3-10 through the optical hole 3-O1, the optical member 3-30, and the optical hole 3-O2 in sequence to the light-emitting side 3-12 of the optical driving mechanism 3-10, and reach the image sensor in the electronic device 3-20, so as to form an image on the image sensor.

The first elastic member 3-300 and the second elastic member 3-400 are respectively disposed on opposite sides of the optical member holder 3-210. An inner section 3-310 and an outer section 3-320 of the first elastic member 3-300 are respectively connected to the upper surface of the optical member holder 3-210 and the frame 3-130, and an inner section 3-410 and an outer section 3-420 of the second elastic member 3-400 are respectively connected to the lower surface of the optical member holder 3-210 and the base 3-120. Therefore, the optical member holder 3-210 can be hung in the hollow box by the first elastic member 3-400 and the second elastic member 3-500.

The driving assembly 3-500 includes at least one first electromagnetic driving member 3-510 and at least one second electromagnetic driving member 3-520. The first electromagnetic driving member 3-510 is disposed on the optical member holder 3-210, and the second electromagnetic driving member 3-520 is disposed on the base 3-120 or the frame 3-130 of the fixed portion 3-100. The electromagnetic effect between the first electromagnetic driving member 3-510 and the second electromagnetic driving member 3-520 can drive the optical member holder 3-210 and the optical member 3-30 disposed thereon to move relative to the first module 3-100 along the Z-axis (the optical axis 3-O of the optical member 3-30) within a range of motion.

For example, the first electromagnetic driving member 3-510 can be a coil module, and the second electromagnetic driving member 3-520 can be a magnetic member (such as a magnet). When a current flows through the coil module (the first electromagnetic driving member 3-510), an electromagnetic effect is generated between the coil module and the magnetic member, and provides a driving force along the Z-axis on the optical member holder 3-210. Therefore, the optical member holder 3-210 and the optical member 3-30 disposed thereon can move along the Z-axis relative to the fixed module 3-100 and the image sensor in the electronic device 3-20. The purpose of focus adjustment can be achieved.

In some embodiments, the first electromagnetic driving member 3-510 can be a magnetic member, and the second electromagnetic driving member 3-520 can be a coil module.

It should be noted that, when the driving assembly 3-500 does not provide the driving force, the optical member holder 3-210 is hung in a predetermined position by the first elastic member 3-300 and the second elastic member 3-400, a gap 3-D1 is formed between the optical member holder 3-210 and the top wall 3-111 of the case 3-110, and a gap 3-D2 is formed between the optical member holder 3-210 and the base 3-120. Since there is no component disposed in the gaps 3-D1 and 3-D2, the gap 3-D1 is the maximum distance that the optical member holder 3-210 can move toward the light-entering side 3-11 (hereinafter referred to as a first limit moving range), and the gap 3-D2 is the maximum distance that the optical member holder 3-210 can move toward the light-emitting side 3-12 (hereinafter referred to as a second limit moving range). The range of motion of the optical member holder 3-210 is the sum of the first limit moving range and the second limit moving range.

In this embodiment, the first limit moving range is greater than the second limit moving range. The ratio of the first limit moving range to the second limit moving range is greater than or equal to 1.5, and the second limit moving range is 10 μm-100 μm (such as 10 μm-50 μm). Since the optical member holder 3-210 is hung in a frequently used focusing position (for example, a focusing position of photographing portrait), in most instances, the driving assembly 3-500 only needs to drive the optical member holder 3-210 to move slightly, and the purpose of saving power can be efficiently achieved.

Referring to FIG. 24, the control module 3-600 is electrically connected to the driving assembly 3-500, so as to transmit a driving signal group to the driving assembly 3-500 and control the magnitude of driving force applied on the movable portion 3-200 from the driving assembly 3-500. The specific control method is discussed below.

When the user desires to move the optical member holder 3-210 from the predetermined position to a target position, the control module 3-600 can first transmit a main signal in the driving signal group to the driving assembly 3-500. When the driving assembly 3-500 receives the aforementioned main signal, it can provide the driving force to the optical member holder 3-210 to move the optical member holder 3-210 to the target position.

Figure 26:
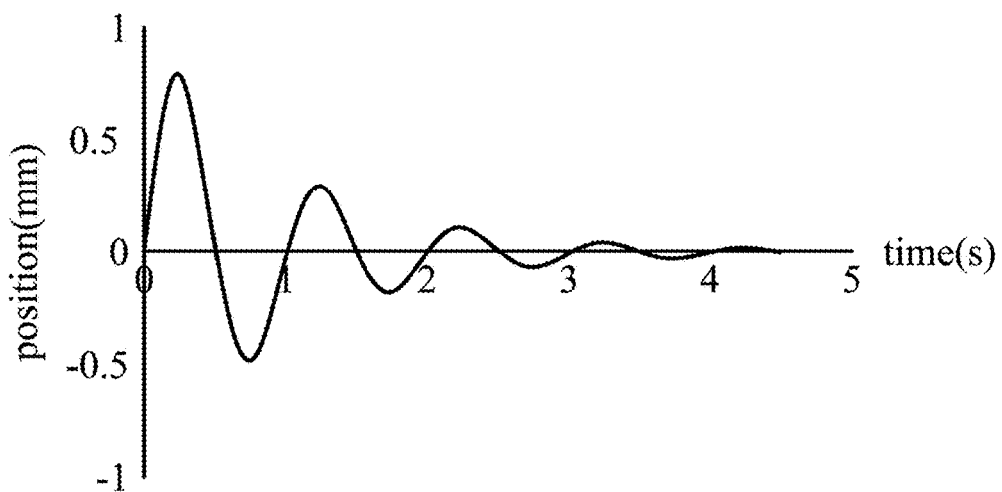
FIG. 26 is a schematic diagram of the natural oscillation of the optical member holder after the control module inputs the main signal according to an embodiment of the invention.

As shown in FIG. 26, when the optical member holder 3-210 is driven and reaches the target position, it may not stop immediately due to inertia or other factors, and moves beyond the target position ("0" indicates the target position). The optical member holder 3-210 naturally oscillates, and a steady state can only be reached after passing through the target position several times.

Figure 27:
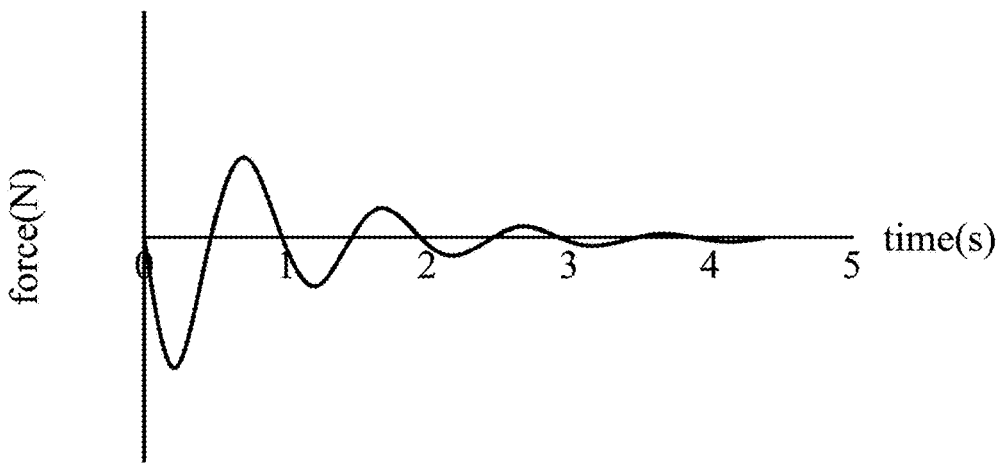
FIG. 27 is a schematic diagram of the reverse driving force provided by the driving assembly after the control module inputs the steady signal according to an embodiment of the invention.

Therefore, as shown in FIG. 27, after transmitting the main signal, the control module 3-600 provides a steady signal to the driving assembly 3-500, and the driving assembly 3-500 provides a reverse driving force to offset the natural oscillation. In order to enable the optical member holder 3-210 to reach the steady state rapidly and prevent generating a reverse oscillation, the frequency of the waveform of the reverse driving force is substantially the same as the frequency of the natural oscillation, and the reverse driving force decays over time.

The magnitude and the duration of the reverse driving force are determined according to weight of the movable portion 3-200, the elastic coefficient of the first elastic member 3-300, the elastic coefficient of the second elastic member 3-400, and the gravity state of the optical driving mechanism 3-10. In particular, the amplitude and the duration of the natural oscillation can be measured by an external apparatus, and the driving assembly 3-500 can provide the appropriate reverse driving force according to the measuring result.

Figure 28:
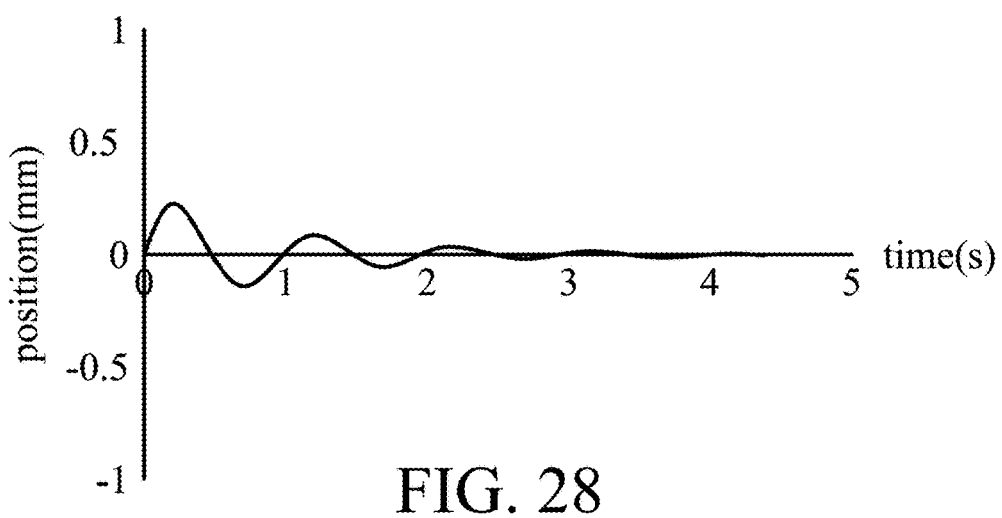
FIG. 28 is a schematic diagram of the oscillation of the optical member holder after receiving the reverse driving force according to an embodiment of the invention.

As shown in FIG. 28, owing to the input of the reverse driving force, the optical member holder 3-210 can rapidly reach the steady state in a predetermined time and stop at the target position. The predetermined time is determined according to the decline phase of the natural oscillation.

After the optical member holder 3-210 reaches the steady state, there is no need to provide the reverse driving force. Therefore, the control module 3-600 stops inputting the steady signal to the driving assembly 3-500 after the predetermined time. In contrast, for maintaining the optical member holder 3-210 at the target position, the main signal is continually input to the driving assembly 3-500. In other words, the duration for inputting the main signal is greater than that for inputting the steady signal.

Referring to FIG. 24, in this embodiment, the inertia detecting member 3-700 is electrically connected to the control module 3-600, and configured to measure the gravity data of the optical member driving mechanism 3-10. In particular, when the disposing orientation of the electronic device 3-20 is different (for example, the light-entering side 3-11 faces the ground or the light-emitting side 3-12 faces the ground), or the electronic device 3-20 is impacted by an external force, the gravity of the optical member driving mechanism is affected. The control module 3-600 can input a compensating signal according to the gravity data measured by the inertia detecting member 3-700 and the weight data of the movable portion 3-200, so as to adjust the required reverse driving force in different gravity state.

Figure 29:
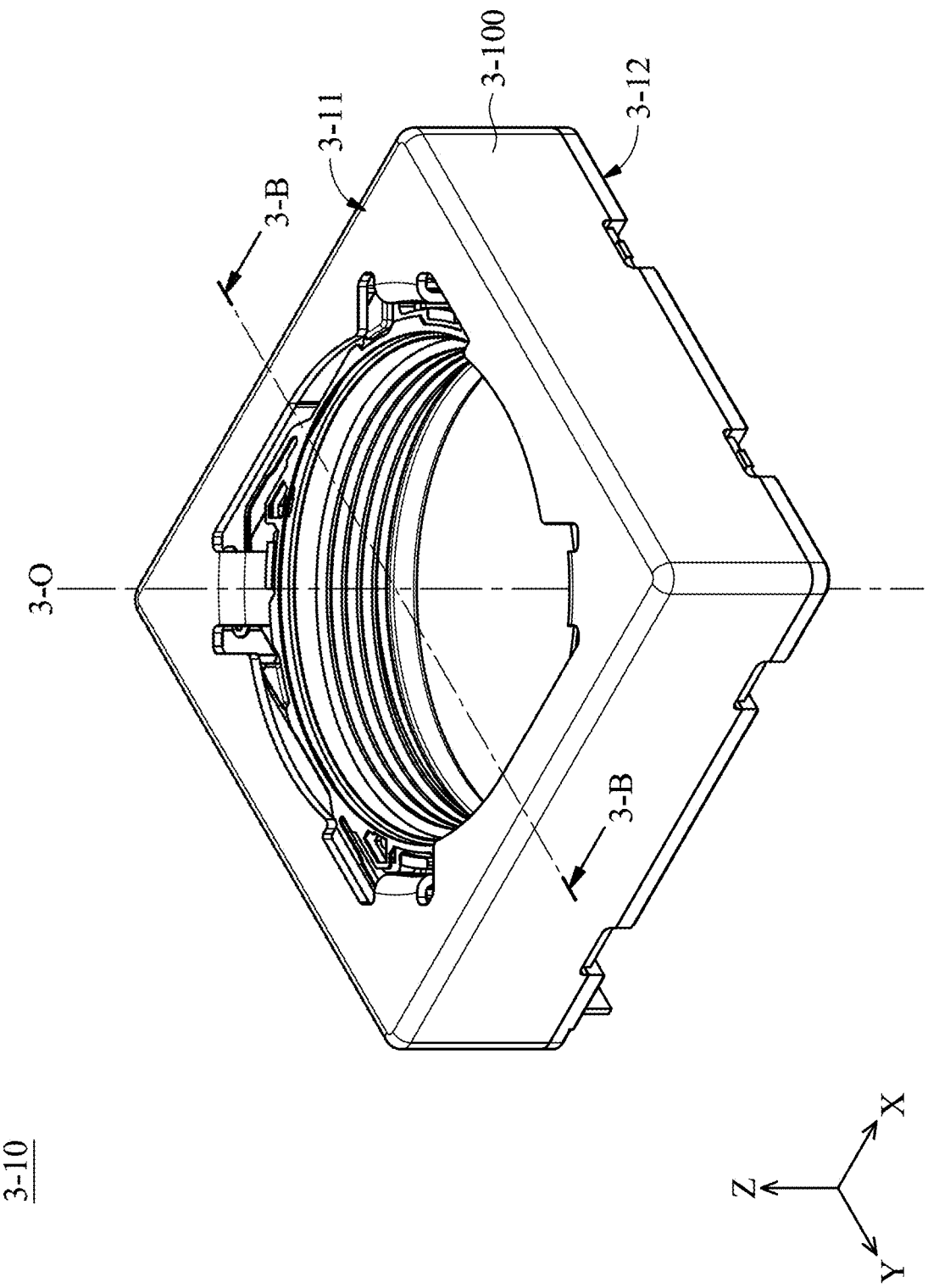
FIG. 29 is a schematic diagram of an optical member driving mechanism according to another embodiment of the invention.
Figure 30:
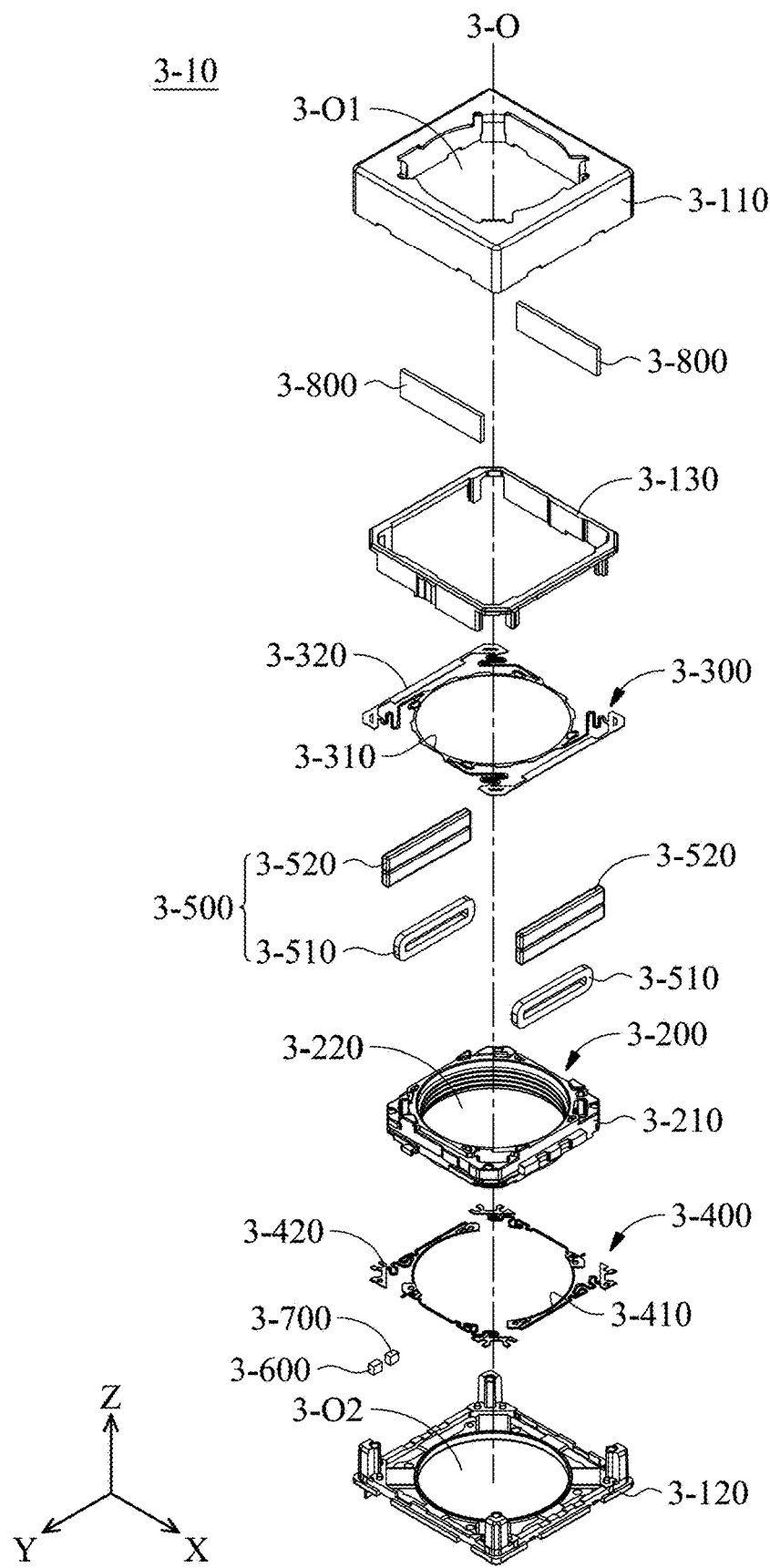
FIG. 30 is an exploded-view diagram of the optical member driving mechanism according to another embodiment of the invention.
Figure 31:
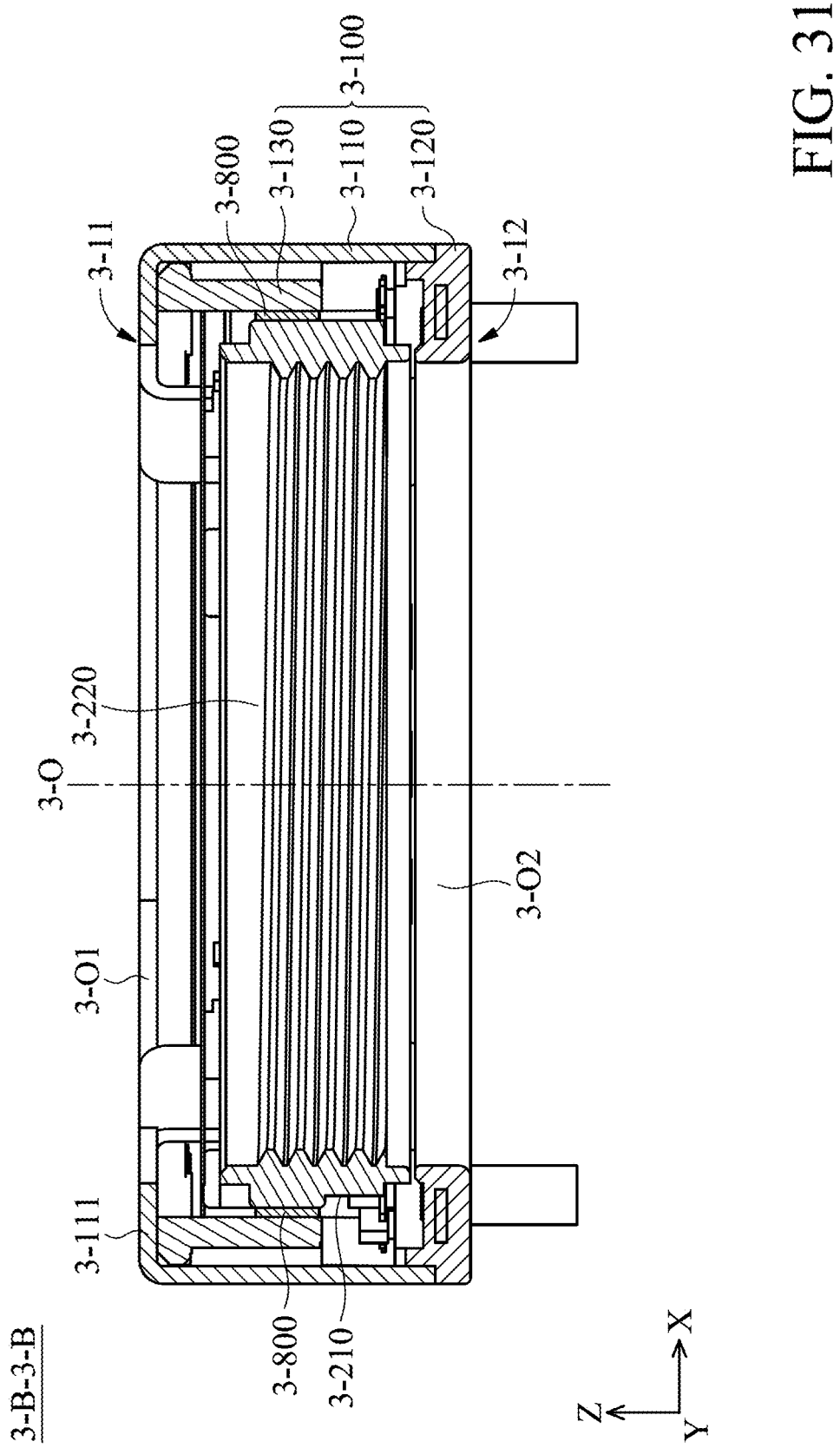
FIG. 31 is a cross-sectional view along the line 3-B-3-B in FIG. 29.

Referring to FIGS. 29-31, in another embodiment, the optical driving mechanism 3-10 further includes at least one vibration absorption member 3-800 disposed between the optical member holder 3-210 and the case 3-110 and contact with both, or disposed between the optical member holder 3-210 and the frame 3-130 and contact with both. The vibration absorption member 3-800 can be a damping member configured to reduce the natural oscillation of the movable portion 3-200, and the movement of the movable portion 3-200 can be smoother.

After adding the vibration absorption member 3-800, the natural oscillation of the movable portion may become underdamped type, overdamped type, or critically damped type. However, no matter which type it is, the control module 3-600 can input the main signal and the steady signal to the driving assembly 3-500 to speed up the movable portion 3-200 to reach the steady state.

In some embodiments, the vibration absorption member 3-800 can be disposed between the optical member holder 3-210 and the first elastic member 3-300 and contact with both, disposed between the optical member holder 3-210 and the second elastic member 3-400 and contact with both, disposed between the fixed portion 3-100 and the first elastic member 3-300 and contact with both, or disposed between the fixed portion 3-100 and the second elastic member 3-400 and contact with both.

In summary, an optical member driving mechanism for driving an optical member having an optical axis is provided, including a fixed portion, a movable portion, a first elastic member, and a driving assembly. The movable portion is configured to hold the optical member, and is movably connected the fixed portion via the first elastic member. The driving assembly drives the movable portion to move along the optical axis within a range of motion. The range of motion includes a first limit moving range and a second limit moving range. The first limit moving range is the maximum distance that the movable portion can move toward the light-entering side, and the second limit moving range is the maximum distance that the movable portion can move toward the light-emitting side. When the movable portion is in a predetermined position relative to the fixed portion, the first limit moving range is greater than the second limit moving range.

Figure 32:
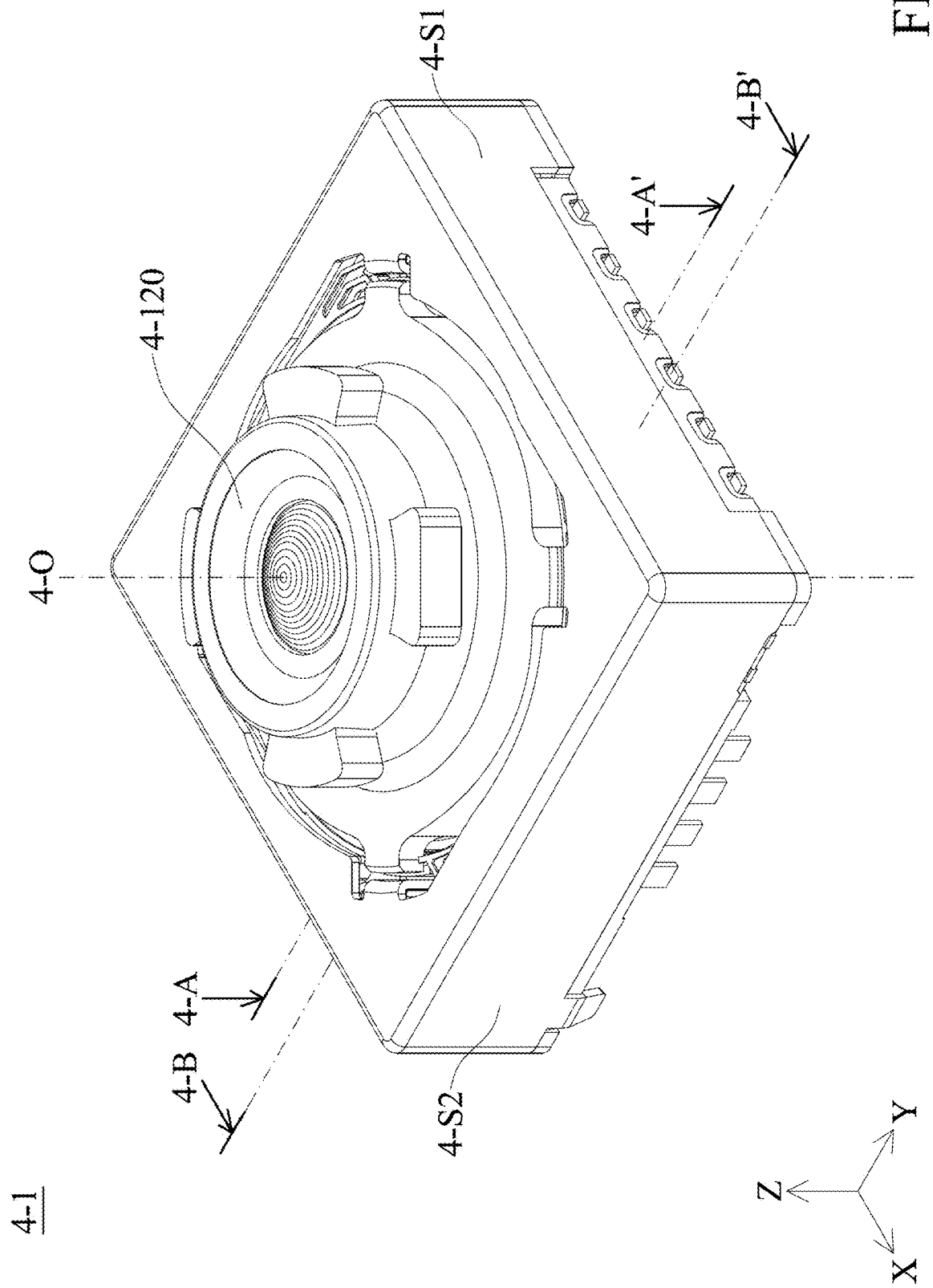
FIG. 32 shows a perspective view of an optical module in accordance with an embodiment of this disclosure.
Figure 33:
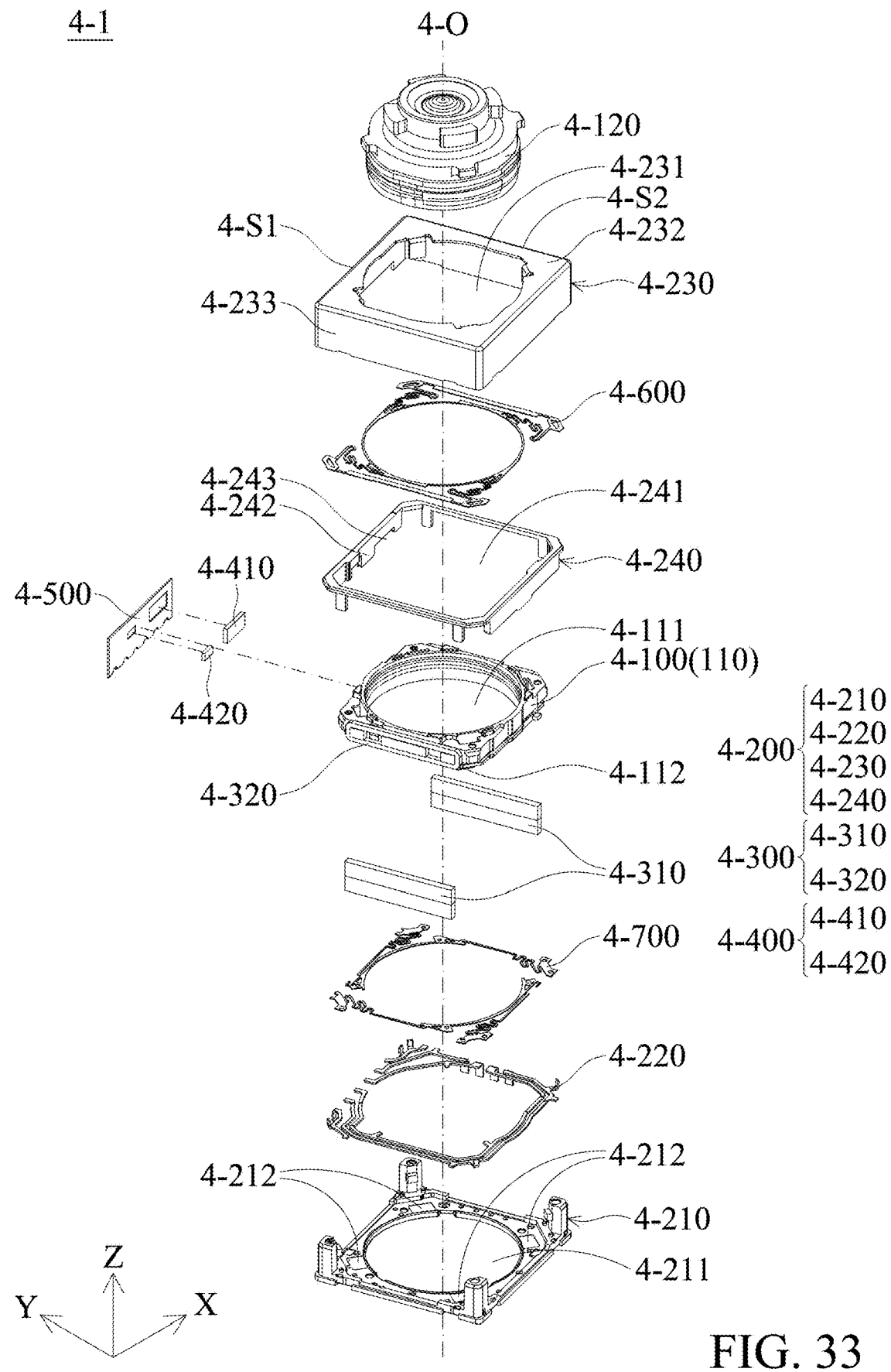
FIG. 33 shows an exploded view of an optical module in accordance with an embodiment of this disclosure.

Refer to FIG. 32 and FIG. 33. FIG. 32 shows a perspective view of an optical module in accordance with an embodiment of this disclosure, and FIG. 33 shows an exploded view of an optical module in accordance with an embodiment of FIG. 32. As shown in FIG. 32 and FIG. 33, in the present embodiment, an optical module 4-1 has a first side 4-S1 extending along an X direction, and a second side 4-S2 extending along a direction (Y direction) different from the first side 4-S1. The optical module 4-1 mainly includes a movable portion 4-100, a fixed portion 4-200, a driving portion 4-300, a position-sensing portion 4-400, a circuit board 4-500, a first flexible element 4-600, and a second flexible element 4-700.

The movable portion 4-100 includes a holder 4-110, and the holder 4-110 has a through hole 4-111 and a plurality of protruding legs 4-112. The holder 4-110 is movable relative to the fixed portion 4-200 and is configured to hold an optical element 4-120, such as a lens in this embodiment, and the optical element 4-120 has an optical axis 4-O. It should be noted that in other embodiments, the elements in the fixed portion may also be adjusted to be the movable portion according to needs.

Figure 34:
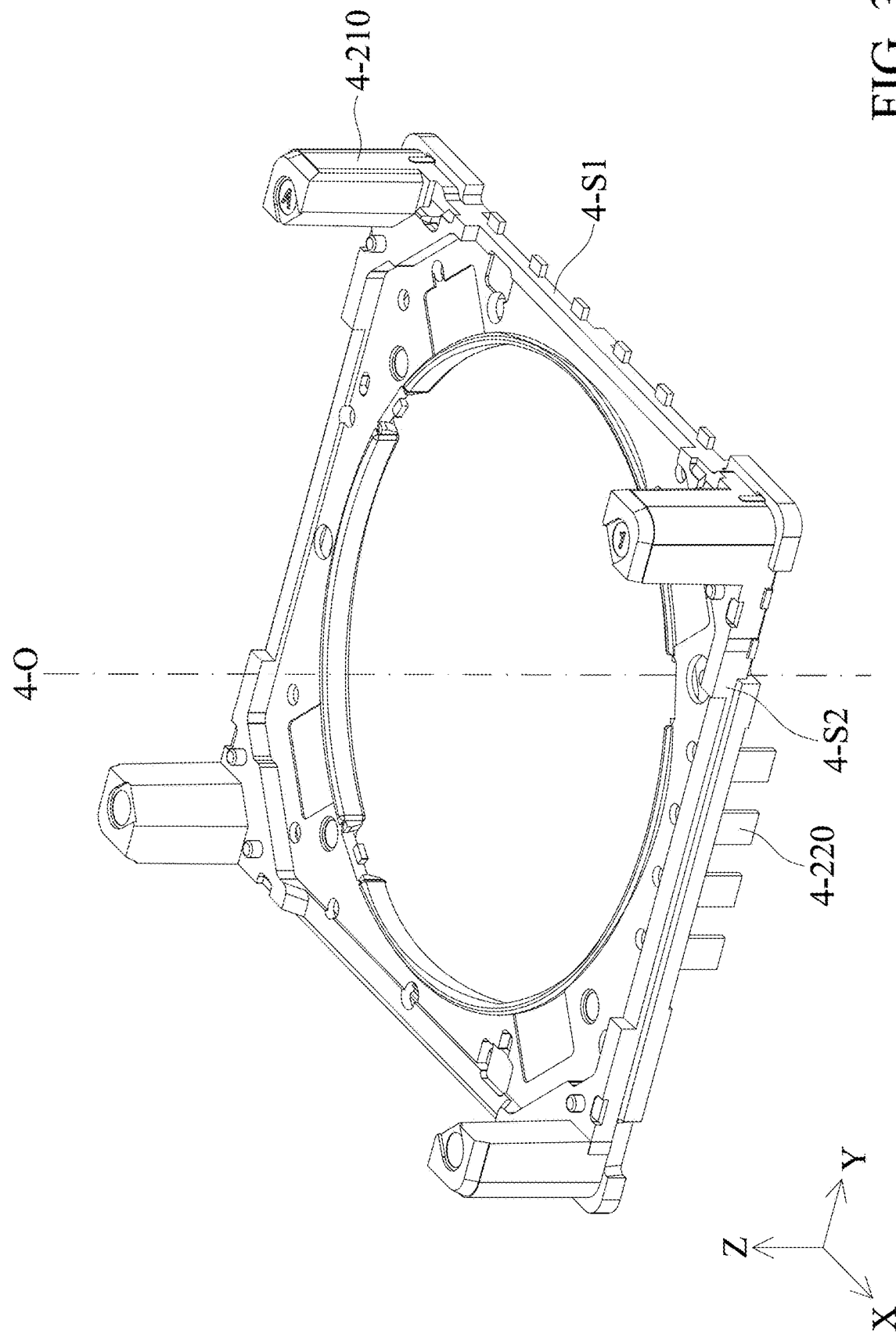
FIG. 34 shows a schematic view of a circuit component embedded in a base in accordance with an embodiment of this disclosure.
Figure 35:
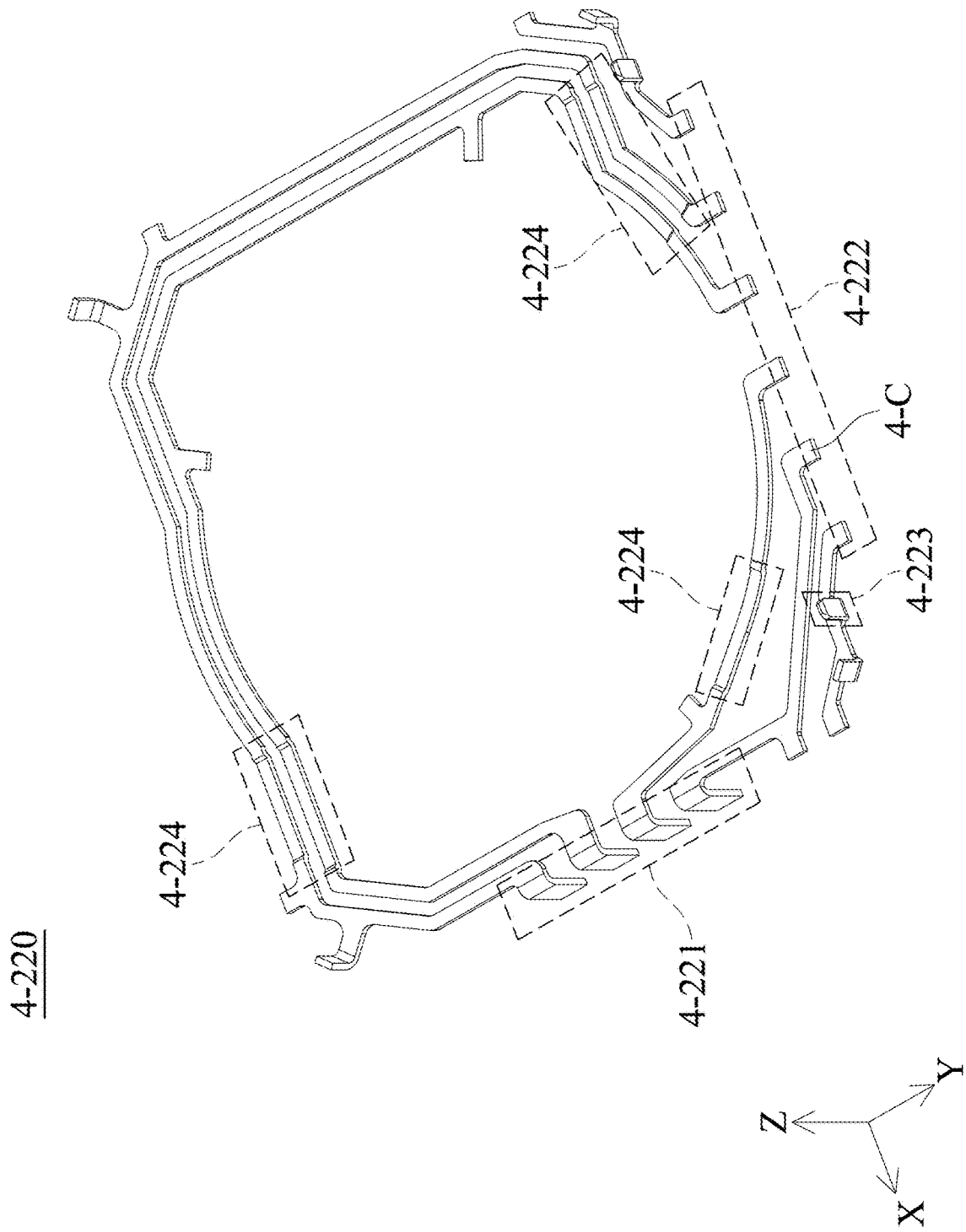
FIG. 35 shows a perspective view of a circuit component in accordance with an embodiment of this disclosure.

Refer to FIG. 33, FIG. 34 and FIG. 35. FIG. 34 shows a schematic view of a circuit component embedded in a base in accordance with an embodiment of this disclosure, and FIG. 35 shows a perspective view of a circuit component in accordance with an embodiment of this disclosure. As shown in FIG. 33, the fixed portion 4-200 includes a base 4-210, a circuit component 4-220, a case 4-230, and a frame 4-240. The base 4-210 has a base opening 4-211 and a plurality of stop recesses 4-212. As shown in FIG. 34, in the present embodiment, the circuit component 4-220 is embedded in the base 4-210. As shown in FIG. 35, the circuit component 4-220 has an external electrical connection portion 4-221, an internal electrical connection portion 4-222, a driving electrical connection portion 4-223, and a recessed portion 4-224 that is recessed to correspond with the stop recess 4-212. The external electrical connection portion 4-221 and the internal electrical connection portion 4-222 have a plurality of terminals 4-C respectively.

Figure 36:
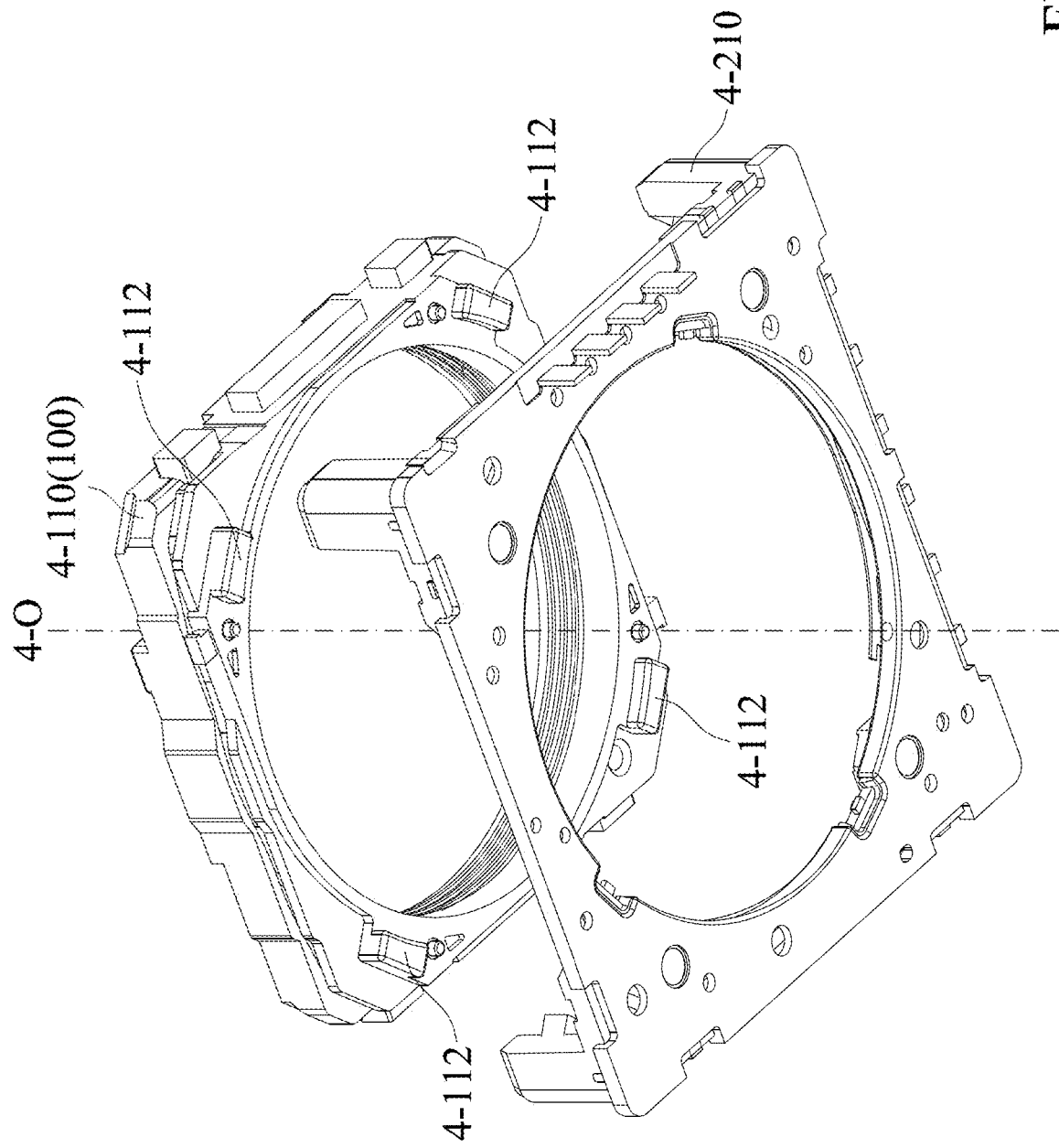
FIG. 36 shows a schematic view of a partial structure of an optical module in accordance with an embodiment of this disclosure.
Figure 37:
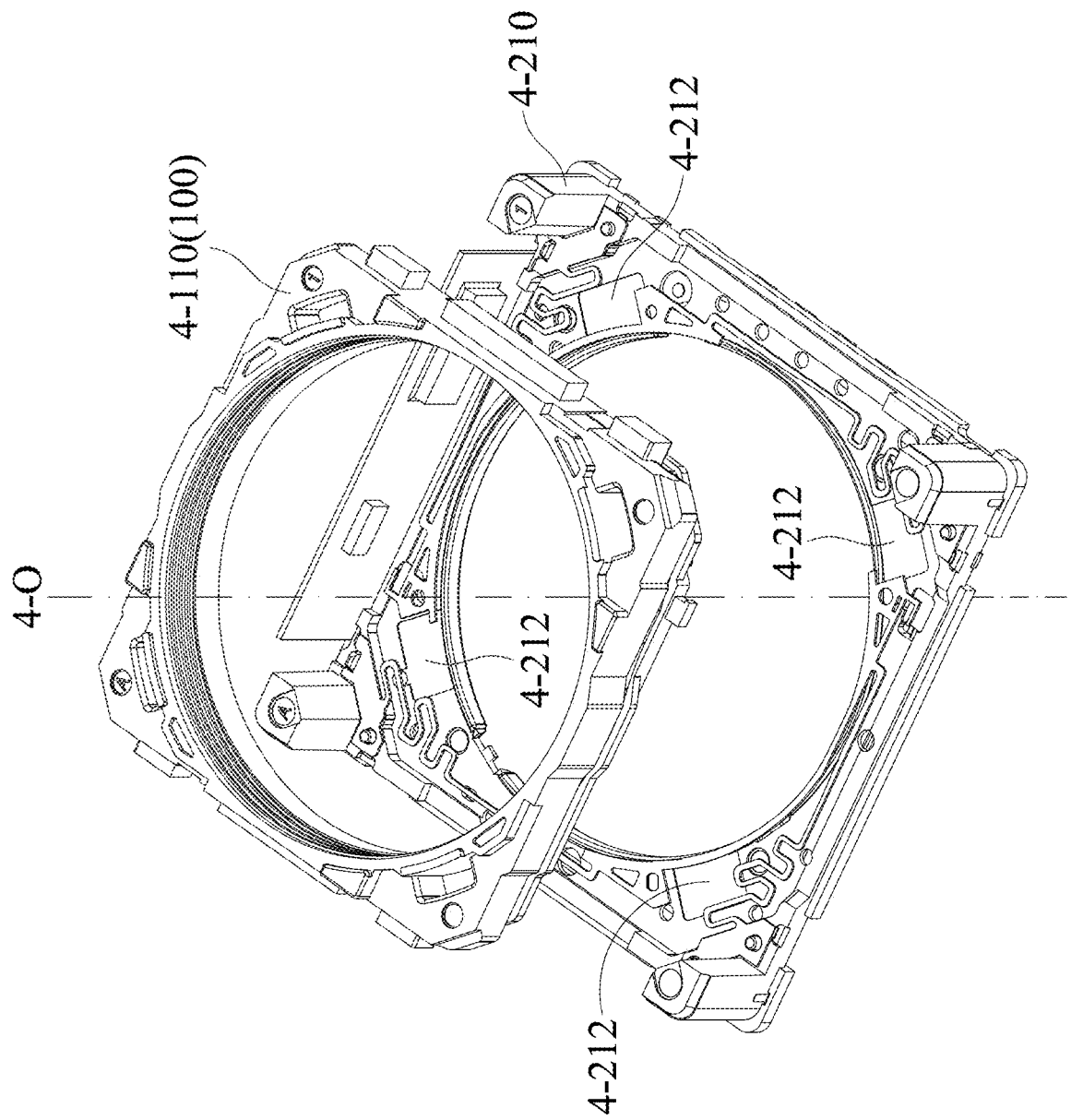
FIG. 37 shows a schematic view of a partial structure of an optical module in accordance with an embodiment of this disclosure.

Refer to FIG. 36 and FIG. 37, which show a schematic view of a partial structure of an optical module in accordance with an embodiment of this disclosure. The holder 4-110 has four protruding legs 4-112 on the side close to the base 4-210, and four stop recesses 4-212 are disposed on the base 4-210 to correspond to the protruding legs 4-112. The stop recesses 4-212 are used to stop the holder 4-110. If the protruding legs 4-112 touch the stop recesses 4-212 when the holder 4-110 is moved, the holder 4-110 will be stopped. Therefore, the stop recesses 4-212 prevent the movable portion 4-100 from exceeding the range of motion. A conventional method of stopping the movable portion is to form a protruding structure on the base. Unlike the conventional method, the method of stopping the movable portion in this embodiment is by forming a recessed structure (the stop recesses 4-212) on the base 4-210. Thus, the range of motion of the movable portion 4-100 in a direction parallel to the optical axis 4-O is greater, and miniaturization of the optical module may also be achieved.

Figure 38:
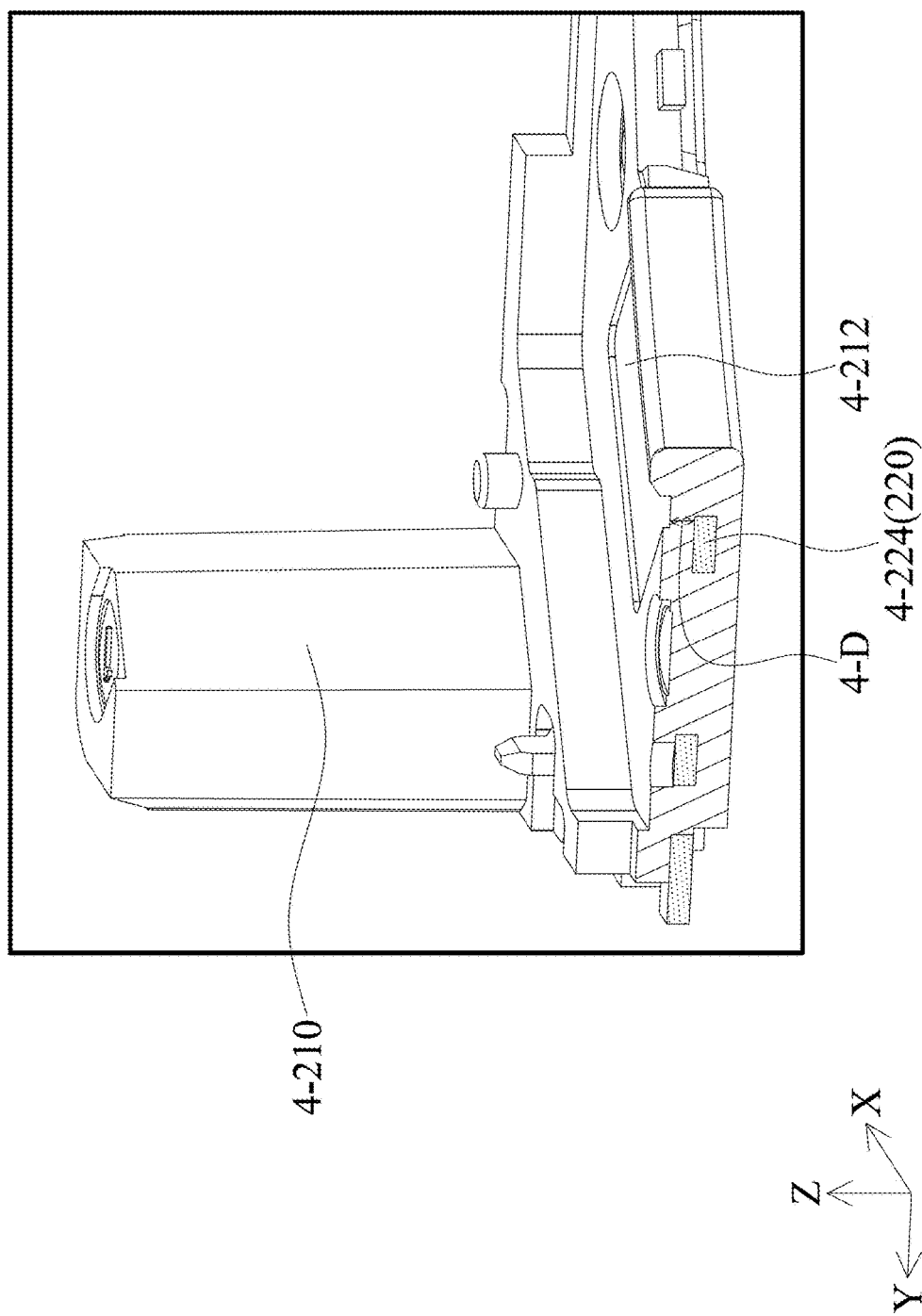
FIG. 38 shows a schematic view of a partial structure of an optical module in accordance with an embodiment of this disclosure.

Refer to FIG. 38, which shows a schematic view of a partial structure of an optical module in accordance with an embodiment of this disclosure. The base 4-210 has stop recesses 4-212. In the direction parallel to the optical axis 4-O, if the height of the circuit component 4-220 embedded in the base 4-210 are all the same no matter whether a portion of the circuit component 4-220 overlaps the stop recesses 4-212 or not when viewed along the direction parallel to the optical axis 4-O, it will be difficult to manufacture the base 4-210. Since the distance 4-D between the circuit component 4-220 and the stopper recesses 4-212 is too small (in other words, because a thickness (distance 4-D) of a part of the base 4-210 is too thin), it will be difficult to manufacture this part of the base 4-210 using a general plastic mold. Therefore, in this embodiment, the circuit component 4-220 has the recessed portion 4-224, and the recessed portion 4-224 recess correspondingly with the stop recesses 4-212 in the direction parallel to the optical axis 4-O. Hence, the process limitation of the base 4-210 may be overcome.

Back to FIG. 33. The case 4-230 has a case opening 4-231, a top wall 4-232, and four side walls 4-233 extending along the optical axis 4-O from an edge of the top wall 4-232. The case 4-230 and the base 4-210 may be combined to form a housing of the optical module 4-1. It should be understood that the center of the case opening 4-231 corresponds to the optical axis 4-O of the optical element 4-120, and a base opening 4-211 corresponds to an image-sensing element (not shown in the figures) disposed outside the optical module 4-1. External light may enter the case 4-230 through the case opening 4-231, and is received by the image-sensing element (not shown in the figures) after passing through the optical element 4-120 and the base opening 4-211, so as to generate a digital image signal.

The frame 4-240 has a frame opening 4-241, a plurality of pillars 4-242 extending along the optical axis 4-O, and a plurality of receiving holes 4-243. In this embodiment, the holder 4-110 and the optical element 4-120 inside the holder 4-110 are movably disposed in the frame 4-240. More specifically, the holder 4-110 may be suspended in the center of the frame 4-240 by the first flexible element 4-600 and the second flexible element 4-700, and materials of the first flexible element 4-600 and the second flexible element 4-700 may be metal.

The driving portion 4-300 includes a driving magnetic element 4-310 and a driving coil 4-320, wherein the driving portion 4-300 may be fixed to the frame 4-240 or movable relative to the frame 4-240. It should be understood that a magnetic force may be generated by the interaction between the driving magnetic element 4-310 and the driving coil 4-320 to move the holder 4-110 relative to the frame 4-240 along the optical axis 4-O, thereby achieving fast focusing.

The position-sensing portion 4-400 includes a position-sensing element 4-410 and an electronic element 4-420, and the position-sensing portion 4-400 is disposed on the circuit board 4-500 and located between the circuit board 4-500 and the movable portion 4-100 (the holder 4-110). The position-sensing element 4-410 is used to sense the position of the movable portion 4-100 relative to the fixed portion 4-200. Specifically, the position-sensing element 4-410 may be, for example, Hall effect sensors, MR sensors, or a Fluxgate sensor or the like. The position-sensing element 4-410 is disposed to sense a magnetic field of a magnetic element (not shown in the figures) on the holder 4-110, and obtain the position of the holder 4-110 relative to the base 4-210. The electronic element 4-420 may be a signal filter or a driver IC.

Figure 39:
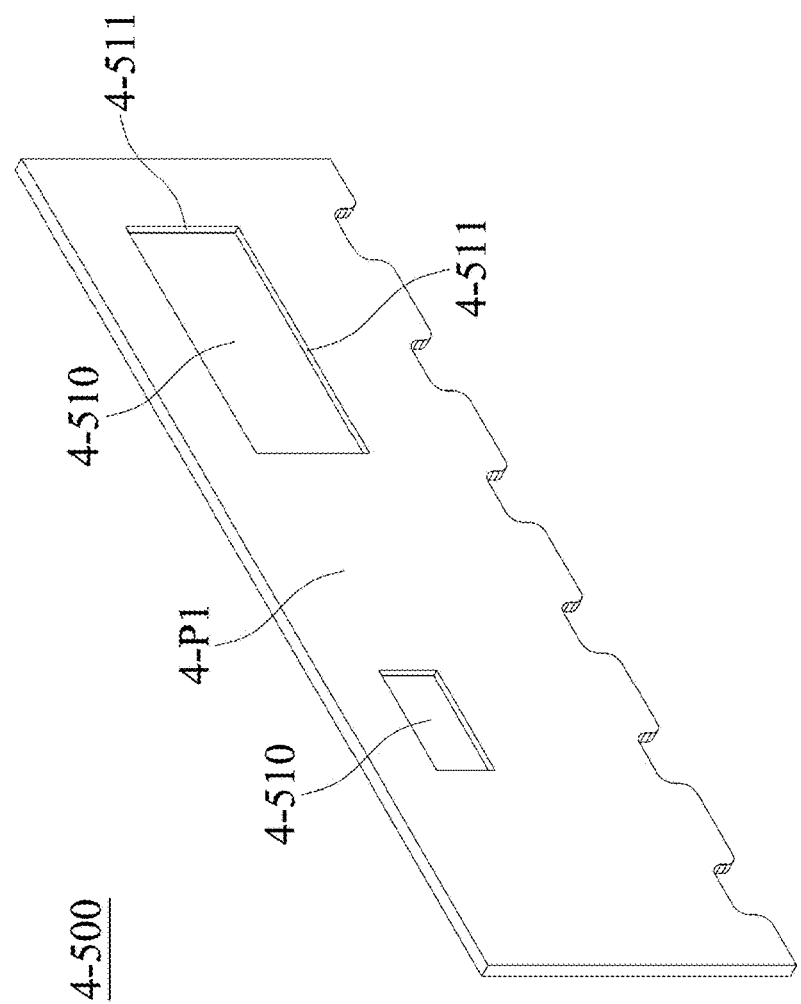
FIG. 39 shows a perspective view of a circuit board in accordance with an embodiment of this disclosure.
Figure 40:
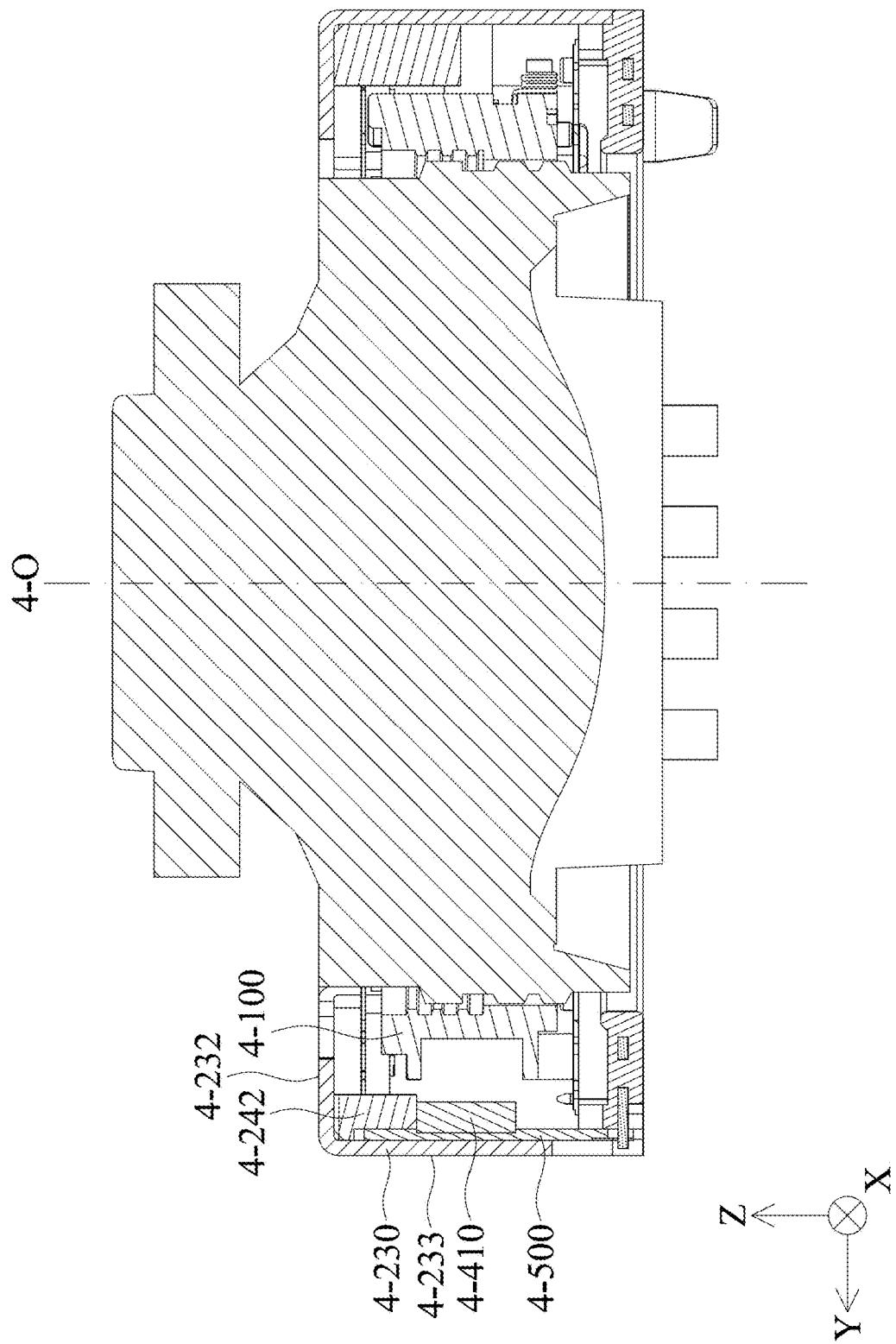
FIG. 40 shows a cross-sectional view of an optical module along line 4-A-4-A' in FIG. 32.
Figure 41:
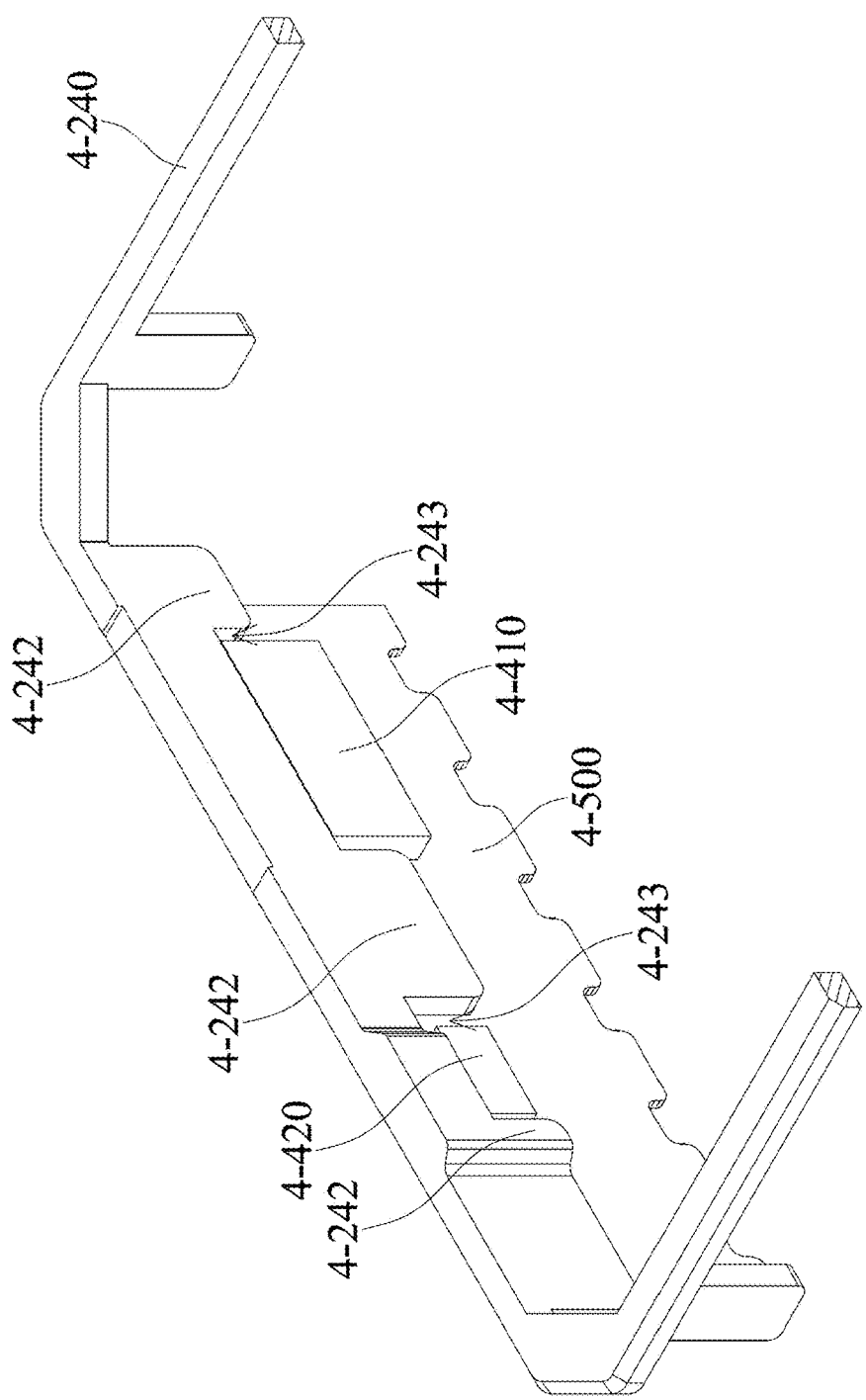
FIG. 41 shows a schematic view of a partial structure of an optical module in accordance with an embodiment of this disclosure.

Refer to FIG. 39 to FIG. 41. FIG. 39 shows a perspective view of a circuit board in accordance with an embodiment of this disclosure, FIG. 40 shows a cross-sectional view of an optical module along line 4-A-4-A' in FIG. 32, and FIG. 41 shows a schematic view of a partial structure of an optical module in accordance with an embodiment of this disclosure. As shown in FIG. 39, the circuit board 4-500 has a first surface 4-P1, and the first surface 4-P1 has two grooves 4-510, and the groove 4-510 may be used to dispose the position-sensing element 4-410 or the electronic element 4-420. The groove 4-510 has four side surfaces 4-511, and the side surfaces 4-511 are non-parallel to the first surface 4-P1 and face the position-sensing element 4-410 or the electronic element 4-420 disposed in the grooves 4-510. A part of the position-sensing element 4-410 or the electronic element 4-420 disposed in the grooves 4-510 is surrounded by the four side surfaces 4-511. Therefore, as shown in FIG. 40, the circuit board 4-500 and the position-sensing element 4-410 partially overlap when viewed along a direction perpendicular to the optical axis 4-O.

As shown in FIG. 40, the circuit board 4-500 is disposed between the side wall 4-233 of the case 4-230 and the pillars 4-242 of the frame 4-240. When viewed along a direction perpendicular to the optical axis 4-O, the pillars 4-242, the side wall 4-233, and the circuit board 4-500 partially overlap. As shown in FIG. 41, the position-sensing element 4-410 is partially disposed in the grooves 4-510 of the circuit board 4-500, and received in the receiving holes 4-243 of the frame 4-240. Moreover, the pillars 4-242 of the frame 4-240 are closer to the movable portion 4-100 (as shown in FIG. 40) than the position-sensing portion 4-400. With such an arrangement, the position-sensing element 4-410 and the electronic element 4-420 disposed in the grooves 4-510 are relatively stable when suffering an impact of an external force. Moreover, the pillars 4-242 of the frame 4-240 may restrict the movement of the movable portion 4-100, and prevent the position-sensing element 4-410 or the electronic element 4-420 from being directly damaged by the impact of the movable portion 4-100.

Figure 42:
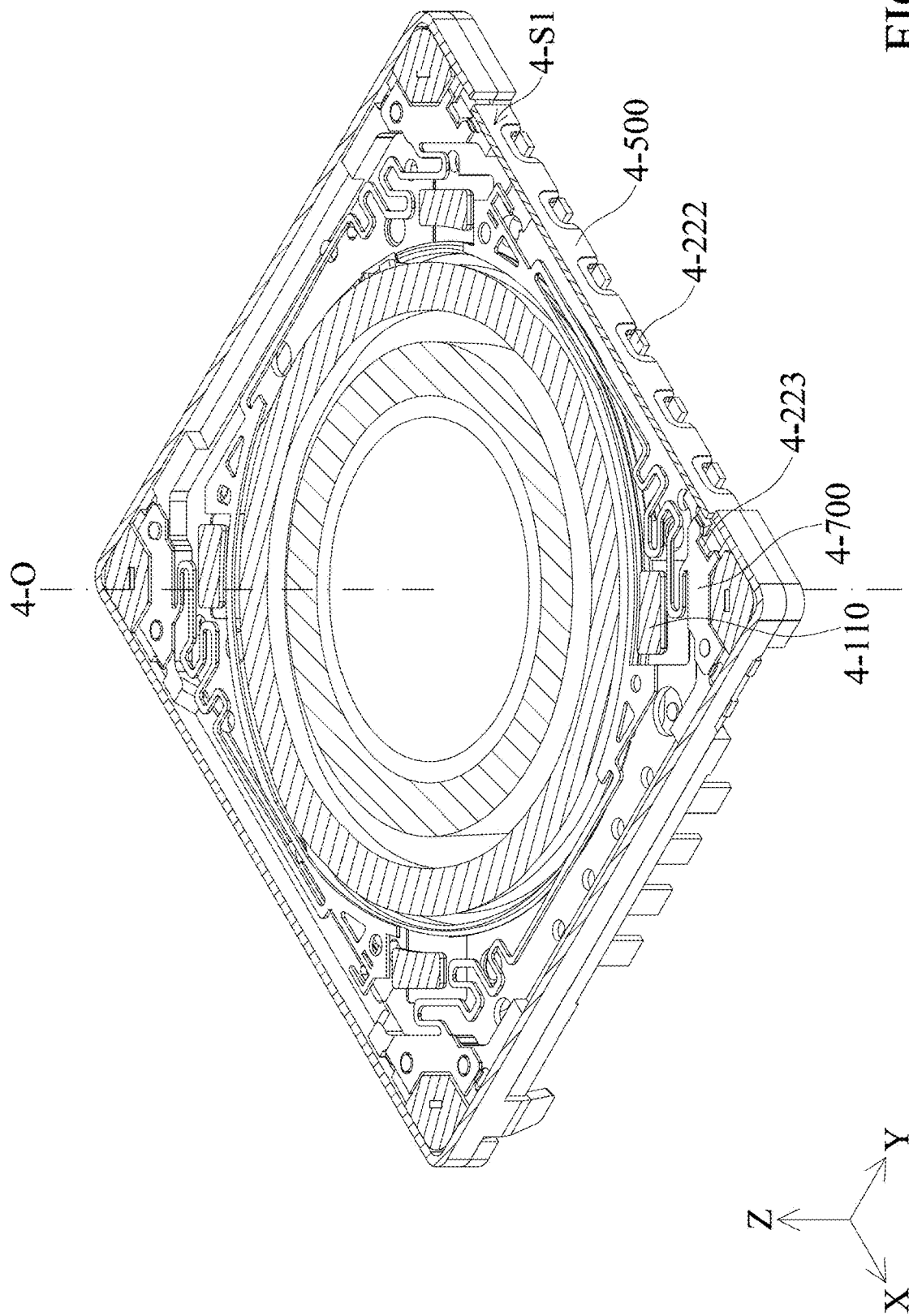
FIG. 42 shows a perspective view of a partial structure of an optical module which cut along line 4-B-4-B' in FIG. 32.
Figure 43:
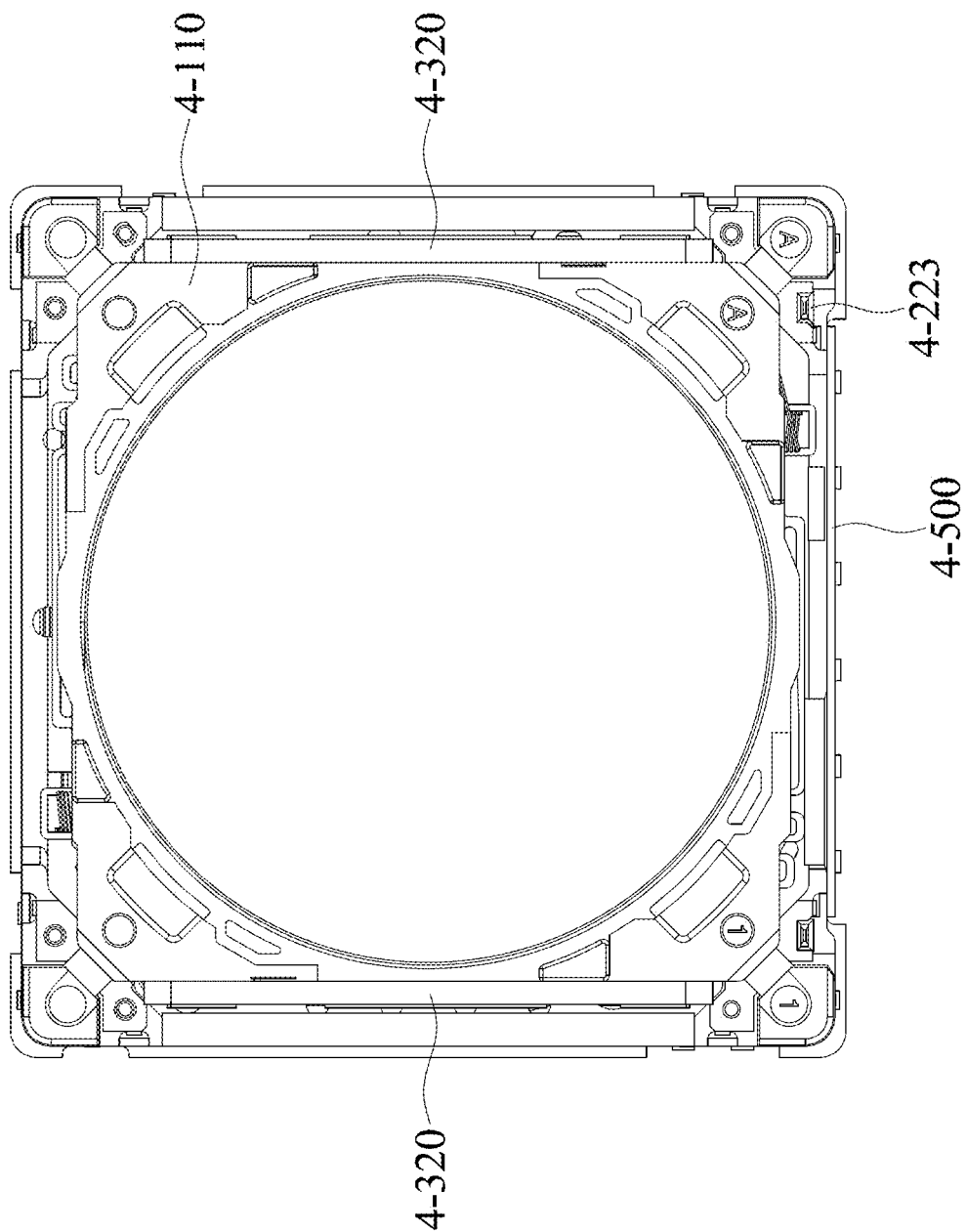
FIG. 43 shows a top view of a partial structure of an optical module in accordance with an embodiment of this disclosure.
Figure 44:
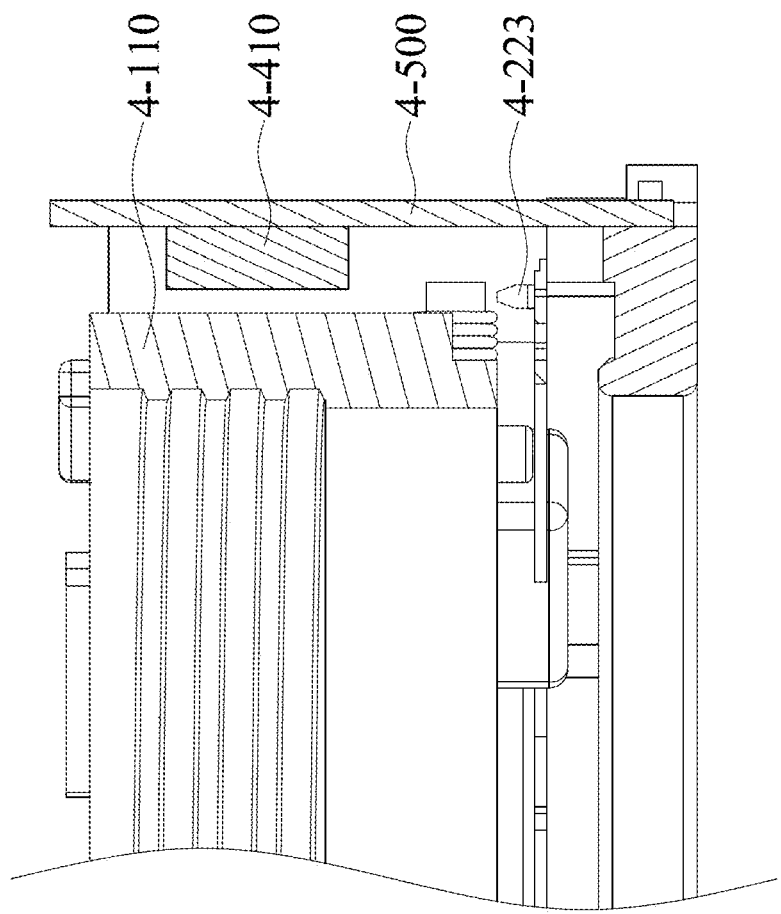
FIG. 44 shows a schematic view of a partial structure of an optical module in accordance with an embodiment of this disclosure.

Refer to FIG. 42 to FIG. 44. FIG. 42 shows a perspective view of a partial structure of an optical module which cut along line 4-B-4-B' in FIG. 32, FIG. 43 shows a top view of a partial structure of an optical module in accordance with an embodiment of this disclosure, and FIG. 44 shows a schematic view of a partial structure of an optical module in accordance with an embodiment of this disclosure. As shown in FIG. 42, the driving electrical connection portion 4-223 of the circuit component 4-220 is located at the first side 4-S1 of the optical module 4-1. The driving electrical connection portion 4-223 is closer to the holder 4-110 than the internal electrical connection portion 4-222 when viewed along the direction parallel to the optical axis 4-O. The driving electrical connection portion 4-223 is connected to the second flexible element 4-700. The driving electrical connection portion 4-223 extends along the circuit component 4-220 embedded in the base 4-210 to one of the terminals 4-C of the internal electrical connection portion 4-222 (as shown in FIG. 34). By electrically connecting, if the position-sensing portion 4-400 on the circuit board 4-500 senses the displacement of the movable portion 4-100 relative to the fixed portion 4-200, the circuit board 4-500 may generate and provide an electrical signal to the driving coil 4-320. The electrical signal is transmitted from the circuit board 4-500 to the second flexible element 4-700 via the circuit component 4-220, and then from the second flexible element 4-700 to the driving coil 4-320. Then, an electromagnetic driving force is generated between the driving coil 4-320 and the driving magnetic element 4-310. The electromagnetic driving force is used to drive the frame 4-240 to move in a direction perpendicular to the optical axis 4-O (in a direction parallel to the XY plane), so that the position displacement may be compensated for, and further achieve the function of Optical Image Stabilization (OIS).

As described above, the driving electrical connection portion 4-223 and the circuit board 4-500 are both disposed on the first side 4-S1 of the optical module 4-1. In addition to simplifying the circuit, as shown in FIG. 43, the driving coil 4-320 disposed on different sides (different from the first side 4-S1) may be designed to be longer, and further enhance the electromagnetic driving force. Moreover, when viewed along a direction perpendicular to the optical axis 4-O, as shown in FIG. 44, the position-sensing element 4-410 does not overlap the driving electrical connection portion 4-223, and the driving electrical connection portion 4-233 is disposed in a space below the position-sensing element 4-410. As a result, the space inside the optical module 4-1 may be used efficiently, thereby achieving module miniaturization.

Figure 45:
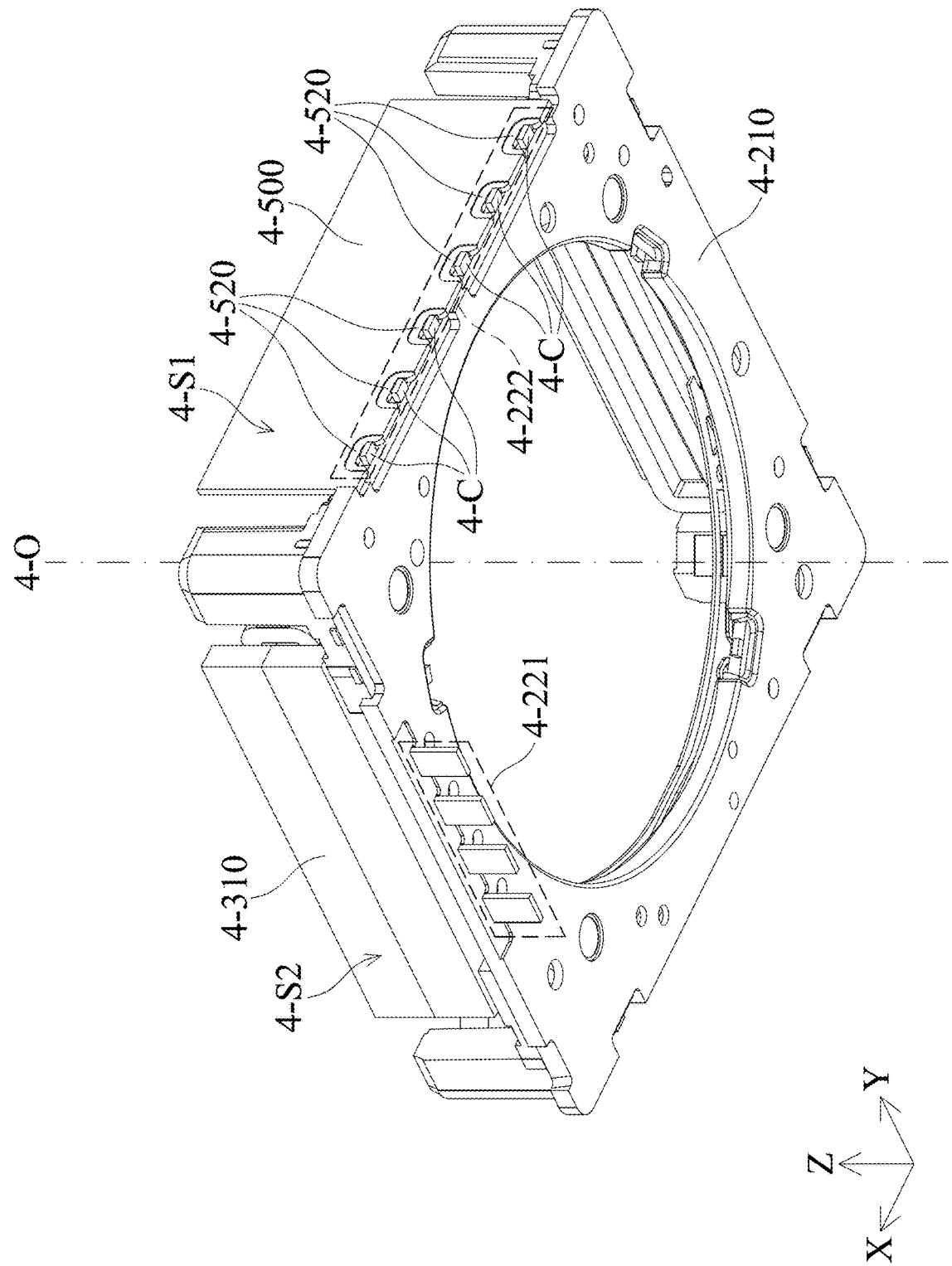
FIG. 45 shows a schematic view of a partial structure of an optical module in accordance with an embodiment of this disclosure.
Figure 46:
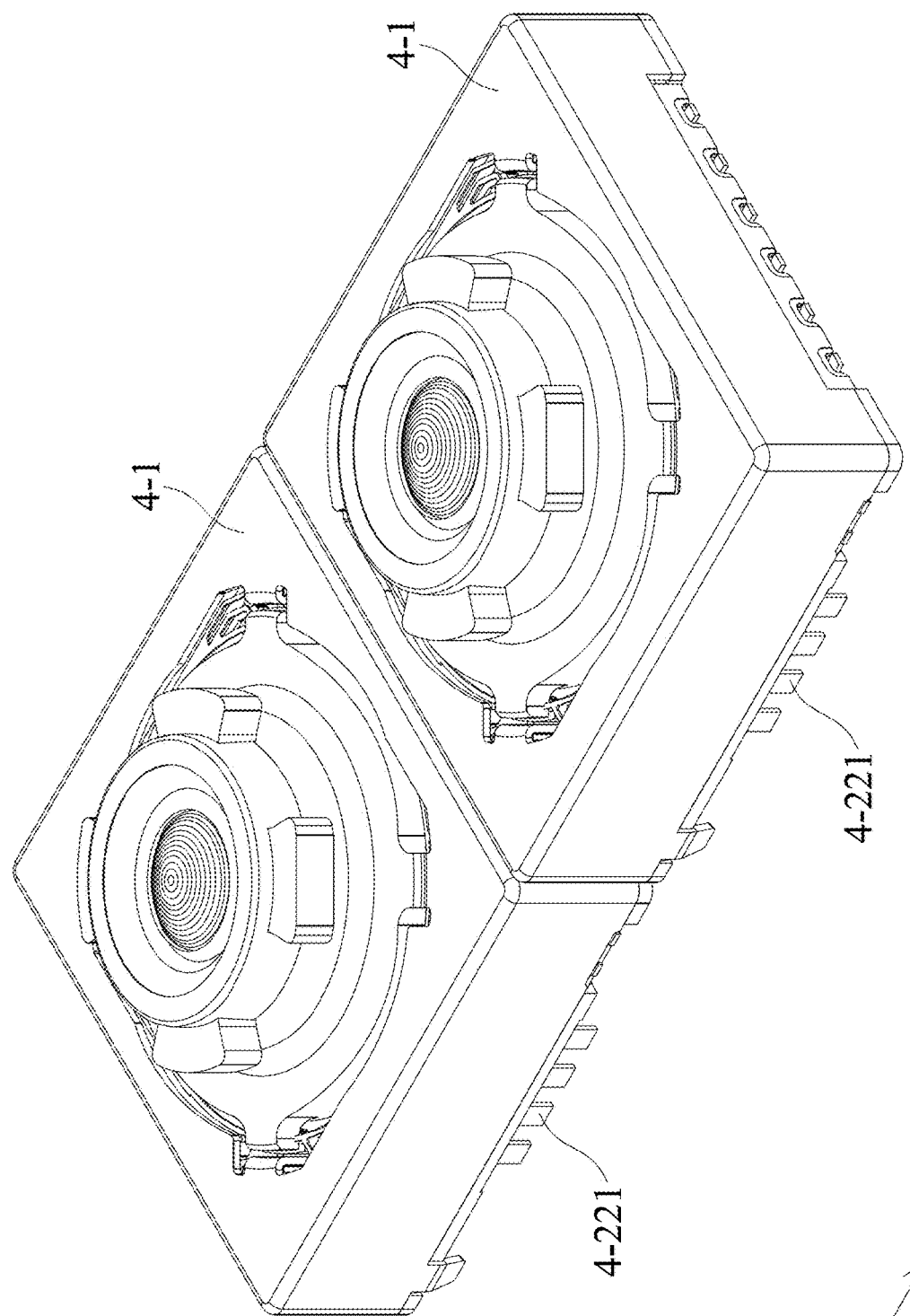
FIG. 46 shows a schematic view of a structure of a dual optical module using an optical module according to an embodiment of this disclosure.

Refer to FIG. 45 and FIG. 46. FIG. 45 shows a schematic view of a partial structure of an optical module in accordance with an embodiment of this disclosure, and FIG. 46 shows a schematic view of a structure of a dual optical module using an optical module according to an embodiment of this disclosure. As shown in FIG. 45, the circuit board 4-500 has a dentate structure 4-520, and the circuit board 4-500 is disposed on the first side 4-S1 of the optical module 4-1. The dentate structure 4-520 is configured to receive the internal electrical connection portion 4-222 of the circuit component 4-220, such that the circuit board 4-500 and the internal electrical connection portion 4-222 may be relatively stable in the subsequent connection and fix.

The internal electrical connection portion 4-222 disposed on the first side 4-S1 of the optical module 4-1 has six terminals 4-C, wherein four of the six terminals 4-C extend along the circuit component 4-220 embedded in the base 4-210 to the external electrical connection portion 4-221 disposed on the second side 4-S2 of the optical module 4-1, and the shape of the circuit component 4-220 embedded in the base 4-210 is corresponded with the shape of the base 4-210 (as shown in FIG. 34). It should be understood that number of the terminals is merely an example and not a limitation, and may be increased or decreased as required. Conventionally, when the circuit board is electrically connected to outside of the optical module, the circuit board is generally extended through the base to simultaneously serve as an external electrical connection portion. In contrast, in this embodiment, the circuit board 4-500 is connected to the internal electrical connection portion 4-222 disposed in the same side (the first side 4-S1) of the optical module, and further connected to the external electrical connection portion 4-221 disposed on the second side 4-S2. With the manner of connection described above, the structure of the base 4-210 may be strengthened by extending the circuit component 4-220 in the base 4-210. Moreover, the circuit board 4-500 does not need to pass through the base 4-210 when the circuit board 4-500 is electrically connected to the outside of the optical module. In other words, the base 4-210 does not need a space into which the circuit board 4-500 can be extended and inserted. Therefore, on the first side 4-S1 of the optical module, the width of the base 4-210 may be smaller than the conventional one. Additionally, the external electrical connection portion 4-221 disposed on the second side 4-S2 is configured in a space below the driving magnetic element 4-310. Thus, on the second side 4-S2 of the optical module, the width of the base 4-210 may not be increased. As shown in FIG. 45, when viewed along the direction parallel to the optical axis 4-O, the external electrical connection portion 4-221 and the driving magnetic element 4-310 partially overlap, thereby achieving module miniaturization.

In addition, the subsequent assembly production efficiency may be improved by disposing the circuit board 4-500 and the external electrical connection portion 4-221 on different sides. For example, if two conventional optical modules are combined to be a dual optical module, the two optical modules must be assembled in the opposite direction to prevent magnetic interference. That is, the side of one optical module disposed the external electrical connection portion faces to one direction, and the side of the other optical module disposed the external electrical connection portion faces to another direction which is 180 degrees different from one module. Magnetic interference occurs when magnetic elements of the two optical modules are too close, and the focus speed and accuracy of the lens may be affected. Since the external electrical connection portions of the two optical modules are in different sides, subsequent assembly soldering needs to be performed in stages. However, as shown in FIG. 46, in this embodiment, when two optical modules 4-1 are combined to a dual optical module, the two optical modules 4-1 may be assembled in the same direction. That is, the sides of two optical modules disposed the external electrical connection portion may be faced to the same direction, and the magnetic interference caused by the magnetic elements being too close may be avoided. Moreover, the external electrical connection portions 4-221 of the two optical modules 4-1 are in the same direction, the subsequent assembly soldering may be performed at the same time.

Figure 47:
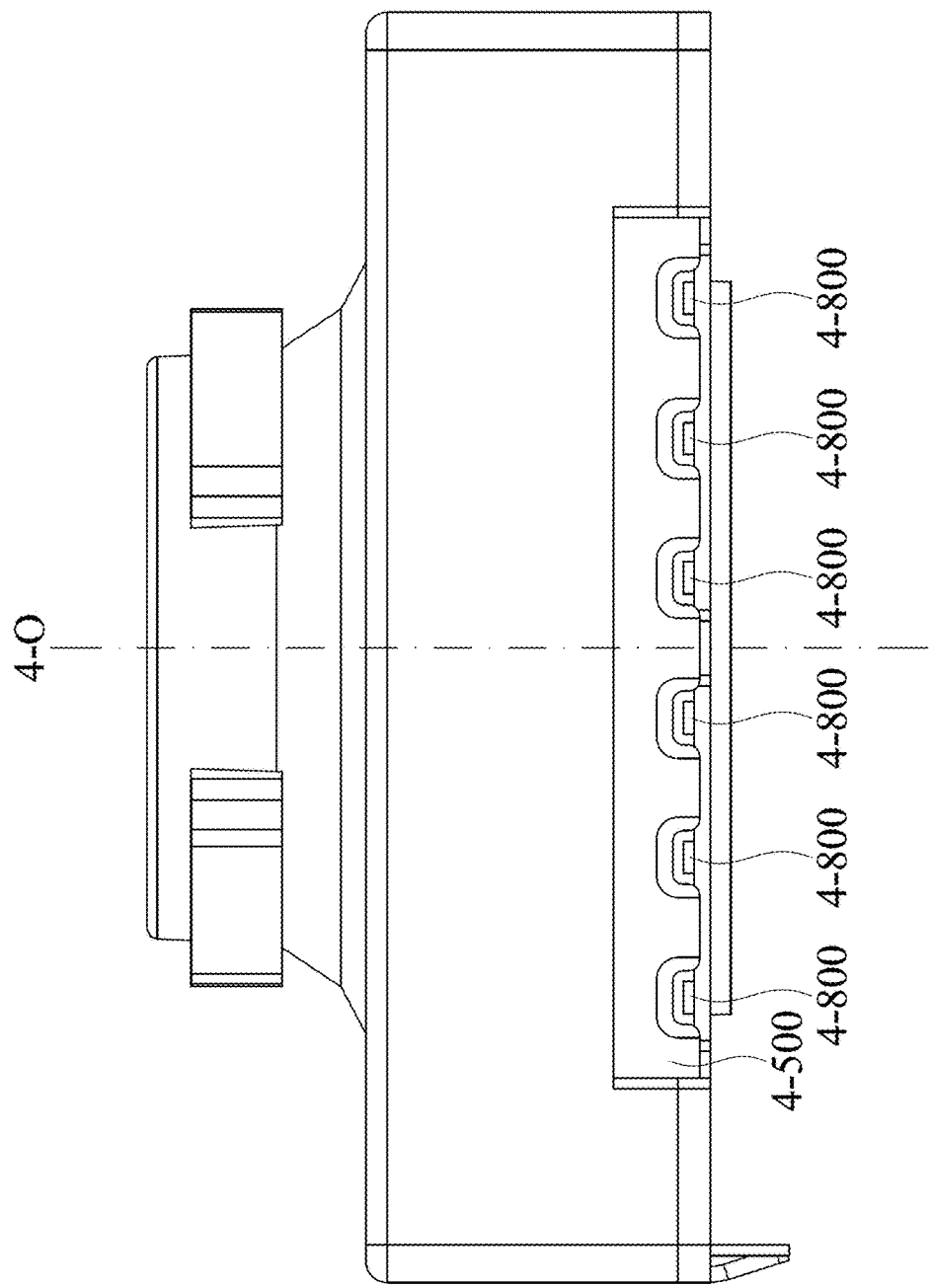
FIG. 47 shows a schematic view of an optical module in accordance with an embodiment of this disclosure.
Figure 48:
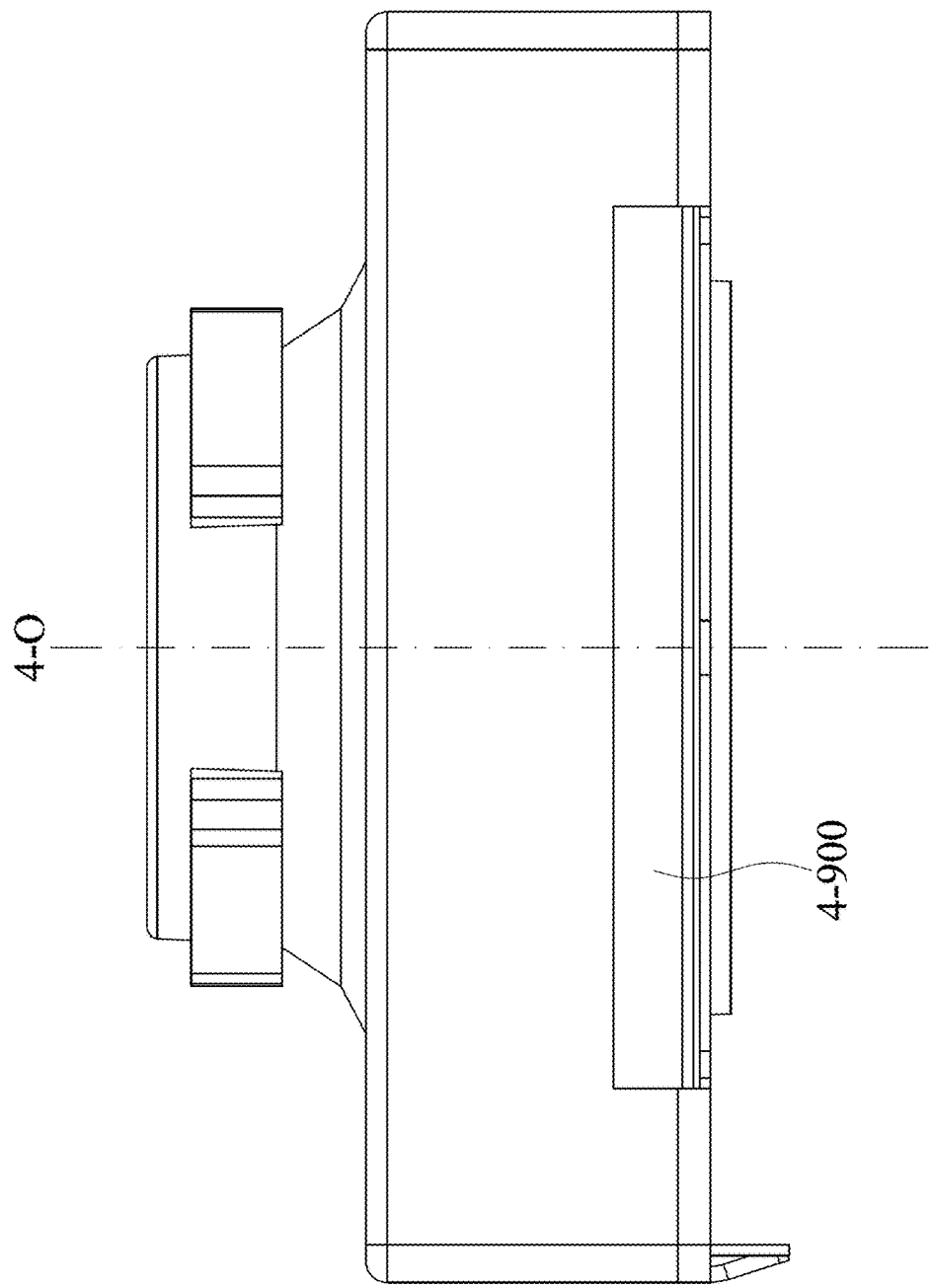
FIG. 48 shows a schematic view of an optical module in accordance with an embodiment of this disclosure.

Refer to FIG. 47 and FIG. 48, which show a schematic view of an optical module in accordance with an embodiment of this disclosure. As shown in FIG. 47, the optical module of the present embodiment further includes a soldering portion 4-800. The soldering portion 4-800 is used to affix the circuit board 4-500 to the internal electrical connection portion 4-222. As shown in FIG. 48, after the circuit board 4-500 and the internal electrical connection portion 4-222 are fixed by the soldering portion 4-800, the soldering portion 4-800 is covered by an adhesive element 4-900. The adhesive element 4-900 may prevent the soldering portion 4-800 from being short, and block external dust entering the interior of the module and keep the interior of the module clean.

Figure 49:
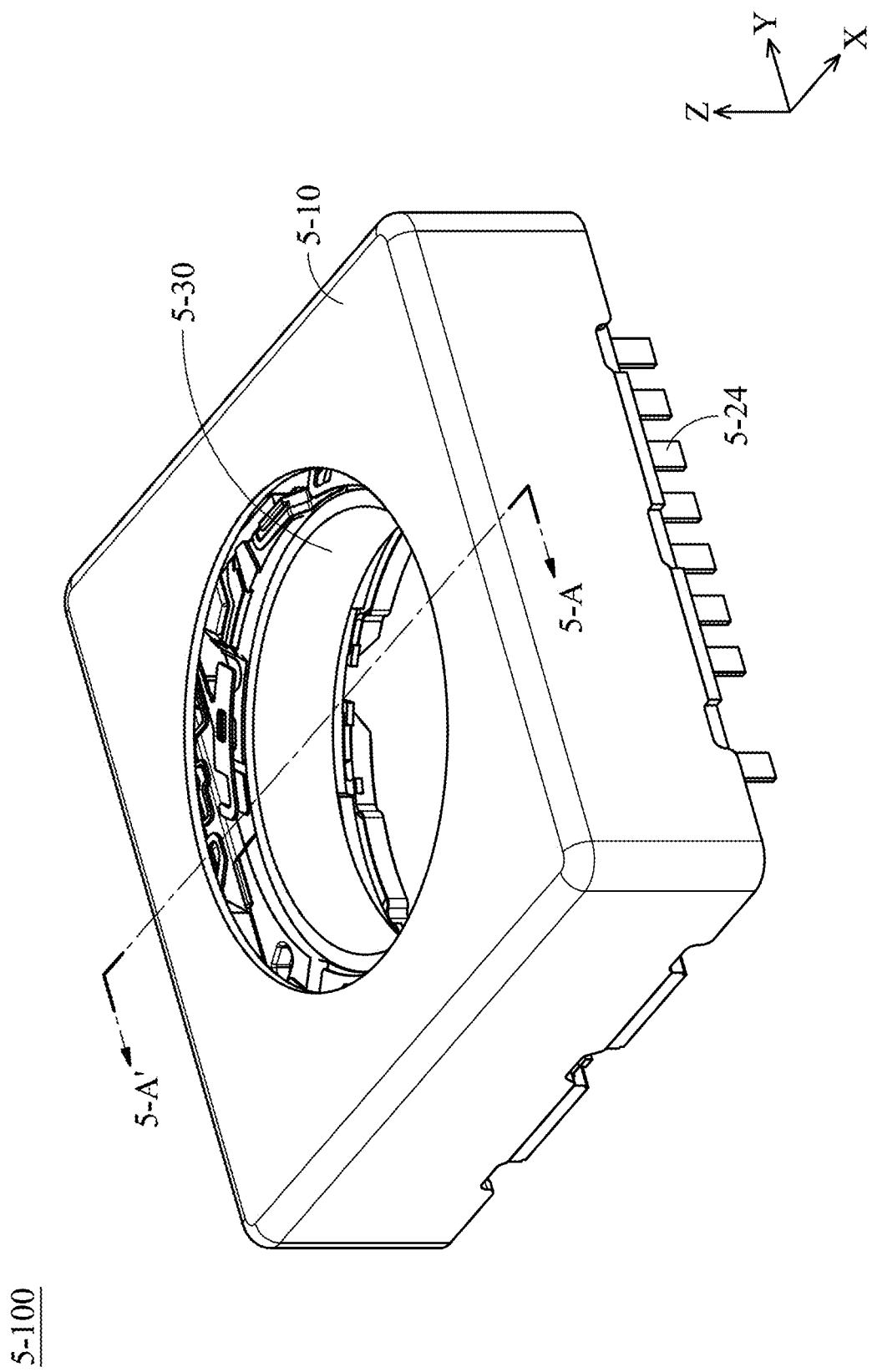
FIG. 49 is a perspective view of an optical module in some embodiments of the present disclosure.
Figure 50:
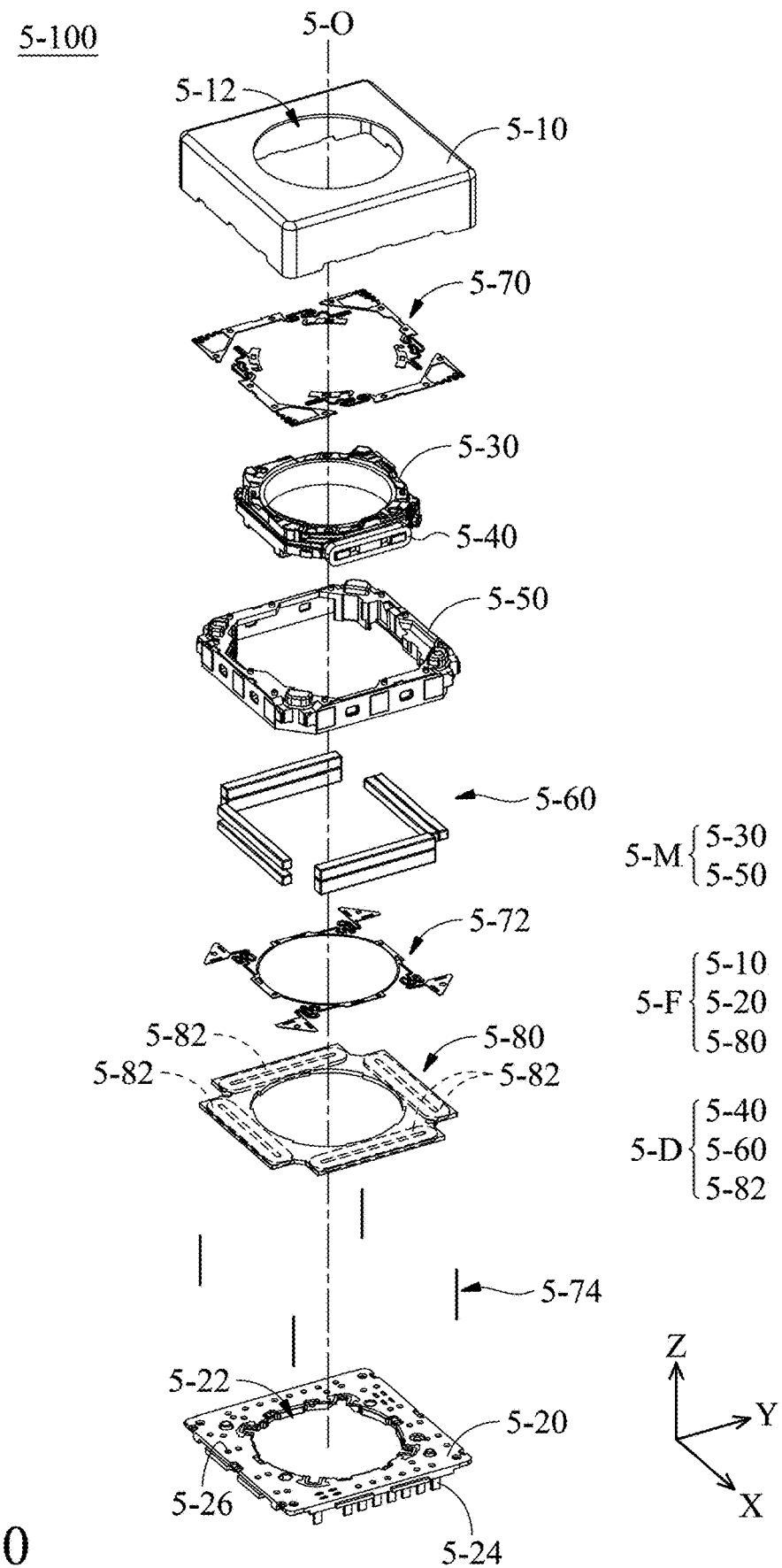
FIG. 50 is an exploded view of the optical module in FIG. 49.
Figure 51:
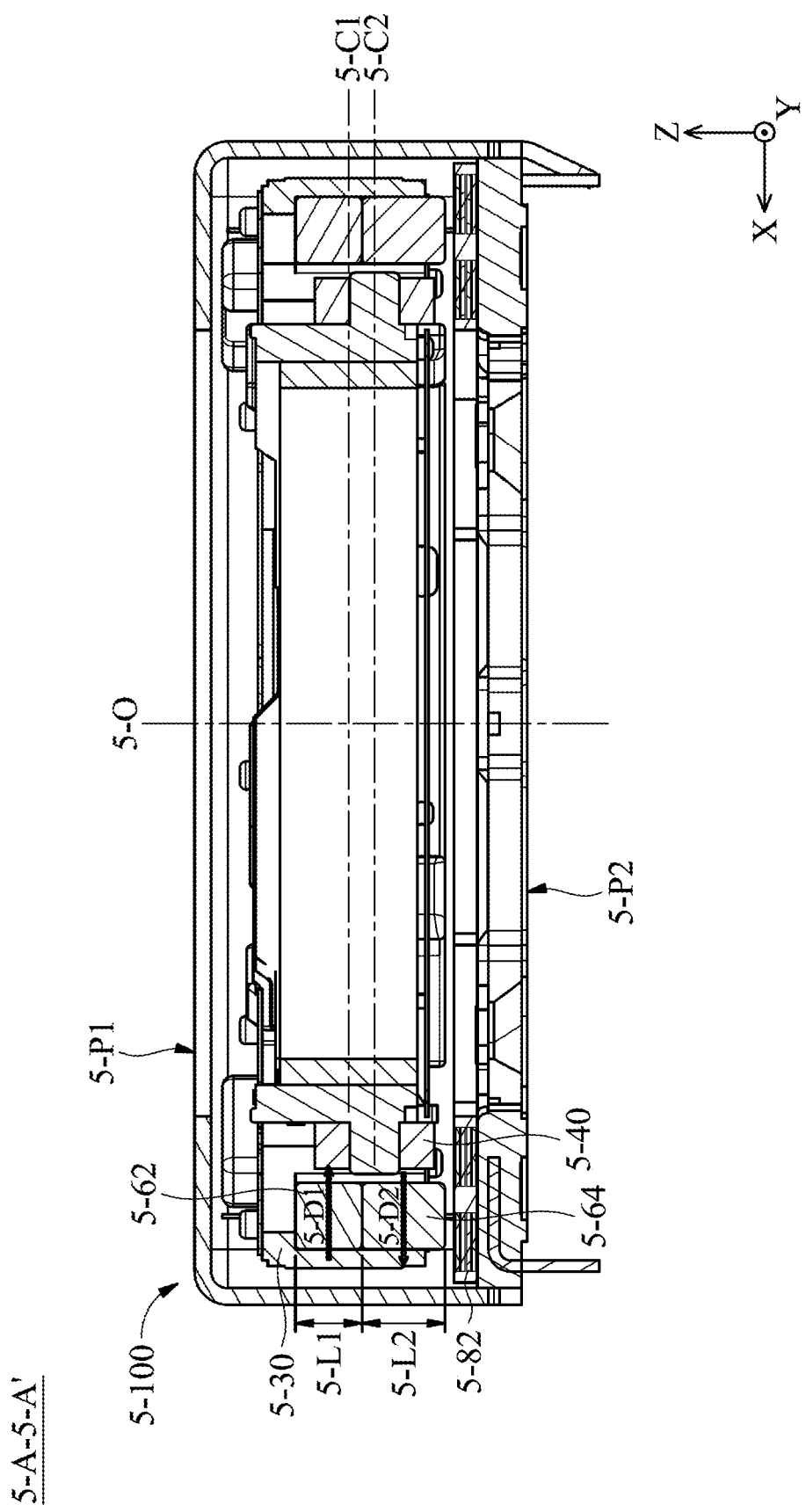
FIG. 51 is a cross-sectional view illustrated along line 5-A-5-A' in FIG. 49.

FIG. 49 is a perspective view of an optical module in some embodiments of the present disclosure, FIG. 50 is an exploded view of the optical module in FIG. 49, and FIG. 51 is a cross-sectional view illustrated along line 5-A-5-A' in FIG. 49. As shown in FIGS. 49 to 51, the optical module 5-100 mainly includes an outer case 5-10, a base 5-20, a holder 5-30, a first driving coil 5-40, a frame 5-50, a plurality of magnetic elements 5-60 (including first magnetic elements 5-62 and second magnetic elements 5-64), a first resilient element 5-70, a second resilient element 5-72, a group of third resilient elements 5-74, and a circuit board 5-80 (a plurality of second driving coils 5-82 are embedded in the circuit board 5-80) in this embodiment. The optical module 5-100 may drive an optical element (not shown) to move to achieve auto focus (AF) or optical image stabilization (OIS). The outer case 5-10, the base 5-20 and the circuit board 5-80 may be referred to as a fixed portion, the holder 5-30 and the frame 5-50 may be referred to as a movable portion 5-M, wherein the movable portion 5-M is movably connected to the fixed portion 5-F and can move relative to the fixed portion 5-F. Moreover, the first driving coils 5-40, the magnetic elements 5-60 and the second driving coils 5-82 may be referred to as a driving assembly 5-D to drive the movable portion 5-M to move relative to the fixed portion 5-F.

The outer case 5-10 can be combined with the base 5-20 to form housing for the optical module 5-100. It should be noted that an outer case opening 5-12 and a base opening 5-22 are respectively provided on the outer case 5-10 and the base 5-20. The center of the outer case opening 5-12 is located at an optical axis 5-O of the optical element (not shown). The base opening 5-22 corresponds to an image sensor (not shown) placed outside the optical module 5-100. Accordingly, the lens in the optical module 5-100 can perform image focusing in the direction of the optical axis 5-O with the image sensor.

The holder 5-30 has a through hole, wherein the optical element can be fixed in the through hole. The magnetic elements 5-60 are affixed to the frame 5-50 or may move relative to the frame 5-50. It should be noted that a magnetic force may be generated by the interaction between the magnetic elements 5-60 and the first driving coils 5-40 to move the holder 5-30 relative to the frame 5-50 along the optical axis 5-O, thereby achieving fast focusing.

In this embodiment, the holder 5-30 and the optical element therein are movably disposed in the frame 5-50. More specifically, the holder 5-30 is suspended in the frame 5-50 by the first resilient element 5-70 and the second resilient element 5-72 made of a metal material (FIG. 51). When a current is supplied to the first driving coils 5-40, the first driving coils 5-40 can act with the magnetic field of the magnetic elements 5-60 to generate an electromagnetic force to move the holder 5-30 and the lens therein along the optical axis 5-O direction with respect to the frame 5-50 to achieve auto focusing.

The circuit board 5-80, such as a flexible printed circuit board (FPC), is fixed to the base 5-20 by adhesion, for example. In this embodiment, the circuit board 5-80 is electrically connected to electronic elements inside or outside the optical module 5-100 to perform auto focus, optical image stabilization, etc. The circuit board 5-80 may also transmit electrical signal to the first driving coils 5-40 through the third resilient elements 5-74 and the first resilient element 5-70 to control the movement of the holder 5-30 on X-axis, Y-axis or Z-axis. Moreover, as shown in FIG. 50, a plurality of second driving coils 5-82 may be embedded in the circuit board 5-80 to interact with the first magnetic element 5-60 or the second magnetic element 5-62 for driving the holder 5-30 to move. When the first driving coils 5-40 and the second driving coils 5-82 interact with the magnetic elements 5-60, driving forces having different directions may be generated to perform functions such as auto focusing and optical image stabilization.

One end of each of the four third resilient elements 5-74 is affixed to the circuit board 5-80 and the other end is connected to the first resilient element 5-70, so that the frame 5-50 and the lens holder 5-30 can be suspended in the top case 5-10 by third resilient elements 5-74. The third resilient elements 5-74 may be a suspension wire and may include a metal material.

Figure 52:
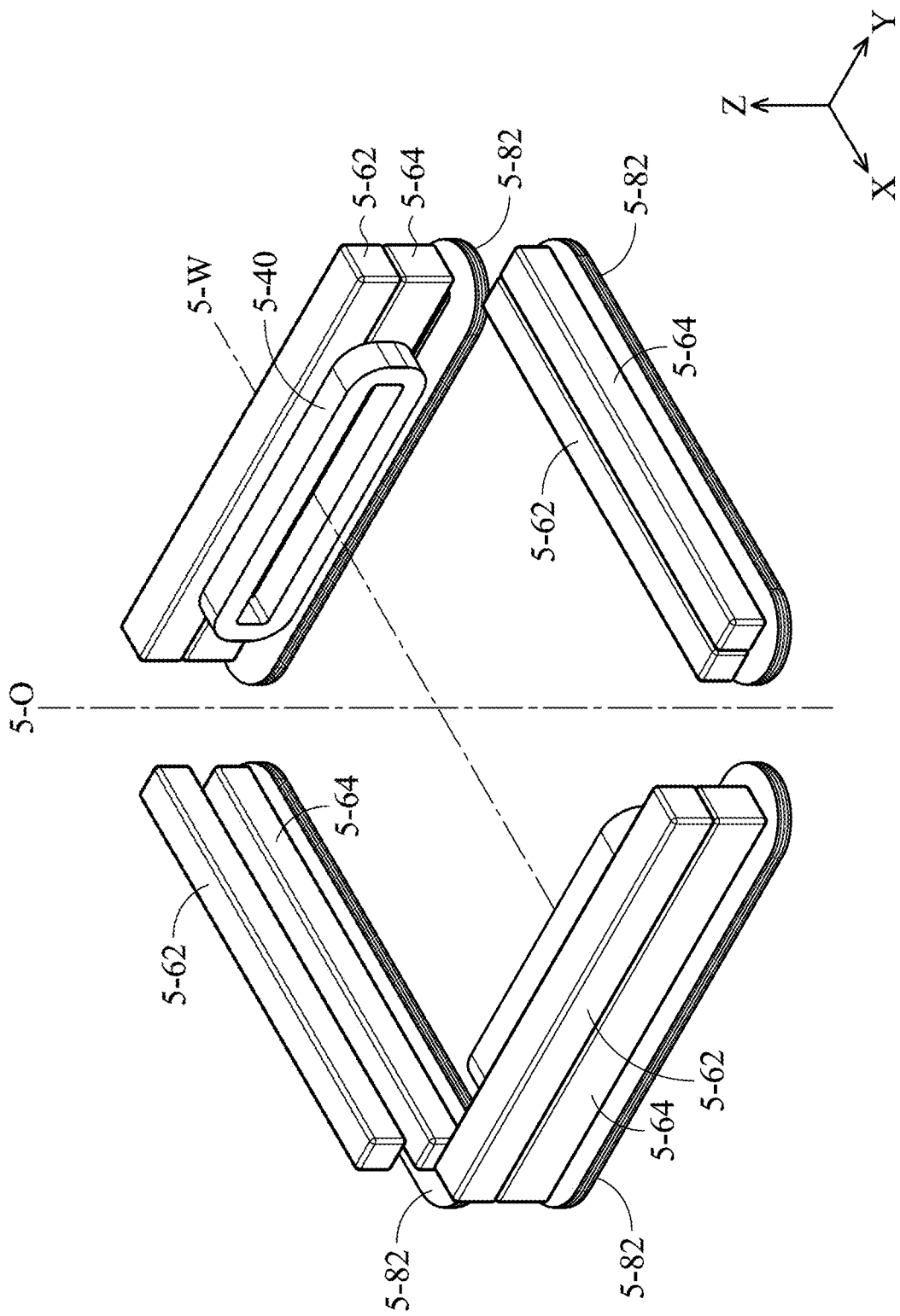
FIG. 52 is a schematic view of some elements of the optical module.

FIG. 52 is a schematic view of some elements of the optical module 5-100. A frame 5-50 is required in the optical module 5-100 to fix the magnetic elements 5-60, so a certain space may be occupied, and the frame 5-50 may cause the movable portion 5-M cannot be positioned corresponding to the magnetic elements 5-60 in a correct position when the movable portion 5-M moved a certain distance. Furthermore, magnetic pole reversal may happen at the lower portion of the optical module 5-100 (the portion adjacent to a light exit side 5-P2, −Z direction), which causes the movable portion 5-M cannot be driven, and the movable distance of the movable portion is limited. As a result, in some embodiments, as shown in FIG. 51, a center 5-C1 of the holder 5-30 may be closer to a light incident side 5-P1 (away from the light exit side 5-P2) than a center 5-C2 of the first driving coils 5-40 in Z direction to ensure the holder 5-30 has enough space to be combined with the optical element (not shown), and the mechanical strength of the optical module 5-100 may also be enhanced.

It should be noted that in FIG. 52, the axis 5-W of the first driving coils 5-40 have a different extending direction to the optical axis 5-O in this embodiment, and the first driving coils 5-40 may be capsule-shaped coils to allow the center 5-C1 of the holder 5-30 being closer to the light incident side 5-P1 (away from the light exit side 5-P2) than the center 5-C2 of the first driving coils 5-40. As a result, the movable portion 5-M may be moved closer to the light incident side 5-P1. Moreover, the size of the first magnetic elements 5-62 or the second magnetic elements 5-64 may be increased to increase the driving force of the driving assembly 5-D.

In some embodiments, the magnetic pole directions of the first magnetic elements 5-62 and the second magnetic elements 5-64 may be designed to be perpendicular to the optical axis 5-O. For example, as shown in FIG. 51, the magnetic pole direction 5-D1 of the first magnetic element 5-62 is oriented in the −X direction, the magnetic pole direction 5-D2 of the second magnetic element 5-64 is oriented in the X direction, and both of the magnetic pole directions 5-D1 and 5-D2 are perpendicular to the optical axis 5-O (Z direction). Furthermore, in some embodiments, the position of the first magnetic element 5-62 may be designed to be closer to the optical incident side 5-P1 than the second magnetic element 5-64 to achieve miniaturization, as shown in FIG. 51.

Furthermore, the magnetic elements 5-60 may be designed to be asymmetric to allow the design of the optical module 5-100 becoming more flexible in some embodiments. For example, as shown in FIG. 51, the magnetic elements 5-60 include first magnetic elements 5-62 and second magnetic elements 5-64, wherein the second magnetic elements 5-64 may correspond to the second driving coils 5-82. The height 5-L1 of the first magnetic element 5-62 may be different than the height 5-L2 of the second magnetic elements 5-64 along the optical axis 5-O (Z direction). In some embodiments, the height 5-L1 may be designed to be smaller than the height 5-L2 to further increase the performance of the optical module 5-100. Furthermore, in some embodiments, as shown in FIG. 52, the first magnetic elements 5-62 and the second magnetic elements 5-64 may be aligned in a direction identical to the optical axis 5-O, or the first magnetic elements 5-62 and the second magnetic elements 5-64 may be aligned in a different direction than the optical axis 5-O to meet the driving force requirement in different directions.

Figure 53:
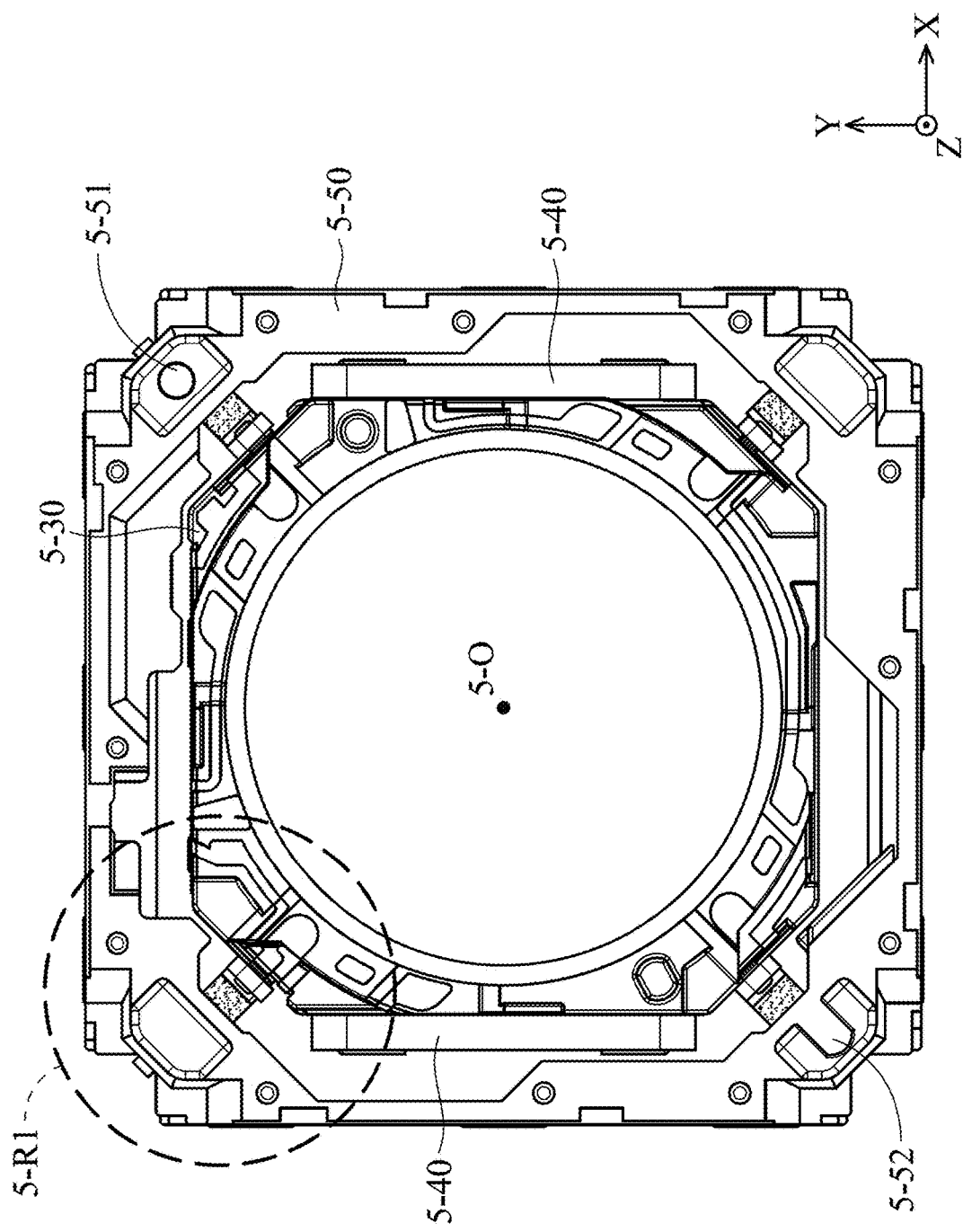
FIG. 53 is a top view of some elements of the optical module.
Figure 54:
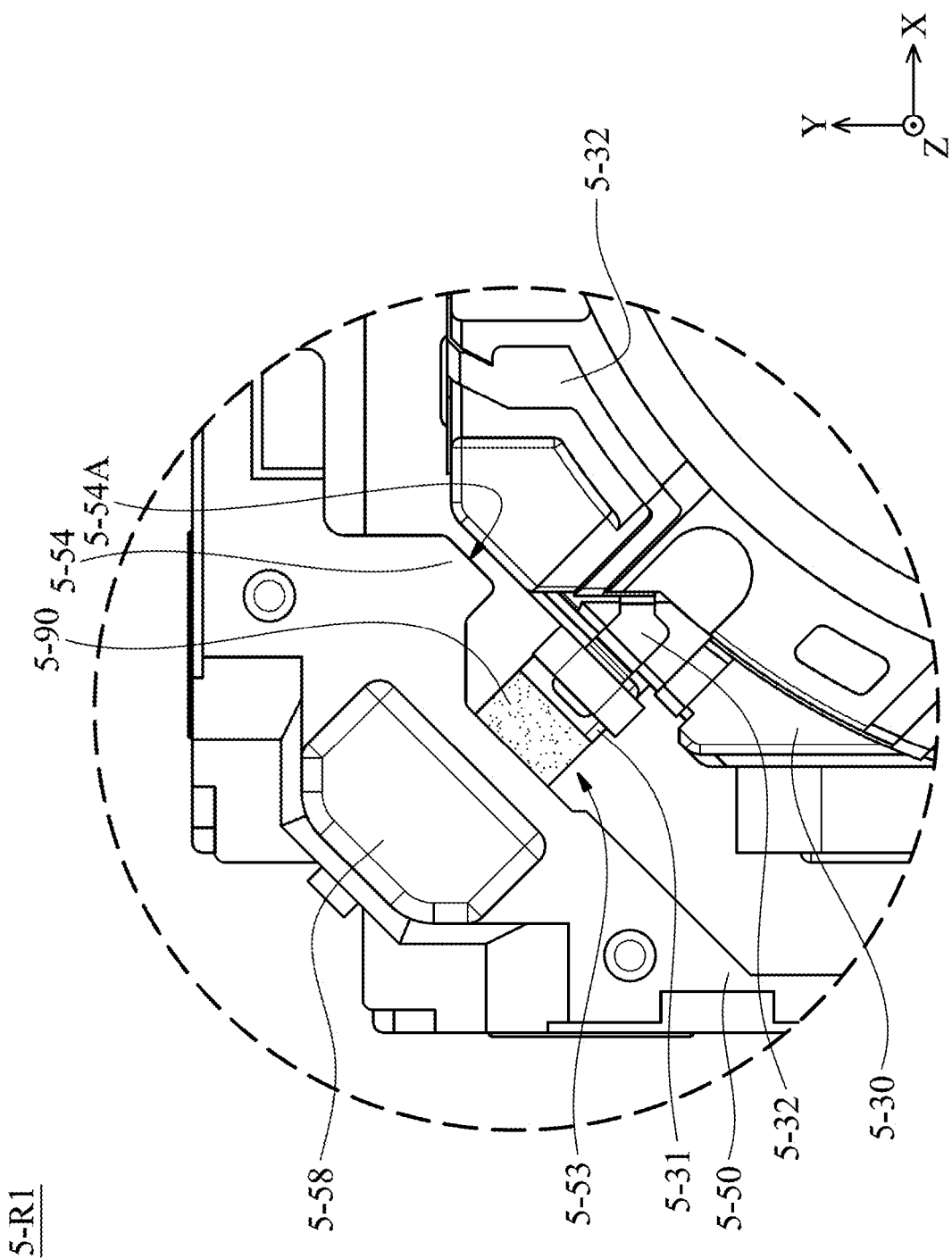
FIGS. 54 and 55 are enlarged views of the region 5-R1 in FIG. 53 viewed in different directions.
Figure 55:
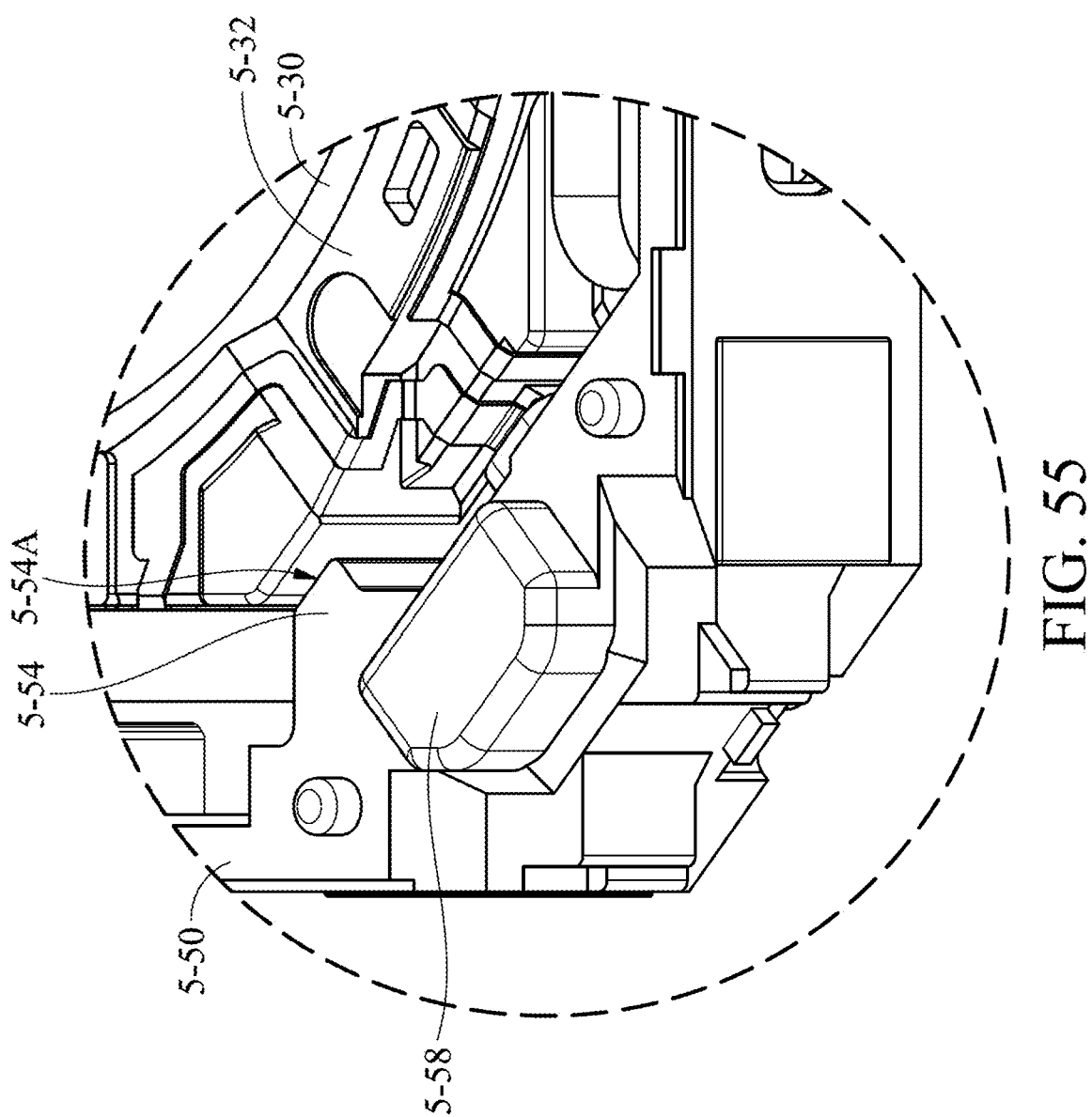

FIG. 53 is a top view of some elements of the optical module 5-100, and FIGS. 54 and 55 are enlarged views of the region 5-R1 in FIG. 53 viewed in different directions. As shown in FIGS. 53 to 55, electrical connecting protrusions 5-31 may be provided on the holder 5-30, and a stereo circuit 5-32 may be disposed on the holder 5-30 in some embodiments to facilitate the electrical connection of the driving assembly 5-D (such as including the first driving coils 5-40, the magnetic elements 5-60 and the second driving coils 5-82, etc.). For example, a portion of the first driving coil 5-40 is wound on the electrical connecting protrusion 5-31 to be electrically connected to other element of the optical module 5-100 through the stereo circuit 5-32. The electrical connecting protrusions 5-31 may position at the corners of the optical module 5-100 and extend in different directions (such as extended to the corners of the optical module 5-100) to utilize the space at the corners of the optical module 5-100, therefore the optical module 5-100 may be further miniaturized. Furthermore, a stopping portion 5-54 may be provided on the frame 5-50 corresponding to the surrounding of the electrical connecting protrusions 5-31, and the stopping portion 5-54 has a surface 5-54A facing the holder 5-30 to restrict the movable range of the holder 5-30, so the electrical connection protrusions 5-31 may be prevented from contacting other portions of the frame 5-50 to avoid damage.

In general, if more than one driving assemblies (such as the combination of a magnetic element and a driving coil) is desired to be disposed in the optical module, a connecting wire is required to connect different driving assemblies. However, the connecting wire is weak and need a large space. In this embodiment, if more than one driving assemblies 5-D is required in the optical module, the driving assemblies 5-D may be connected by the electrical connecting protrusions 5-31 and the stereo circuit 5-32 on the holder 5-30 to avoid the problems caused by the additional connecting wire. In some embodiments, there are at least two electrical connection portions 5-31 and at least two driving coils 5-40 in the optical module 5-100. A portion of each of the driving coils 5-40 is wound on one of the electrical connecting protrusions 5-31, and the driving coil 5-40 is electrically connected to the fixed portion 5-F (such as the base 5-20 or the circuit board 5-80) to further increase the driving force. In this condition, an additional circuit element 5-24 may be disposed in the base 5-20 (such as embedded in the base 5-20) to allow the driving coil 5-40 electrically connected to other external elements through the circuit element 5-24. Furthermore, heat dissipating holes 5-26 may be provided on the base 5-20 to dissipate the heat generated from the circuit element 5-24 during operation.

Moreover, a damping element 5-90 may be disposed on a position 5-53 for the damping element between the frame 5-30 and the frame 5-50 to stabilize the holder 5-30, preventing any unnecessary vibration from occurring during operation of the holder 5-30. Furthermore, the damping element 5-90 is also disposed on the electrical connecting protrusion 5-31 to achieve miniaturization. The damping element 5-90 may be an element such as gel which can absorb vibration.

In some embodiments, as shown in FIG. 53, a positioning portion 5-51 and a positioning portion 5-52 may be provided on the frame 5-50 to position the frame 5-50 when assembling the frame with other elements. For example, the shapes of the positioning portion 5-51 and the positioning portion 5-52 may be different for error proof during assembly. In some embodiments, as shown in FIG. 53, the positioning portion 5-51 may be circular and the positioning portion 5-52 may be strip-shaped when viewed along the optical axis 5-O to prevent the problem caused by the manufacture tolerance of the elements.

Figure 56:
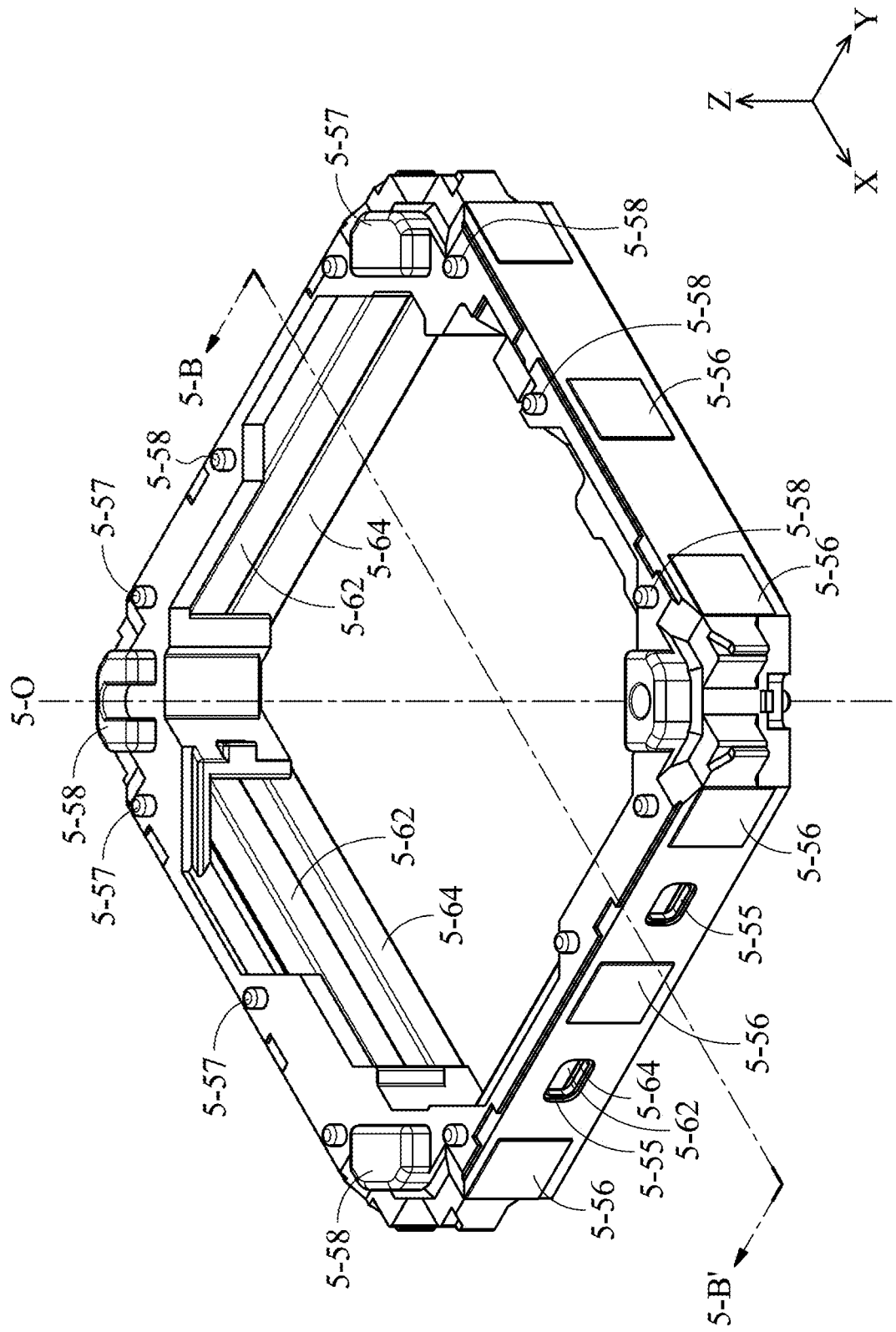
FIG. 56 is a schematic view of some elements of the optical module.
Figure 57:
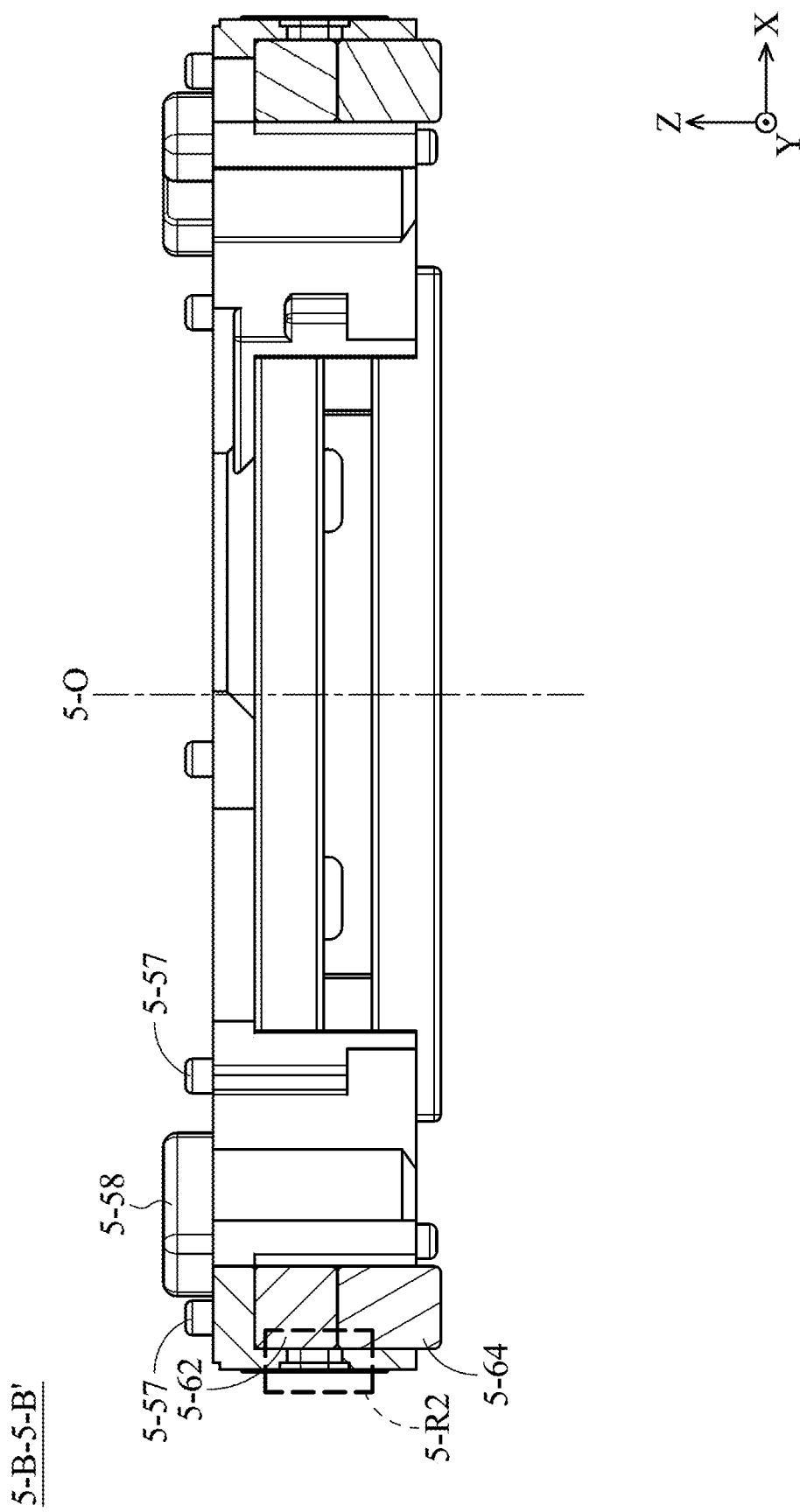
FIG. 57 is a cross-sectional view illustrated along line 5-B-5-B' in FIG. 56.
Figure 58:
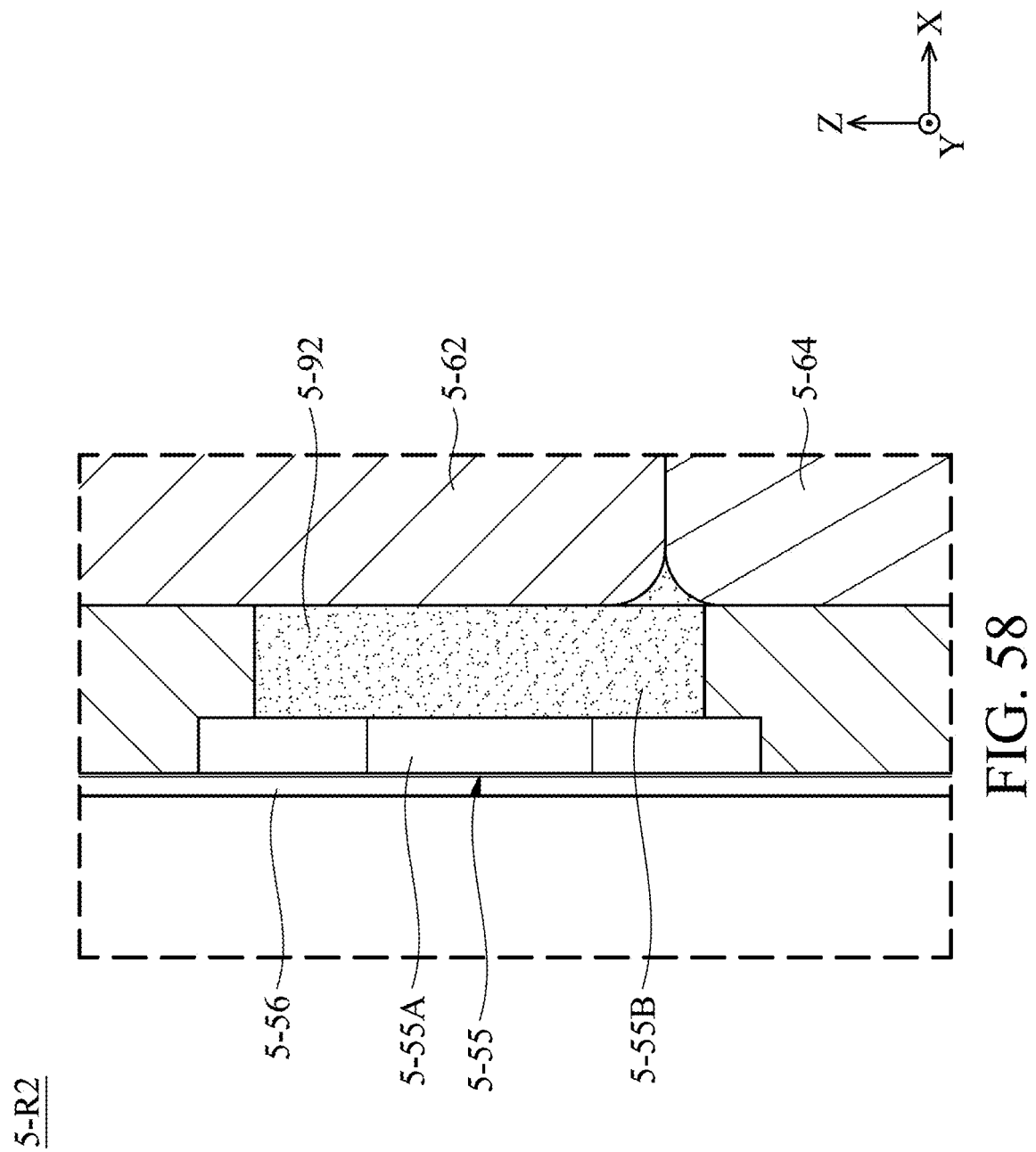
FIG. 58 is an enlarged view of the region 5-R2 in FIG. 57.

FIG. 56 is a schematic view of some elements of the optical module, FIG. 57 is a cross-sectional view illustrated along line 5-B-5-B' in FIG. 56, and FIG. 58 is an enlarged view of the region 5-R2 in FIG. 57. In some embodiments, as shown in FIGS. 56 to 58, openings 5-55 may be provided on the frame 5-50, and an adhesive element 5-92 may be provided in the opening 5-55 (FIG. 58) to fix the relative position of the frame 5-50 and a portion of the driving assembly 5-D (such as the first magnetic element 5-62 and/or the second magnetic element 5-62). The optical axis 5-O does not pass through the openings 5-55, and the openings 5-55 may increase the contact area between the adhesive element 5-92 and the frame 5-50, and the adhesive element 5-92 may be provided on the frame 5-50 from the outer side of the frame 5-50 (the side away from the optical axis 5-O) to simplify the assembly steps of the optical module 5-100. The driving assembly 5-D is disposed on the side of the frame 5-50 facing the optical axis 5-O (inner side), so the opening 5-55 may be farther from the optical axis 5-O than the driving assembly 5-D (such as the first magnetic element 5-62 and the second magnetic element 5-64). In other words, the distance between the opening 5-55 and the optical axis 5-O may be greater than the distance between the driving assembly 5-D and the optical axis 5-O.

Furthermore, a plurality of protrusions 5-56 may be provided on the sidewall of the frame 5-50, and the protrusions 5-56 extend toward the outer case 5-10 (a portion of the fixed portion 5-F) to be the portion of the frame 5-50 that contacts the outer case 5-10, so the moving range of the frame 5-50 may be limited to prevent the frame 5-50 from moving too much and damaging the optical module 5-100. As a result, the shortest distance between the protrusion 5-56 and the outer case 5-10 may be less than the shortest distance between the opening 5-55 and the outer case 5-10. As a result, if the outer case 5-10 collides with the frame 5-50, it can be ensured that it is the protrusions 5-56 colliding with the outer case 5-10 rather than other portions of the frame 5-50. Furthermore, the protrusions 5-56 may prevent the adhesive element 5-92 in the openings 5-55 from coming into direct contact with the outer case 5-10. In some embodiments, there are at least two protrusions 5-56, and the opening 5-55 may be disposed between the protrusions 5-56 to further utilize the space of the frame 5-50.

As shown in FIG. 58, the opening 5-55 may be wider at the outer side and be narrower at the inner side (such as have a stepped shape) in a cross-sectional view, wherein the width (such as the size in the Z direction) at the side away from the optical axis 5-O is greater. The adhesive element 5-92 may be disposed on the portion 5-55B of the opening 5-55 with a smaller width, and the portion 5-55A of the opening 5-55 with a greater width may be utilized to prevent the adhesive element 5-92 from overflowing to the outside of the opening 5-55, so the position of the adhesive element 5-92 may be controlled. Furthermore, the fixing strength between the frame 5-50 and the magnetic element 5-60 may be further increased by the design of the opening 5-55 (having a wider shape at the outer side and a narrower shape at the inner side), such as using a hook configuration to fix the frame 5-50 and the magnetic element 5-60. Moreover, in a direction that is perpendicular to the optical axis 5-O (X direction), the opening 5-55 partially overlaps the first magnetic element 5-62 and the second magnetic element 5-64 to allow the adhesive element 5-92 disposed in the opening 5-55 to come into contact with the first magnetic element 5-62 and the second magnetic element 5-64 at the same time.

Figure 59:
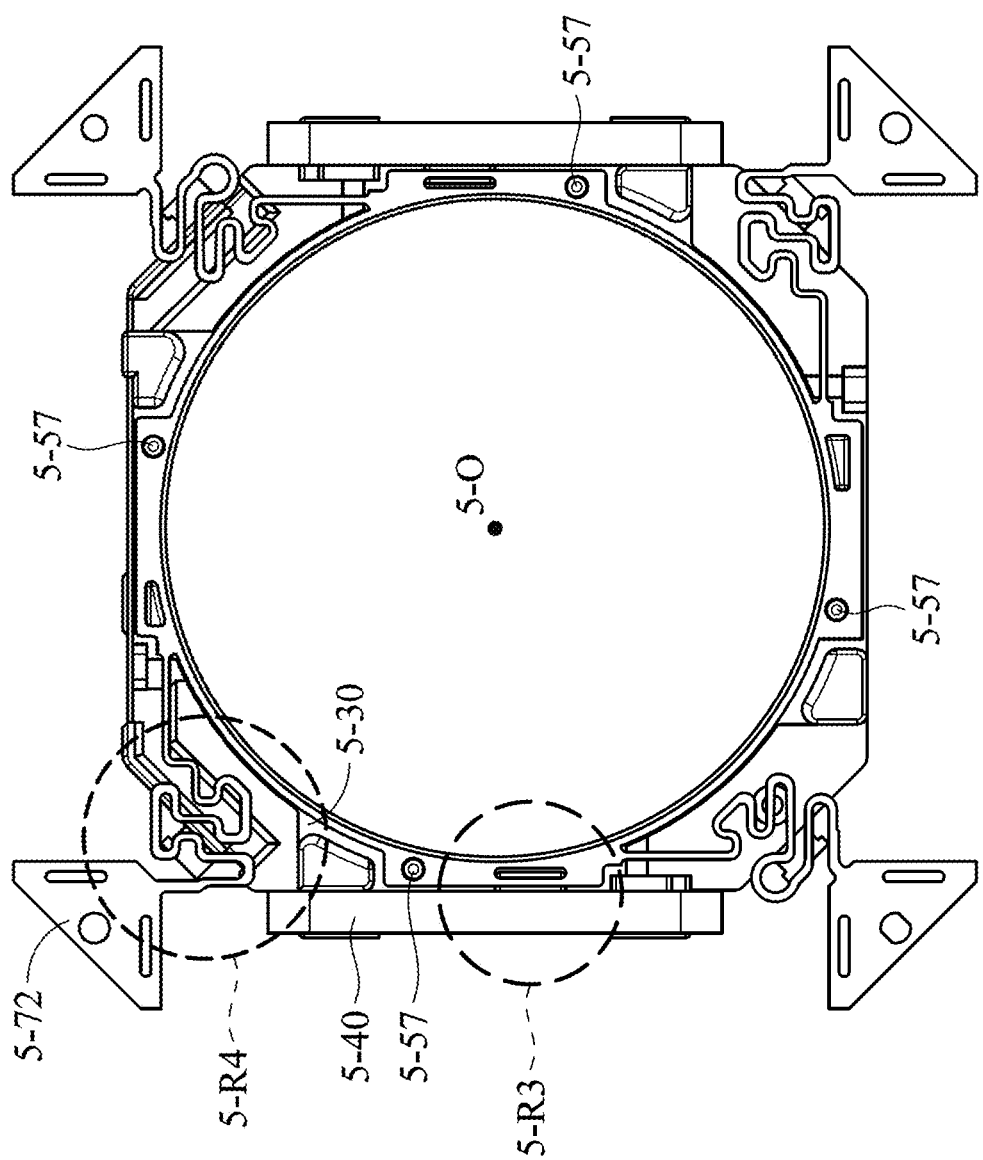
FIG. 59 is a bottom view of some elements of the optical module in some embodiments of the present disclosure.

FIG. 59 is a bottom view of some elements of the optical module 5-100 in some embodiments of the present disclosure, and FIGS. 60 and 61 are enlarged views of the region 5-R3 in FIG. 59. Additional adhesive material 5-94 is shown in FIG. 61 but not shown in FIG. 60. A recess 5-33 that is concave in the optical axis 5-O direction may be provided on the holder 5-30 for corresponding to the driving assembly 5-D and the plate-shaped second resilient element 5-72 (or the first resilient element 5-70) at the same time. As a result, as shown in FIG. 61, the adhesive material 5-94 contacts three elements (the holder 5-30, the first driving coil 5-40 and the second resilient element 5-72) at the same time to fix their relative position. It should be noted that the direction of the axis 5-W (X direction) of the first driving coil 5-40 (FIG. 52) is different than the thickness direction of the second resilient element 5-72 (Z direction). As a result, miniaturization may be achieved and the assembly steps may be simplified.

Figure 62:
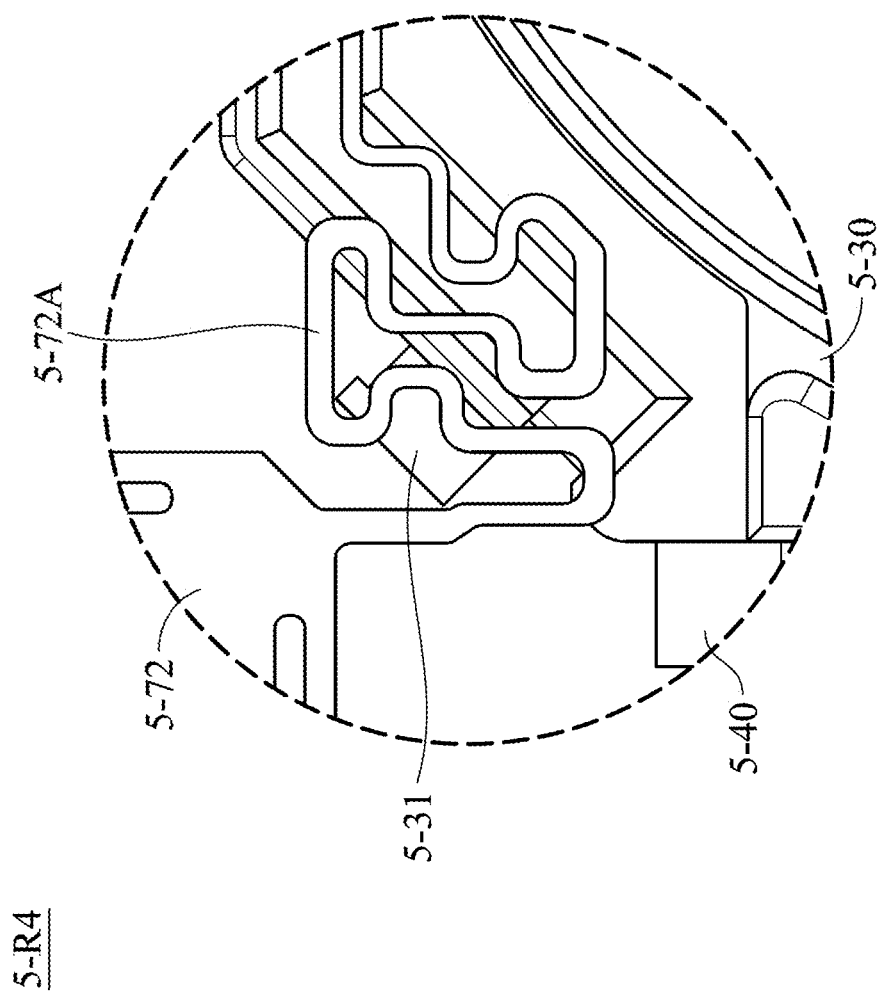
FIG. 62 is an enlarged view of the region 5-R4 in FIG. 59.

FIG. 62 is an enlarged view of the region 5-R4 in FIG. 59. As shown in FIG. 62, the string portion 5-72A of the second resilient element 5-72 may partially overlap the electrical connecting protrusion 5-31 in the optical axis direction to reduce the distance required for electrical connection, so miniaturization may be achieved.

In some embodiments, positioning columns 5-57 may be provided on the frame 5-50, and the first resilient element 5-70 or the second resilient element 5-72 may have holes corresponding to the positioning columns 5-57 to fix the relative position of the frame 5-50 to the first resilient element 5-70 or the second resilient element 5-72 during the assembly steps of the optical module 5-100, as shown in FIG. 59. Furthermore, a stopping portion 5-58 may be provided on the corner of the frame 5-50 and extending in the Z direction from the frame 5-50. By providing the stopping portion 5-58 at the corner of the frame 5-50, the movable range of the holder 5-30 and the frame 5-50 may be limited to prevent other portions of the holder 5-30 and the frame 5-50 from colliding with other elements.

Figure 63:
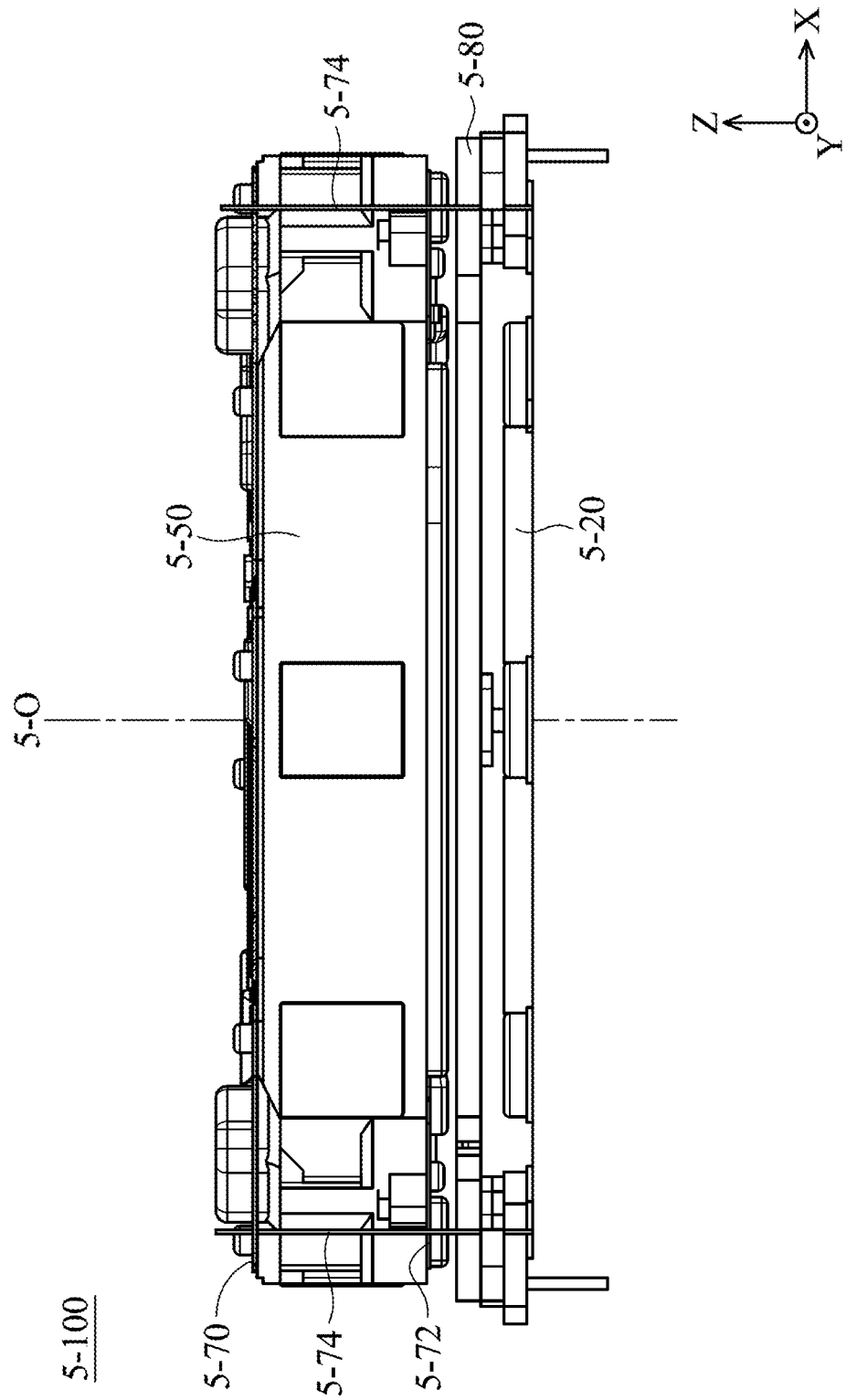
FIG. 63 is a side view of some elements of the optical element in some embodiments of the present disclosure.
Figure 64:
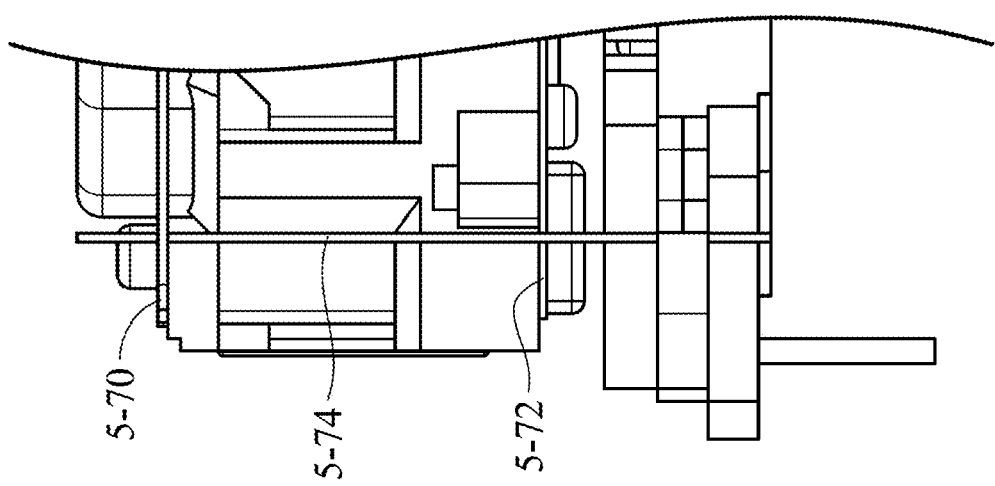
FIG. 64 is an enlarged view of FIG. 63.
Figure 65:
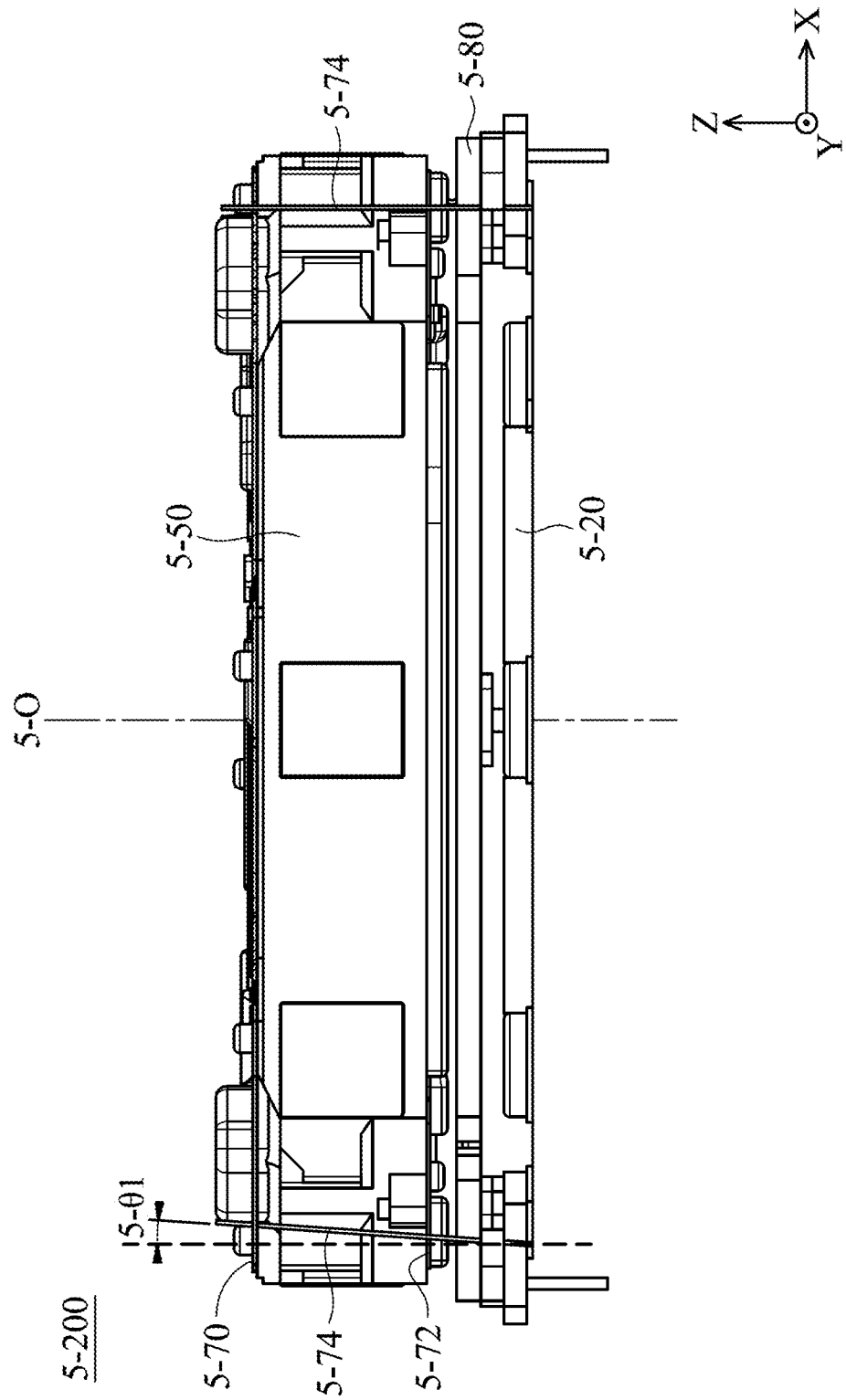
FIG. 65 is a side view of some elements of the optical element in some embodiments of the present disclosure.
Figure 66:
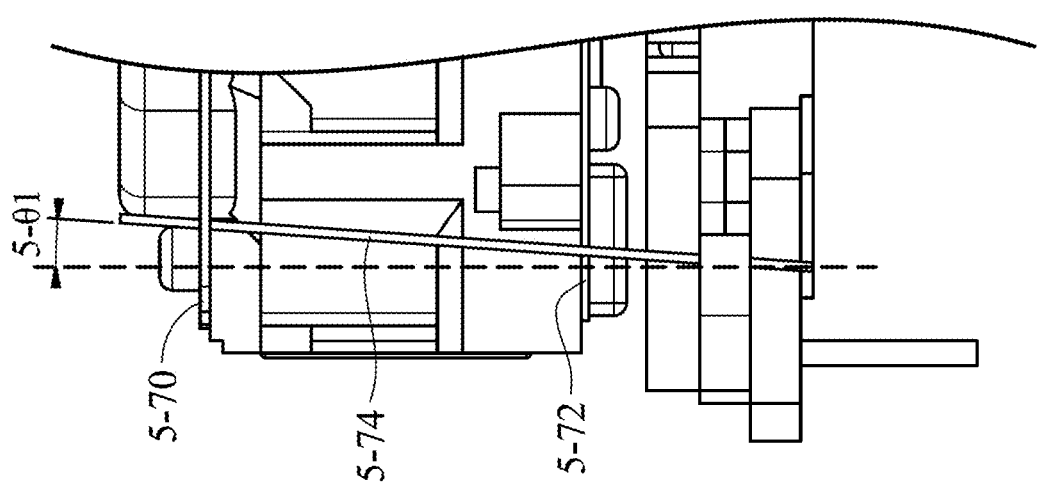
FIG. 66 is an enlarged view of FIG. 65.
Figure 67:
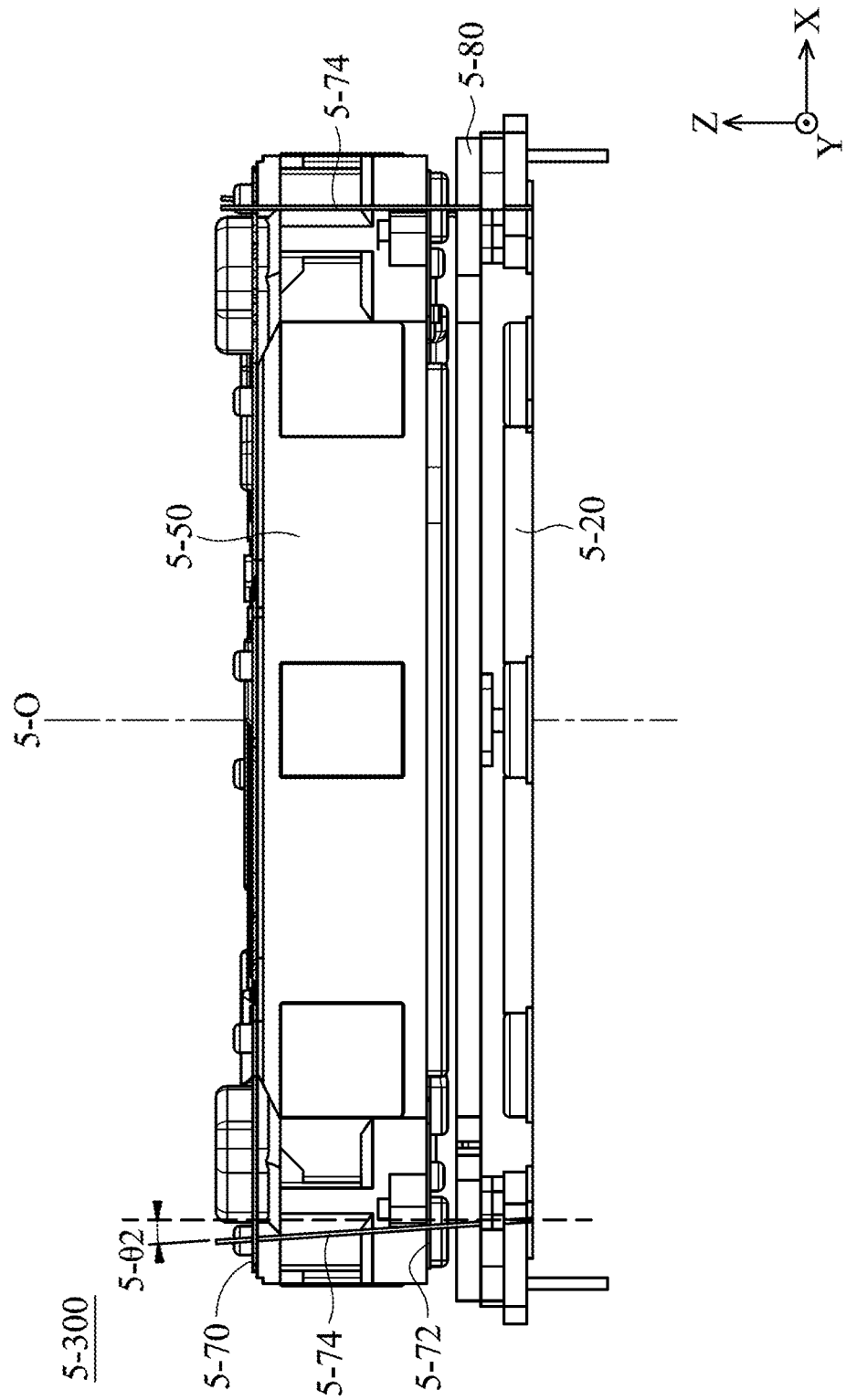
FIG. 67 is a side view of some elements of the optical element in some embodiments of the present disclosure.
Figure 68:
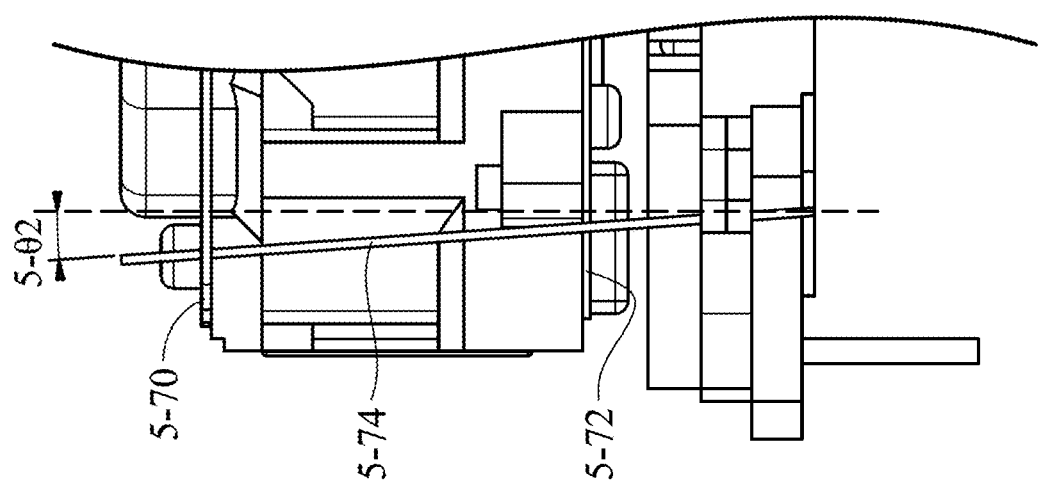
FIG. 68 is an enlarged view of FIG. 67.

Refer to FIGS. 63 to 68, wherein FIGS. 63, 65 and 67 are side views of some elements of the optical modules 5-100, 5-200 and 5-300 in some embodiments of the present disclosure, and FIGS. 64, 66 and 68 are enlarged views of FIGS. 63, 65 and 67, respectively. In FIGS. 63 and 64, the third resilient element 5-74 of the optical module 5-100 extends in a direction that is substantially parallel to the optical axis 5-O and connects to the first resilient element 5-70 and the second resilient element 5-72. However, the present disclosure is not limited thereto. In FIGS. 65 to 68, the distance between the two connecting points of the third resilient elements 5-74 and the first resilient element 5-70 is different than the distance between the two connecting points of the third resilient elements 5-74 and the second resilient element 5-72. For example, in FIG. 65, the distance between the two connecting points of the third resilient elements 5-74 and the first resilient element 5-70 of the optical module 5-200 is less than the distance between the two connecting points of the third resilient elements 5-74 and the second resilient element 5-72 of the optical module 5-200 and FIG. 67, and the distance between the two connecting points of the third resilient elements 5-74 and the first resilient element 5-70 of the optical module 5-300 is greater than the distance between the two connecting points of the third resilient elements 5-74 and the second resilient element 5-72 of the optical module 5-300. In other words, the third resilient element 5-74 may tilt toward or away from the optical axis 5-O. In some embodiments, the angle that the third resilient element 5-74 can tilt (such the angle 5-O1 in FIG. 66 or the angle 5-O2 in FIG. 68) may be between +10 degrees to −10 degrees to enhance the design flexibility.

Figure 69:
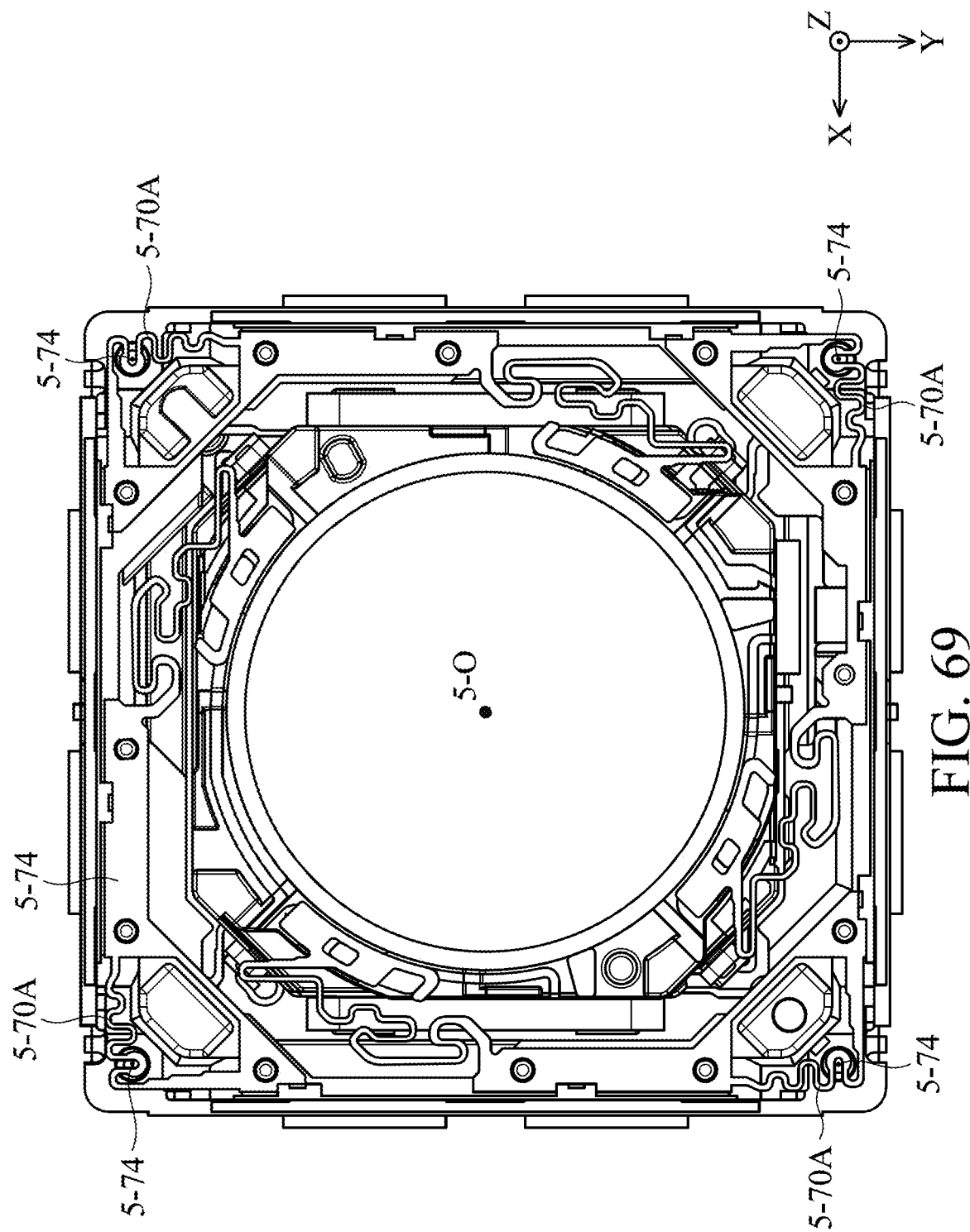
FIG. 69 is a top view of the optical module in some embodiments of the present disclosure.

FIG. 69 is a top view of an optical module (such as the optical modules 5-100, 5-200 or 5-300) in some embodiments of the present disclosure. In order to allow the third resilient element 5-74 tilting, a recessed portion facing to outer side (away from the optical axis 5-O) may be provided on the string portion 5-70A at the corner of the first resilient element 5-70 to allow the third resilient element 5-74 moves at the recessed portion of the string portion 5-70A. Furthermore, as shown in FIG. 69, the recessed portions of the string portions 5-70A at four corners may be oriented in different directions to balance the stress that the first resilient element 5-70 withstands.

In summary, an optical module is provided in the present disclosure, which has a first magnetic element and a second magnetic element with different sizes along the optical axis. As a result, the design flexibility of the optical module may be enhanced, miniaturization may be achieved, and the driving force of the optical module may be increased.

Figure 70:
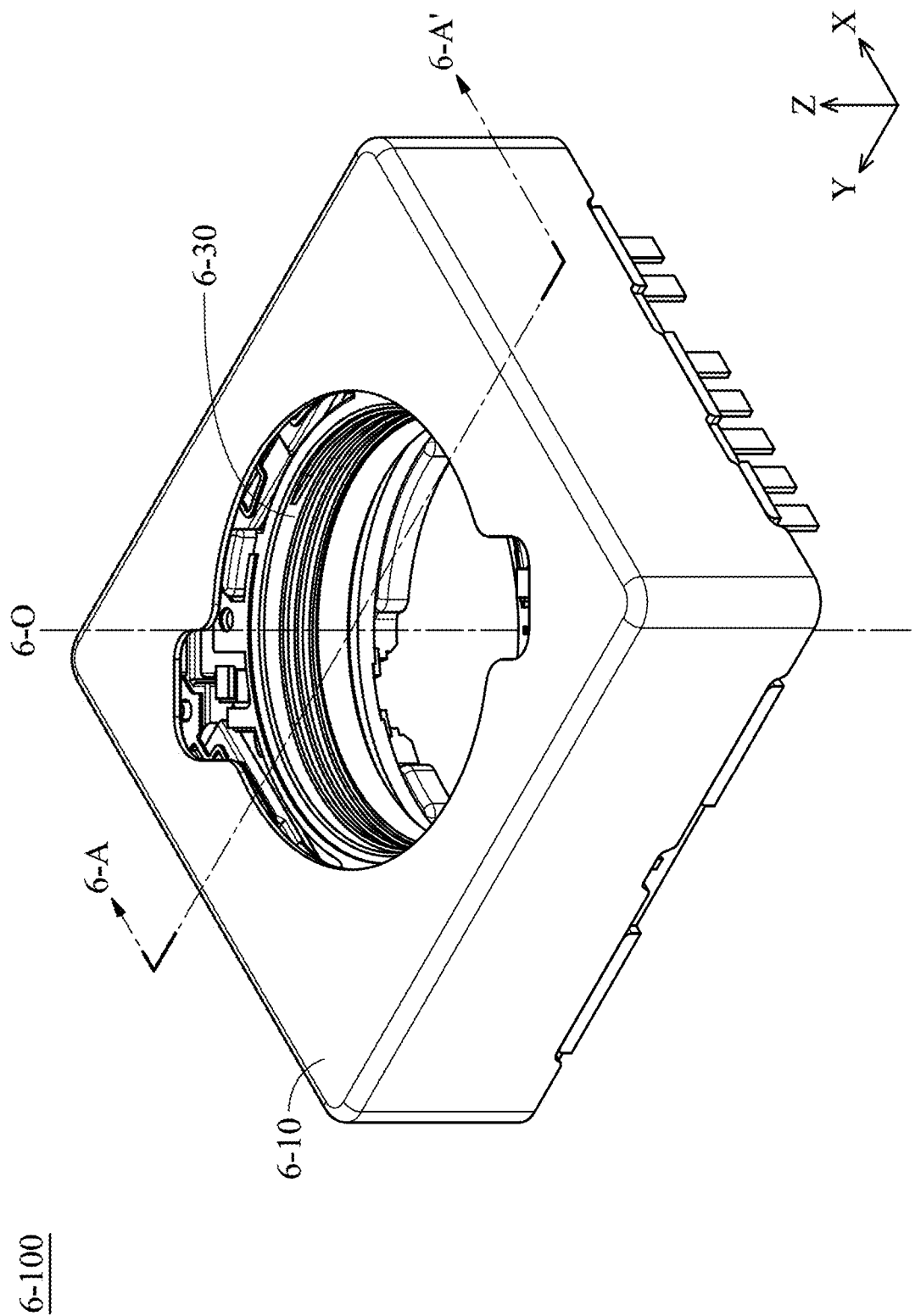
FIG. 70 is a schematic view of a driving mechanism according to some embodiments of the present disclosure.
Figure 71:
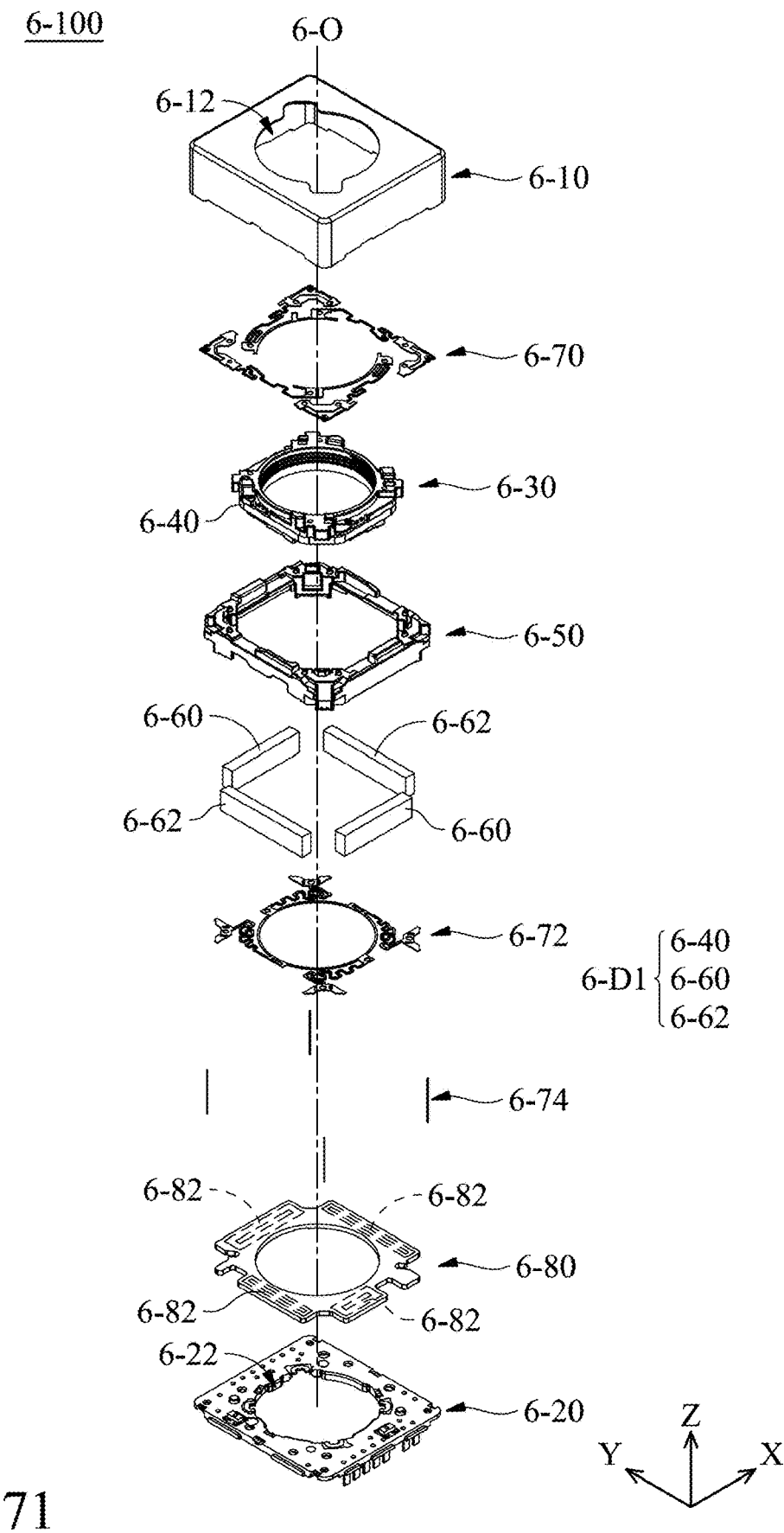
FIG. 71 is an exploded view of a driving mechanism according to some embodiments of the present disclosure.
Figure 72:
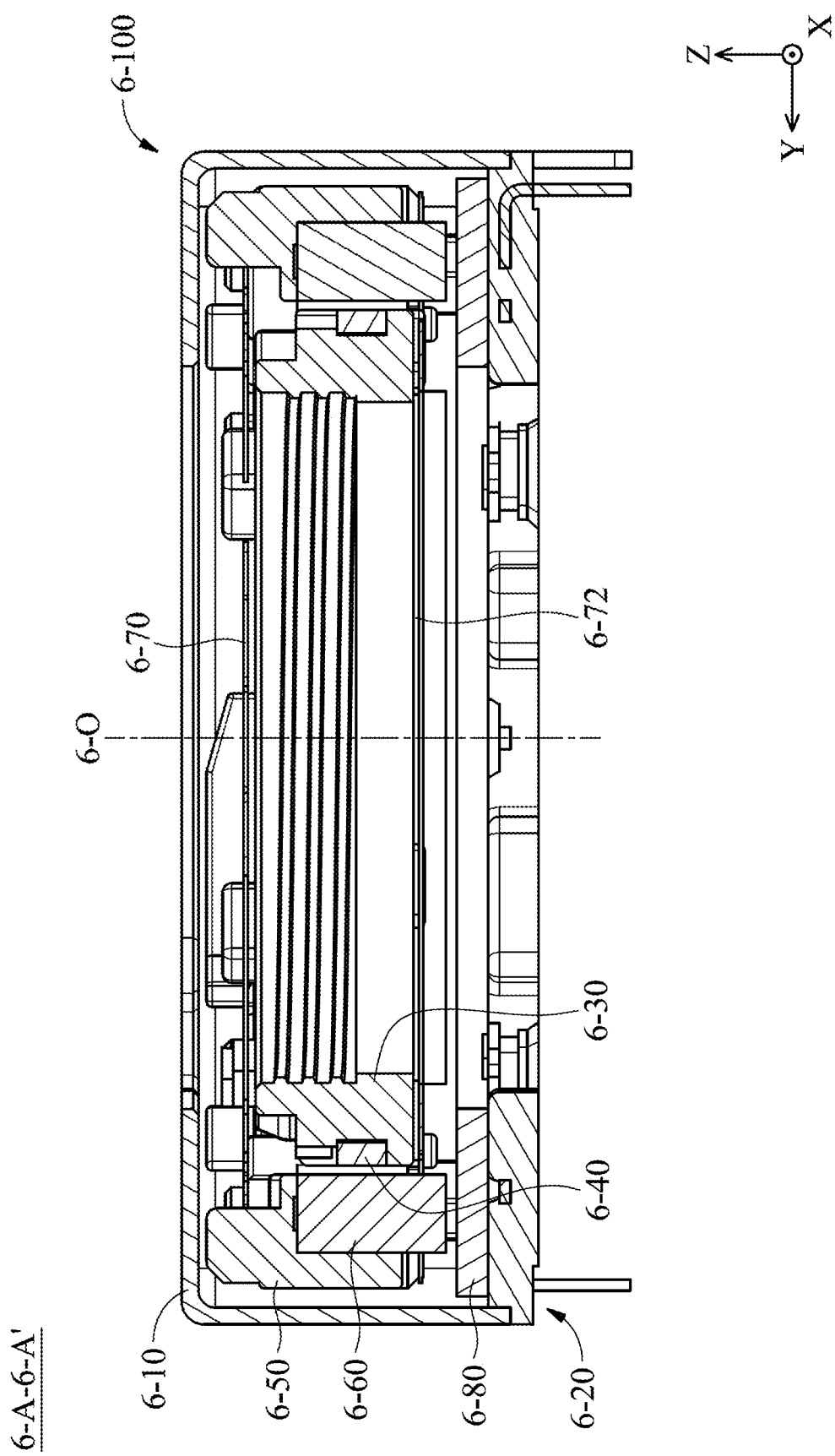
FIG. 72 is a cross-sectional view illustrated along a line 6-A-6-A' in FIG. 70.

FIG. 70 is a perspective view of a driving mechanism 6-100 according to an embodiment of the present disclosure, FIG. 71 is an exploded view of the driving mechanism 6-100 in FIG. 70, and FIG. 72 is a cross-sectional view illustrated along line 6-A-6-A' in FIG. 70. As shown in FIGS. 70 to 72, the driving mechanism 6-100 mainly includes an outer case 6-10, a base 6-20, a holder 6-30, a first driving assembly 6-D1 (includes a first driving coil 6-40, a plurality of first magnetic elements 6-60 and a plurality of second magnetic elements 6-62), a frame 6-50, a first resilient element 6-70, a second resilient element 6-72, a group of suspension wires 6-74, and a circuit board 6-80 in this embodiment. The driving mechanism 6-100 may drive an optical element (not shown) to move to achieve auto focus (AF) or optical image stabilization (OIS).

The outer case 6-10 can be combined with the base 6-20 to form housing for the driving mechanism 6-100. It should be noted that an outer case opening 6-12 and a base opening 6-22 are respectively formed on the outer case 6-10 and the base 6-20. The center of the outer case opening 6-12 is located at an optical axis of the optical element (not shown). The base opening 6-22 corresponds to an image sensor (not shown) placed outside the driving mechanism 6-100. Accordingly, the lens in the driving mechanism 6-100 can perform image focusing in the direction of the optical axis 6-O with the image sensor.

The holder 6-30 has a through hole, wherein the optical element can be fixed in the through hole. The first driving coil 6-40 is wound around the outer surface of the holder 6-30. The frame 6-50 has an opening 6-52, wherein the first magnetic elements 6-60 are affixed to the frame 6-50 or may move relative to the frame 6-50. It should be noted that a magnetic force may be generated by the interaction between the first magnetic elements 6-60 and the first driving coil 6-40 to move the holder 6-30 relative to the frame 6-50 along the optical axis O, thereby achieving fast focusing.

In this embodiment, the holder 6-30 and the optical element therein are movably disposed in the frame 6-50. More specifically, the holder 6-30 is suspended in the frame 6-50 by the first resilient element 6-70 and the second resilient element 6-72 made of a metal material (FIG. 72). When a current is supplied to the first driving coil 6-40, the first driving coil 6-40 can act with the magnetic field of the first magnetic elements 6-60 to generate an electromagnetic force to move the holder 6-30 and the lens therein along the optical axis direction with respect to the frame 6-50 to achieve auto focusing.

The circuit board 6-80, such as a flexible printed circuit board (FPC), is fixed to the base 6-20 by adhesion, for example. In this embodiment, the circuit board 6-80 is electrically connected to electronic elements inside or outside the driving mechanism 6-100 to perform auto focus, optical image stabilization, etc. The circuit board 6-80 may also transmit electrical signal to the first driving coil 6-40 through the suspension wires 6-74 and the first resilient element 6-70 to control the movement of the holder 6-30 on X-axis, Y-axis or Z-axis. Moreover, as shown in FIG. 71, a plurality of second driving coils 6-82 may be embedded in the circuit board 6-80 to interact with the first magnetic element 6-60 or the second magnetic element 6-62 for driving the holder 6-30 to move.

One end of the four suspension wires 6-74 is fixed to the circuit board 6-80 and the other end is connected to the first resilient element 6-70, so that the frame 6-50 and the lens holder 6-30 can be suspended in the top case 6-10 by suspension wires 6-74. The suspension wires 6-74 may include a metal material.

Figure 73:
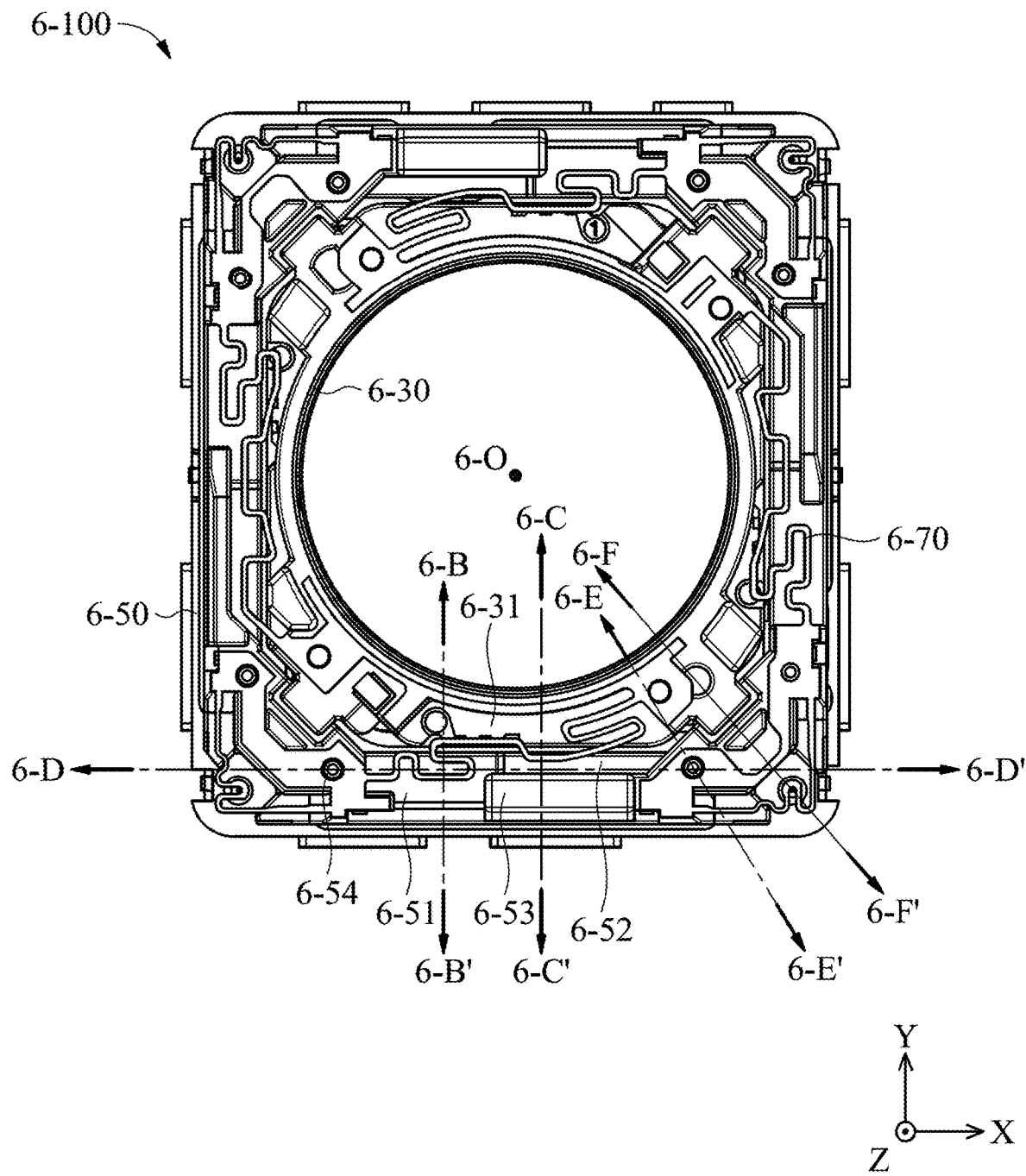
FIG. 73 is a top view of some elements of the driving mechanism in some embodiments of the present disclosure.
Figure 74:
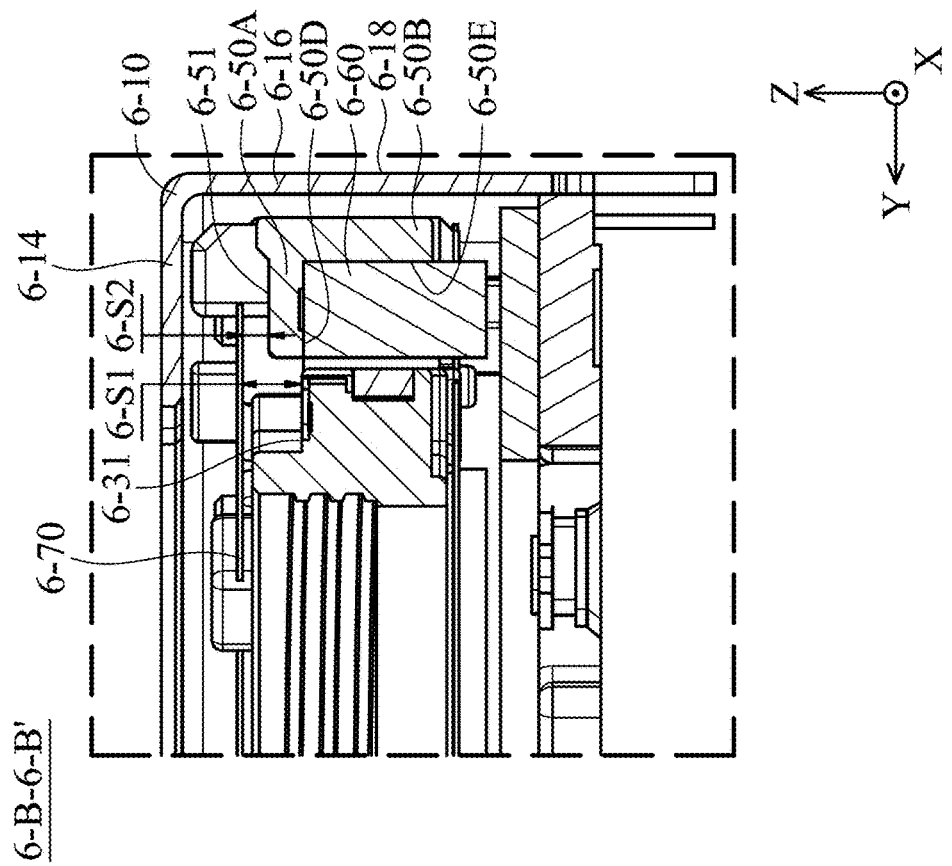
FIG. 74 is a cross-sectional view illustrated along a line 6-B-6-B' in FIG. 73.

FIG. 73 is a top view of some elements of the driving mechanism 6-100 in some embodiments of the present disclosure, and FIG. 74 is a cross-sectional view illustrated along a line 6-B-6-B' in FIG. 73. The holder 6-30 includes a first holder surface 6-31 facing the Z direction, and the frame 6-50 includes a first frame surface 6-51 facing the Z direction. In FIG. 74, the shortest distance 6-S1 between the first holder surface 6-31 and the first resilient element 6-70 is different from the shortest distance 6-S2 between the first frame surface 6-51 and the first resilient element 6-70. In some embodiments, the shortest distance 6-S1 is greater than the shortest distance 6-S2. As shown in FIG. 73, the first resilient element 6-70 partially overlaps the first holder surface 6-31 and the first frame surface 6-51 when viewed along the optical axis 6-O. In other words, both the first holder surface 6-31 and the first frame surface 6-51 face the first resilient element 6-70 but not contact the first resilient element 6-70.

Because the holder 6-30 belongs to the movable portion of the driving mechanism 6-100 (the portion which can move relative of the outer case 6-10 and the bottom 6-20), so there will be a great distance variation between the first holder surface 6-31 and the first resilient element 6-70. As a result, a gap is formed between the first holder surface 6-31 and the first resilient element 6-70, and formed between the first frame surface 6-51 and the first resilient element 6-70 to prevent collision between the holder 6-30 or the frame 6-50 to the first resilient element 6-70 from occurring at the first holder surface 6-31 and at the first frame surface 6-51, and the driving mechanism 6-100 may be miniaturized as well. The distance variation between the first holder surface 6-31 and the first resilient element 6-70 is different than the distance variation between the first frame surface 6-51 and the first resilient element 6-70 when the holder 6-30 is moving. As a result, depending on design requirements, the distance between the first holder surface 6-31 and the first resilient element 6-70 and the distance between the first frame surface 6-51 and the first resilient element 6-70 may be adjusted individually to prevent damage from occurring due to collision between the elements.

In some embodiments, when the holder 6-30 moves relative to the frame 6-50 along the optical axis 6-O, the movable distance of the holder 6-30 toward the first resilient element 6-70 (i.e. +Z direction) is different than the movable distance of the holder 6-30 away from the first resilient element 6-70 (i.e. −Z direction). For example, in some embodiments, the movable distance of the holder 6-30 in +Z direction is greater than the movable distance of the holder 6-30 in −Z direction. As a result, the performance of the driving mechanism 6-100 may be further enhanced.

Figure 75:
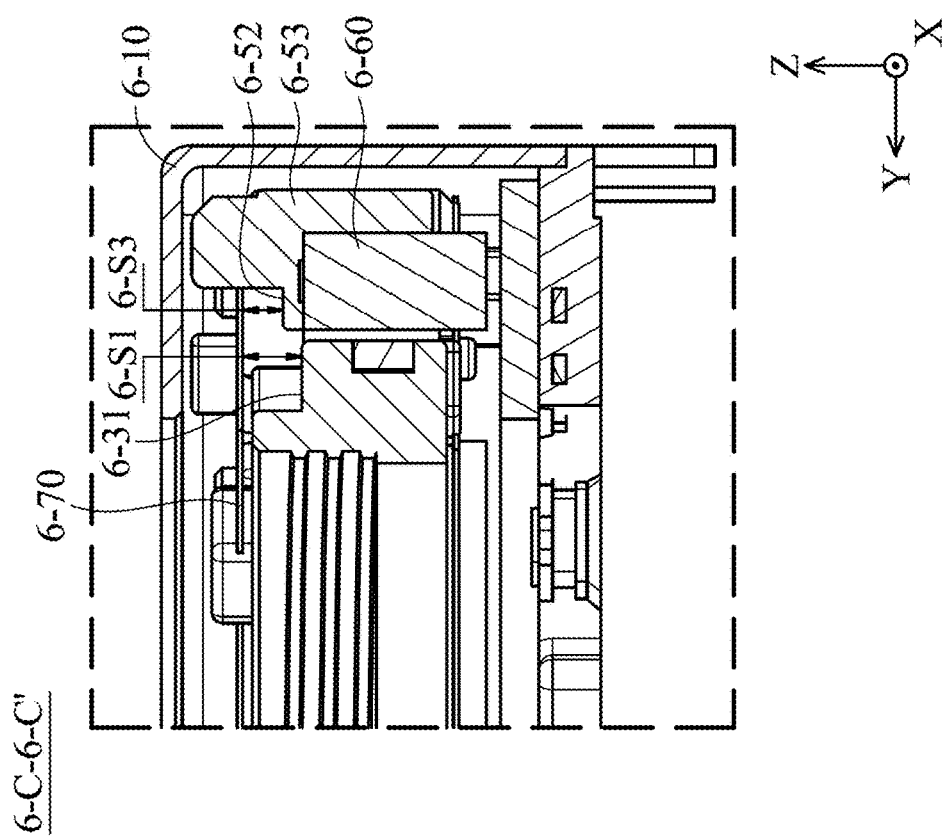
FIG. 75 is a cross-sectional view illustrated along a line 6-C-6-C' in FIG. 73.
Figure 76:
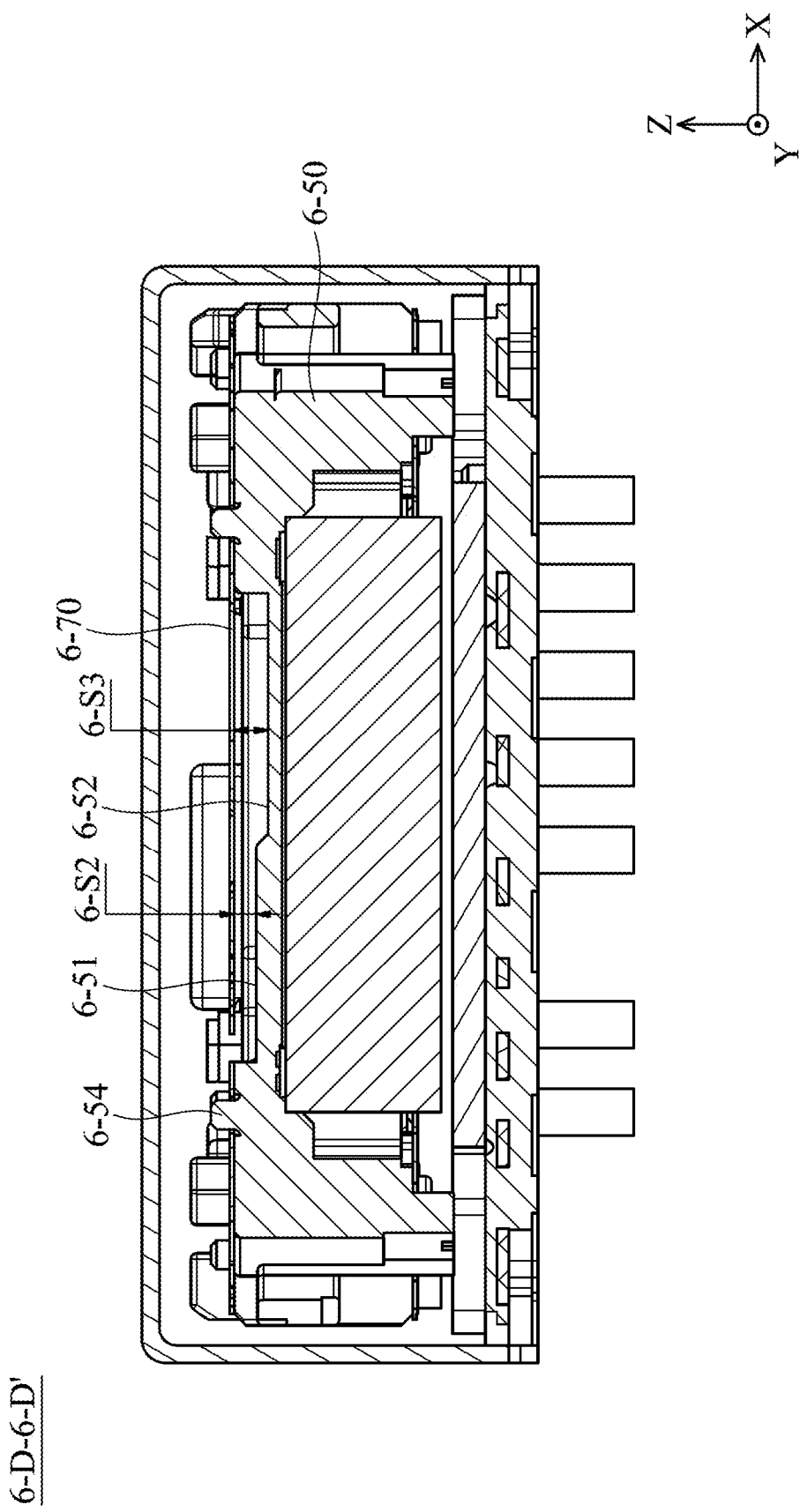
FIG. 76 is a cross-sectional view illustrated along a line 6-D-6-D' in FIG. 73.

Referring to FIGS. 73, 75 and 76, wherein FIGS. 75 and 76 are cross-sectional views of the driving mechanism 6-100 illustrated along lines 6-C-6-C' and 6-D-6-D' in FIG. 73, respectively, frame 6-50 further includes a second frame surface 6-52 and a protruding portion 6-53, and the second frame surface 6-52 and the first frame surface 6-51 face the same direction. The protruding portion 6-53 extends along the optical axis 6-O (Z direction), and the protruding portion 6-53 is disposed on the first frame surface 6-51 and the second frame surface 6-52 and is across the first frame surface 6-51 and the second frame surface 6-52.

Furthermore, in FIG. 76, the first frame surface 6-51 is closer to a connection 6-54 of the frame 6-50 and the first resilient element 6-70 than the second frame surface 6-52. In other words, the distance between the first frame surface 6-51 and the connection 6-54 is less than the distance between the second frame surface 6-52 and the connection 6-54.

In FIG. 75, the shortest distance 6-S1 between the first holder surface 6-31 and the first resilient element 6-70 is greater than the shortest distance 6-S3 between the second frame surface 6-52 and the first resilient element 6-70 (i.e. 6-S1>6-S3). Furthermore, the shortest distance 6-S3 between the second frame surface 6-52 and the first resilient element 6-70 is greater than the shortest distance 6-S2 between the first frame surface 6-51 and the first resilient element 6-70 (i.e. 6-S3>6-S2) in FIG. 76. In other words, 6-S1>6-S3>6-S2. The first resilient element 6-70 has different deformation amounts at a position corresponding to the first frame surface 6-51 and at a position corresponding to the second frame surface 6-52 when the holder 6-30 is moving. For example, the deformation amount of the first resilient element 6-70 at the position corresponding to the first frame surface 6-51 may be less than the deformation amount of the first resilient element 6-70 at the position corresponding to the second frame surface 6-52. Therefore, making the shortest distance 6-S3 greater than the shortest distance 6-S2 allows the distance between the second frame surface 6-52 and the first resilient element 6-70 being further increased. As a result, the first resilient element 6-70 may be further prevented from colliding to the frame 6-50 at a position having a greater deformation amount (i.e. the position corresponding to the second frame surface 6-52) when the driving mechanism 6-100 is operating, and the driving mechanism 6-100 may be miniaturized as well. Moreover, providing the protruding portion 6-53 on the frame 6-50 can increase the mechanical strength of the frame 6-50 to enhance the durability of the frame 6-50.

Figure 77:
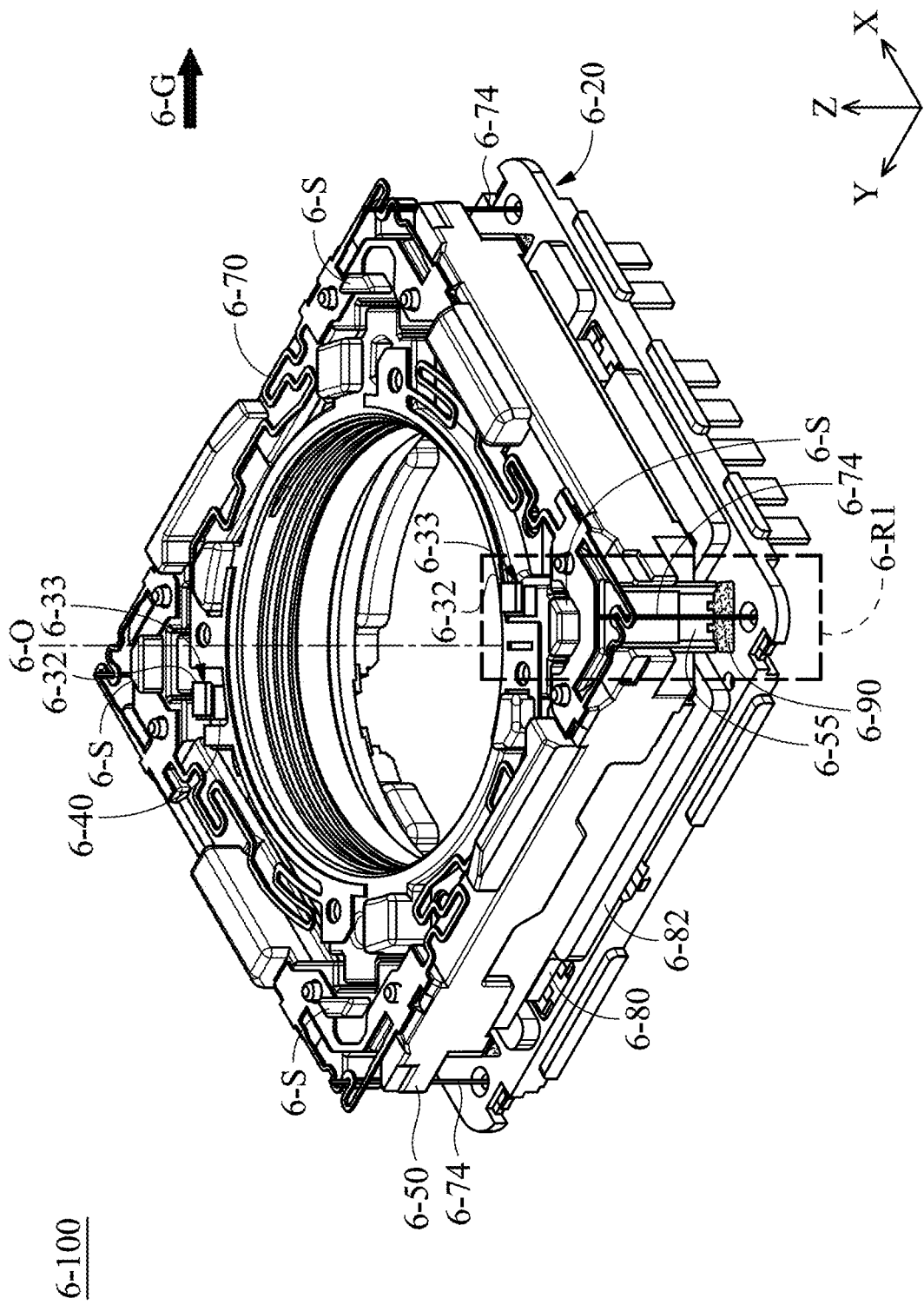
FIG. 77 is a schematic view of some elements of the driving mechanism in some embodiments of the present disclosure.
Figure 78:
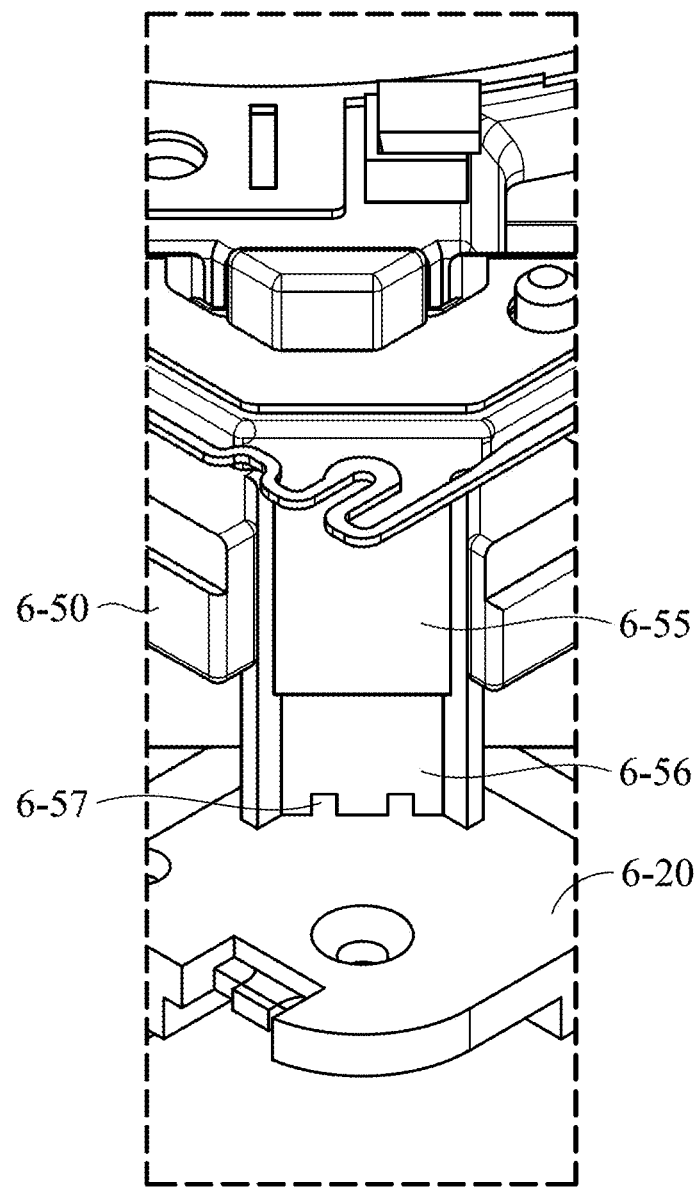
FIG. 78 is an enlarged view of some elements of the driving mechanism in FIG. 77.
Figure 79:
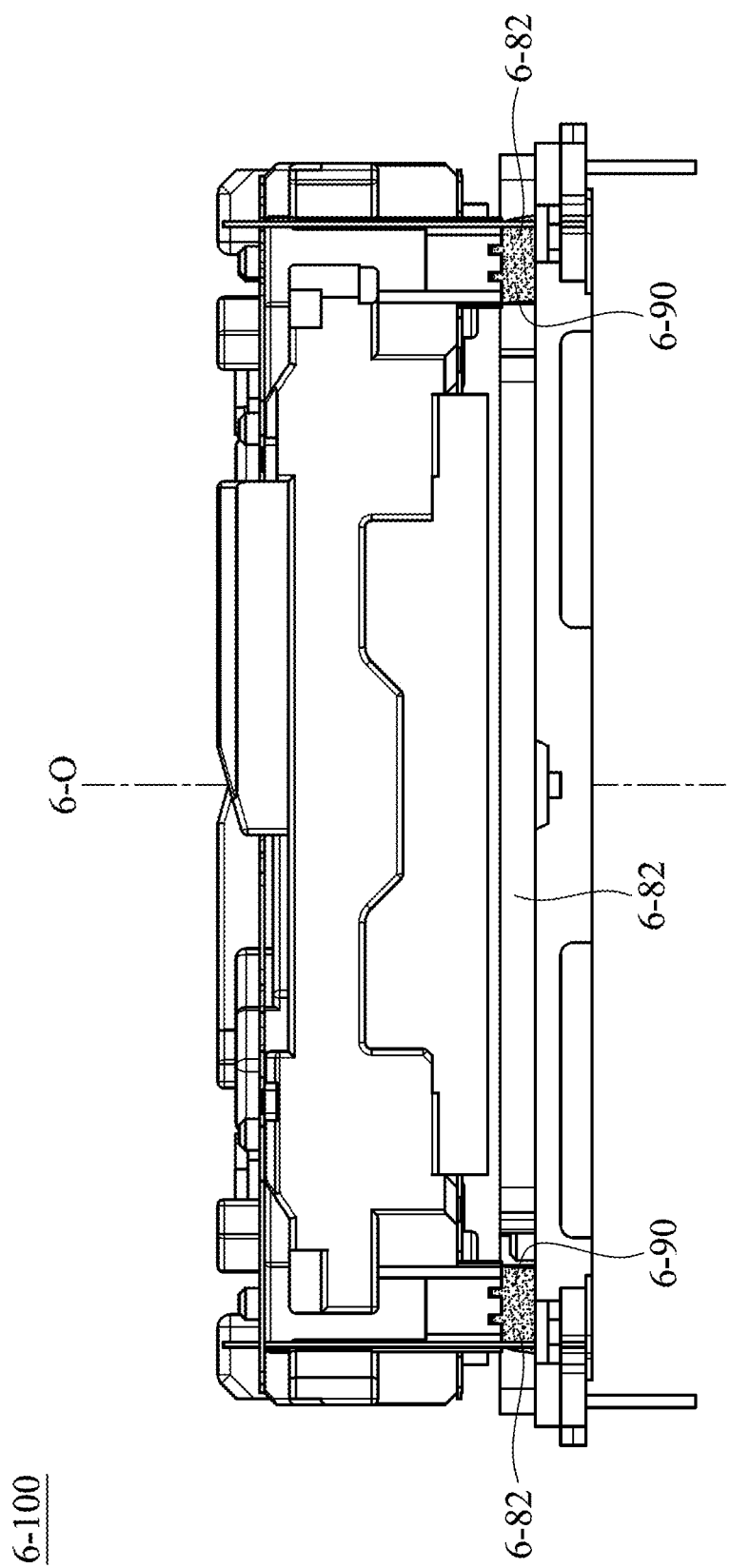
FIG. 79 is a side view of the driving mechanism in FIG. 77.

FIG. 77 is a schematic view of some elements of the driving mechanism 6-100 (the case 6-10 is omitted), FIG. 78 is an enlarged view of some elements of the driving mechanism 6-100 (indicated by the region 6-R1), and FIG. 79 is a side view of the driving mechanism 6-100 in FIG. 74. In FIG. 8, the frame 6-50 further includes a damping material placing portion 6-55 extending toward the base 6-20, and a damping material positioning structure 6-56 is formed on one side of the damping material placing portion 6-55, and the side is adjacent to the base 6-20. Furthermore, an opening 6-57 is formed on the damping material positioning structure 6-56 and is concave to a direction away from the optical axis 6-O.

In FIGS. 8 and 10, a damping material 6-90 may be provided between the frame 6-50 and the base 6-20 (the suspension wires 6-74 and the damping material 6-90 are omitted in FIG. 78), and a portion of the damping material 6-90 may be disposed on the damping material positioning structure 6-56 and fixed in the opening 6-57. The damping material 6-90 may be a damping material such as gel. The damping material positioning structure 6-56 has a concave structure to provide the damping material 6-90 by, for example, dispensing.

In FIG. 79, a portion of the damping material 6-90 overlaps to the second driving coil 6-82 embedded in the circuit board 6-80 (please refer to FIG. 71 as well) when viewed in a direction that is perpendicular to the optical axis 6-O. The vibration or the oscillation (such as resonance) of the driving mechanism 6-100 may be prevented from occurring by providing the damping material 6-90 on the driving mechanism 6-100. Furthermore, forming the opening 6-57 on the damping material positioning structure 6-56 further increases the contact area between the damping material 6-90 and the frame 6-50 to allow the damping material 6-90 being disposed between the base 6-20 and the frame 6-50 in a more stable way, and the driving mechanism 6-100 may be miniaturized.

As shown in FIG. 77, stopping portions 6-S are formed at the corners of the frame 6-50 and positioned between the first resilient element 6-70 and the holder 6-30 and extends from the frame 6-50 to the Z direction. By providing the stopping portions 6-S on the corners of the frame 6-50, the movement of the holder 6-30 may be limited to prevent the holder 6-30 from colliding with other elements. Furthermore, providing the stopping portions 6-S between the first resilient element 6-70 and the holder 6-30 may prevent the first resilient element 6-70 from directly contacting the holder 6-30 at the corners, so the durability of the first resilient element 6-70 may be increased. In particular, the first resilient element 6-70 is exposed from one side of the stopping portion 6-S rather than winding around the stopping portion 6-S when viewed along the optical axis 6-O.

Referring to FIGS. 77 and 80, wherein FIG. 80 is a top view of the driving mechanism 6-100, the holder 6-30 further includes a plurality of electrical connecting portions 6-32 extending to the Z direction. Each of the electrical connecting portions 6-32 has an electrical connecting surface 6-33, and the first driving coil 6-40 is electrically connected to the first resilient element 6-70 at the electrical connecting surface 6-33 by soldering, welding or by using conductive paste, etc. It should be noted that all electrical connecting surfaces 6-33 of the electrical connecting portions 6-32 face the same direction, such as the direction 6-G in FIGS. 77 and 80. Moreover, the electrical connecting portions 6-32 are exposed from the outer case 6-10 when viewed along the optical axis 6-O. As a result, miniaturization may be achieved by allowing the electrical connecting portions 6-32 being parallel to the optical axis 6-O. Making the electrical connecting portions 6-32 being exposed from the outer case 6-10 and letting the electrical connecting surfaces 6-33 that are facing in the same direction aid in the assembly of the driving mechanism 6-100.

Figure 81:
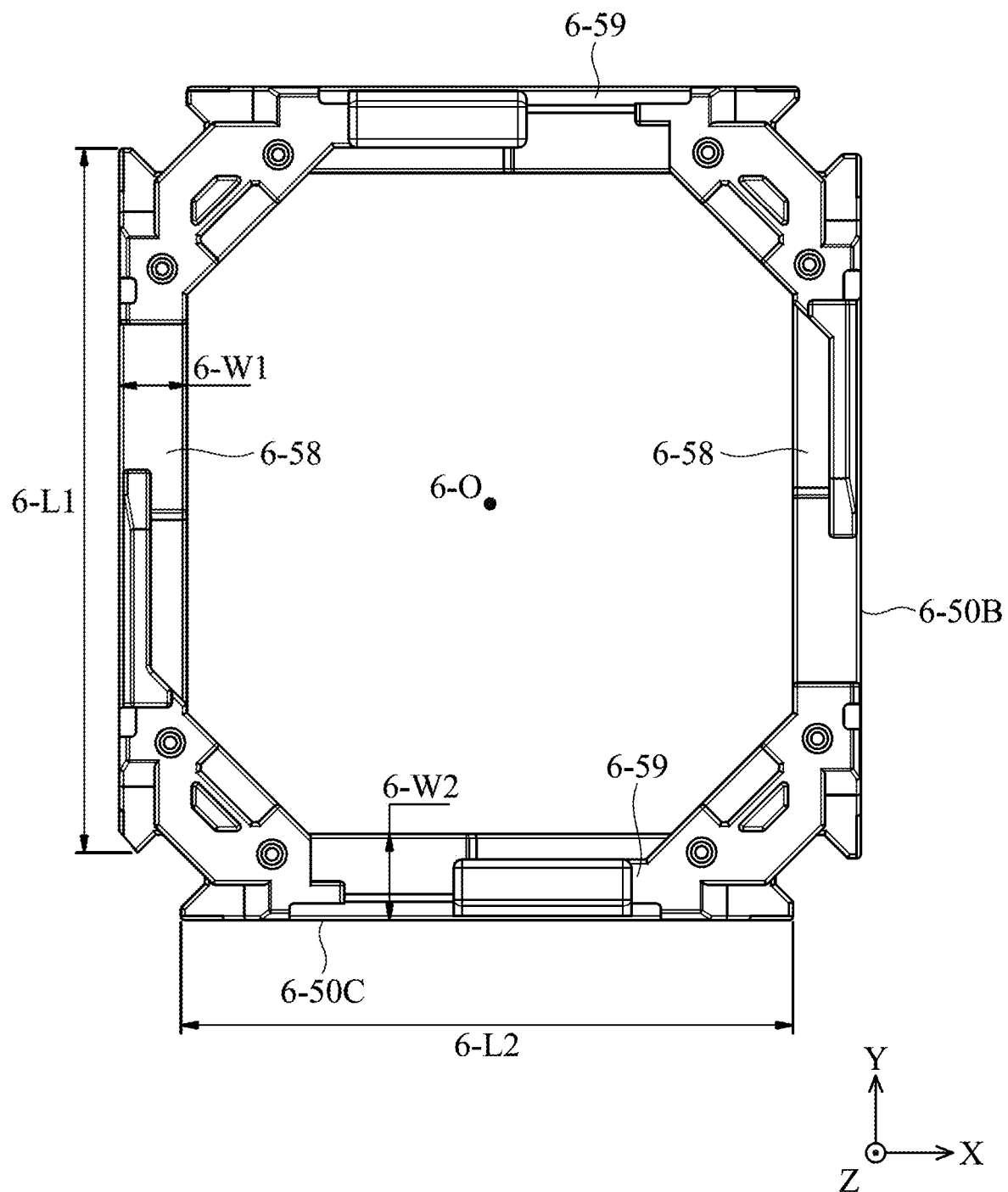
FIG. 81 is a top view of a frame in some embodiments of the present disclosure.

FIG. 81 is a top view of the frame 6-50 in some embodiments of the present disclosure. The frame 6-50 includes a first side 6-58 and a second side 6-59 extending in a direction that is perpendicular to the optical axis 6-O, and the first side 6-58 and the second side 6-59 extend toward different directions. For example, the first side 6-58 may extend in the Y direction and the second side 6-59 may extend in the X direction. Furthermore, in some embodiments, the length 6-L1 of the first side 6-58 on a first extending direction of the first side 6-58 (i.e. Y direction) is greater than the length 6-L2 of the second side 6-58 on a second extending direction of the second side 6-58 (i.e. X direction), and a width 6-W1 of the first side 6-58 is less than a width 6-W2 of the second side 6-59. As a result, the size of the frame 6-50 on a specific direction may be reduced (e.g. X direction in this embodiment) to utilize the space of the driving mechanism 6-100 in a more effective way, and the performance of the driving mechanism 6-100 may be increased.

Figure 82:
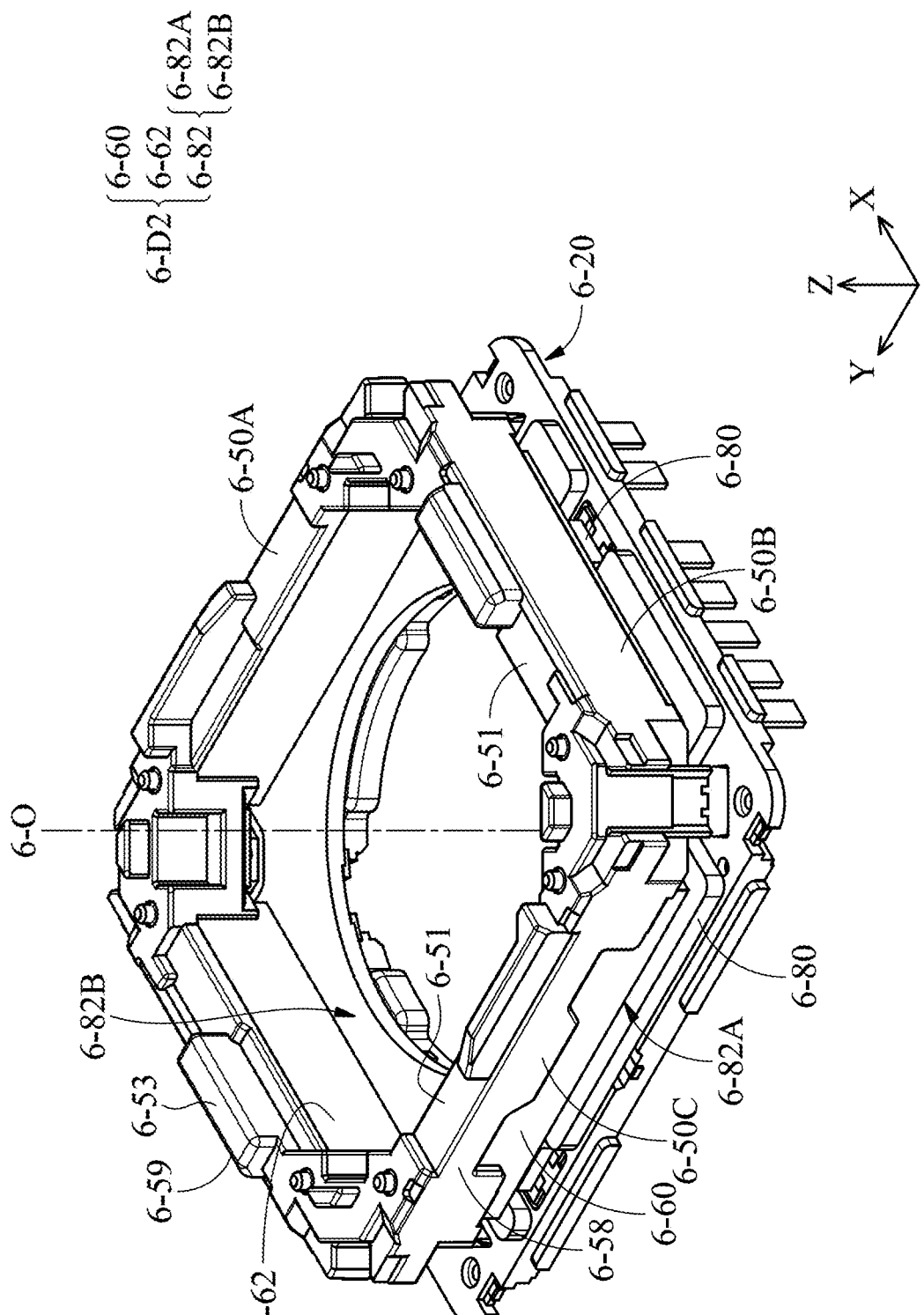
FIG. 82 is a schematic view of some elements of the driving mechanism in some embodiments of the present disclosure.

FIG. 82 is a schematic view of some elements of the driving mechanism 6-100 in some embodiments of the present disclosure, and FIGS. 83 and 84 are top views of some embodiments of the driving mechanism 6-100. A second driving assembly 6-D2 includes the first magnetic elements 6-60, the second magnetic elements 6-62 and the second driving coils 6-82 (including first coils 6-82A and second coils 6-82B) embedded in the circuit board 6-80. In FIG. 82, the first magnetic element 6-60 is disposed at the first side 6-58 of the frame 6-50 and is corresponding to the first coil 6-82A embedded in the circuit board 6-80 (e.g. partially overlap with each other when viewed in the Z direction), and the second magnetic element 6-62 is disposed at the second side 6-59 of the frame 6-50 and is corresponding to the second coil 6-82B embedded in the circuit board 6-80 (e.g. partially overlap with each other when viewed in the Z direction). Furthermore, the thickness 6-T1 of the first magnetic element 6-60 in the X direction is less than the thickness 6-T2 of the second magnetic element 6-62 in the Y direction in FIG. 83.

Providing the second driving assembly 6-D2 in the driving mechanism 6-100 can increase the amount of the moving dimensions of the holder 6-30, such as allowing the holder being moved or rotated. Furthermore, the greatest range for the first coil 6-82A being disposed is shown as the region 6-R2 in FIG. 84, and the greatest range for the second coil 6-82B being disposed in shown as the region 6-R3 in FIG. 84, wherein the width of the region 6-R2 in the X direction may be less than the width of the region 6-R3 in the Y direction, and the length of the region 6-R2 in the Y direction may be greater than the length of the region 6-R3 in the X direction.

In some embodiments, the number of turns of the first coil 6-82A may be designed to be less than the number of turns of the second coil 6-82B to reduce the width of the first coil 6-82A in the X direction. Furthermore, the first magnetic element 6-60 corresponding to the first coil 6-82A may have a greater size than the second magnetic element 6-62 corresponding to the second coil 6-82B to adjust the driving force of the driving mechanism 6-100. Moreover, a portion of the first coil 6-82A may overlap the second coil 6-82B in a direction that is perpendicular to the optical axis 6-O. In this embodiment, the magnetic elements 6-60 and 6-62 and the first coil 6-82A and the second coil 6-82B may be designed to have different sizes to allow the driving mechanism 6-100 having a rectangular shape, so the space of the driving mechanism 6-100 on a specific direction may be further utilized.

Figure 85:
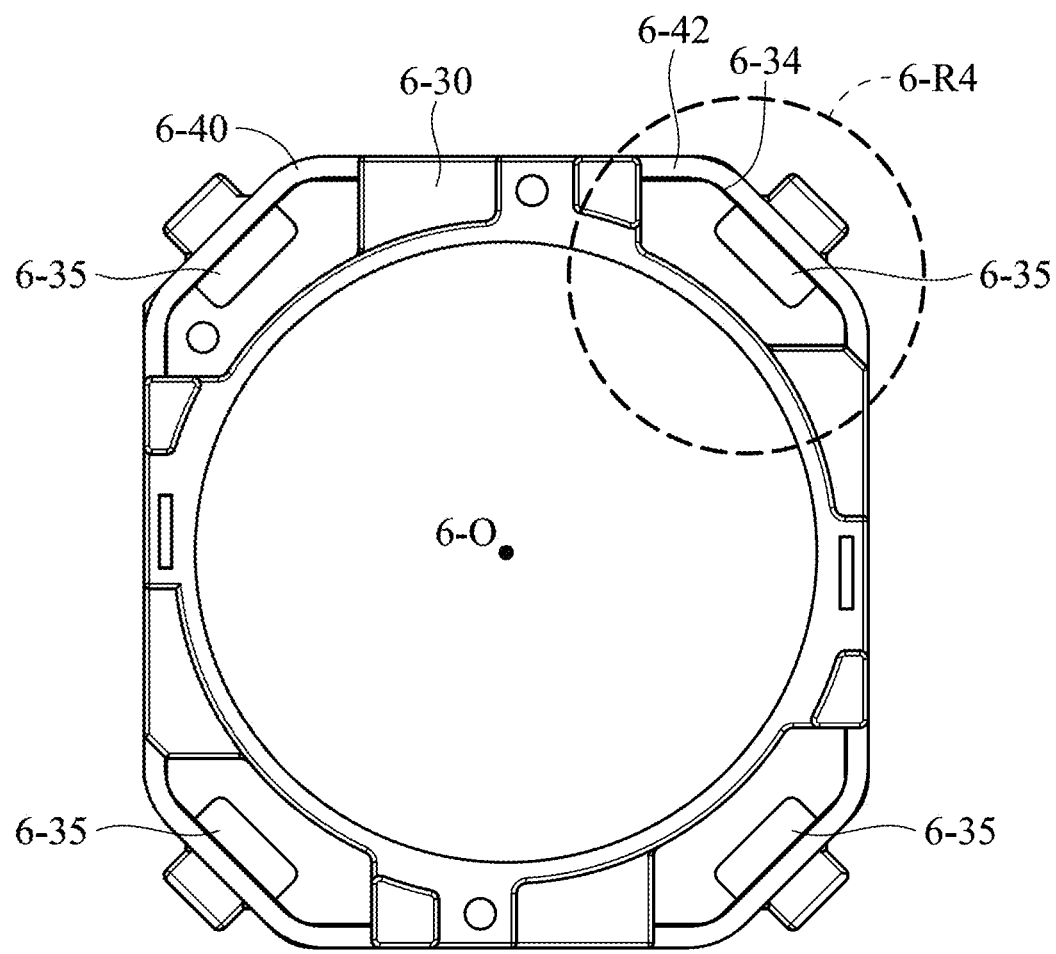
FIG. 85 is a schematic view of a holder and a first driving coil in some embodiments of the present disclosure.
Figure 86:
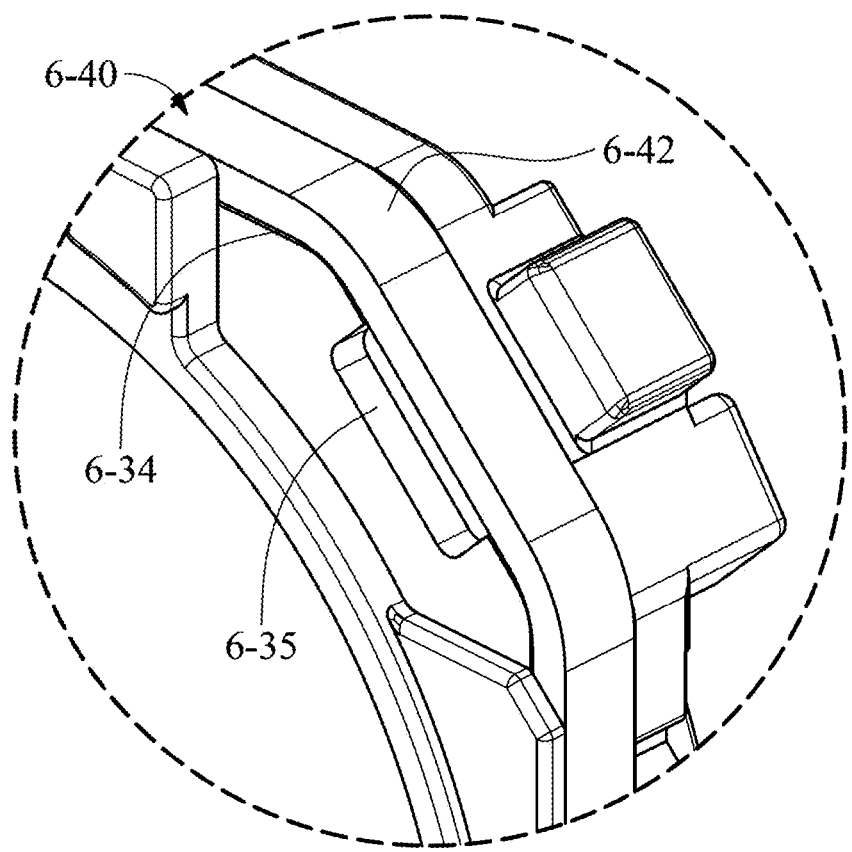
FIG. 86 is an enlarged view of a portion of FIG. 85.
Figure 87:
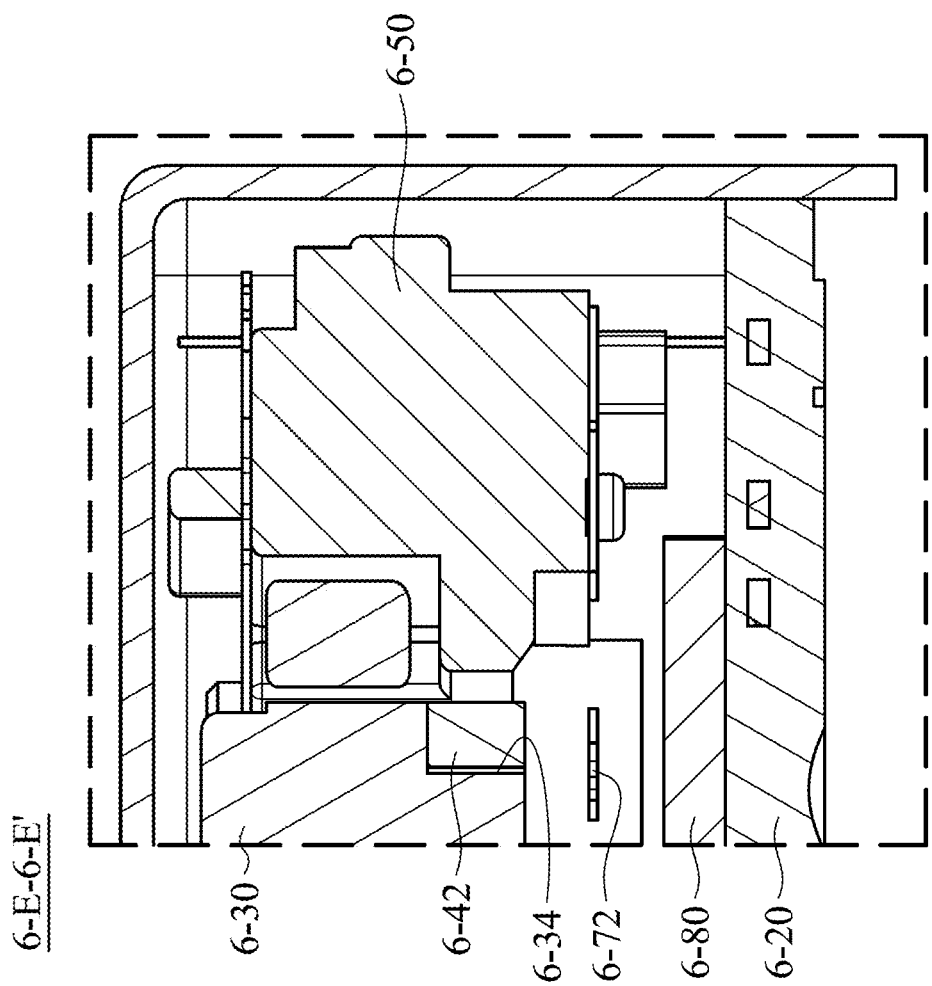
FIG. 87 is a cross-sectional view illustrated along a line 6-E-6-E' in FIG. 73.
Figure 88:
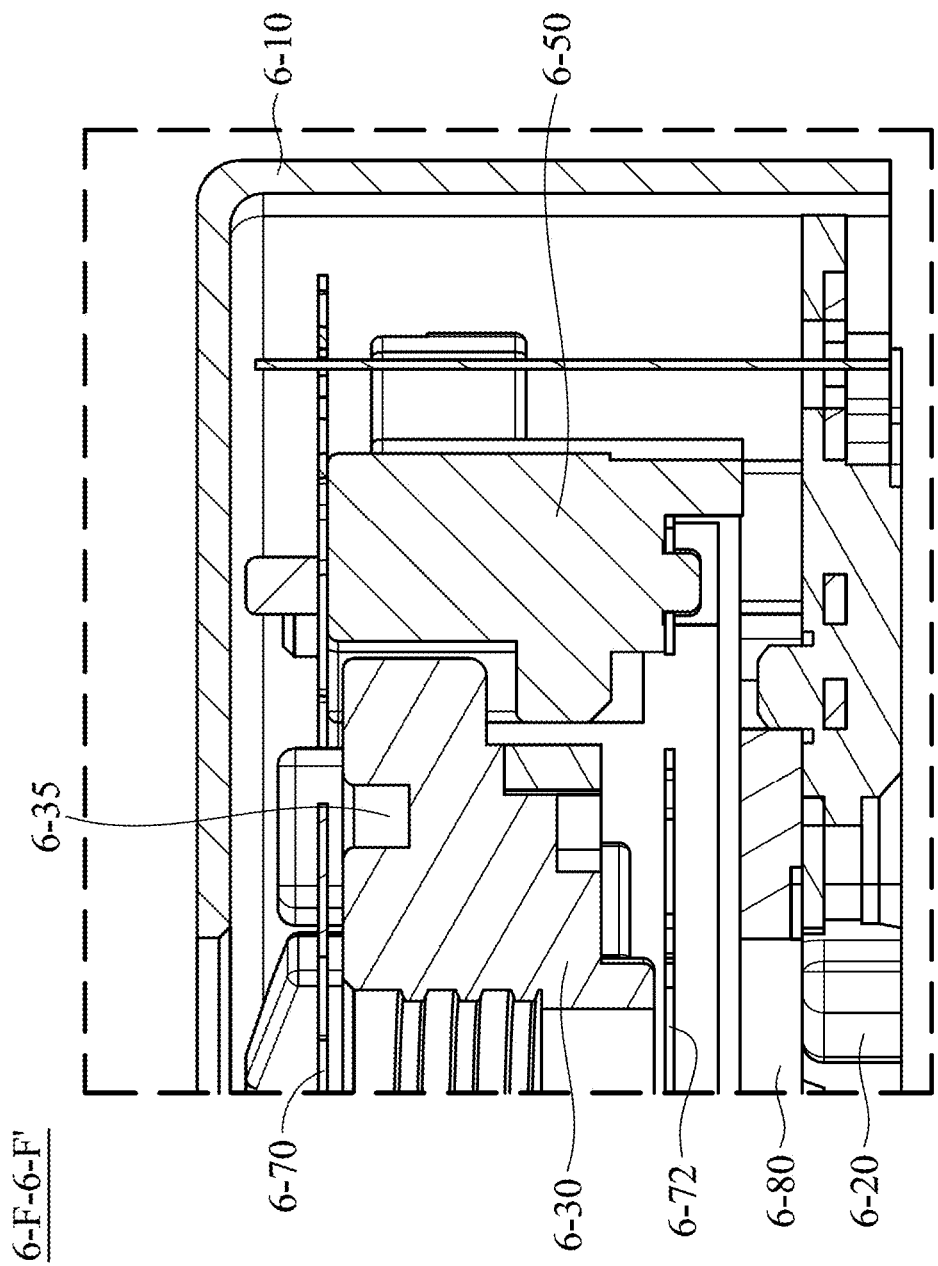
FIG. 88 is a cross-sectional view illustrated along a line 6-F-6-F' in FIG. 73.

FIG. 85 is a schematic view of the holder 6-30 and the first driving coil 6-40 of some embodiments of the present disclosure, FIG. 86 is an enlarged view of the region 6-R4 in FIG. 85 viewing from a different direction, FIG. 87 is a cross-sectional view illustrated along a line 6-E-6-E' in FIG. 73, and FIG. 88 is a cross-sectional view illustrated along a line 6-F-6-F' in FIG. 73. In FIGS. 85-88, the holder 6-30 includes a second holder surface 6-34 and a recess 6-35, wherein the second holder surface 6-34 faces a first segment 6-42 of the first driving coil 6-40, and the recess 6-35 is corresponding to the first segment 6-42. In some embodiments, adhesive (not shown) may be provided in the recess 6-35 to bond the holder 6-30 and the first segment 6-42. The adhesive may be stored in the recess 6-35 to prevent adhesive from overflowing to other elements.

As shown in FIG. 87, the second resilient element 6-72 directly faces the first segment 6-42 of the driving coil 6-40 in the Z direction. In other words, no other element is positioned between the second resilient element 6-72 and the driving coil 6-40 in the Z direction. As a result, the risk of the second resilient element 6-72 from colliding to other elements may be reduced. Furthermore, providing the recess 6-35 on the holder 6-30 also increases the structural strength of the holder 6-30 and reduces the weight of the holder 6-30.

Referring back to FIGS. 74 and 82, the frame 6-50 includes a frame top wall 6-50A substantially perpendicular to the optical axis 6-O and frame side walls 6-50B and 6-50C substantially parallel to the optical axis 6-O. As shown in FIG. 74, the frame top wall 6-50A includes a third frame surface 6-50D, and each of the frame side walls 6-50B and 6-50C includes a fourth frame surface 6-50E, wherein both the third frame surface 6-50D and the fourth surface 6-50E face the magnetic element 6-60, and the third frame surface 6-50D and the fourth surface 6-50E are facing in different directions. For example, in some embodiments, the first frame surface 6-50D may be perpendicular to the optical axis 6-O, and the fourth frame surface 6-50E may be parallel to the optical axis 6-O. Furthermore, the outer case 6-10 further includes a top case 6-14 and sidewalls 6-16 extending from the sides of the top case 6-14 along the optical axis 6-O, and the fourth frame surface 6-50E is parallel to the surface 6-18 of the sidewall 6-16.

Figure 89:
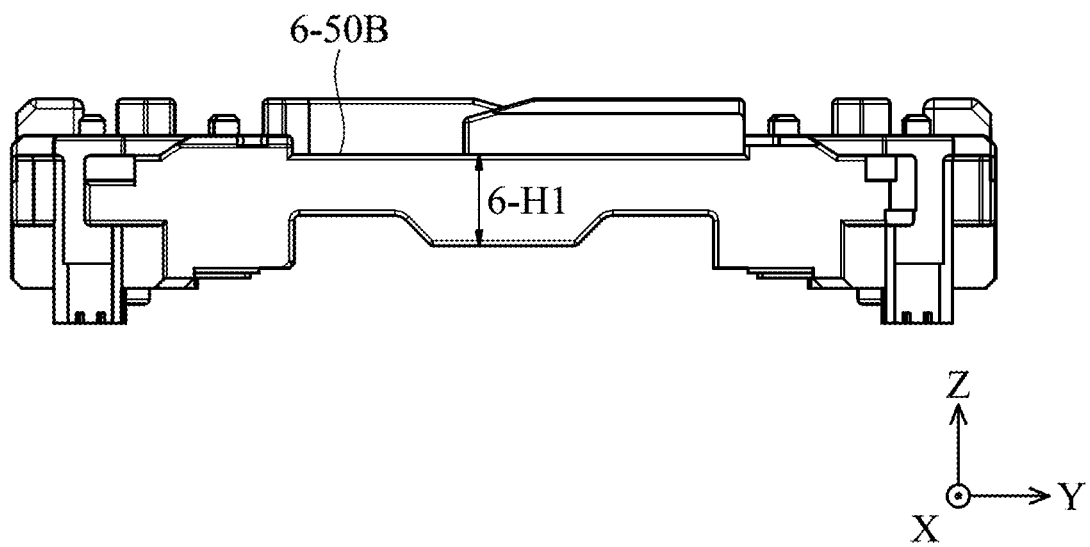
FIGS. 89 and 90 are side views of the frame in FIG. 77 when viewed in X and Y directions, respectively.
Figure 90:
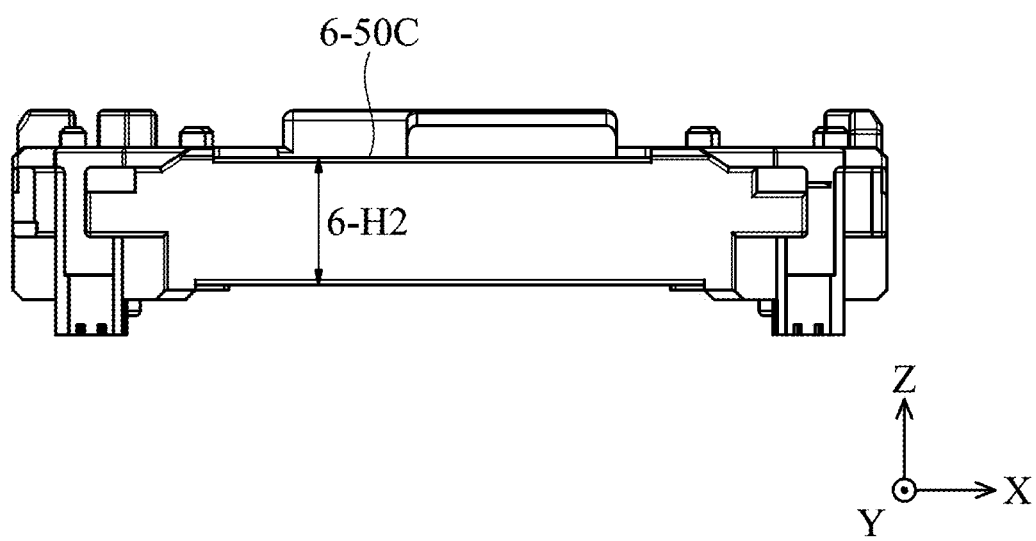

Moreover, the frame side walls 6-50B and 6-50C are two different portions extending in different directions, and the sizes of the first side wall 6-50B and the second side wall 6-50C along the optical axis 6-O (Z direction) are different. For example, FIGS. 89 and 90 are side views of the frame 6-50 viewed in the X direction and the Y direction, respectively, wherein the height 6-H1 of the first side wall 6-50B in the Z direction is greater than the height 6-H2 of the second side wall 6-50C in the Z direction. As a result, the contact area between the frame 6-50 to the first magnetic element 6-60 and the second magnetic element 6-62 may be increased to enhance the bonding between the frame 6-50 to the first magnetic element 6-60 and the second magnetic element 6-62 and the mechanical strength of the bonding. Moreover, the driving mechanism 6-100 may have an asymmetry structure in the X direction and the Y direction to miniaturize the driving mechanism 6-100 in a specific direction. Moreover, as shown in FIG. 74, because a portion of the first frame surface 6-51 does not overlap the frame side walls 6-50B and 6-50C in the Z direction, the space for the first resilient element 6-70 may be increased to decrease the design difficulty of the driving mechanism 6-100.

Figure 91:
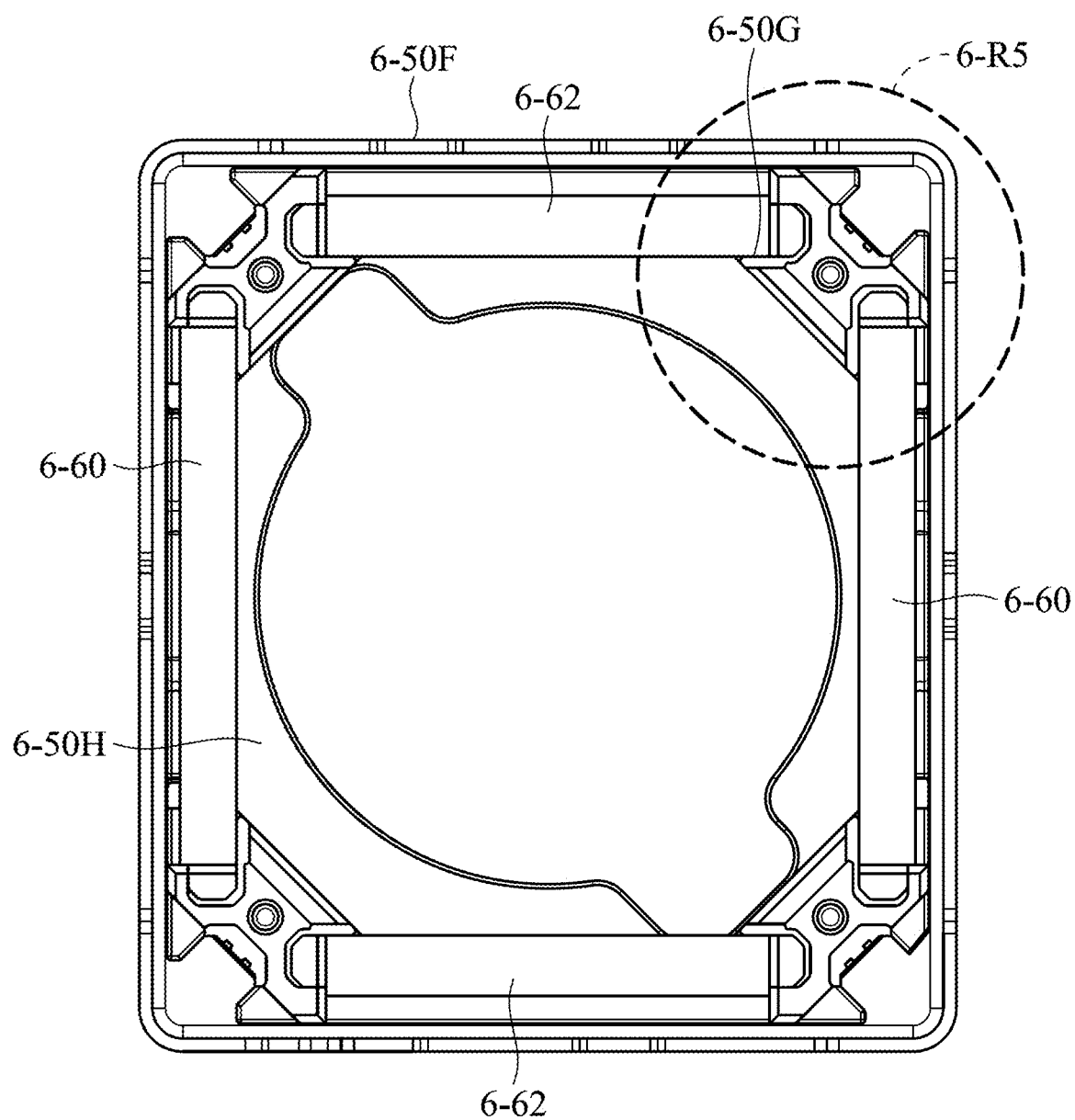
FIG. 91 is a top view of some elements of the driving mechanism in some embodiments of the present disclosure.
Figure 92:
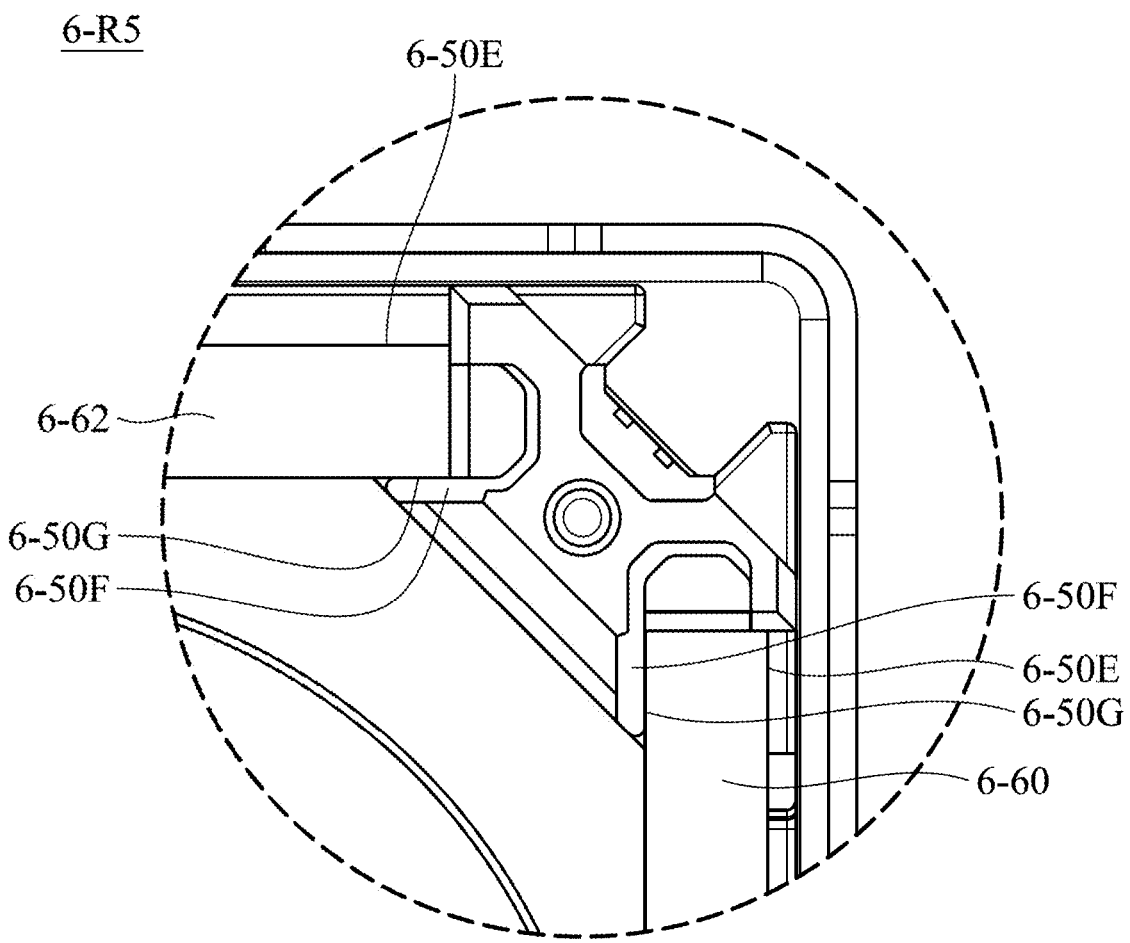
FIG. 92 is an enlarged view of a portion of FIG. 91.

FIG. 91 is a top view of some elements of the driving mechanism 6-100, and FIG. 92 is an enlarged view of the region 6-R5 in FIG. 91. The frame 6-50 further includes a positioning portion 6-50F having a positioning surface 6-50G facing the first magnetic element 6-60 or the second magnetic element 6-62 and does not perpendicular to the corresponding fourth frame surface 6-50E, and the positioning surface 6-50G is parallel to the optical axis 6-O. As a result, the positioning portion 6-50F contacts the first magnetic element 6-60 or the second magnetic element 6-62 to locate the position of the first magnetic element 6-60 or the second magnetic element 6-62 when the driving mechanism 6-100 is being assembled. In some embodiments, the distance between the positioning surface 6-50G and the optical axis 6-O is less than the distance between the fourth frame surface 6-50E and the optical axis 6-O. As a result, the contact area between the frame 6-50 and the magnetic elements may be further increased to strengthen the bonding between the frame 6-50 to the magnetic elements 6-60 and 6-62.

Moreover, in some embodiments, adhesive material (not shown) may be provided between the third frame surface 6-50D (or the fourth frame surface 6-50E) to the magnetic elements 6-60 and 6-62. Because the adhesive material is provided on surfaces facing different directions, the bonding and fixing ability between the magnetic elements 6-60 and 6-62 and the frame 6-50 along different directions may be increased.

In summary, a driving mechanism for holding and driving an optical element is provided in the present disclosure. By making the distance between the frame of the driving mechanism to the resilient element different to the distance between the holder to the resilient element, the durability of the driving mechanism may be increased, and the size of the driving mechanism may be decreased to achieve miniaturization.

Figure 93:
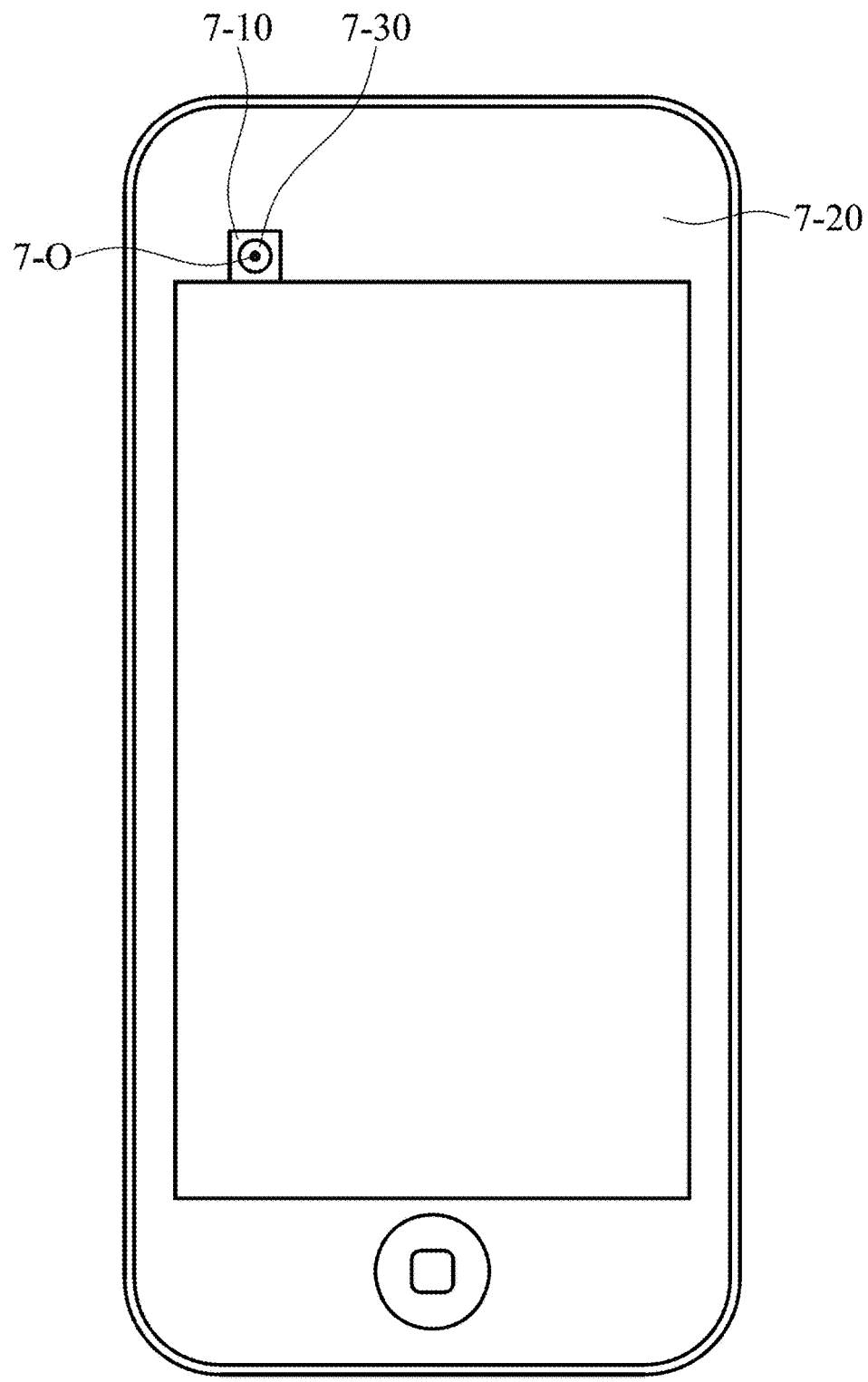
FIG. 93 is a schematic diagram of an electronic device according to an embodiment of the invention.

Referring to FIG. 93, in an embodiment of the invention, the optical member driving mechanism 7-10 can be disposed in an electronic device 7-20 and used to hold and drive a lens 7-30, so that the lens 7-30 can move relative to an image sensor (not shown) in the electronic device 7-20, and the purpose of focus adjustment can be achieved. For example, the electronic device 7-20 can be a digital camera or a smart phone having the function of capturing photographs or making video recordings, and the optical member 7-30 can be a lens. The optical axis 7-O of the optical member 7-30 is substantially parallel to the Z-axis in the drawing, and perpendicular to the image sensor in the electronic device 7-20.

Figure 94:
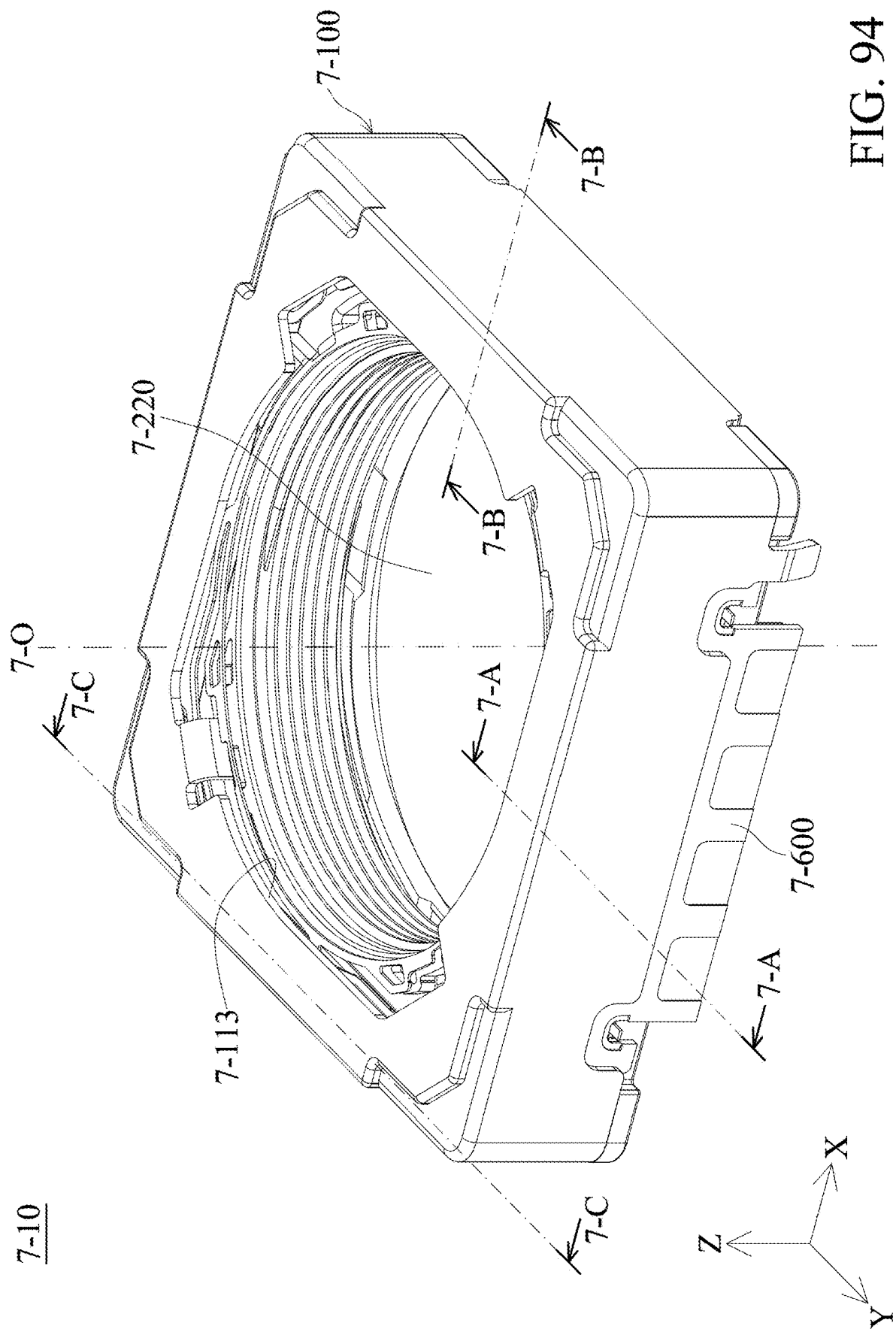
FIG. 94 is a schematic diagram of an optical member driving mechanism according to an embodiment of the invention.
Figure 95:
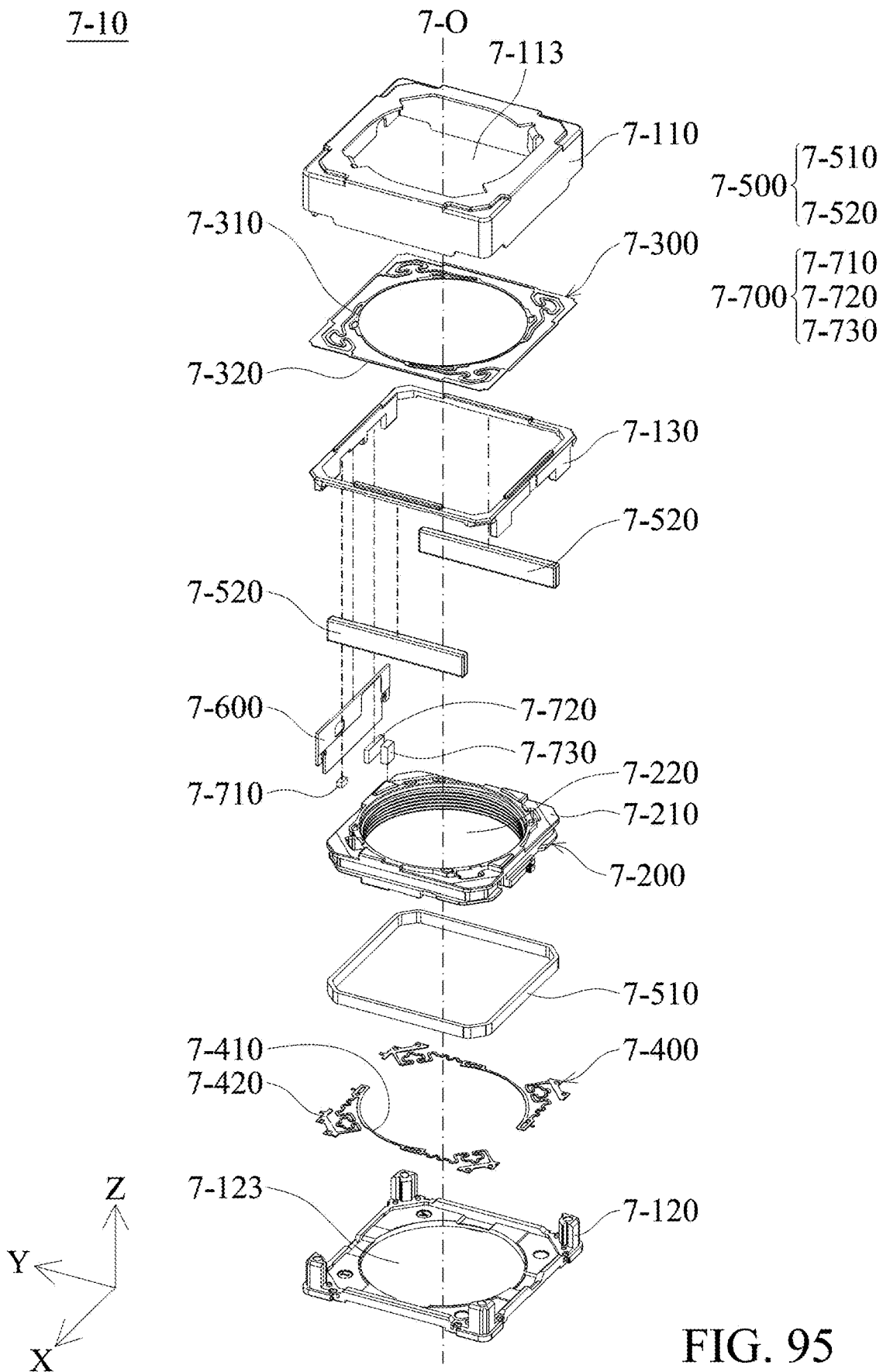
FIG. 95 is an exploded-view diagram of the optical member driving mechanism according to an embodiment of the invention.
Figure 96:
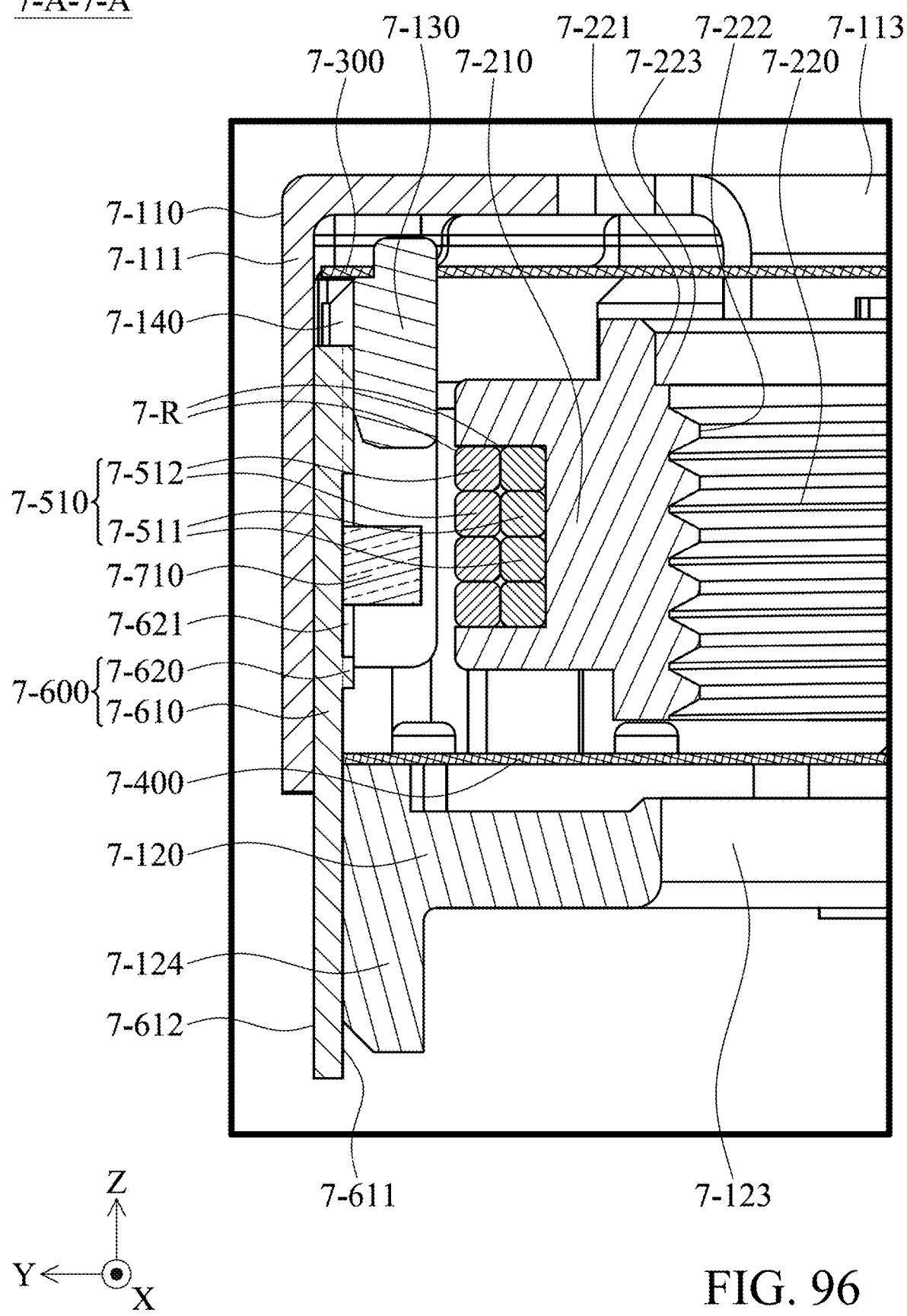
FIG. 96 is a cross-sectional view along the line 7-A-7-A in FIG. 94.
Figure 97:
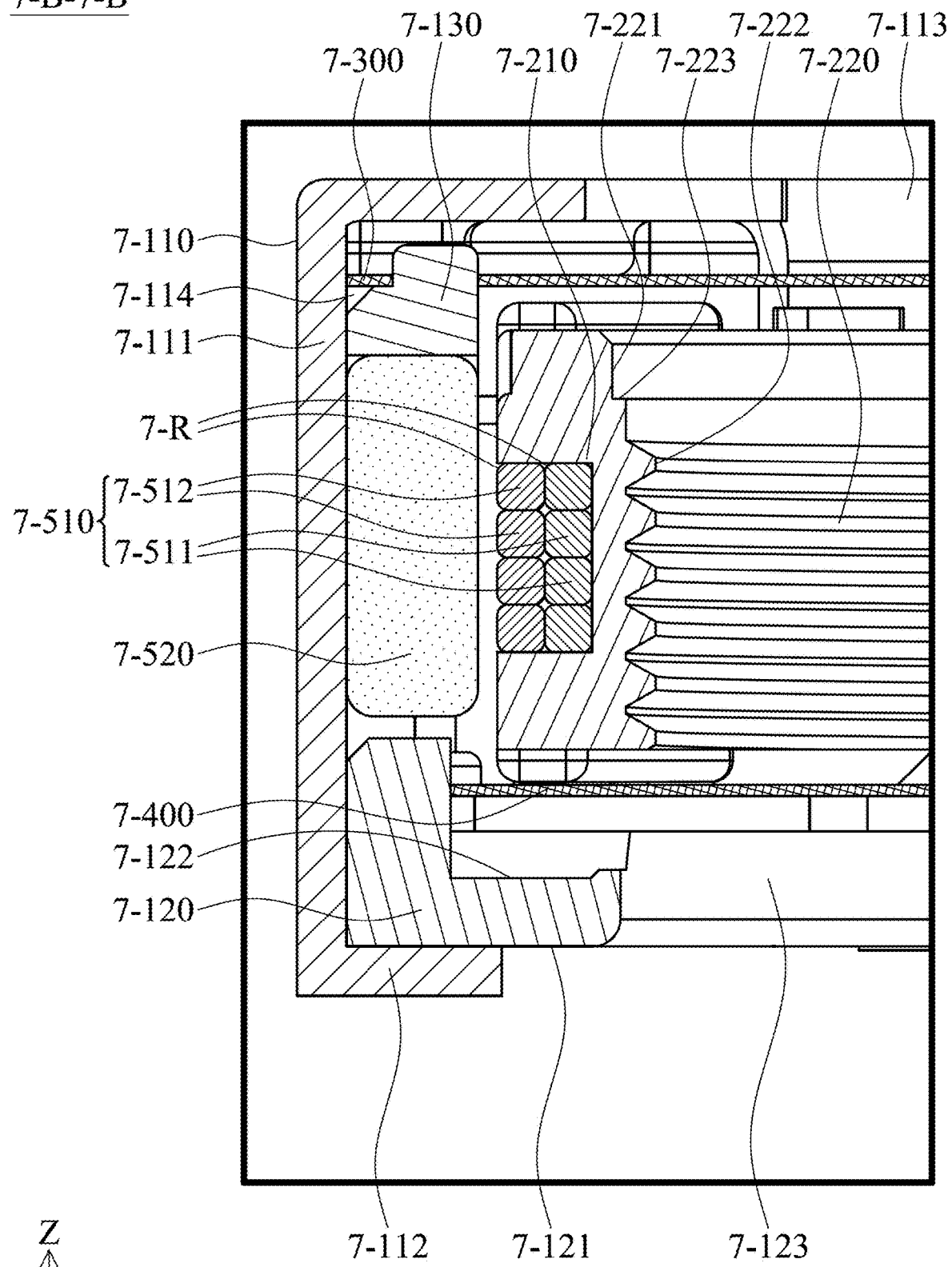
FIG. 97 is a cross-sectional view along the line 7-B-7-B in FIG. 94.
Figure 98:
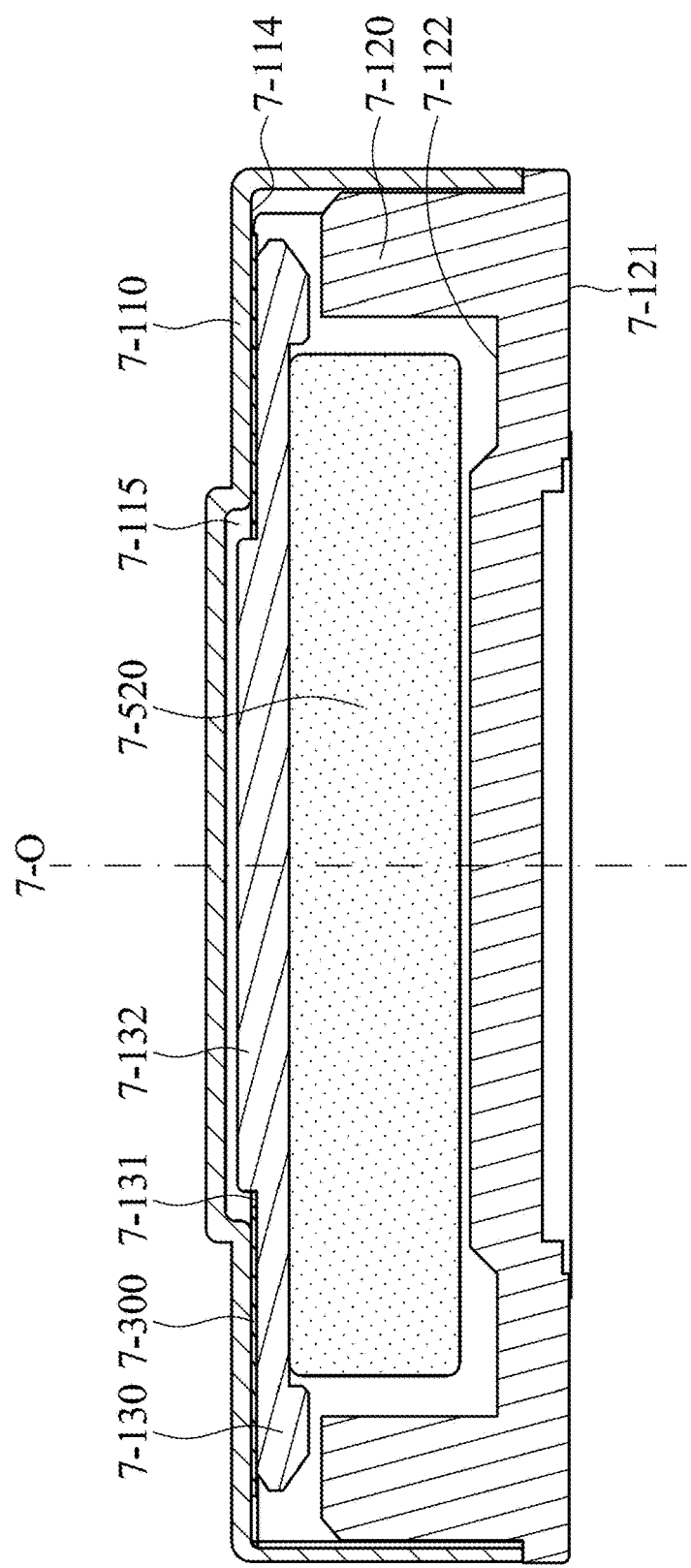
FIG. 98 is a cross-sectional view along the line 7-C-7-C in FIG. 94.

FIG. 94 is a schematic diagram of the optical member driving mechanism 7-10, FIG. 95 is an exploded-view diagram of the optical member driving mechanism 7-10, and FIGS. 96, 97 and 98 are cross-sectional views along the line 7-A-7-A, line 7-B-7-B and line 7-C-7-C in FIG. 94. As shown in FIGS. 94-98, the optical member driving mechanism 7-10 primarily includes a fixed portion 7-100, a movable portion 7-200, a first elastic member 7-300, a second elastic member 7-400, a driving assembly 7-500, a circuit board 7-600, and a sensing assembly 7-700.

The fixed portion 7-100 includes a case 7-110, a base 7-120, and a frame 7-130. The case 7-110 and the base 7-120 can be assembled and form a hollow box, and the frame 7-130, the movable portion 7-200, the first elastic member 7-300, the second elastic member 7-400, the driving assembly 7-500, the circuit board 7-600, and the sensing assembly 7-700 can be accommodated in the hollow box. The frame 7-130 can be affixed to the base 7-120, and a gap 7-140 is formed between the frame 7-130 and a lateral wall 7-111 of the case 7-110 (as shown in FIG. 96).

As shown in FIG. 97, in this embodiment, the case 7-110 further includes a bending portion 7-112 connected to the lateral wall 7-111, and the bottom surface 7-121 of the base 7-120 is disposed between the bending portion 7-112 and the top surface 7-122 of the base 7-120 (the top surface 7-122 faces the movable portion 7-200, and the bottom surface 7-121 is opposite to the top surface 7-122). Since the case 7-110 and the base 7-120 are respectively made of metal and non-metal material (such as plastic), the bending portion 7-112 can contact the image sensor and support the optical member driving mechanism 7-10 when the optical member driving mechanism 7-10 is disposed on the image sensor, so as to prevent the base 7-120 from damaging due to the pressure.

As shown in FIG. 98, in this embodiment, a depression 7-115 is formed on a case surface 7-114 of the case 7-110, and a protrusion 7-132 is formed on a frame surface 7-131 of the frame 7-131. The case surface 7-114 and the frame surface 7-131 are substantially perpendicular to the optical axis 7-O of the optical member 7-30, and the case surface 7-114 faces the frame surface 7-131. When the case 7-110 and the base 7-121 are assembled to form the hollow box, the protrusion 7-132 is accommodated in the depression 7-115. Therefore, if the frame 7-130 moves relative to the case 7-110 when an external force is applied on the optical member driving mechanism 7-10, the protrusion 7-132 and the depression 7-115 can restrict the range of motion of the frame 7-130, so as to prevent the frame 7-130 from deforming due to impact.

As shown in FIGS. 94-97, the movable portion 7-200 includes an optical member holder 7-210. An accommodating hole 7-220 is formed on the center of the optical member holder 7-210, and the optical member 7-30 can be fixedly disposed in the accommodating hole 7-220. The case 7-110 and the base 7-120 of the fixed portion 7-100 respectively has an optical hole 7-113 and an optical hole 7-123 corresponding to the accommodating hole 7-220. Thus, an external light can pass through the optical hole 7-113, the optical member 7-30, and the optical hole 7-123 in sequence and reach the image sensor in the electronic device 7-20, so as to form an image on the image sensor.

The accommodating hole 7-220 has a smooth segment 7-221, a threaded segment 7-222, and a connecting segment 7-223, wherein the smooth segment 7-221 and the threaded segment 7-222 are arranged along the optical axis 7-O, and the connecting segment 7-223 connects the smooth segment 7-221 to the threaded segment 7-222. The dimensions of the smooth segment 7-221 are greater than that of the threaded segment 7-222, so that a step is generated. The wall surface of the smooth segment 7-221 is substantially parallel to the optical axis 7-O, and the connecting segment 7-223 is substantially perpendicular to the optical axis 7-O. When the optical member 7-30 is disposed in the accommodating hole 7-220, the user can fill a glue on the step, therefore, the adhesive area of the glue can be increased, and the optical member 7-30 can be securely affixed.

The first elastic member 7-300 and the second elastic member 7-400 are respectively disposed on the opposite sides of the optical member holder 7-210. An inner section 7-310 and an outer section 7-320 of the first elastic member 7-300 are respectively connected to the upper surface of the optical member holder 7-210 and the frame 7-130, and an inner section 7-410 and an outer section 7-420 of the second elastic member 7-400 are respectively connected to the lower surface of the optical member holder 7-210 and the base 7-120. Therefore, the optical member holder 7-210 can be hung in the hollow box by the first elastic member 7-400 and the second elastic member 7-500.

The driving assembly 7-500 includes at least one first electromagnetic driving member 7-510 and at least one second electromagnetic driving member 7-520. The first electromagnetic driving member 7-510 is disposed on the optical member holder 7-210, and the second electromagnetic driving member 7-520 is disposed on the base 7-120 or the frame 7-130 of the fixed portion 7-100. The electromagnetic effect between the first electromagnetic driving member 7-510 and the second electromagnetic driving member 7-520 can drive the optical member holder 7-210 and the optical member 7-30 disposed thereon to move relative to the first module 7-100 along the Z-axis (the optical axis 7-O of the optical member 7-30).

For example, the first electromagnetic driving member 7-510 can be a coil module, and the second electromagnetic driving member 7-520 can be a magnetic member (such as a magnet). When a current flows through the coil module (the first electromagnetic driving member 7-510), an electromagnetic effect is generated between the coil module and the magnetic member, and provides an electromagnetic force along the Z-axis on the optical member holder 7-210. Therefore, the optical member holder 7-210 and the optical member 7-30 disposed thereon can move along the Z-axis relative to the fixed module 7-100 and the image sensor in the electronic device 7-20. The purpose of focus adjustment can be achieved.

As shown in FIGS. 96 and 97, in this embodiment, the coil module (the first electromagnetic driving member 7-510) includes a first wire 7-511 and a second wire 7-512. The first wire 7-511 and the second wire 7-512 are attached on the optical member holder 7-210, and the first wire is disposed between the optical member holder 7-210 and the second wire 7-512. The first wire 7-511 and the second wire 7-512 are in parallel, therefore, when the current flows through the coil module, a larger driving force can be generated to push the optical member holder 7-210.

Specifically, both the first wire 7-511 and the second wire 7-512 have rectangular cross-sections, and the first wire 7-511 and the second wire 7-512 are disposed on the optical holder 7-210 in a mutually aligned manner. In particular, as seen from the optical axis 7-O (the Z-axis), the stacking rectangular cross-sections of the first wire 7-511 are aligned to each other, and the stacking rectangular cross-sections of the second wire 7-512 are aligned to each other. As seen from a direction that is perpendicular to the optical axis 7-O (the X-axis or the Y-axis), the stacking rectangular cross-sections of the first wire 7-511 are aligned to the stacking rectangular cross-sections of the second wire 7-512.

Owing to the arrangement of the first wire 7-511 and the second wire 7-512, the width of the coil module can be efficiently reduced, so as to facilitate the miniaturization of the optical member driving mechanism 7-10. Furthermore, since the wires use the space on the corner, which is originally a void, a lower impedance in the same volume can be achieved, and the energy can be further saved.

In this embodiment, the corners of each of the rectangular cross-sections of the first wire 7-511 or the second wire 7-512 is fillets 7-R, so as to prevent damaging in assembly due to collision. At least one of the first wire 7-511 and the second wire 7-512 can be adhesive, such that the user can easily assemble and fix.

Figure 99:
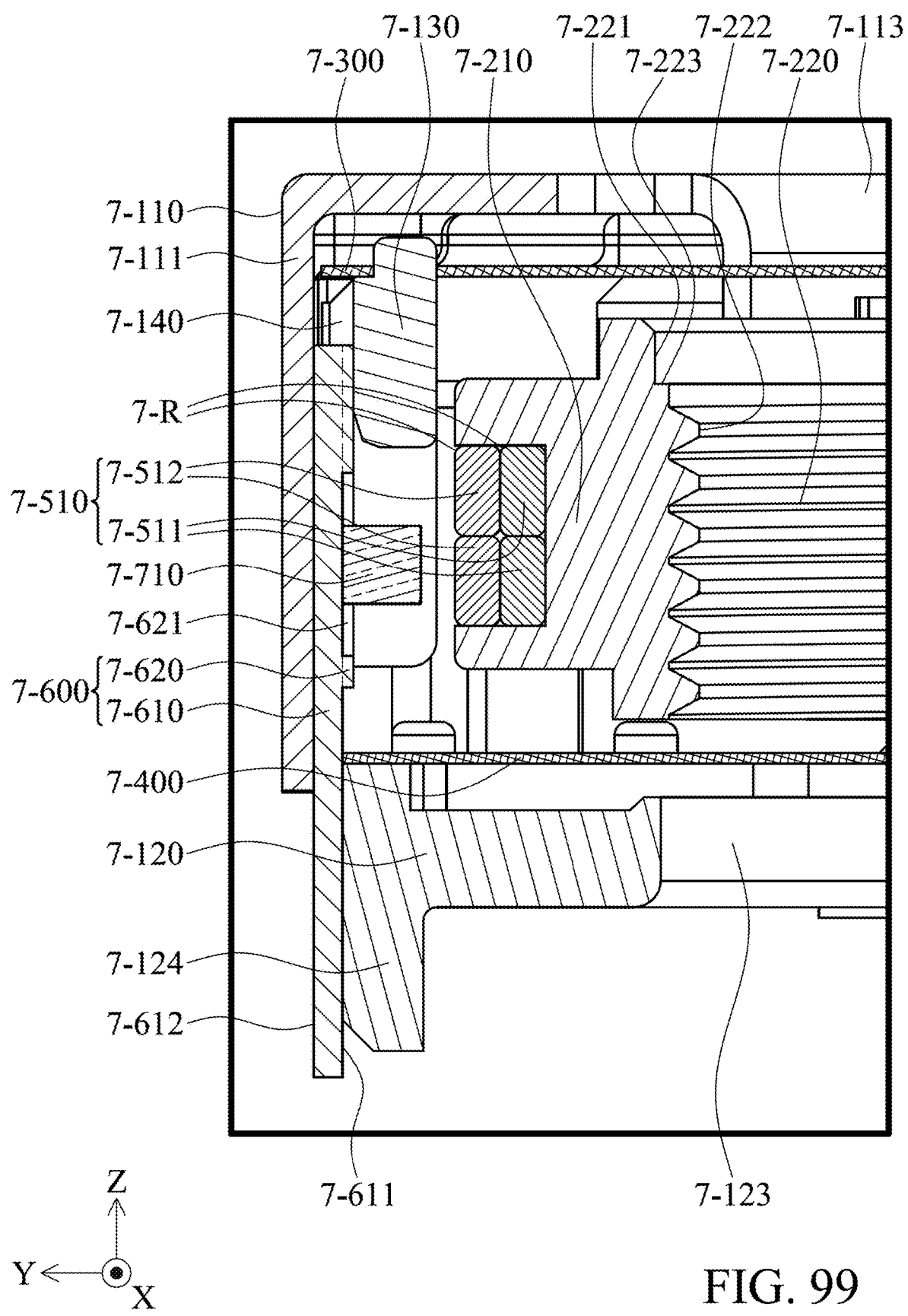
FIG. 99 is a schematic diagram of an optical member driving mechanism according to another embodiment of the invention.

In the aforementioned embodiment, the length of each of the rectangular cross-sections of the first wire 7-511 and the second wire 7-512 is substantially the same as the width of each of the rectangular cross-sections of the first wire 7-511 and the second wire 7-512, but it is not limited thereto. Referring to FIG. 99, in some embodiments, the length of each of the rectangular cross-sections of the first wire 7-511 and the second wire 7-512 is different than the width of each of the rectangular cross-sections of the first wire 7-511 and the second wire 7-512. For example, the length in a direction that is parallel to the optical axis 7-O is greater than the width in a direction that is perpendicular to the optical axis 7-O, so as to further reduce the dimensions of the optical member driving mechanism 7-10.

In some embodiments, the first electromagnetic driving member 7-510 can be a magnetic member, and the second electromagnetic driving member 7-520 can be a coil module.

Figure 100:
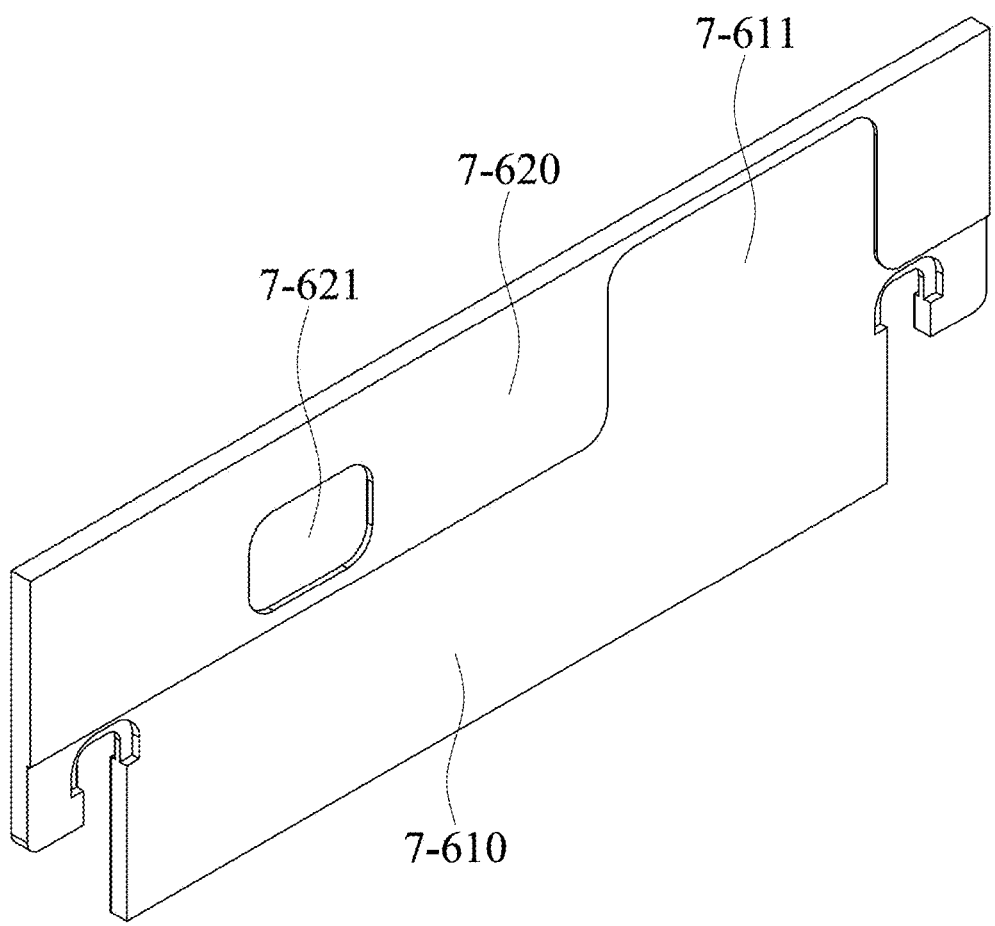
FIG. 100 is a schematic diagram of a circuit board according to an embodiment of the invention.

Referring to FIGS. 95, 96, and 100, the circuit board 7-600 of the optical member driving mechanism 7-10 is disposed in the gap 7-140, which is situated between the frame 7-130 and the case 7-110. The circuit board 7-600 includes a plate portion 7-610 and a protruding portion 7-620. The plate portion 7-610 has a first surface 7-611 and a second surface 7-612, wherein the first surface 7-611 faces the frame 7-130, and the second surface 7-612 faces the case 7-110. In this embodiment, the protruding portion 7-620 is situated between the frame 7-130 and the first surface 7-611, the protruding portion 7-620 contacts the frame 7-130, and the second surface 7-612 of the plate portion 7-610 contacts the case 7-110. Since the thickness of the plate portion 7-610 plus the thickness of the protruding portion 7-620 substantially equals the width of the gap 7-140, the circuit board 7-600 can be tightly disposed in the gap 7-140 and substantially parallel to the optical axis 7-O of the optical member 7-30.

Since the protruding portion 7-620 is situated between the frame 7-130 and the first surface 7-611, and does not extend to the base 7-120, the base 7-120 is closer to the plate portion 7-610 than the frame 7-130 as seen from the X-axis, and the protruding portion 7-620 and the base 7-120 do not overlap.

Furthermore, the peripheral area of the base 7-120 includes a supporting portion 7-124 extending along the optical axis 7-O, and the first surface 7-611 of the plate portion 7-610 can be attached on the supporting portion 7-124, so as to prevent the circuit board 7-600 from bending.

The sensing assembly 7-700 includes an electronic member 7-710, a sensor 7-720, and a sensing object 7-730. The electronic member 7-710 and the sensor 7-720 can be disposed on the circuit board 7-600 and electrically connected to each other. The sensing object 7-730 can be disposed on the optical member holder 7-210 and corresponded to the sensor 7-720.

The sensor 7-720 can detect the relative movement between the sensing object 7-720 and the sensor 7-730 to obtain the relative position between the fixed portion 7-100 and the movable portion 7-200. For example, the sensor 7-720 can be a Hall sensor, a magnetoresistance effect sensor (MR sensor), a giant magnetoresistance effect sensor (GMR sensor), a tunneling magnetoresistance effect sensor (TMR sensor), or a fluxgate sensor, and the sensing object 7-730 can be a magnet.

In this embodiment, one or more recesses 7-621 are formed on the protruding portion 7-620 of the circuit board 7-600, and the electronic member 7-710 and the sensor 7-720 can be disposed in the recesses 7-621. Therefore, as seen from the X-axis, the protruding portion 7-620 partially overlaps the electronic member 7-710 and/or the sensor 7-720. The collision to the electronic member 7-710 and/or the sensor 7-720 when the movable portion 7-200 moves relative to the fixed portion 7-100 can be avoided.

Figure 101:
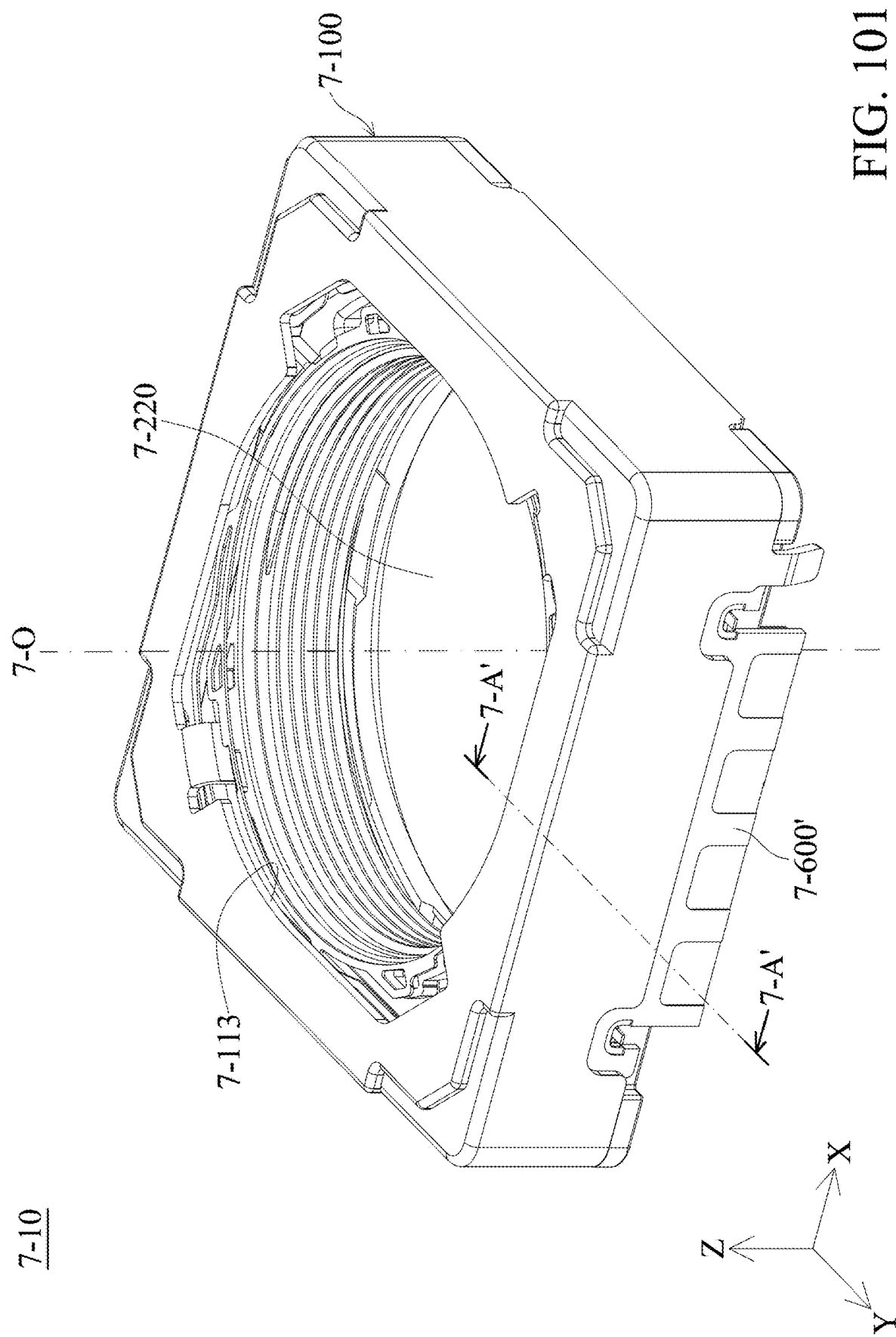
FIG. 101 is a schematic diagram of an optical member driving mechanism according to another embodiment of the invention.
Figure 102:
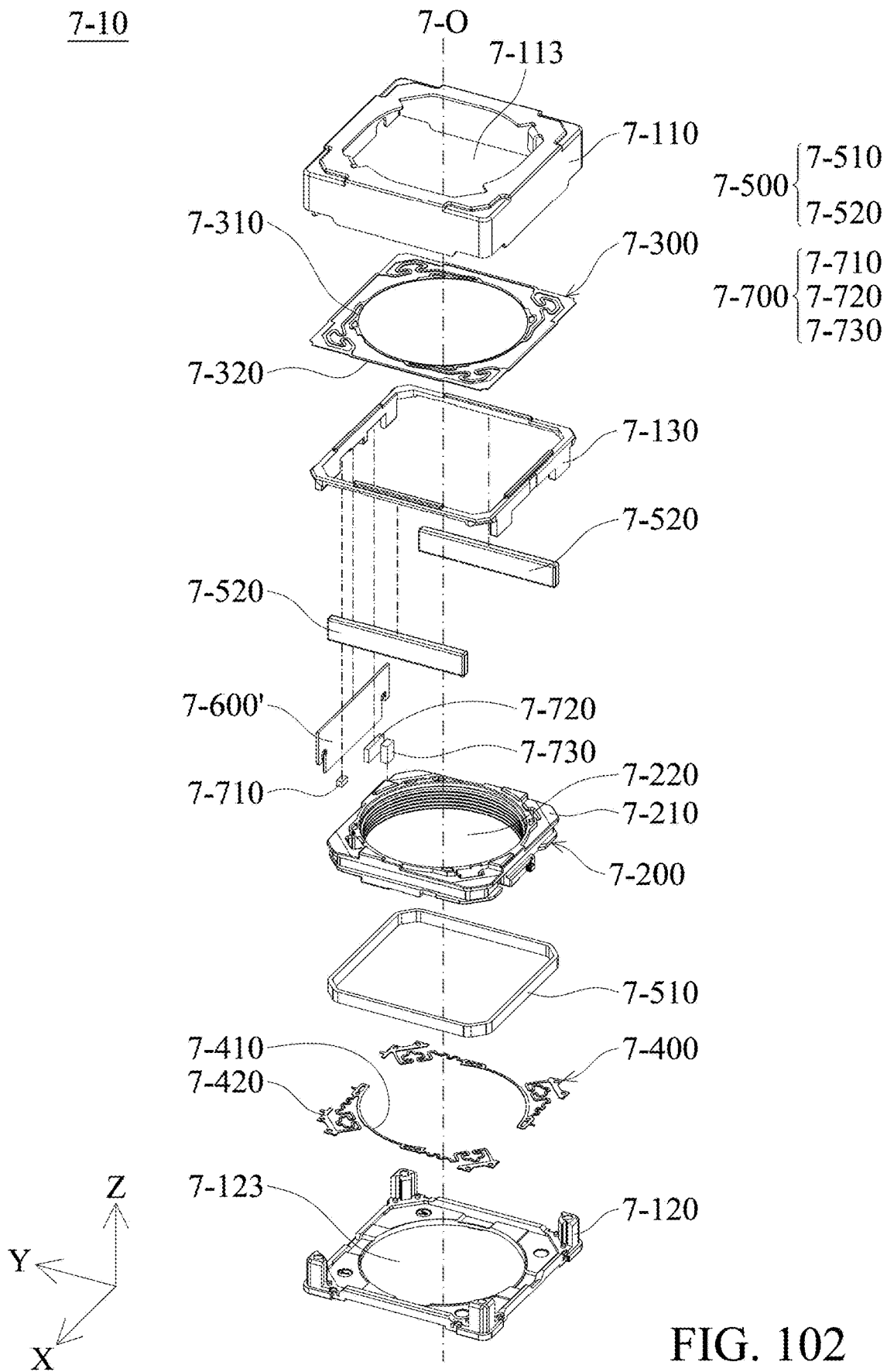
FIG. 102 is an exploded-view diagram of the optical member driving mechanism according to another embodiment of the invention.
Figure 103:
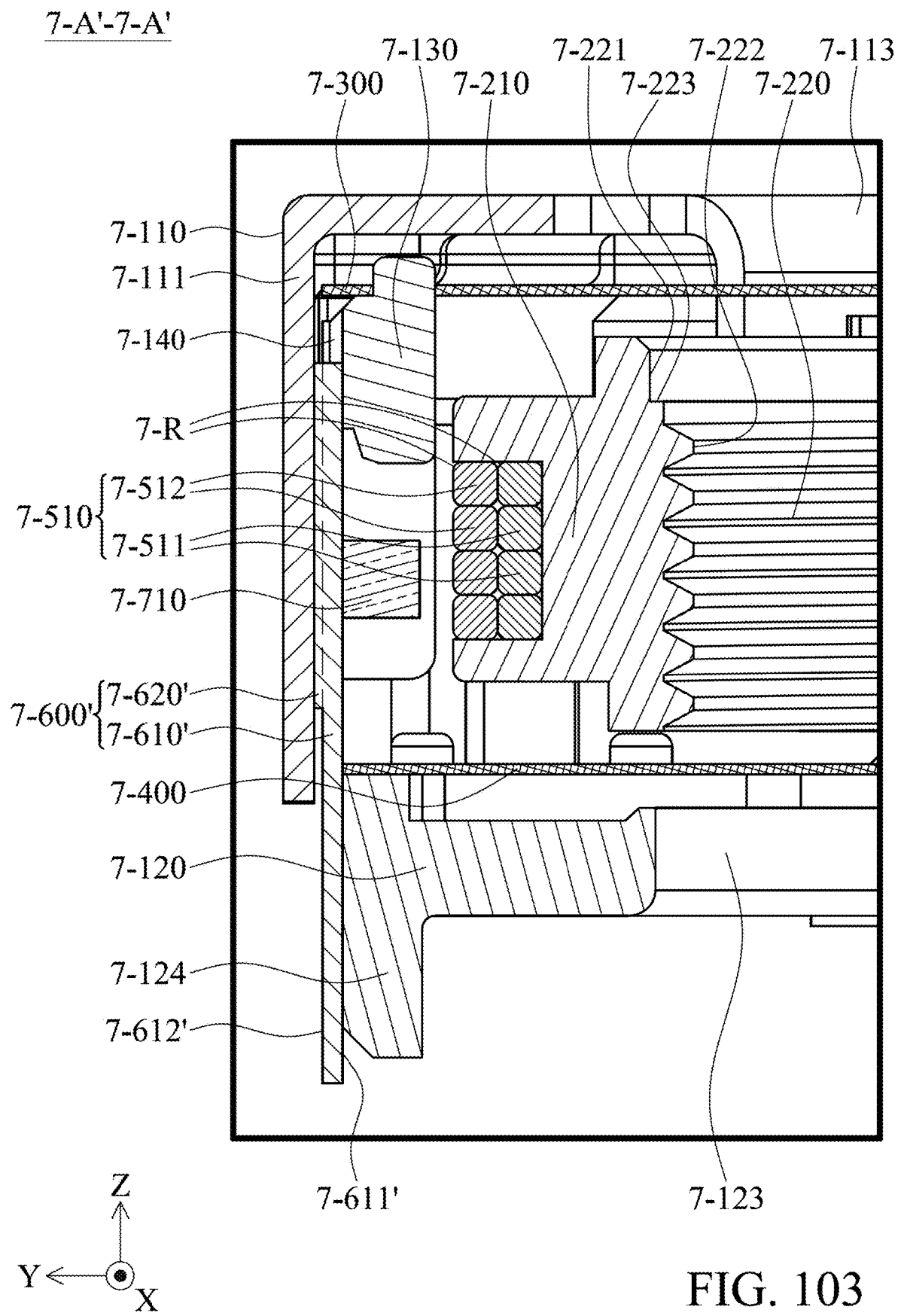
FIG. 103 is a cross-sectional view along the line 7-A'-7-A' in FIG. 101.

Referring to FIGS. 101-103, in another embodiment, an optical member driving mechanism 7-10' primarily includes a fixed portion 7-100, a movable portion 7-200, a first elastic member 7-300, a second elastic member 7-400, a driving assembly 7-500, a circuit board 7-600', and a sensing assembly 7-700. The structure and the arrangement of the fixed portion 7-100, the movable portion 7-200, the first elastic member 7-300, the second elastic member 7-400, the driving assembly 7-500, and the sensing assembly 7-700 are similar to the same component in the aforementioned embodiment, the features thereof are not repeated in the interest of brevity.

In this embodiment, the circuit board 7-600' is also disposed in the gap 7-140 between the frame 7-130 and the case 7-110, and includes a plate portion 7-610' and a protruding portion 7-620'. A first surface 7-611' of the plate portion 7-610' faces the frame 7-130, and second surface 7-612' of the plate portion 7-610' faces the case 7-110. Different from the aforementioned embodiment is that the protruding portion 7-620' is situated between the case 7-110 and the second surface 7-612', the protruding portion 7-620' contacts the case 7-110, and the first surface 7-611' of the plate portion 7-610' contacts the frame 7-130.

In summary, an optical member driving mechanism for driving an optical member having an optical axis is provided, including a fixed portion, a movable portion, a driving assembly, and a circuit board. The fixed portion includes a case and a frame, and a gap is formed therebetween. The movable portion is movably connected to the fixed portion, and configured to hold the optical member. The driving assembly can drive the movable portion to move relative to the fixed portion. The circuit board is disposed in the gap, and has a plate portion and a protruding portion. The protruding portion is disposed between the plate portion and the fixed portion, so as to tightly dispose the circuit board in the gap.

Figure 104:
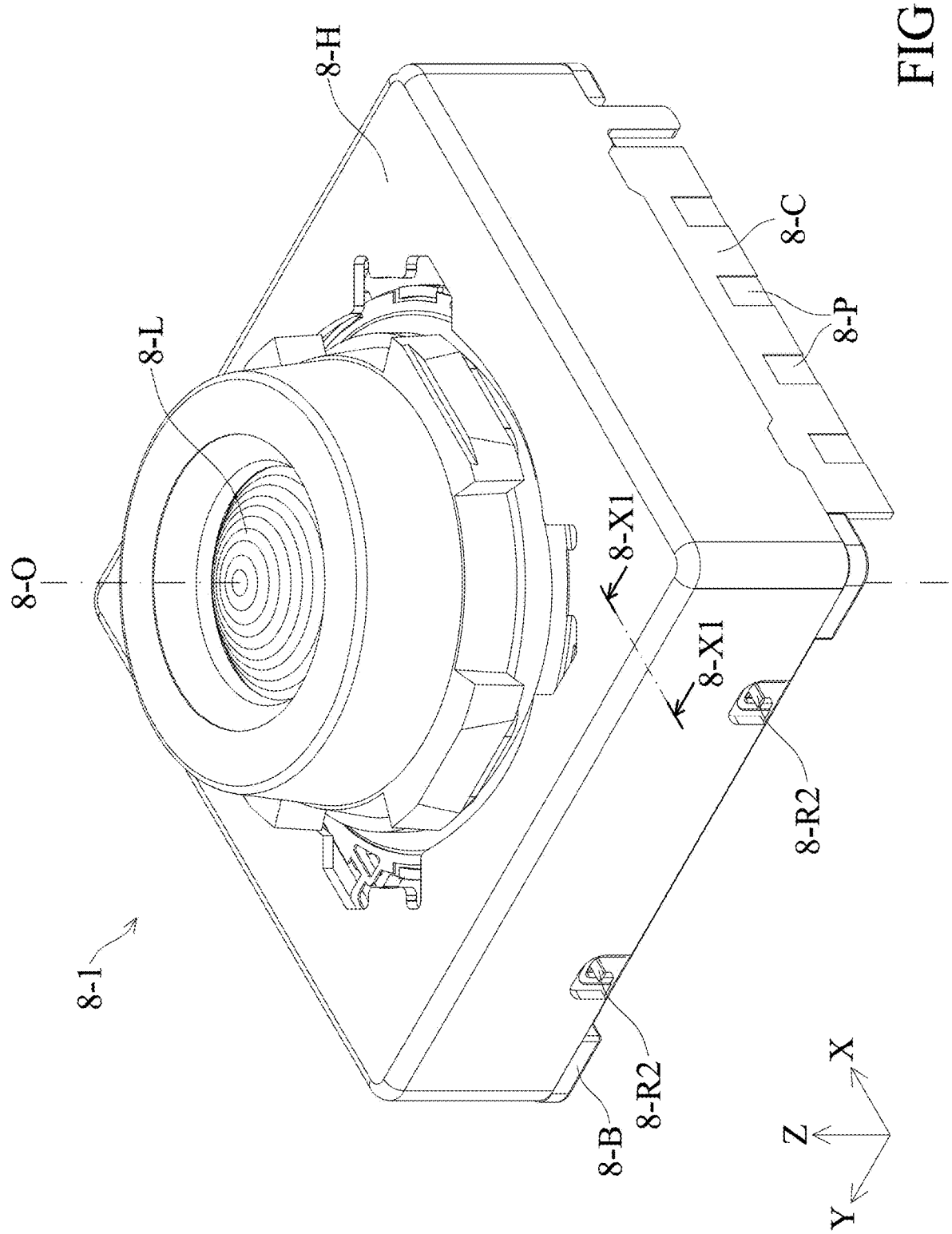
FIG. 104 shows a perspective diagram of an optical element disposed in a driving mechanism in accordance with an embodiment of the invention.
Figure 105:
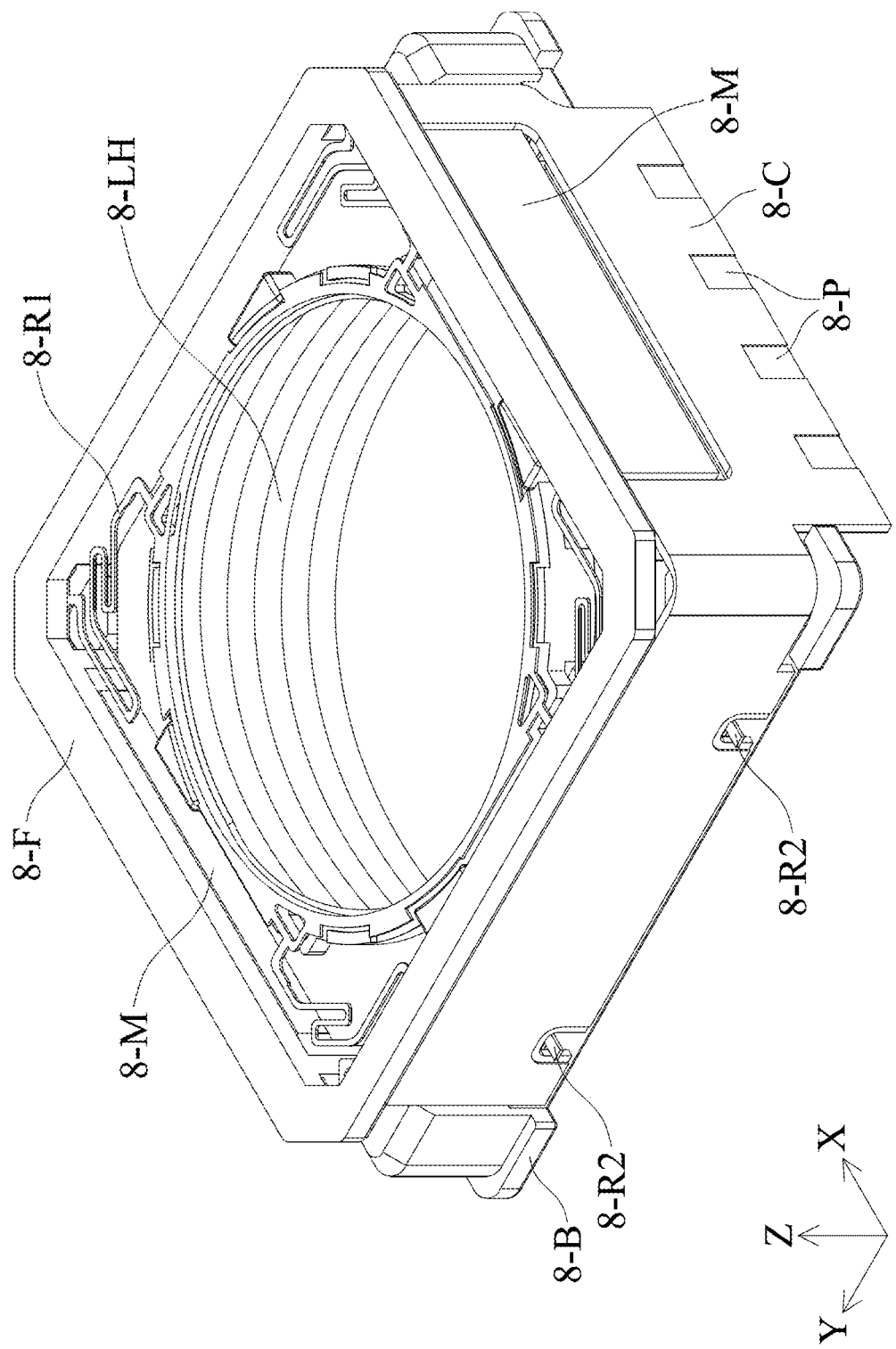
FIG. 105 shows a perspective diagram of the driving mechanism in FIG. 104 with the housing removed therefrom.

Referring to FIGS. 104 and 105, FIG. 104 shows a perspective diagram of an optical element 8-L disposed in a driving mechanism 8-1 in accordance with an embodiment of the invention, and FIG. 105 shows a perspective diagram of the driving mechanism 8-1 in FIG. 104 with the housing 8-H removed therefrom. The optical element 8-L, such as an optical lens, can be joined to driving mechanism 8-1 and constitute a camera lens module. The camera lens module may be disposed in handheld digital products such as mobile phones or tablet PCs for photographing or video recording.

In this embodiment, the driving mechanism 8-1 may comprise a voice coil motor (VCM) for driving the optical element 8-L to move in a direction parallel to or perpendicular to an optical axis 8-O of the optical element 8-L, so as to perform auto-focusing (AF) or optical image stabilizer (OIS) function of the camera lens module, wherein the optical axis 8-O is parallel to the Z axis.

As shown in FIGS. 104 and 105, the driving mechanism 8-1 primarily comprises a housing 8-H, a base 8-B connected to the housing 8-H, and a holder 8-LH movably received in the housing 8-H. The housing 8-H and the base 8-B are affixed to each other and constitute a fixed part of the driving mechanism 8-1. Moreover, the holder 8-LH constitutes a movable part of the driving mechanism 8-1 for holding the optical element 8-L. A frame 8-F is affixed to the inner surface of the housing 8-H, and a sheet spring 8-R1 connects the holder 8-LH to the frame 8-F, whereby the holder 8-LH and the optical element 8-L disposed in the holder 8-LH can move relative to the housing 8-H and the base 8-B.

At least a magnetic element 8-M (e.g. magnet) is adhered to the frame 8-F for driving the holder 8-LH to move relative to the housing 8-H and the base 8-B by magnetic force. Moreover, an L-shaped circuit board 8-C is arranged through two lateral sides of the polygonal base 8-B, and a plurality of terminals 8-P are formed at the bottom of the circuit board 8-C to electrically connect to an external circuit. In this embodiment, the circuit board 8-C may be a multilayer flexible printed circuit board.

Figure 106:
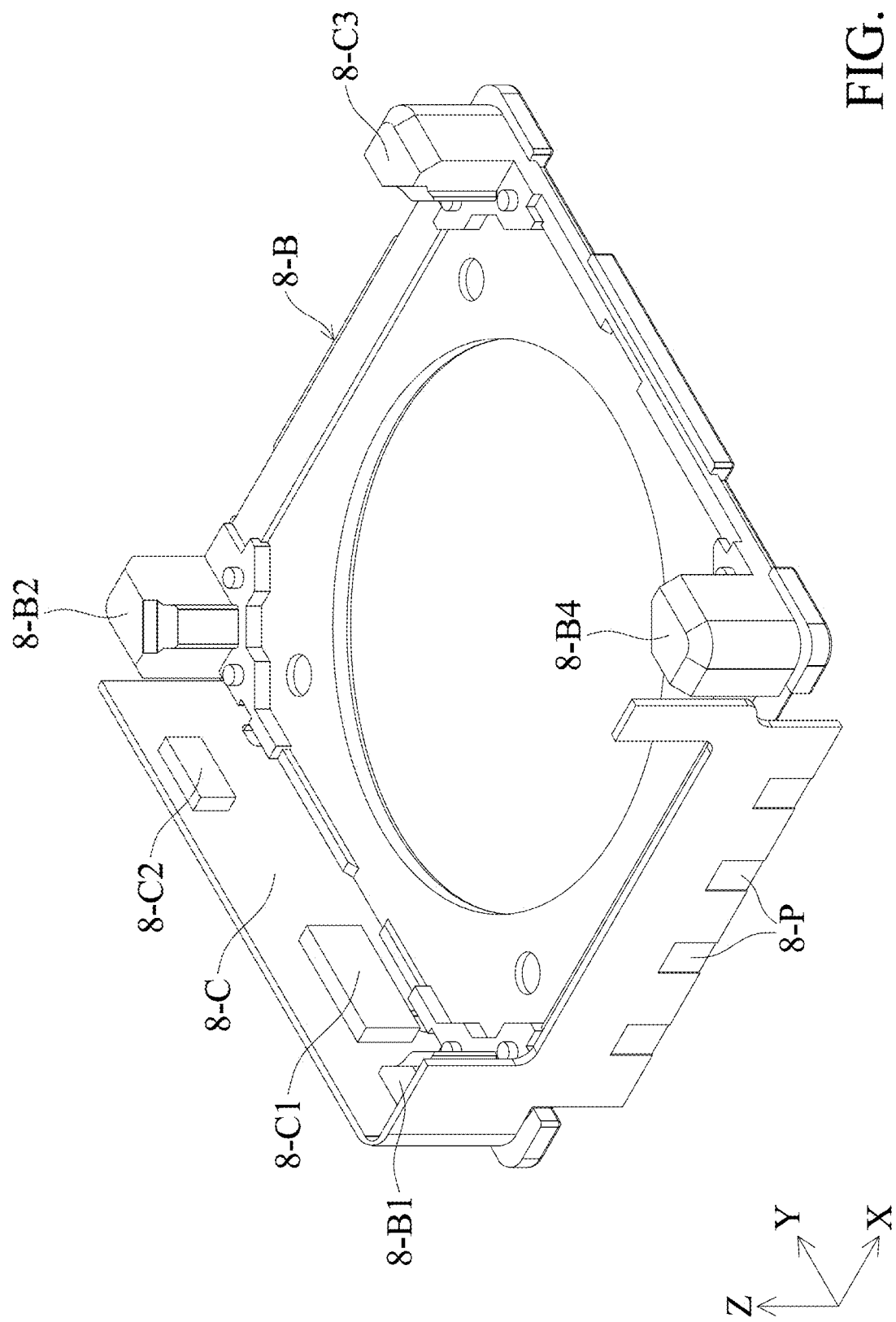
FIG. 106 shows the circuit board and the base after assembly of the driving mechanism.
Figure 107:
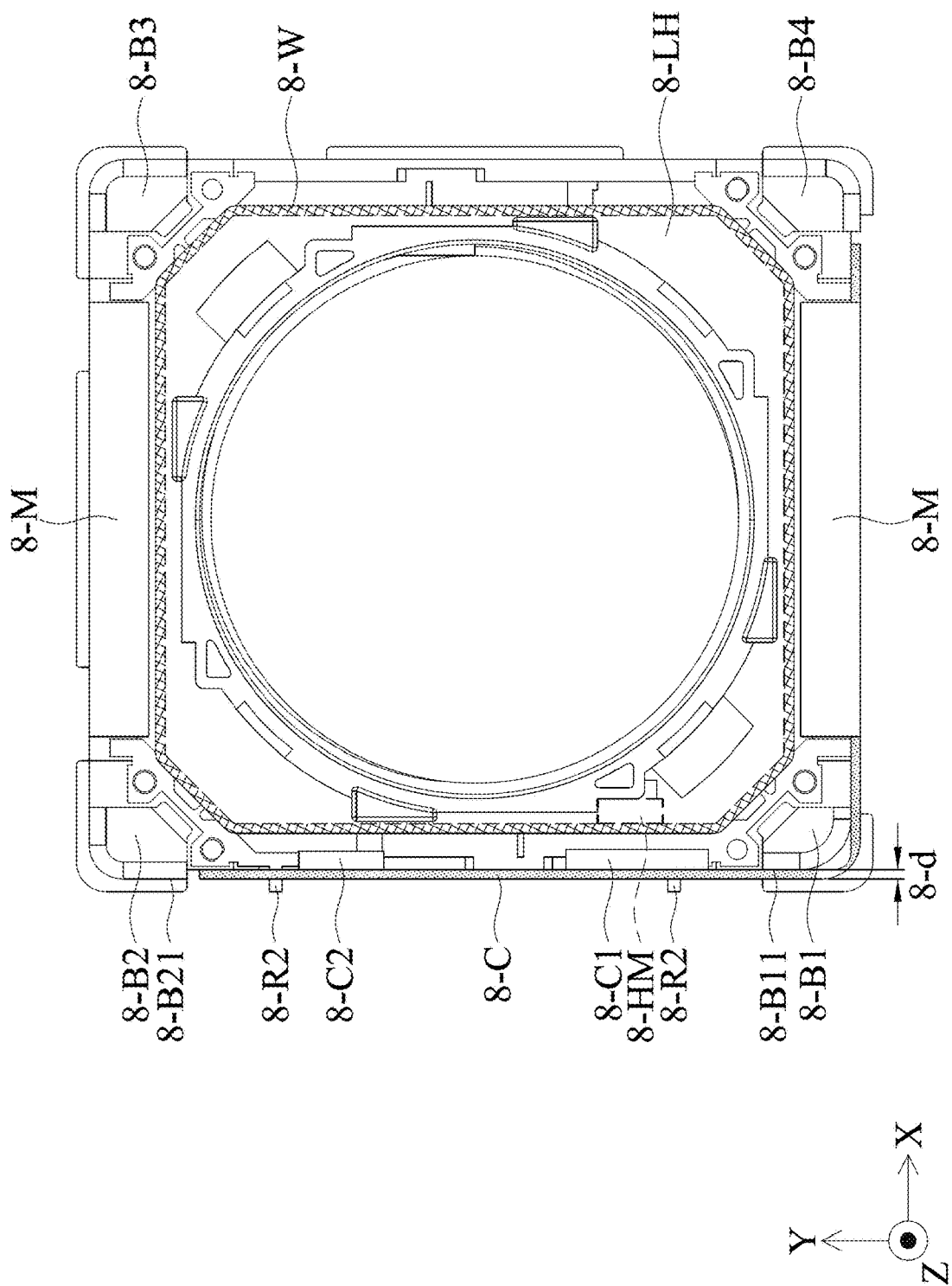
FIG. 107 shows a top view of the base, the magnetic elements, and the holder 8-LH after assembly of the driving mechanism.

FIG. 106 shows the circuit board 8-C and the base 8-B after assembly of the driving mechanism, and FIG. 107 shows a top view of the base 8-B, the magnetic elements 8-M, and the holder 8-LH after assembly of the driving mechanism.

As shown in FIGS. 106 and 107, a position sensor 8-C1 and a filter 8-C2 (e.g. capacitor) are disposed on the inner side of the circuit board 8-C. The position sensor 8-C1 may be an integrated circuit element for detecting the displacement of an object 8-HM (FIG. 107) on the holder 8-LH (movable part) relative to the housing 8-H and the base 8-B (fixed part). In this embodiment, the position sensor 8-C1 is a Hall effect sensor, and the object 8-HM comprises a magnet.

Referring to FIG. 107, a coil 8-W is disposed around the holder 8-LH and located corresponding to the magnetic elements 8-M. The coil 8-W and the magnetic elements 8-M can constitute a driving assembly for moving the holder 8-LH. When an external circuit applies a current signal to the coil 8-W, the magnetic elements 8-M and the coil 8-W can generate an electromagnetic force driving the holder 8-LH to move relative to the housing 8-H and the base 8-B. Specifically, when viewed in the Z direction, the circuit board 8-C and the holder 8-LH do not overlap.

Still referring to FIGS. 106 and 107, the base 8-B forms a first protrusion 8-B1 a second protrusion 8-B2, a third protrusion 8-B3, and a fourth protrusion 8-B4 extending in the Z direction and located at the four corners of the base 8-B. It should be noted that only the first protrusion 8-B1 is in contact with the circuit board 8-C, and the second and fourth protrusions 8-B2 and 8-B4 are spaced apart from the circuit board 8-C. Thus, mechanical interference between the circuit board 8-C and the base 8-B can be reduced to facilitate rapid positioning and assembly of the driving mechanism.

In this embodiment, the first protrusion 8-B1 has a first flat outer surface 8-B11 perpendicular to the X axis, and the second protrusion 8-B2 has a second flat outer surface 8-B21 perpendicular to the X axis. Specifically, the first and second flat outer surfaces 8-B11 and 8-B21 are offset and have a distance 8-d along the X axis. That is, the first and second flat outer surfaces 8-B11 and 8-B21 are located in different position along the X axis, whereby a space adjacent to the first protrusion 8-B1 can be provided for receiving the circuit board 8-C.

Figure 108:
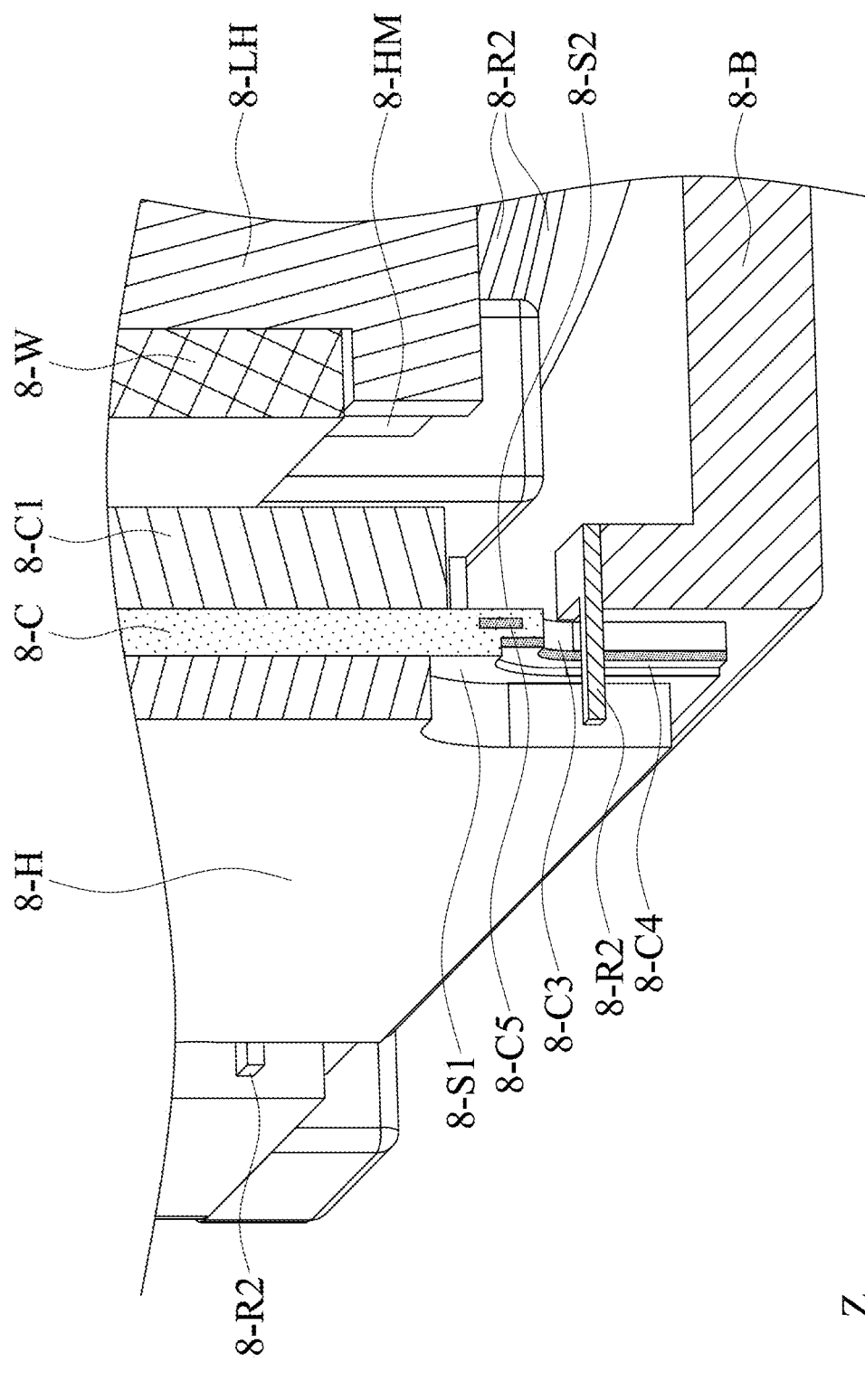
FIG. 108 shows a partial cross-sectional view taken along line 8-X1-8-X1 in FIG. 104.

FIG. 108 shows a partial cross-sectional view taken along line 8-X1-8-X1 in FIG. 104. As shown in FIGS. 104, 105 and 108, the holder 8-LH is connected to the base 8-B via another sheet spring 8-R2. The sheet spring 8-R2 is a metal conductive element that has an end extending through an opening portion 8-C3 (FIG. 108) of the circuit board 8-C. During assembly, the end of the sheet spring 8-R2 can be electrically connected to a conductive portion 8-C4 of the circuit board 8-C by soldering, welding, or conductive glue. In this embodiment, the conductive portion 8-C4 is located adjacent to the opening portion 8-C3 on the bottom side of the circuit board 8-C, and it is exposed to an outer surface 8-S1 of the circuit board 8-C.

It should be noted that the circuit board 8-C may be a multilayer flexible circuit board, wherein a trace 8-C5 is embedded in the circuit board 8-C and electrically connected to the position sensor 8-C1. Here, the conductive portion 8-C4 and the trace 8-C5 are situated in different layers of the circuit board 8-C, and they partially overlap each other when viewed along the X axis (horizontal direction).

Still referring to FIG. 108, as the sheet spring 8-R2 (conductive element) is electrically connected to the coil 8-W on the holder 8-LH by soldering, welding, or conductive glue, an external circuit can apply an electrical signal sequentially through the circuit board 8-C and the sheet spring 8-R2 to the coil 8-W, thereby generating an electromagnetic force for driving the holder 8-LH (movable part) to move relative to the housing 8-H and the base 8-B (fixed part).

To reduce the height of the driving mechanism 8-1 in the Z direction, the position sensor 8-C1 on the inner surface 8-S2 of the circuit board 8-C may be located close to the opening portion 8-C3 on the bottom side of the circuit board 8-C. Moreover, when viewed along the Z direction, the position sensor 8-C1 overlap with the sheet spring 8-R2. In this configuration, the conductive portion 8-C4 is only exposed to the outer surface 8-S1, but not exposed to the inner surface 8-S2 of the circuit board 8-C, so that it is ensured that the opening portion 8-C3 can have a considerable thickness to provide more space and flexibility for circuit design. Here, since the opening portion 8-C3 has a considerable thickness, the solder material would not flow from the outer surface 8-S1 to the inner surface 8-S2 of the circuit board 8-C during the soldering process.

Figure 109:
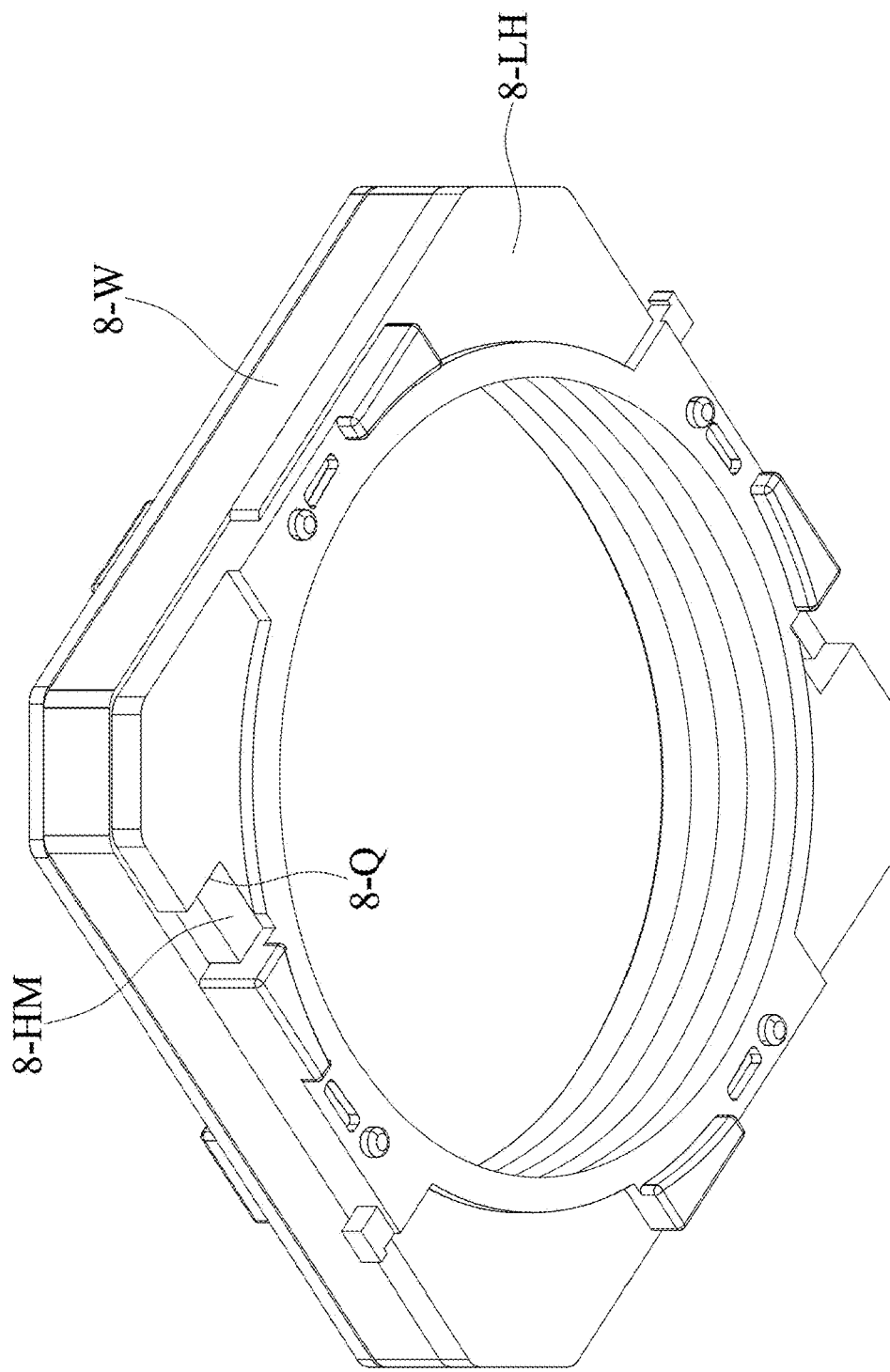
FIG. 109 is a perspective view showing the object and the coil disposed on the holder.
Figure 110:
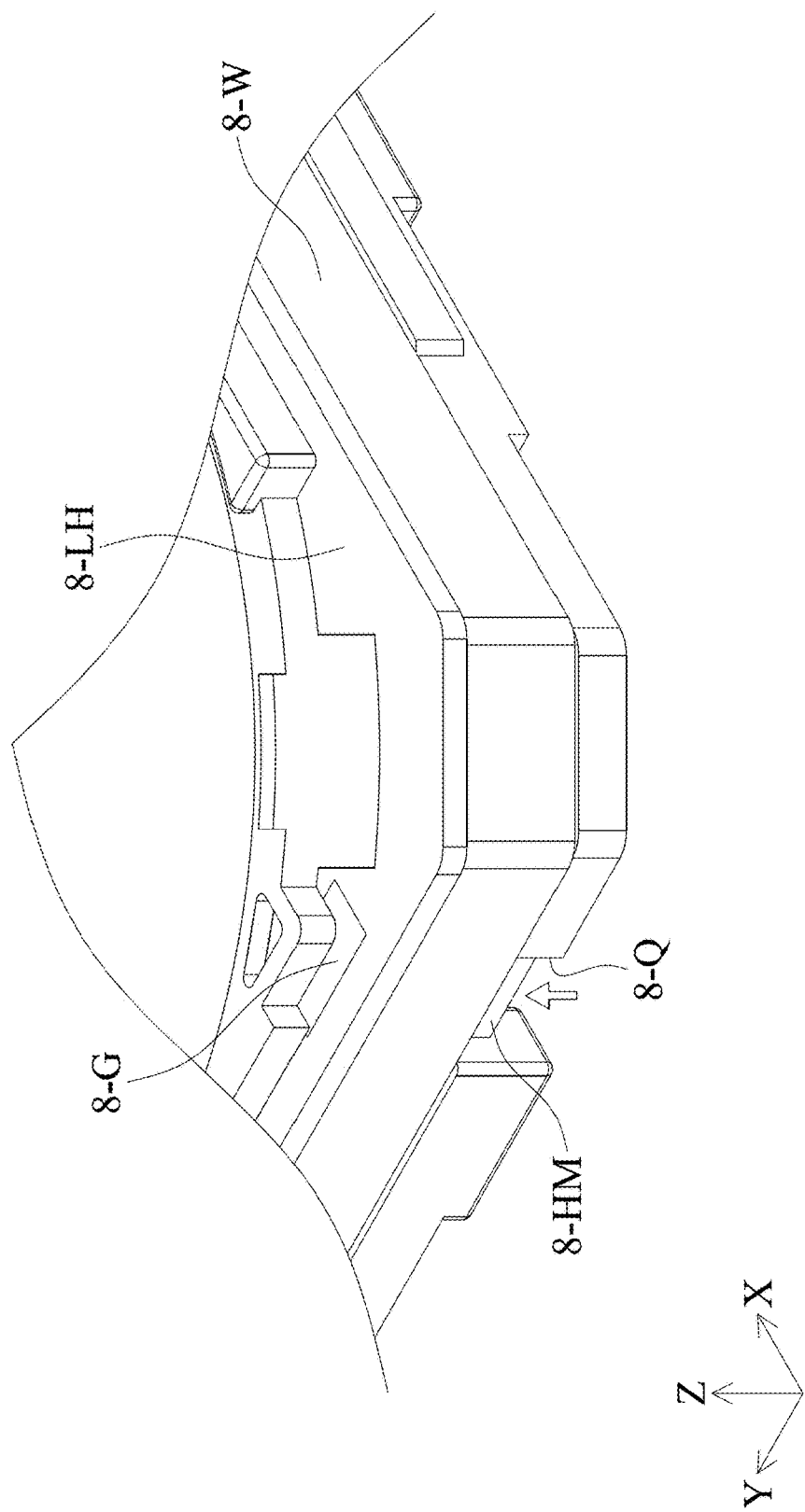
FIG. 110 is a partial enlarged view showing the object inserted in a recess of the holder.
Figure 111:
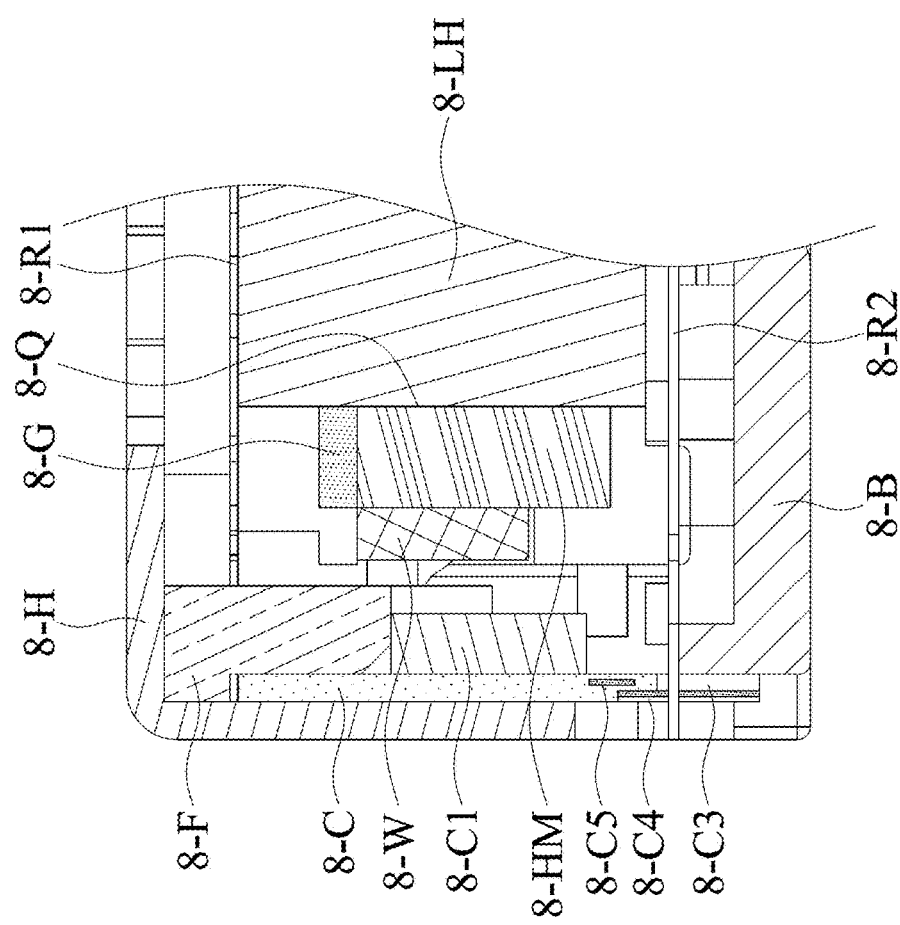
FIG. 111 is an enlarged partial cross-sectional view of the driving mechanism in FIG. 104.

FIG. 109 is a perspective view showing the object 8-HM and the coil 8-W disposed on the holder 8-LH, FIG. 110 is a partial enlarged view showing the object 8-HM inserted in a recess 8-Q of the holder 8-LH, and FIG. 111 is an enlarged partial cross-sectional view of the driving mechanism 8-1 in FIG. 104.

Referring to FIGS. 109-111, a recess 8-Q is formed on the holder 8-LH for receiving the object 8-HM (e.g. magnet). In this embodiment, the recess 8-Q extends from a bottom surface toward a top surface of the holder 8-LH in the Z direction. During assembly, the object 8-HM can be inserted into the recess 8-Q from the bottom surface toward the top surface of the holder 8-LH, as the arrow indicates in FIG.

110, thus preventing the object 8-HM from separating from the holder 8-LH due to the magnetic forces generated by the magnetic elements 8-M or the coil 8-W.

In some embodiments, the glue 8-G may be disposed in the recess 8-Q before inserting the object 8-HM into the recess 8-Q. After inserting the object 8-HM into the recess 8-Q, the sheet spring 8-R2 can be assembled to the bottom side of the holder 8-LH, thereby facilitating simple and rapid assembly of the driving mechanism. It should be noted that the recess 8-Q may penetrate through the holder 8-LH or not, and the object 8-HM may be exposed to the bottom side of the holder 8-LH after assembly.

Figure 112:
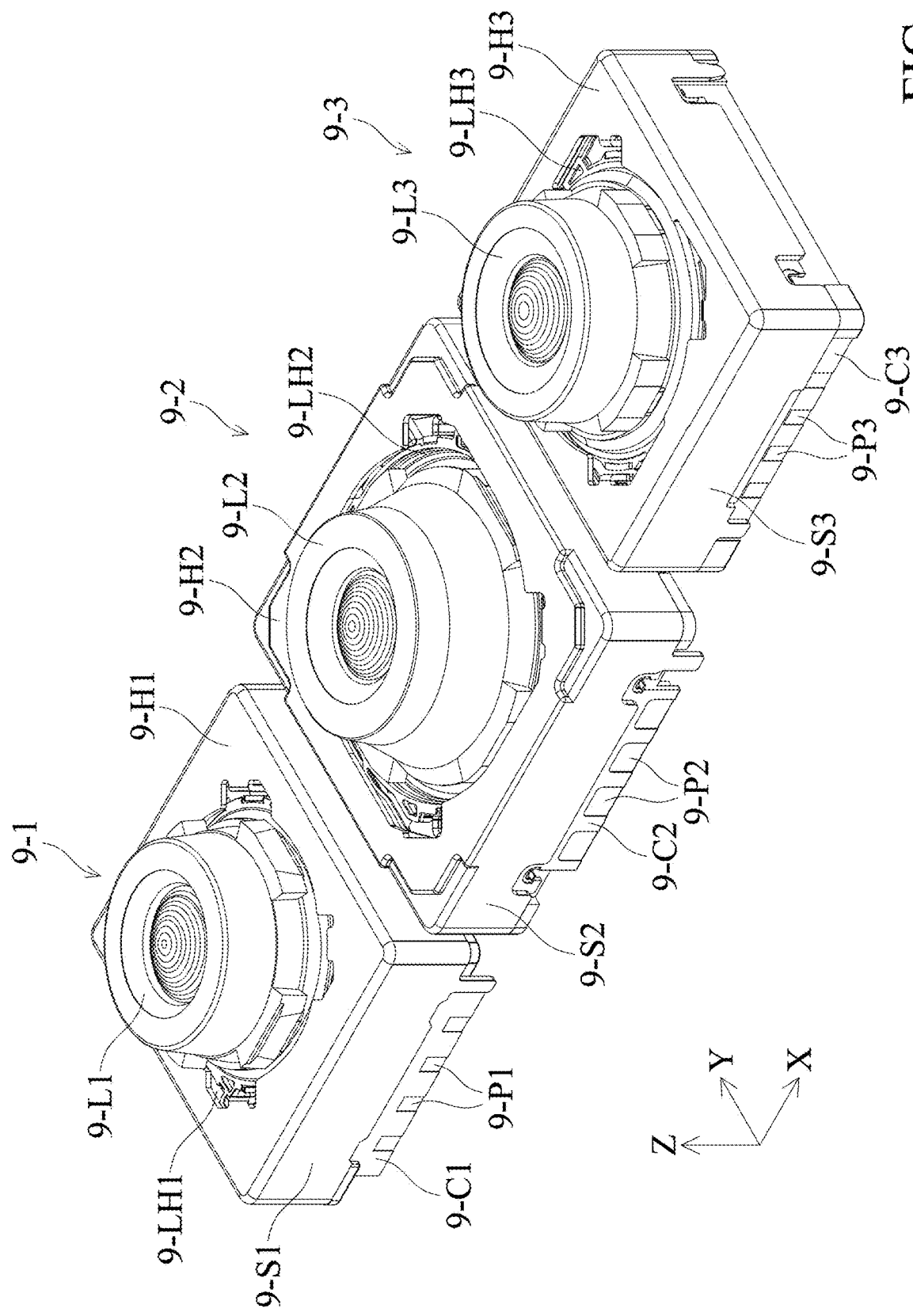
FIG. 112 is a perspective diagram of three optical elements received in a driving system in accordance with an embodiment of the invention.
Figure 113:
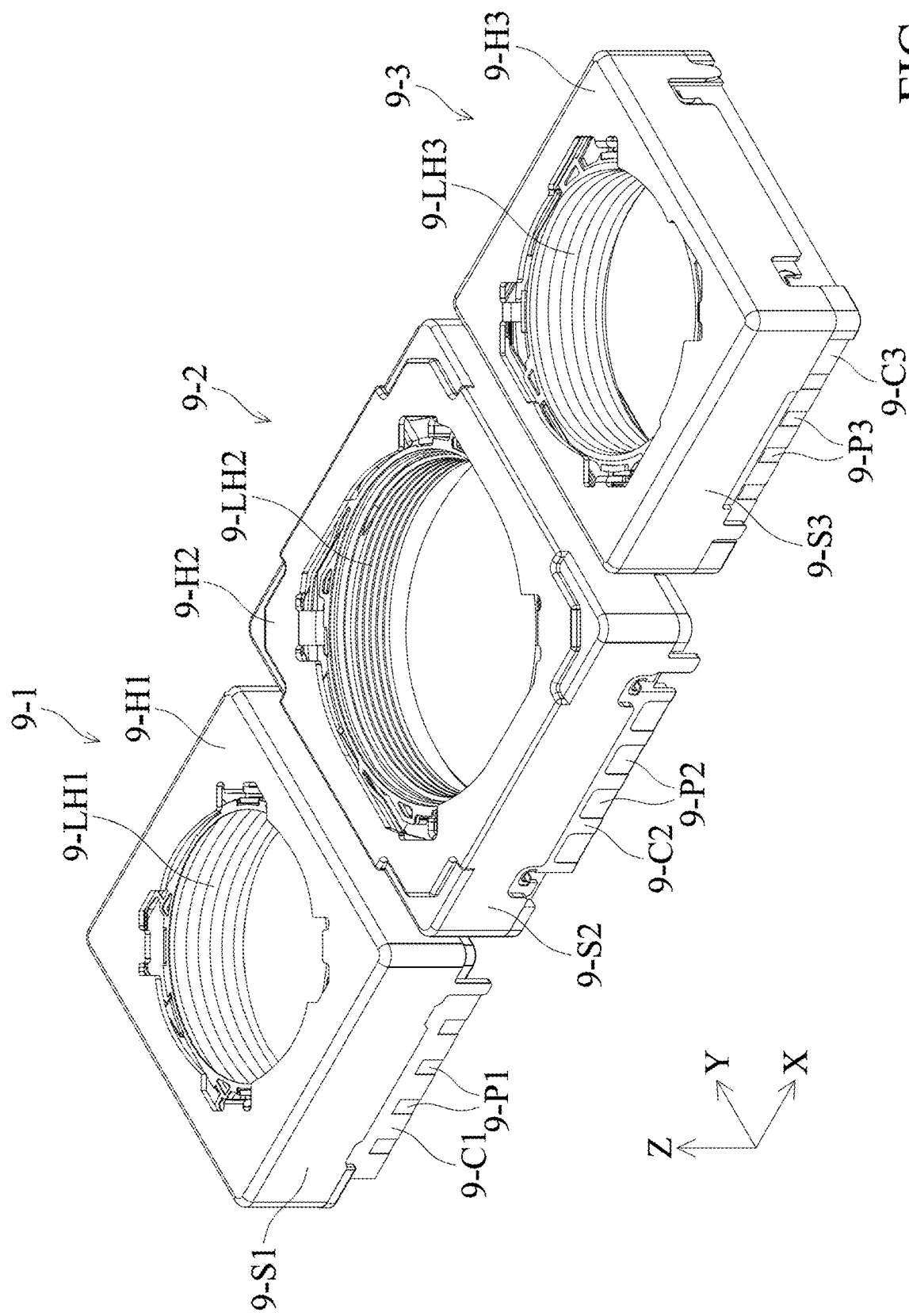
FIG. 113 is a perspective diagram of the driving system in FIG. 112.
Figure 114:
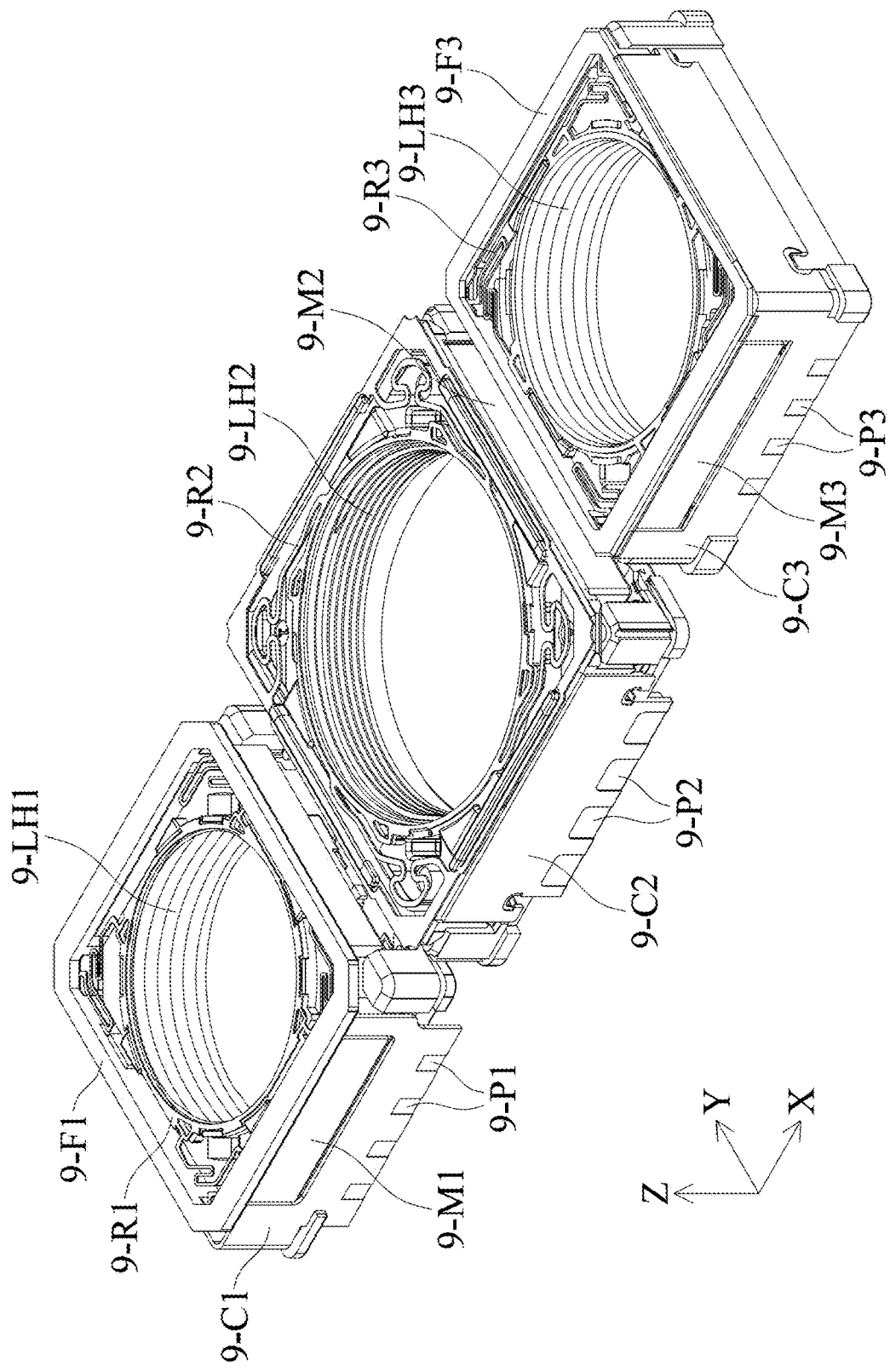
FIG. 114 is a perspective diagram of the driving system of FIG. 112 with the housings removed therefrom.

Referring to FIGS. 112 to 114, FIG. 112 is a perspective diagram of three optical elements 9-L1, 9-L2 and 9-L3 received in a driving system in accordance with an embodiment of the invention, FIG. 113 is a perspective diagram of the driving system in FIG. 112, and FIG. 114 is a perspective diagram of the driving system of FIG. 112 with the housings 9-H1, 9-H2 and 9-H3 removed therefrom.

As shown in FIGS. 112 to 114, the driving system in this embodiment primarily comprises a first module 9-1, a second module 9-2, and a third module L3 for holding and moving the three optical elements 9-L1, 9-L2 and 9-L3. The optical elements 9-L1, 9-L2 and 9-L3 may be optical lenses having different focal lengths or optical effective diameters, and they are joined in the first, second and third modules 9-1, 9-2 and 9-3 to constitute a camera lens system. The camera lens system may be disposed in handheld digital products such as mobile phones or tablet PCs.

For example, the first, second and third modules 9-1, 9-2 and 9-3 may comprise a voice coil motor (VCM) for driving the optical elements 9-L1, 9-L2 and 9-L3 to move in a direction parallel to or perpendicular to the optical axes thereof, so as to perform auto-focusing (AF) or optical image stabilizer (OIS) function of an the camera lens system, wherein the optical axes of the optical elements 9-L1, 9-L2 and 9-L3 are parallel to the Z axis.

FIG. 114 shows three frames 9-F1, 9-F2 and 9-F3 are respectively disposed in the first, second and third modules 9-1, 9-2 and 9-3. During assembly, the frames 9-F1, 9-F2 and 9-F3 are respectively adhered to the inner surface of the housings 9-H1, 9-H2 and 9-H3. Moreover, three sheet springs 9-R1, 9-R2 and 9-R3 respectively connect the frames 9-F1, 9-F2 and 9-F3 to the holders 9-LH1, 9-LH2 and 9-LH3, whereby the holders 9-LH1, 9-LH2 and 9-LH3 and the optical elements 9-L1, 9-L2 and 9-L3 are movable relative to the frames 9-F1, 9-F2 and 9-F3 and the housings 9-H1, 9-H2 and 9-H3.

Additionally, the first, second and third modules 9-1, 9-2 and 9-3 respectively have a first magnetic element 9-M1, a second magnetic element 9-M2, and a third magnetic element 9-M3, and the first, second and third magnetic elements 9-M1 to 9-M3 are respectively adhered to the frames 9-F1, 9-F2 and 9-F3. In this embodiment, the first, second and third magnetic elements 9-M1, 9-M2 and 9-M3 are magnets, and when an external circuit applies current signals to the coils (not shown) on the holders 9-LH1, 9-LH2 and 9-LH3, electromagnetic forces can be generated by the coils and the magnets. Thus, the holders 9-LH1, 9-LH2 and 9-LH3 and the optical elements 9-L1, 9-L2 and 9-L3 can be driven to move relative to the frames 9-F1, 9-F2 and 9-F3 and the housings 9-H1, 9-H2 and 9-H3, so as to achieve auto-focusing (AF) or optical image stabilizer (OIS) function of the camera lens system.

Still referring to FIGS. 112 to 114, the first, second and third modules 9-1, 9-2 and 9-3 respectively comprise a first circuit board 9-C1, a second circuit board 9-C2, and a third circuit board 9-C3 that electrically connect the coils on the holders 9-LH1, 9-LH2 and 9-LH3 to an external circuit. As shown in FIGS. 112 and 113, the first circuit board 9-C1 has a first terminal 9-P1 located on a first side 9-S1 of the first module 9-1, the second circuit board 9-C2 has a second terminal 9-P2 located on a second side 9-S2 of the second module 9-2, and the third circuit board 9-C3 has a third terminal 9-P3 located on a third side 9-S3 of the third module 9-3. In some embodiments, the first, second and third terminals 9-P1 to 9-P3 may be directly embedded in the bases of the first, second and third modules 9-1 to 9-3 without the circuit boards 9-C1 to 9-C3.

It should be noted that the first, second and third sides 9-S1 to 9-S3 of the first, second and third modules 9-1 to 9-3 are located on the same side of the driving system. As at least two of the first, second and third terminals 9-P1 to 9-P3 are located on the same side of the driving system, they can be electrically connected to the external circuit by a single process (e.g. soldering, welding or conductive glue) without rotation of the driving system, thereby increasing assembly efficiency and reducing the production cost.

Figure 115:
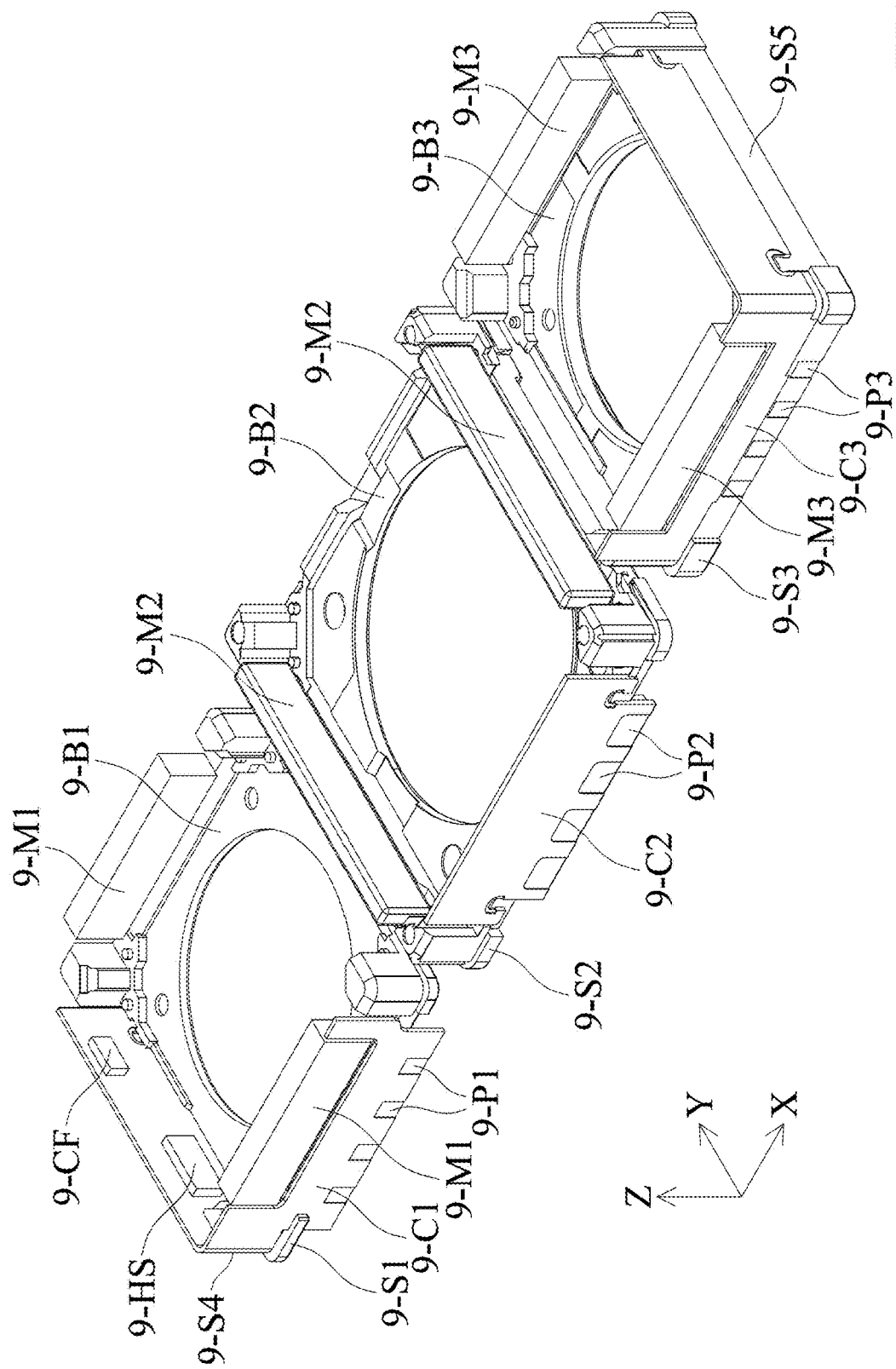
FIGS. 115-117 are perspective diagrams and top view of the driving system with the housings, the frames, and the holders removed therefrom.
Figure 116:
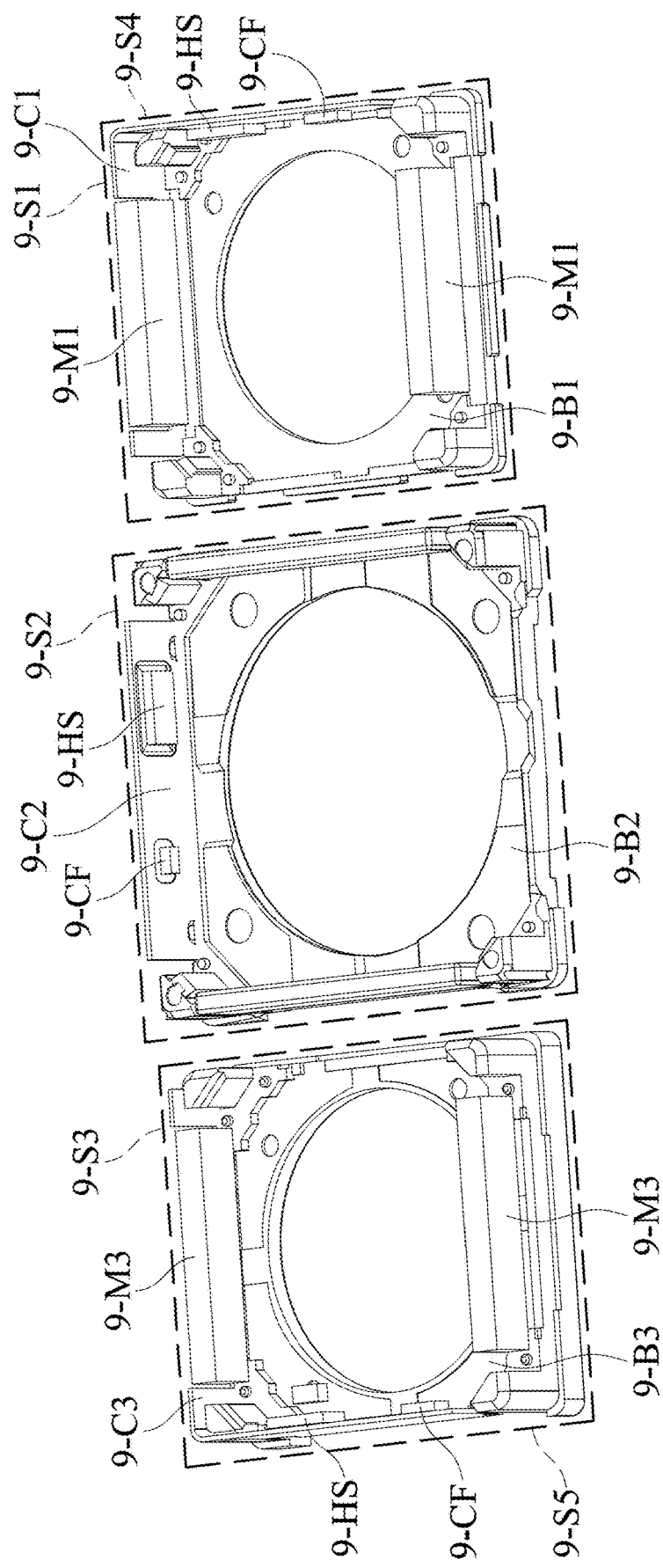
Figure 117:
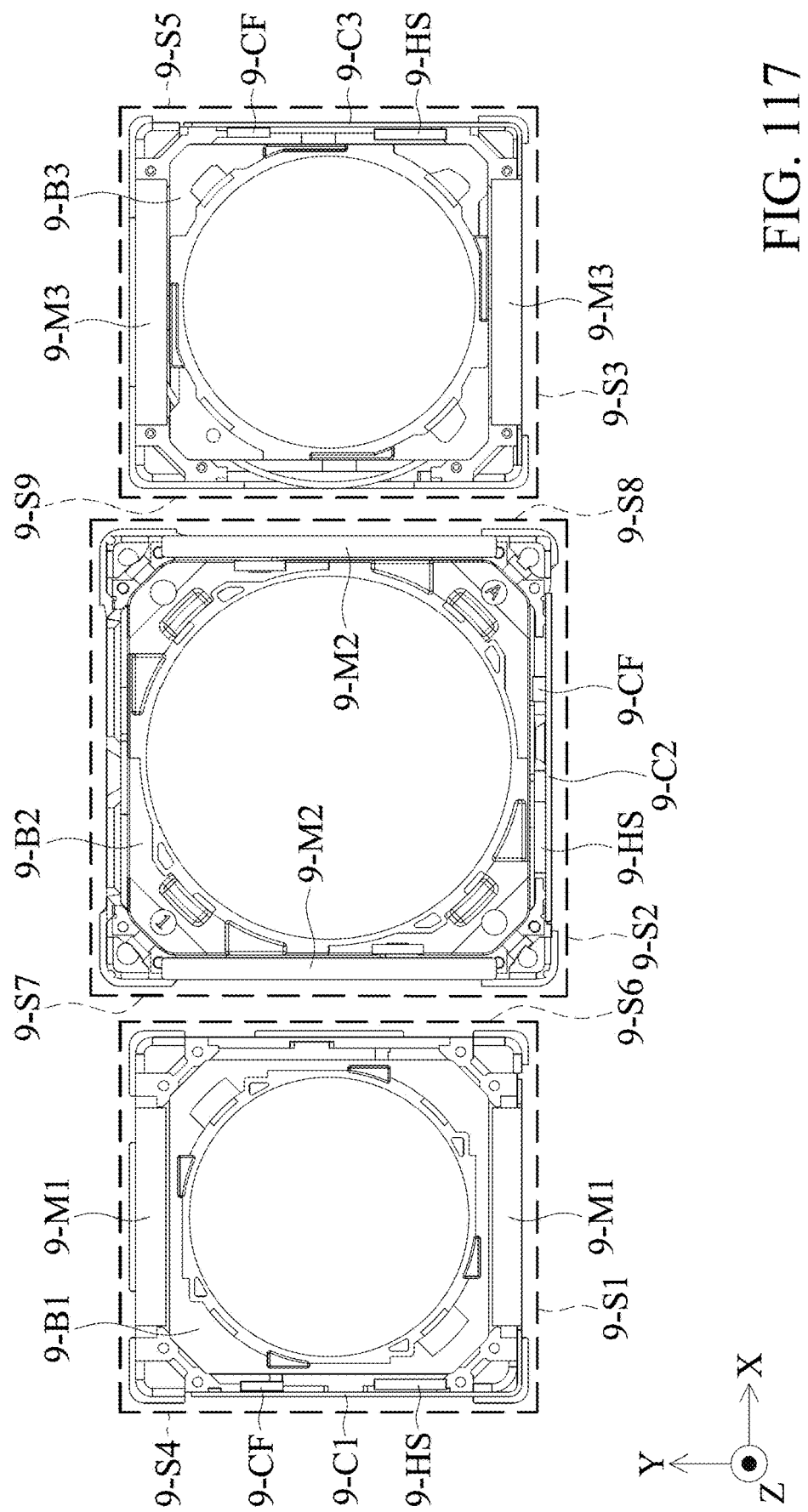

FIGS. 115-117 are perspective diagrams and top view of the driving system with the housings 9-H1 to 9-H3, the frames 9-F1 to 9-F3, and the holders 9-LH1 to 9-LH3 removed therefrom. As shown in FIGS. 115-117, the first circuit board 9-C1 has an L-shaped structure extending from the first side 9-S1 to a fourth side 9-S4 of the first module 9-1 (FIG. 116). Moreover, the second circuit board 9-C2 is disposed only on the second side 9-S2 of the second module 9-2, and the third circuit board 9-C3 has an L-shaped structure extending from the third side 9-S3 to a fifth side 9-S5 of the third module 9-3 (FIG. 116).

Specifically, when viewed along the optical axes of the optical elements 9-L1 to 9-L3 (Z direction), the first magnetic element 9-M1 partially overlaps the first circuit board 9-C1 on the first side 9-S1, and the third magnetic element 9-M3 partially overlaps the third circuit board 9-C3 on the third side 9-S3, so as to improve space utilization of the driving system.

In this embodiment, a position sensor 9-HS and a filter 9-CF (e.g. capacitor) are disposed on an inner surface of each of the first, second and third circuit boards 9-C1 to 9-C3. The position sensor 9-HS may be a Hall effect sensor for detecting the movement of the holder 9-LH1 to 9-LH3 relative to the housings 9-H1 to 9-H3, so as to facilitate a closed-loop control of the driving system.

As shown in FIG. 117, a sixth side 9-S6 of the first module 9-1 faces a seventh side 9-S7 of the second module 9-2. Each of the first magnetic elements 9-M1 are disposed on a side of the first module 9-1 other than the sixth side 9-S6 (e.g. the first side 9-S1), and one of the second magnetic elements 9-M2 is disposed on the seventh side 9-S7, so that the first and second magnetic elements 9-M1 and 9-M2 are distant from each other to prevent magnetic interference therebetween.

Similarly, an eighth side 9-S8 of the second module 9-2 faces a ninth side 9-S9 of the third module 9-3. One of the second magnetic elements 9-M2 is disposed on a side of the second module 9-2, and the third magnetic elements 9-M3 are disposed on the sides of the third module 9-3 other than the ninth side 9-S9 (e.g. the third side 9-S3), so that the second and third magnetic elements 9-M2 and 9-M3 are distant from each other to prevent magnetic interference therebetween. In this embodiment, the first and third magnetic elements 9-M1 and 9-M3 have a longitudinal structure parallel to the X axis (first direction), and the second magnetic element 9-M2 has a longitudinal structure parallel to the Y axis (second direction).

Figure 118:
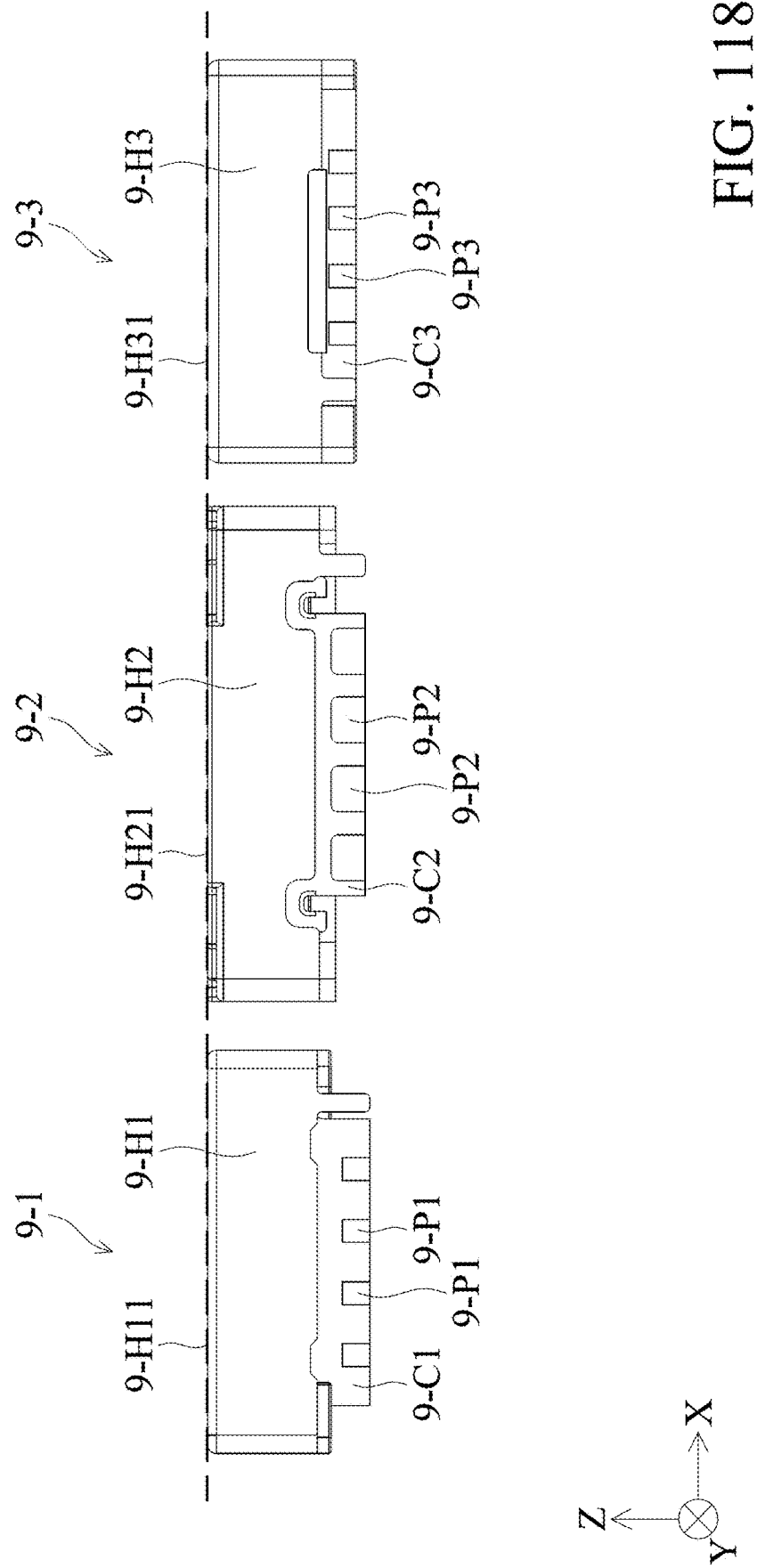
FIG. 118 are shows a side view of the first, second and third modules.
Figure 119:
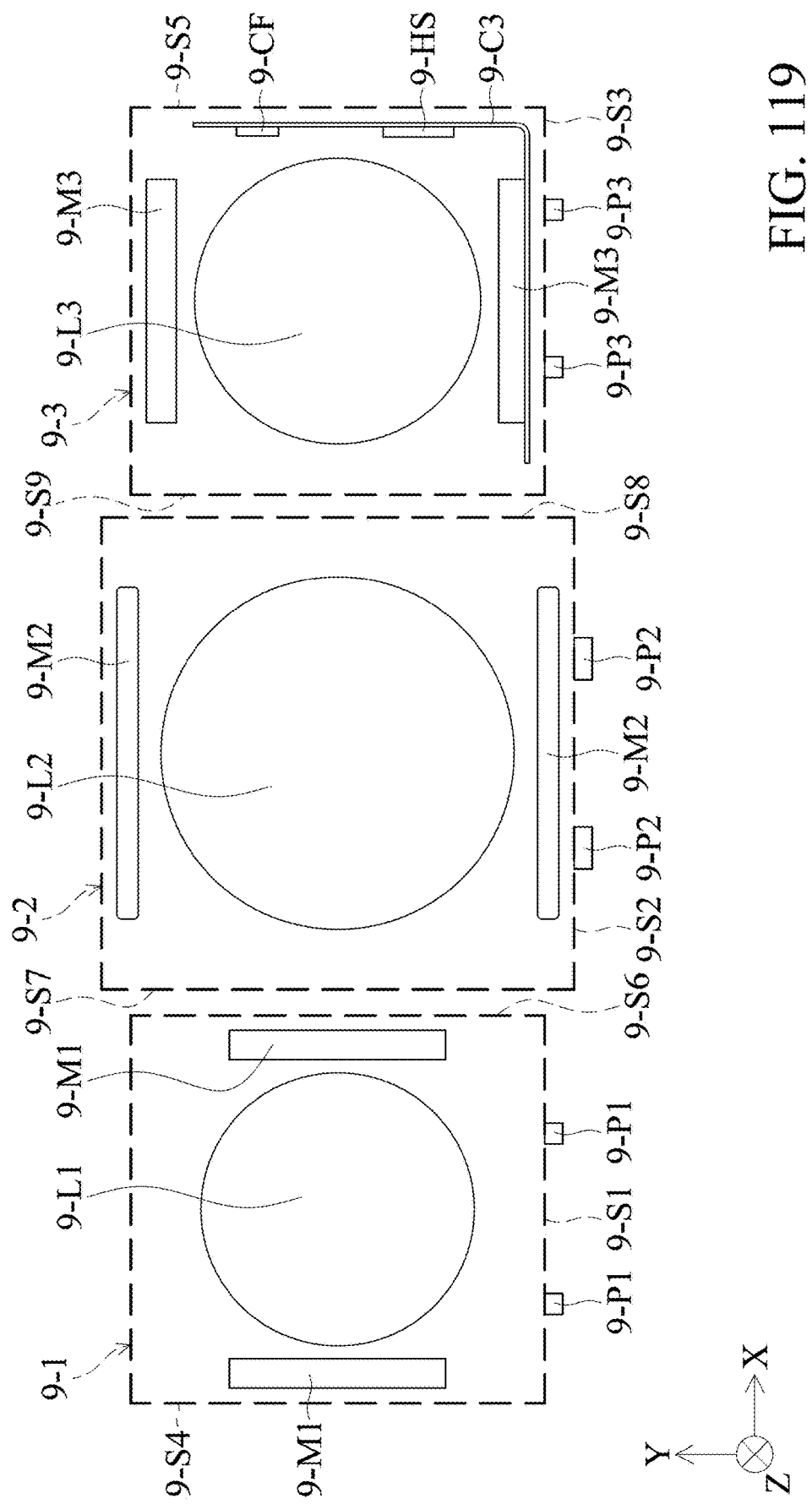
FIGS. 119-125 show different arrangements of the first, second and third terminals, the first, second and third magnetic elements, and the first, second and third circuit boards in the driving system.

FIG. 118 are shows a side view of the first, second and third modules 9-1, 9-2 and 9-3. As shown in FIG. 118, the housing 9-H1 of the first module 9-1 has a first top surface 9-H11, the housing 9-H2 of the second module 9-2 has a second top surface 9-H21, and the housing H3 of the third module 9-3 has a third top surface 9-H31. Here, the first, second and third top surfaces 9-H11 to 9-H31 are at substantially the same height along the Z axis.

It should be noted that the first, second and third modules 9-1, 9-2 and 9-3 may have different thicknesses along the Z axis, corresponding to the optical elements 9-L1 to 9-L3 that have different focal lengths or optical effective diameters. During assembly, the first, second and third top surfaces 9-H11 to 9-H31 of the first, second and third modules 9-1, 9-2 and 9-3 are positioned and aligned to each other at the same height of the Z axis, thus facilitating accurate positioning and assembly between the first, second and third modules 9-1, 9-2 and 9-3.

FIGS. 119 to 125 show different arrangements of the first, second and third terminals 9-P1 to 9-P3, the first, second and third magnetic elements 9-M1 to 9-M3, and the first, second and third circuit boards 9-C1 to 9-C3 in the driving system. Referring to the embodiment of FIG. 119, one of the first magnetic elements 9-M1 is disposed on the sixth side 9-S6, and two second magnetic elements 9-M2 are disposed on the sides of the second module 9-2 other than the seventh and eighth sides 9-S7 and 9-S8 (e.g. the second side 9-S2). In this configuration, the third magnetic element 9-M3 can be disposed on each side of the third module 9-3 (e.g. the ninth side 9-S9 or the other sides). Thus, the first, second and third magnetic elements 9-M1 to 9-M3 are distant from each other to prevent magnetic interference therebetween. In this embodiment, only an L-shaped third circuit board 9-C3 is provided in the third module 9-3, and the first and second circuit boards 9-C1 and 9-C2 are omitted from the driving system.

Figure 120:
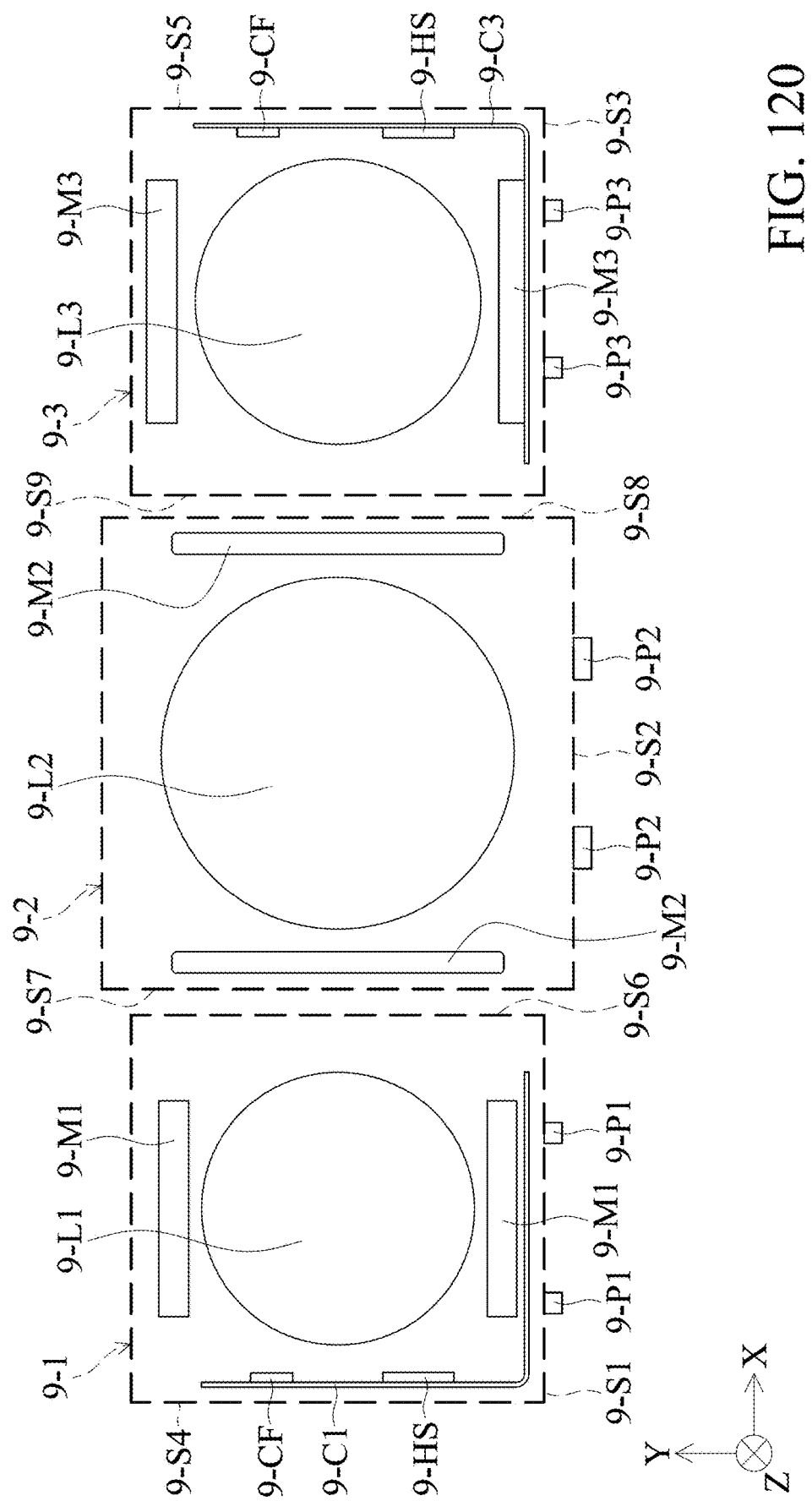

In the embodiment of FIG. 120, two first magnetic elements 9-M1 are disposed on the sides other than the sixth side 9-S6 (e.g. the first side 9-S1), and two second magnetic elements 9-M2 are disposed on the seventh and eighth sides 9-S7 and 9-S8 of the second module 9-2. In this configuration, two third magnetic elements 9-M3 are disposed on the sides of the third module 9-3 other than the ninth side 9-S9 (e.g. the third side 9-S3). Thus, the first, second and third magnetic elements 9-M1 to 9-M3 are distant from each other to prevent magnetic interference therebetween. In this embodiment, an L-shaped first circuit board 9-C1 and an L-shaped third circuit boards 9-C3 are provided in the first and third modules 1 and 3, and the second circuit board 9-C2 is omitted from the driving system.

Figure 121:
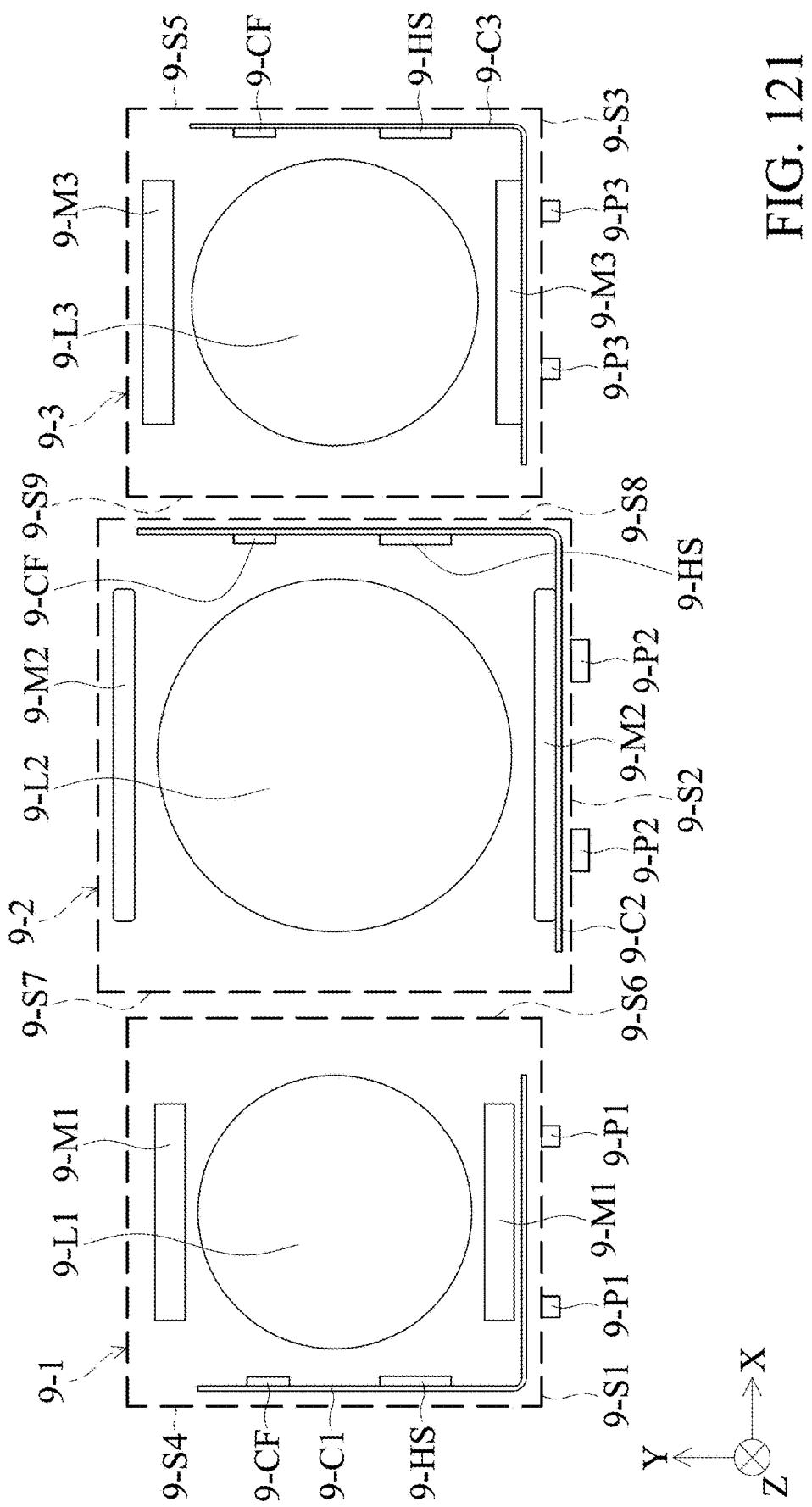

In the embodiment of FIG. 121, two first magnetic elements 9-M1 are disposed on the sides of the first module 9-1 other than the sixth side 9-S6 (e.g. the first side 9-S1), and two second magnetic elements 9-M2 are disposed on the sides other than the seventh and eighth sides 9-S7 and 9-S8 (e.g. the second side 9-S2). Furthermore, two third magnetic elements 9-M3 are disposed on the sides of the third module 9-3 other than the ninth side 9-S9 (e.g. the third side 9-S3). Thus, the first, second and third magnetic elements 9-M1 to 9-M3 are distant from each other to prevent magnetic interference therebetween. In this embodiment, the L-shaped first, second and third circuit boards 9-C1 to 9-C3 are respectively provided in the first, second and third module 9-1-3, wherein the second circuit board 9-C2 may extend from the second side 9-S2 to the seventh side 9-S7 or the eighth side 9-S8 without magnetic interference from the magnetic elements 9-M1 to 9-M3.

Figure 122:
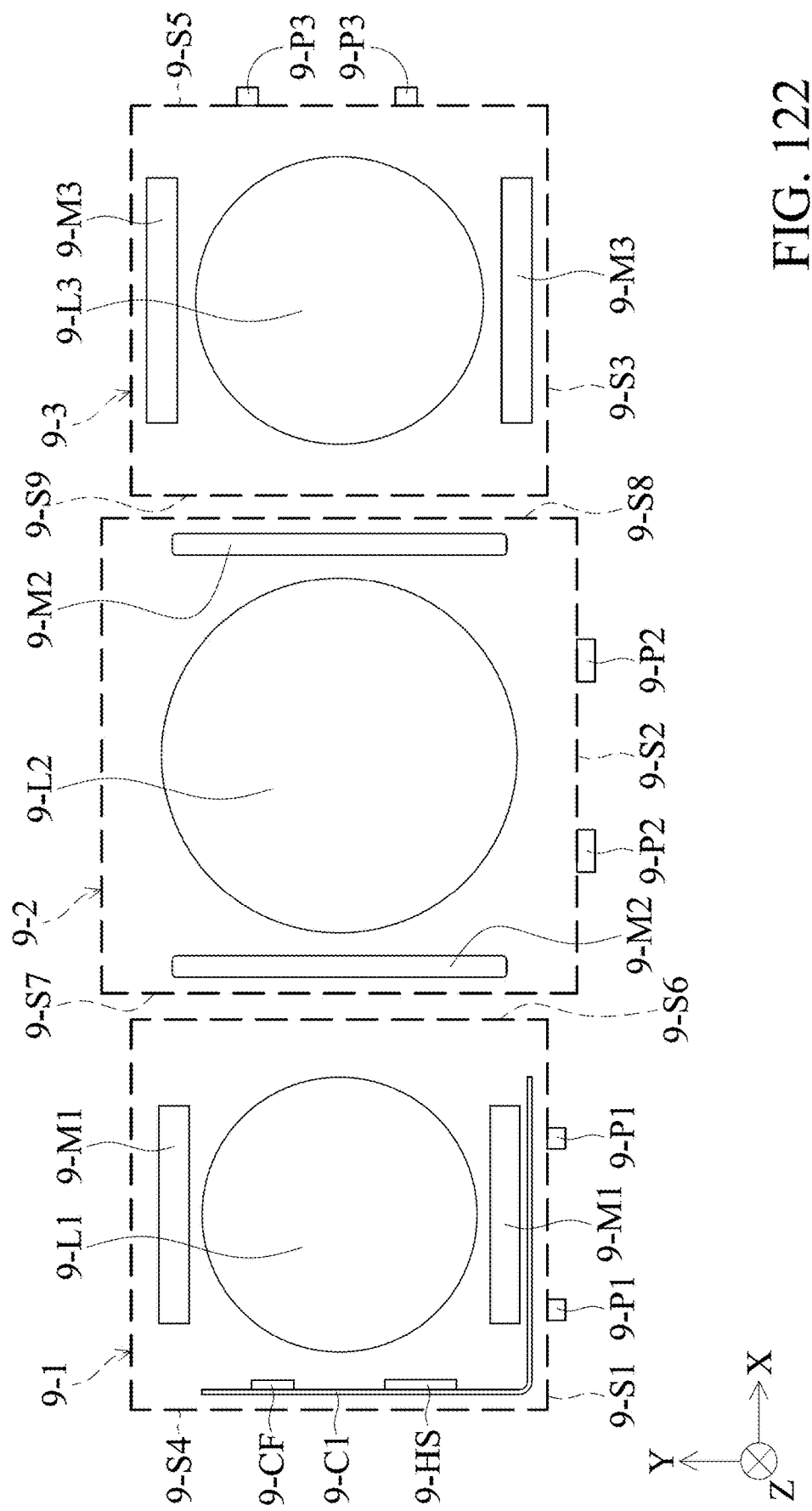

In the embodiment of FIG. 122, two first magnetic elements 9-M1 are disposed on the sides other than the sixth side 9-S6 of the first module 9-1 (e.g. the first side 9-S1), and two second magnetic elements 9-M2 are disposed on the seventh and eighth sides 9-S7 and 9-S8 of the second module 9-2. In this configuration, two third magnetic elements 9-M3 are disposed on the sides other than the ninth side 9-S9 of the third module 9-3 (e.g. the third side 9-S3). Thus, the first, second and third magnetic elements 9-M1 to 9-M3 are distant from each other to prevent magnetic interference therebetween. In this embodiment, only an L-shaped first circuit board 9-C1 is provided in the first module 9-1, and the second and circuit boards 9-C2 and 9-C3 are omitted from the driving system. Moreover, the third terminal 9-P3 is disposed on the fifth side 9-S5 of the third module 9-3.

Figure 123:
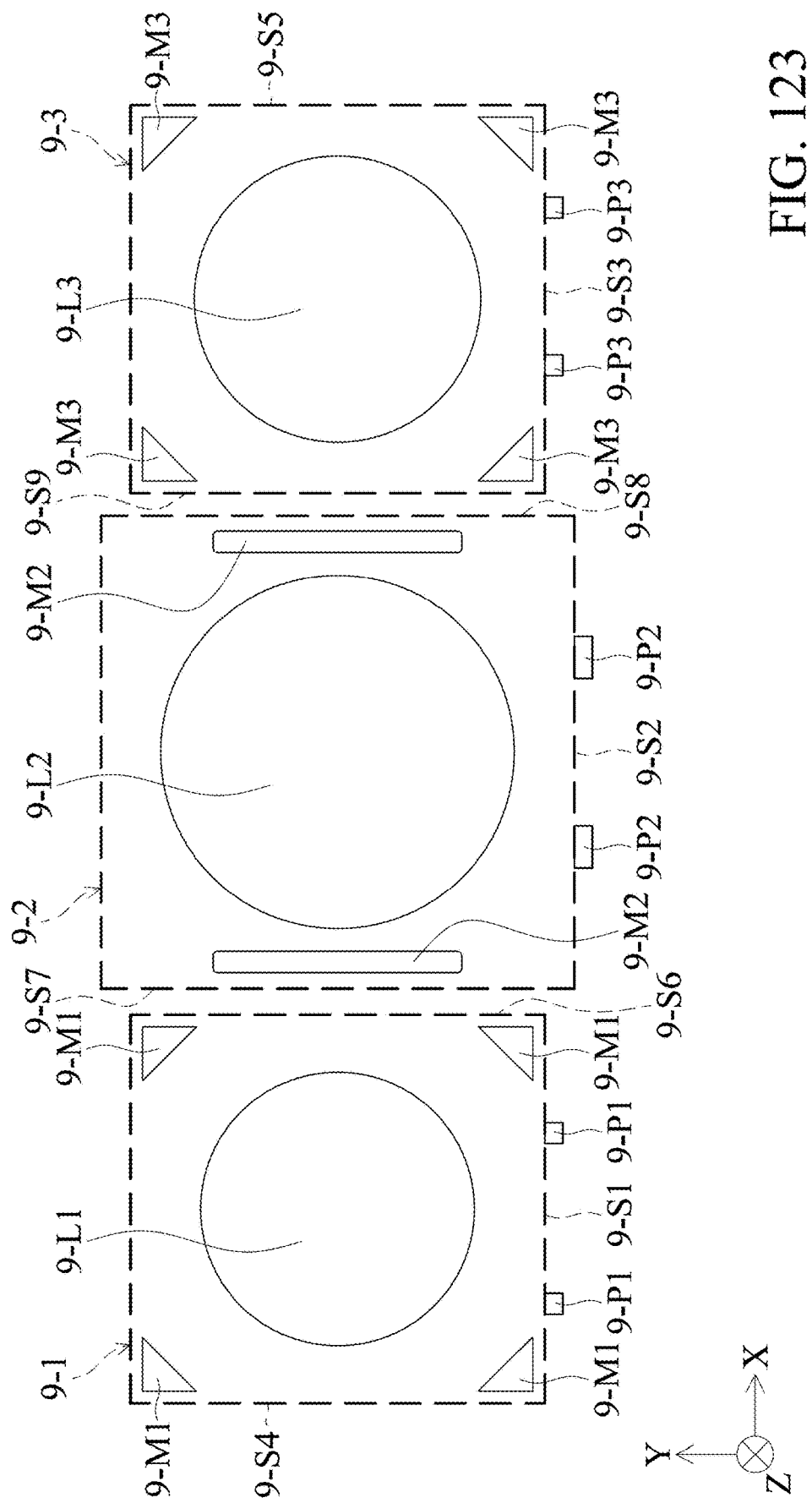

In the embodiment of FIG. 123, the first magnetic elements 9-M1 may have a triangular structure and are disposed at the four corners of the first module 9-1. Similarly, the third magnetic elements 9-M3 may have a triangular structure and are disposed at the four corners of the third module 9-3. In this configuration, two second magnetic elements 9-M2 can be disposed on the seventh and eighth sides 9-S7 and 9-S8 of the second module 9-2 to prevent magnetic interference between the first, second and third magnetic elements 9-M1 to 9-M3.

Figure 124:
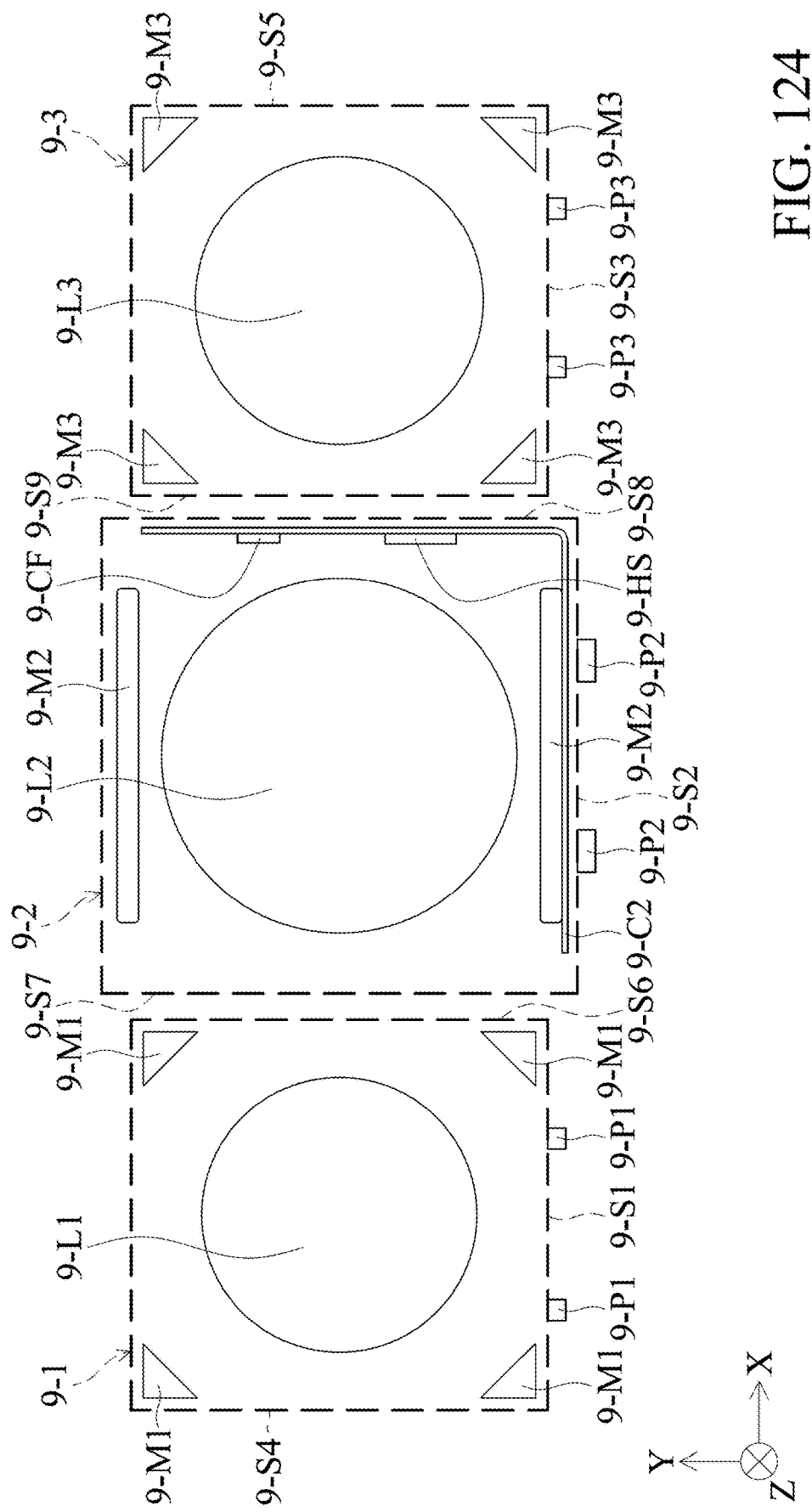

In the embodiment of FIG. 124, four triangular first magnetic elements 9-M1 are disposed at the four corners of the first module 9-1, and four triangular third magnetic elements 9-M3 are disposed at the four corners of the third module 9-3. In this configuration, two second magnetic elements 9-M2 are disposed on the sides other than the seventh and eighth sides 9-S7 and 9-S8 of the second module 9-2, so that magnetic interference between the first, second and third magnetic elements 9-M1 to 9-M3 can be avoided. Specifically, an L-shaped circuit board 9-C2 is provided in the second module 9-2, and it may extend from the second side 9-S2 to the seventh side 9-S7 or the eighth side 9-S8 without magnetic interference from the magnetic elements 9-M1 to 9-M3 to the position sensor 9-HS.

Figure 125:
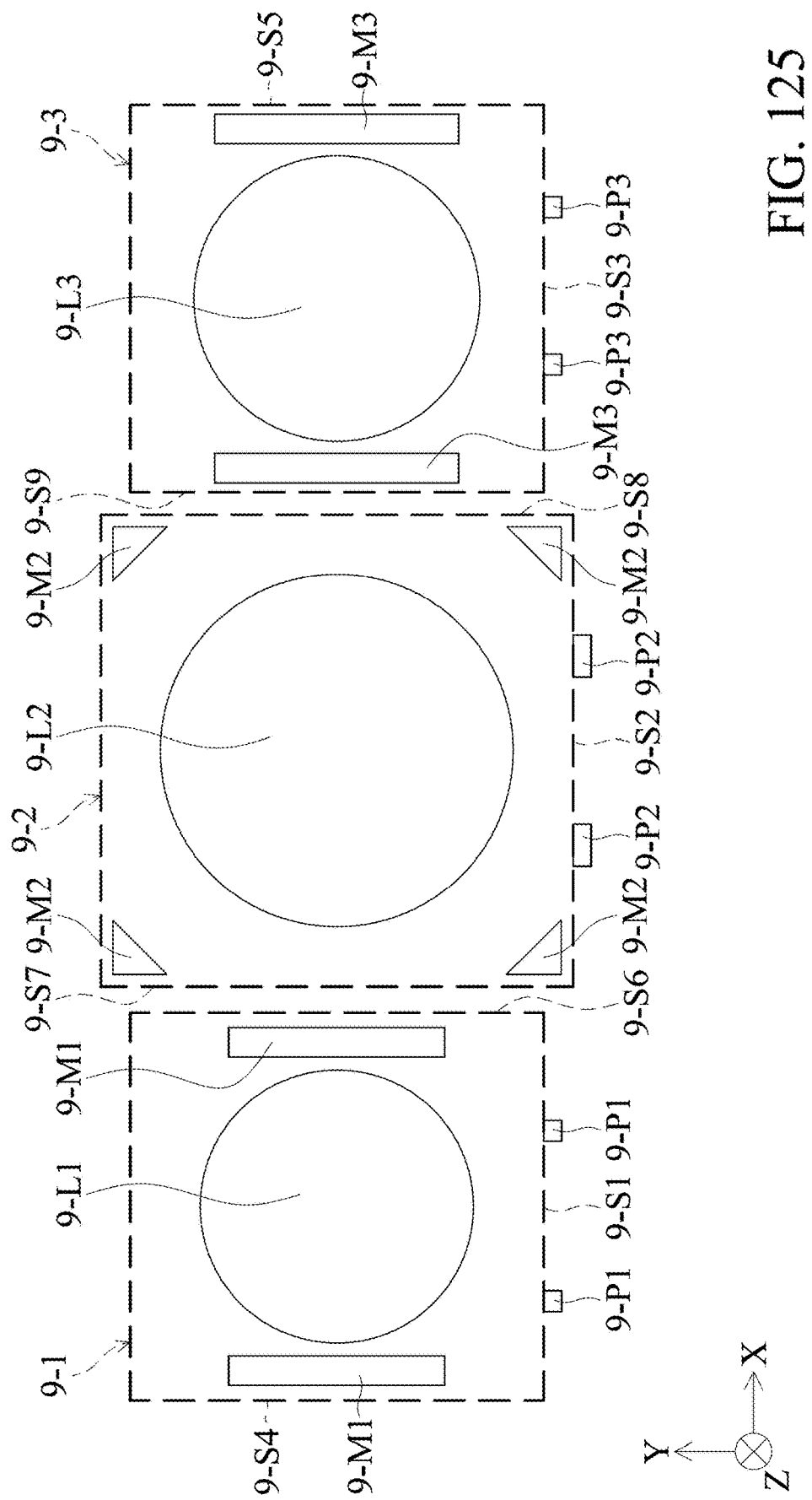

Similarly, in the embodiment of FIG. 125, four triangular second magnetic elements 9-M2 are disposed at the four corners of the second module 9-2. In this configuration, one of the first magnetic elements 9-M1 can be disposed on the sixth side 9-S6 of the first module 9-1, and one of the third magnetic elements 9-M3 can be disposed on the ninth side 9-S9 of the third module 9-3. Thus, the first, second and third magnetic elements 9-M1 to 9-M3 are distant from each other to prevent magnetic interference therebetween.

Figure 126:
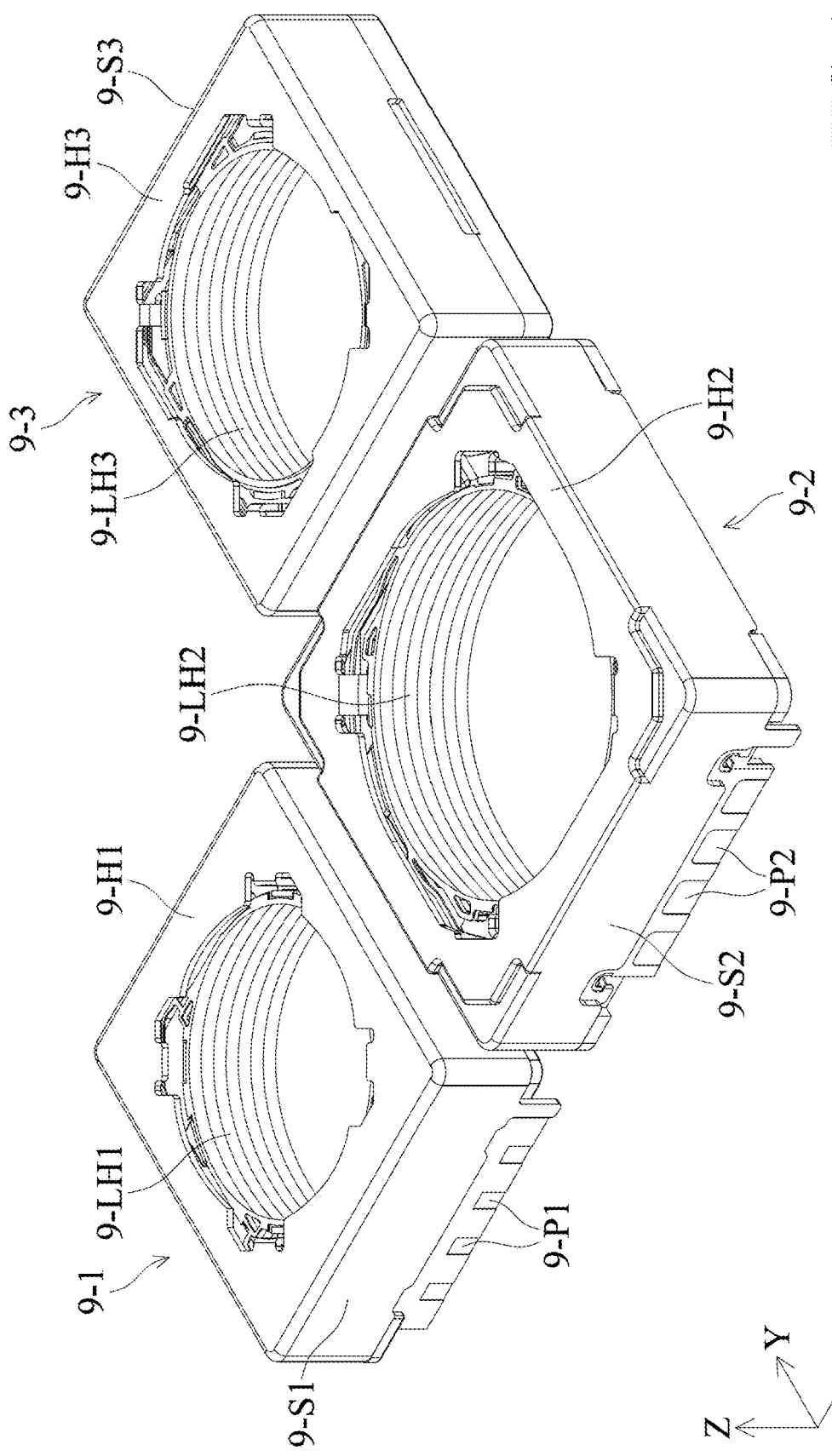
FIGS. 126 and 127 are perspective diagrams of a driving system in accordance another embodiment of the invention.
Figure 127:
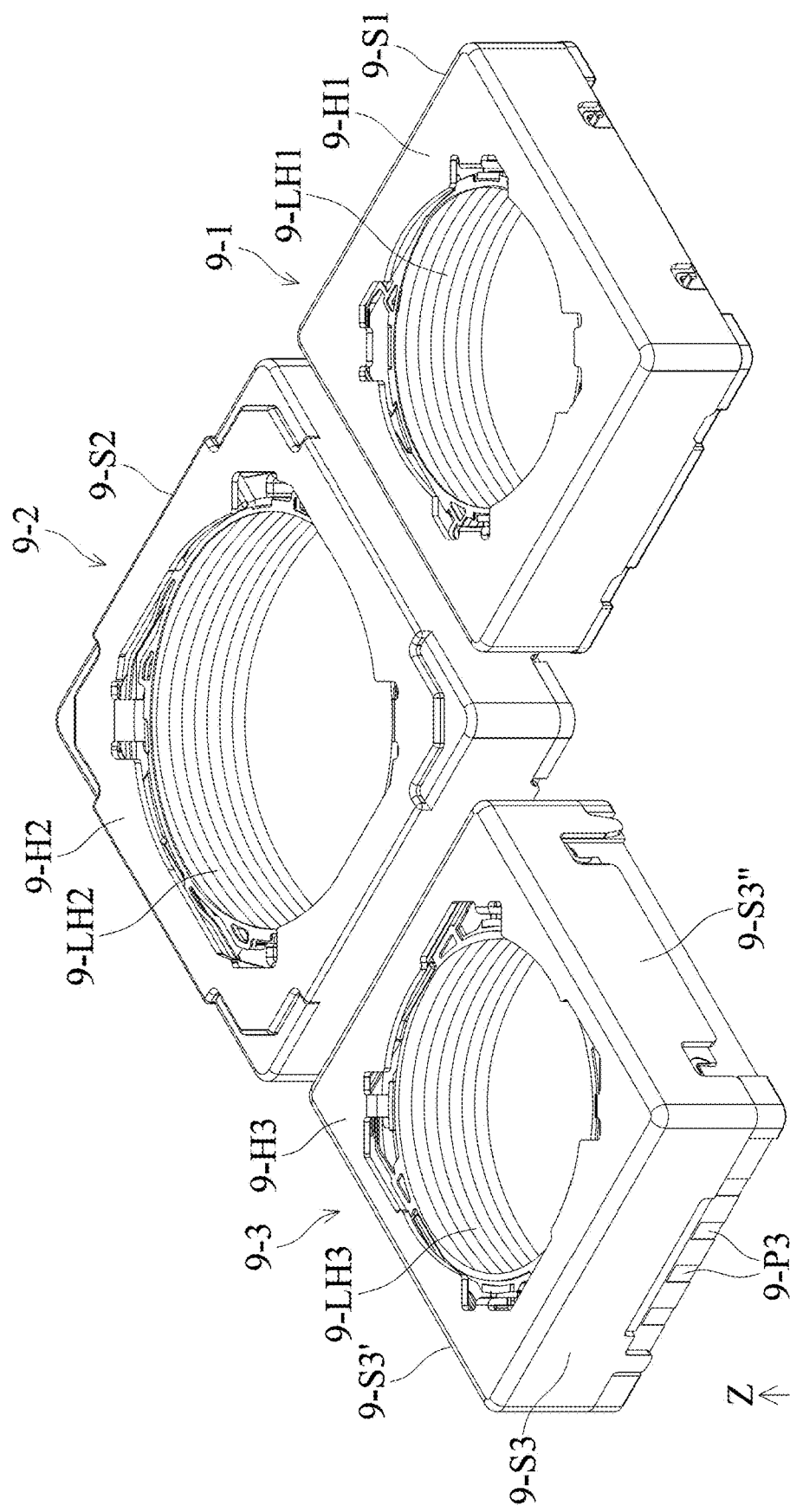

FIGS. 126 and 127 are perspective diagrams of a driving system in accordance another embodiment of the invention. In this embodiment, the first, second and third modules 9-1 to 9-3 are arranged in an L-shaped manner, wherein the first and second terminals 9-P1 and 9-P2 are located on the same sides of the driving system, and the third terminal 9-P3 is located on a different side of the driving system than the first and second terminals 9-P1 and 9-P2.

Referring to FIG. 127, the third terminal 9-P3 is disposed on a third side 9-S3 of the third module 9-3, wherein the third side 9-S3 is parallel to the first and second sides 9-S1 and 9-S2 of the first and second modules 9-1 and 9-2. In some embodiments, however, the third terminal 9-P3 may be disposed on another side other than the third side 9-S3, such as the side 9-S3' or 9-S3" that is perpendicular to the first and second sides 9-S1 and 9-S2.

As mentioned above, since at least two of the first, second and third terminals 9-P1 to 9-P3 are located on the same side of the driving system, they can be electrically connected to an external circuit by a single process (e.g. soldering, welding or conductive glue) without rotation of the driving system, thus increasing assembly efficiency and reducing the production cost.

Figure 128:
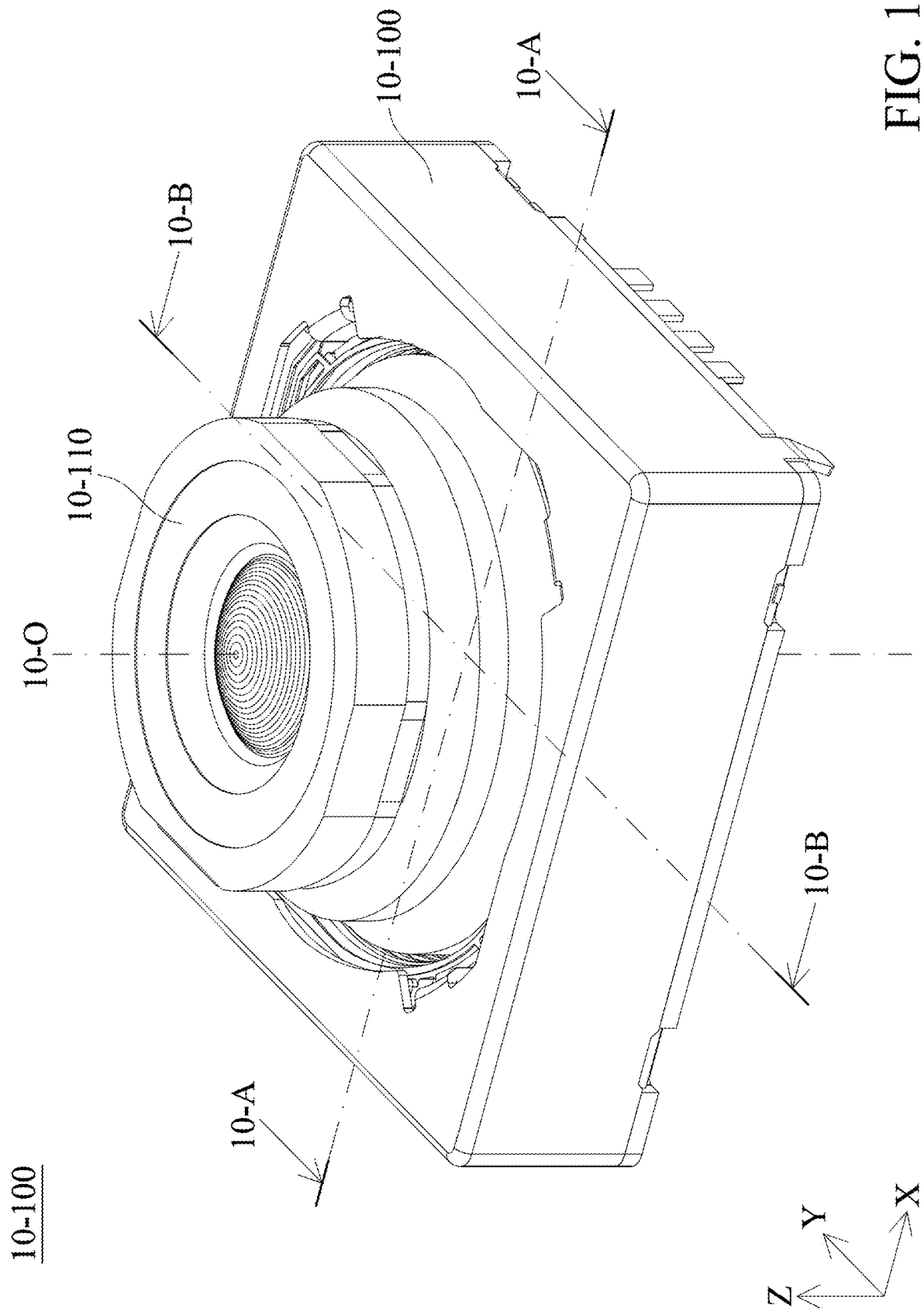
FIG. 128 shows a perspective schematic view of an optical element driving mechanism according to the present disclosure.

Please refer to FIG. 128, FIG. 128 is a perspective schematic view of an optical element driving mechanism 10-100 according to an embodiment of the present disclosure. As shown in FIG. 128, the optical element driving mechanism 10-100 carries an optical element 10-110, and the optical element 10-110 has an optical axis 10-O.

Figure 129:
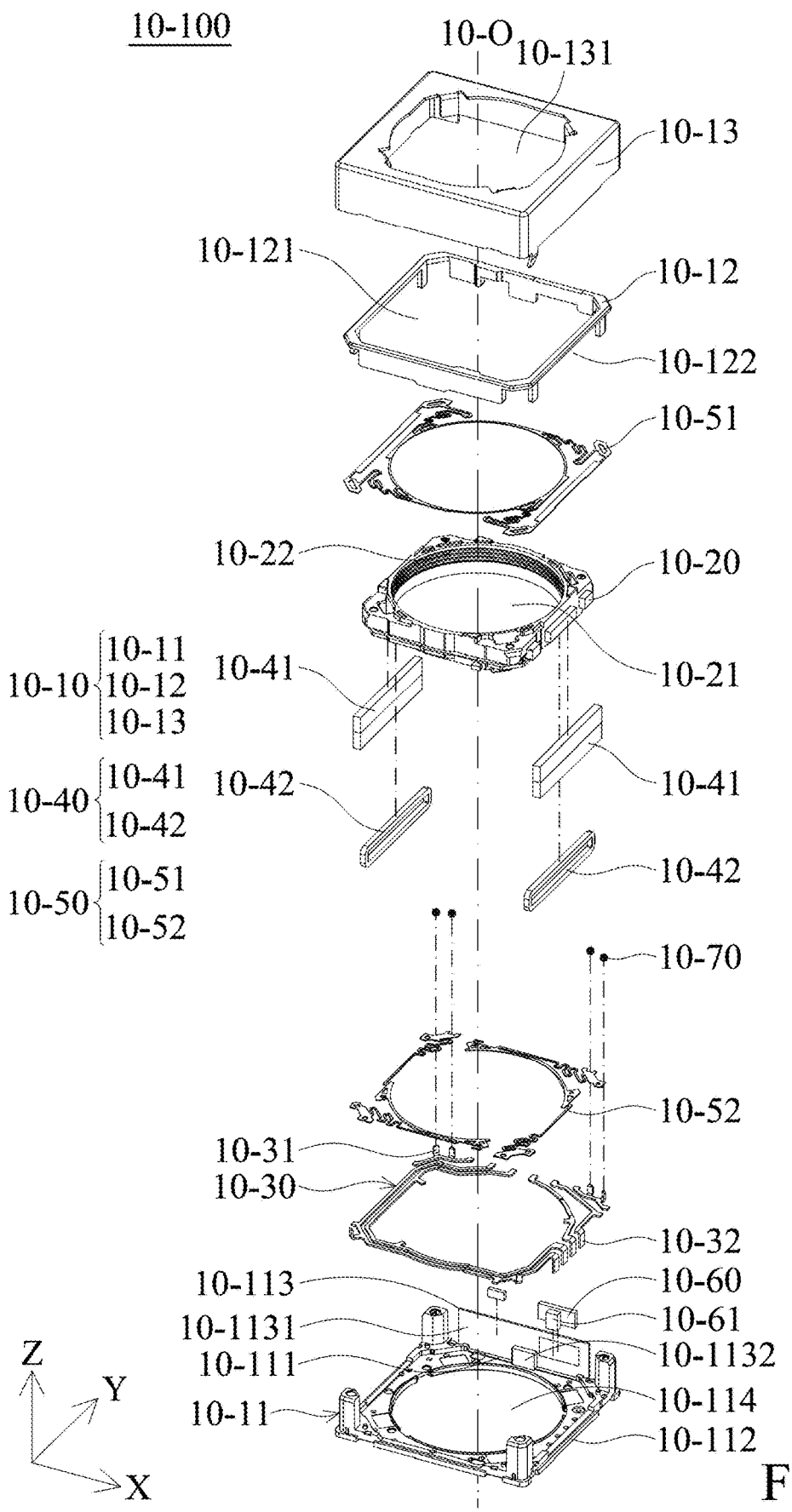
FIG. 129 shows an exploded view of the optical element driving mechanism according to the present disclosure.

FIG. 129 is an exploded view of the optical element driving mechanism 10-100 according to an embodiment of the present disclosure. As shown in FIG. 129, the optical element driving mechanism 10-100 includes a fixed part 10-10, a movable part 10-20, a metallic member 10-30, a driving assembly 10-40, an elastic assembly 10-50, a position sensing assembly 10-60 and a connector 10-70.

The fixed part 10-10 includes a base 10-11, a frame 10-12 and an outer frame 10-13. The base 10-11 is located under the frame 10-12 and the outer frame 10-13, and the frame 10-12 is located between the base 10-11 and the outer frame 10-13. The base 10-11 includes a first side 10-111, a second side 10-112, a standing wall 10-113 and a base opening 10-114. The first side 10-111 is not parallel to the second side 10-112. In an embodiment, the first side 10-111 is perpendicular to the second side 10-112, and the first side 10-111 and the second side 10-112 are perpendicular to the optical axis 10-O. The standing wall 10-113 is disposed on the first side 10-111, and the standing wall 10-113 extends along the optical axis 10-O. The standing wall 10-113 has an inner side wall 10-1131 and a protruding part 10-1132, and the inner side wall 10-1131 faces the movable part 10-20. The protruding part 10-1132 is formed on the inner side wall 10-1131. The base opening 10-114 is corresponding to an image sensing element (not shown) which is disposed outside the optical element driving mechanism 10-100. The frame 10-12 has a frame opening 10-121 and a frame side 10-122. The outer frame 10-13 has an outer frame opening 110-31, a center of the outer frame opening 10-131 is corresponding to the optical axis 10-O of the optical element 10-110. Accordingly, the optical element 10-110 disposed in the optical element driving mechanism 10-100 and the image sensing element can perform image focusing in the direction of the optical axis 10-O.

The movable part 10-20 is movably connected to the fixed part 10-10 and carries the optical element 10-110. The movable part 10-20 has a hollow ring structure and a through hole 10-21. The movable part 10-20 also has a threaded structure 10-22, which is formed on the through hole 10-21. The optical element 10-110 can be locked in the through hole 10-22. In this embodiment, the movable part 10-20 and the optical element 10-110 are movably disposed within the frame 10-12.

The metallic member 10-30 is disposed on the base 10-11, and the metallic member 10-30 includes an inner electrical connection part 10-31 and an outer electrical connection part 10-32, and the inner electrical connection part 10-31 and the outer electrical connection part 10-32 are connected to each other. The metallic member 10-30 is made of electrically conductive material, for example, the metallic member 10-30 may be made of electrically conductive metals or electrically conductive alloys. For example, the metallic member 10-30 may be made of electrically conductive metals such as silver, copper, gold, aluminum, tungsten, iron, titanium, etc. or electrically conductive alloys such as the alloys thereof. The metallic member 10-30 extends from the second side 10-112 of the base 10-11 to the first side 10-111 of the base 10-11. The inner electrical connection part 10-31 of the metallic member 10-30 protrudes upwardly in the direction of the optical axis 10-O, and the outer electrical connection part 10-32 of the metallic member 10-30 protrudes downwardly in the direction of the optical axis 10-O. In this way, it may facilitate the connection between the inner electrical connection part 10-31 and the other elements of the optical element driving mechanism 10-100, and it may also facilitate the connection between the outer electrical connection part 10-32 and an external power supply (not shown) which is disposed outside the optical element driving mechanism 10-100. Each one of the inner electrical connection part 10-31 is connected to each one of the outer electrical connection part 10-32 so as to conduct an electrical current from the outer electrical connection part 10-32 to the inner electrical connection part 10-31.

The driving assembly 10-40 drives the movable part 10-20 to move relative to the fixed part 10-10, and the driving assembly 10-40 includes at least one driving magnetic element 10-1141 and a coil 10-42. In one embodiment (such as the embodiment shown in FIG. 131), the driving assembly 10-40 may include at least two driving magnetic elements 10-1141, and the driving magnetic elements 10-1141 are disposed on two opposite sides of the base 10-11. In other words, in this embodiment, each one of the driving magnetic elements 10-1141 is not adjacent to each other. In this way, magnetic interference between each one of the driving magnetic elements 10-1141 is prevented, and the focusing speed and positioning accuracy of the optical element driving mechanism 10-100 are improved, and miniaturization of the optical element driving mechanism 10-100 is achieved. Moreover, the driving magnetic elements 10-1141 are fixed on the frame side 10-122 of the frame 10-12 to avoid the movement of the driving magnetic elements 10-1141 with respect to the frame 10-12. The driving magnetic elements 10-1141 may be permanent magnets, and the shapes of the driving magnetic elements 10-1141 may be stripes or triangles.

The coil 10-42 of the driving assembly 10-40 is wound around an outer peripheral surface of the movable part 10-20. When the electrical current is applied to the coil 10-42, the coil 10-42 can act with the magnetic field of the driving magnetic elements 10-1141 to generate an electromagnetic force to drive the movable part 10-20 and the optical element 10-110 to move in the direction of the optical axis 10-O.

The elastic assembly 10-50 includes an upper spring 10-51 and a lower spring 10-52. The upper spring 10-51 of the elastic assembly 10-50 is disposed on the movable part 10-20. The elastic assembly 10-50 is elastically connected to the fixed part 10-10 and the movable part 10-20, so that the movable part 10-20 can be suspended. The elastic assembly 10-50 may be made of electrically conductive metals or electrically conductive alloys. For example, the elastic assembly 10-50 may be made of electrically conductive metals such as silver, copper, gold, aluminum, tungsten, iron, titanium, etc. or electrically conductive alloys such as the alloys thereof.

The position sensing assembly 10-60 has a sensing magnet 10-61. The position sensing assembly 10-60 is disposed on the first side 10-111, and the sensing magnet 10-61 is disposed on the movable part 10-20. The position sensing assembly 10-60 may be a Hall Effect Sensor, Magnetoresistance Effect Sensor (MR Sensor), Giant Magnetoresistance Effect Sensor (GMR Sensor), Tunneling Magnetoresistance Effect Sensor (TMR Sensor), or Fluxgate. The sensing magnet 10-61 may be a permanent magnet.

The connector 10-70 is disposed between the elements to fix various elements, and the connector 10-70 electrically connects various elements. The connector 10-70 may be solder made of tin alloy, such as tin-lead alloy, tin-silver-copper alloy, tin-copper alloy, tin-nickel alloy, tin-indium alloy, tin-stibnum alloy, tin-silver alloy, tin-gold alloy, tin-palladium alloy, tin-platinum alloy, etc. It should be understood that the connector 10-70 may also be other electrically connectable materials, such as electrically conductive glue.

Figure 130:
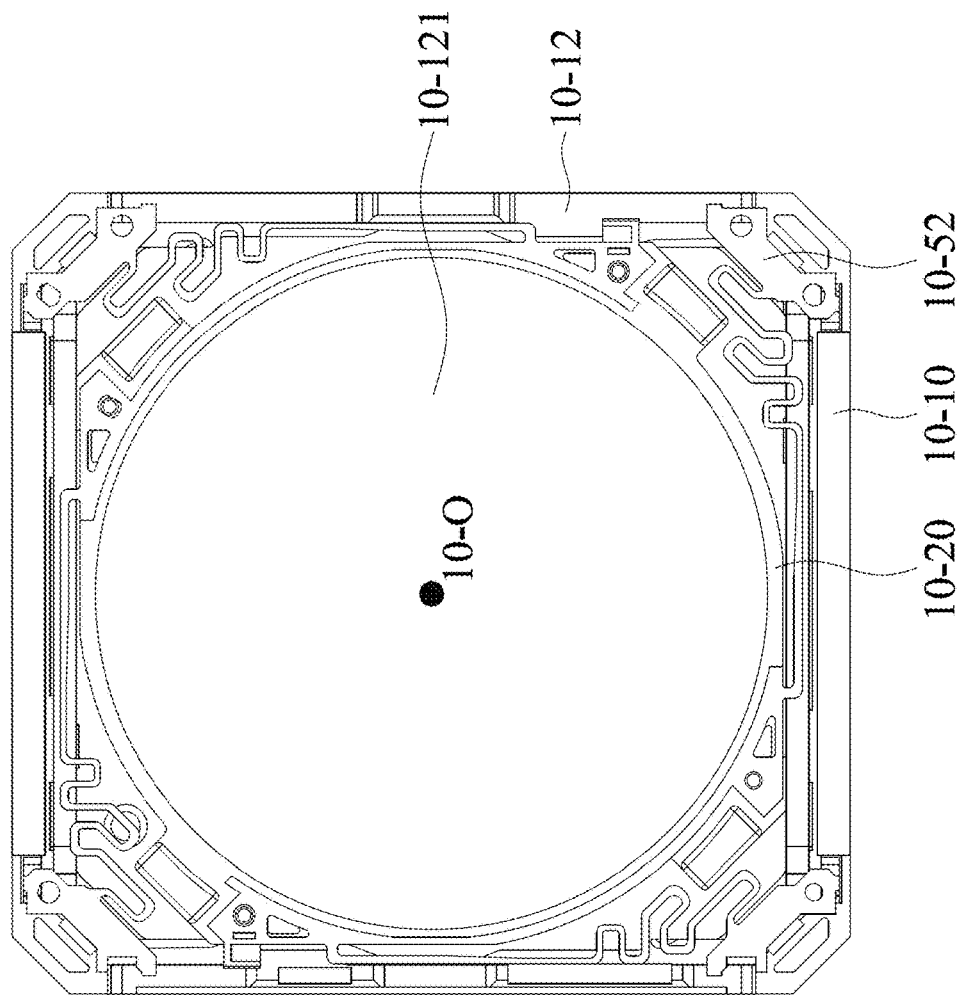
FIG. 130 shows a schematic view of a fixed part, a movable part and a lower spring of the optical element driving mechanism according to the present disclosure.

Please refer to FIG. 130, FIG. 130 shows a schematic view of the fixed part 10-10, the movable part 10-20 and the lower spring 10-52. The lower spring 10-52 of the elastic assembly 10-50 is disposed under the movable part 10-20, and the lower spring 10-52 is elastically connected to the fixed part 10-10 and the movable part 10-20, so that the movable part 10-20 can be suspended. More specifically, the movable part 10-20 can be suspended in the frame opening 10-121 of the frame 10-12 by the elastic assembly 10-50 with metallic materials.

Figure 131:
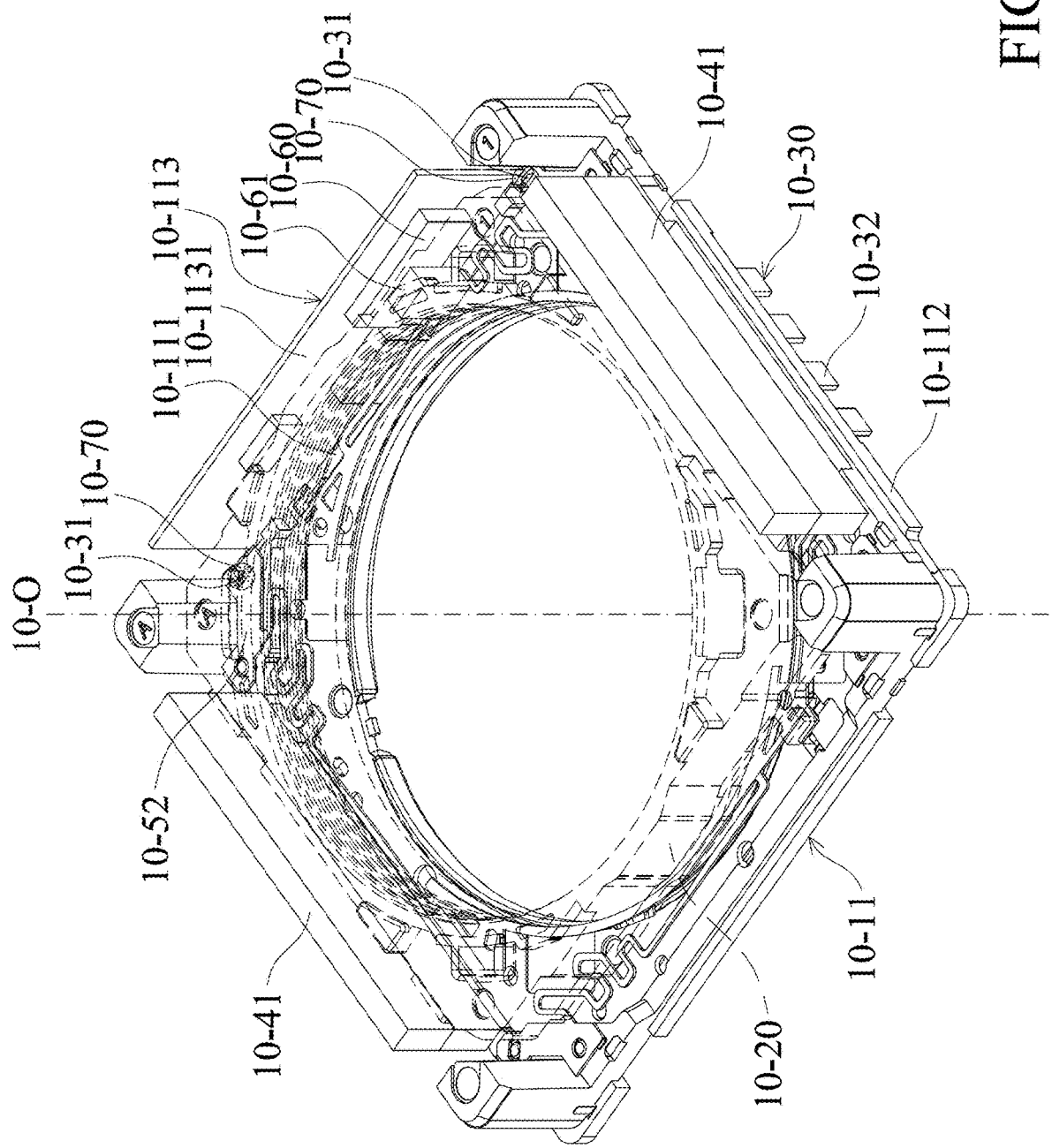
FIG. 131 shows a schematic view of the optical element driving mechanism omitting a frame and an outer frame, according to the present disclosure.

Please refer to FIG. 131, FIG. 131 shows a schematic view of the optical element driving mechanism 10-100 omitting the frame 10-12 and the outer frame 10-13, wherein the movable part 10-20 is illustrated with dotted line to clearly show the relation between various elements. The metallic member 10-30 extends adjacent to the standing wall 10-113. The inner electrical connection part 10-31 of the metallic member 10-30 is disposed on the first side 10-111 of the base 10-11, and the outer electrical connection part 10-32 is disposed on the second side 10-112 of the base 10-11, in this way, it facilitates the assembly of the optical element driving mechanism 10-100 and the other elements.

As shown in FIG. 131, the driving magnetic elements 10-1141 are disposed on the second side 10-112 and the opposite side of the second side 10-112, and the first side 10-111 is not disposed with any driving magnetic elements 10-1141. It should be noted that, in this embodiment, the optical element driving mechanism 10-100 is provided with two driving magnetic elements 10-1141, and the driving magnetic elements 10-1141 are disposed by the aforementioned manner. However, in other embodiments, when the optical element driving mechanism 10-100 is provided with three driving magnetic elements 10-1141, a counter weight (not shown) may be provided to balance the weight of the optical element driving mechanism 10-100.

The position sensing assembly 10-60 is disposed on the inner side wall 10-1131 of the standing wall 10-113. The sensing magnet 10-61 is disposed on the movable part 10-20. The position sensing assembly 10-60 is electrically connected to the inner electrical connection part 10-31 of the metallic member 10-30 via an internal circuit (not shown) of the standing wall 10-113. The lower spring 10-52 is disposed adjacent to the inner electrical connection part 10-31, and the connector 10-70 is disposed between the inner electrical connection part 10-31 and the lower spring 10-52, so that the inner electrical connection part 10-31 is electrically connected to the lower spring 10-52. In this way, the magnetic variance caused by the movement of the sensing magnet 10-61 can be detected by the position sensing assembly 10-60 to determine the position displacement of the movable part 10-20 with respect to the base 10-11 in the direction of the optical axis 10-O. Alternatively, the position sensing assembly 10-60 can also determine the position displacement of the movable part 10-20 with respect to the base 10-11 in the direction perpendicular to the optical axis 10-O.

Figure 132:
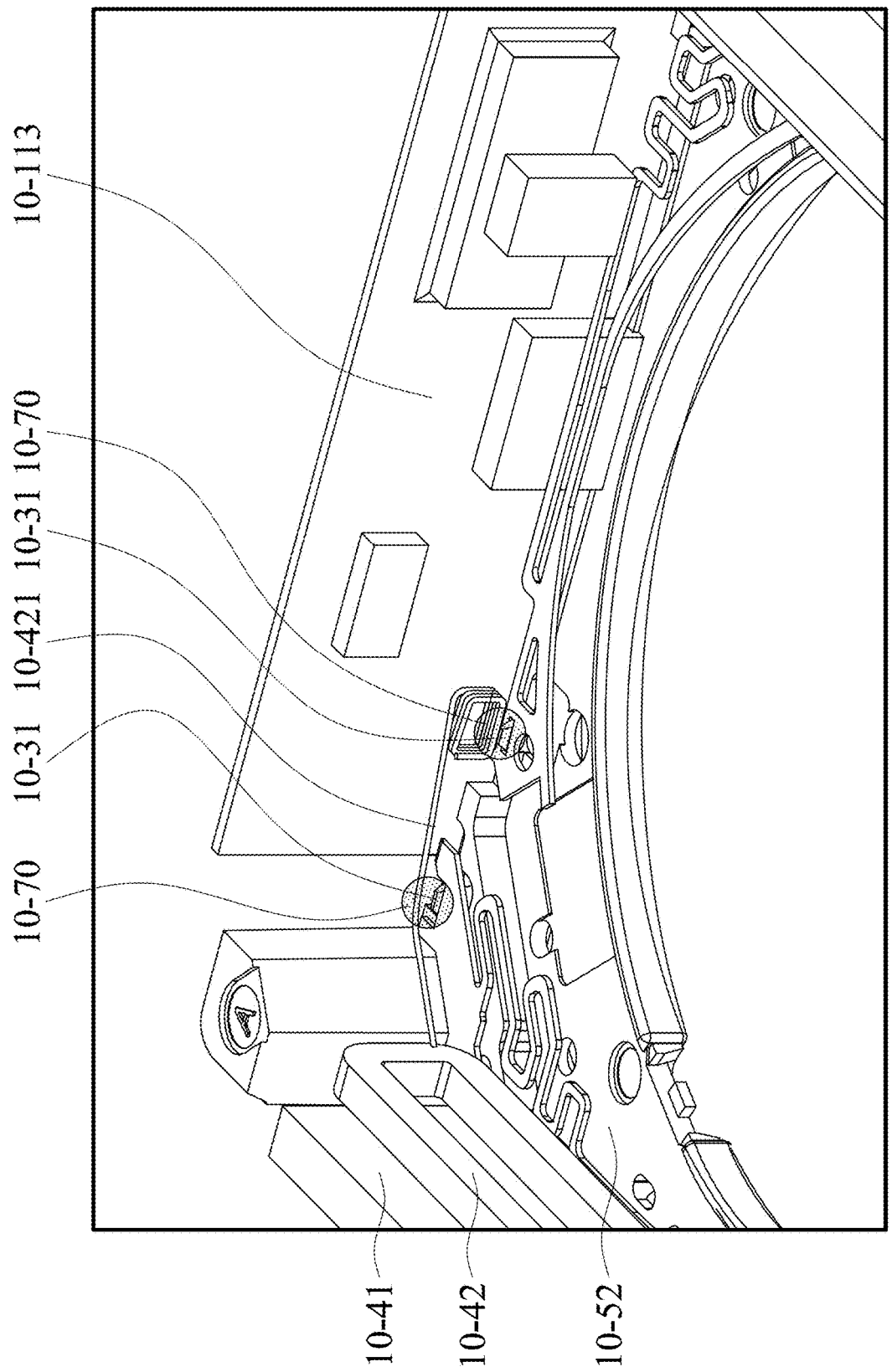

FIG. 132 shows a partial schematic view of the inner electrical connection part 10-31 and the driving assembly 10-40. As shown in FIG. 132, the coil 10-42 of the driving assembly 10-40 is disposed corresponding to the driving magnetic elements 10-1141. Moreover, the coil 10-42 has a coil extension 10-421, the coil extension 10-421 extends from the coil 10-42 to surroundings of the inner electrical connection part 10-31 of the metallic member 10-30 and the lower spring 10-52 of the elastic assembly 10-50, and the connector 10-70 is disposed between the inner electrical connection part 10-31, the coil extension 10-421 and the lower spring 10-52, so that the inner electrical connection part 10-31, the coil 10-42 and the lower spring 10-52 are electrically connected. Therefore, the electrical current can flow from the outer electrical connection part 10-32 to the coil 10-42 through the lower spring 10-52, so that the driving magnetic elements 10-1141 and the coil 10-42 drive the movable part 10-20 to move relative to the fixed part 10-10.

Figure 133:
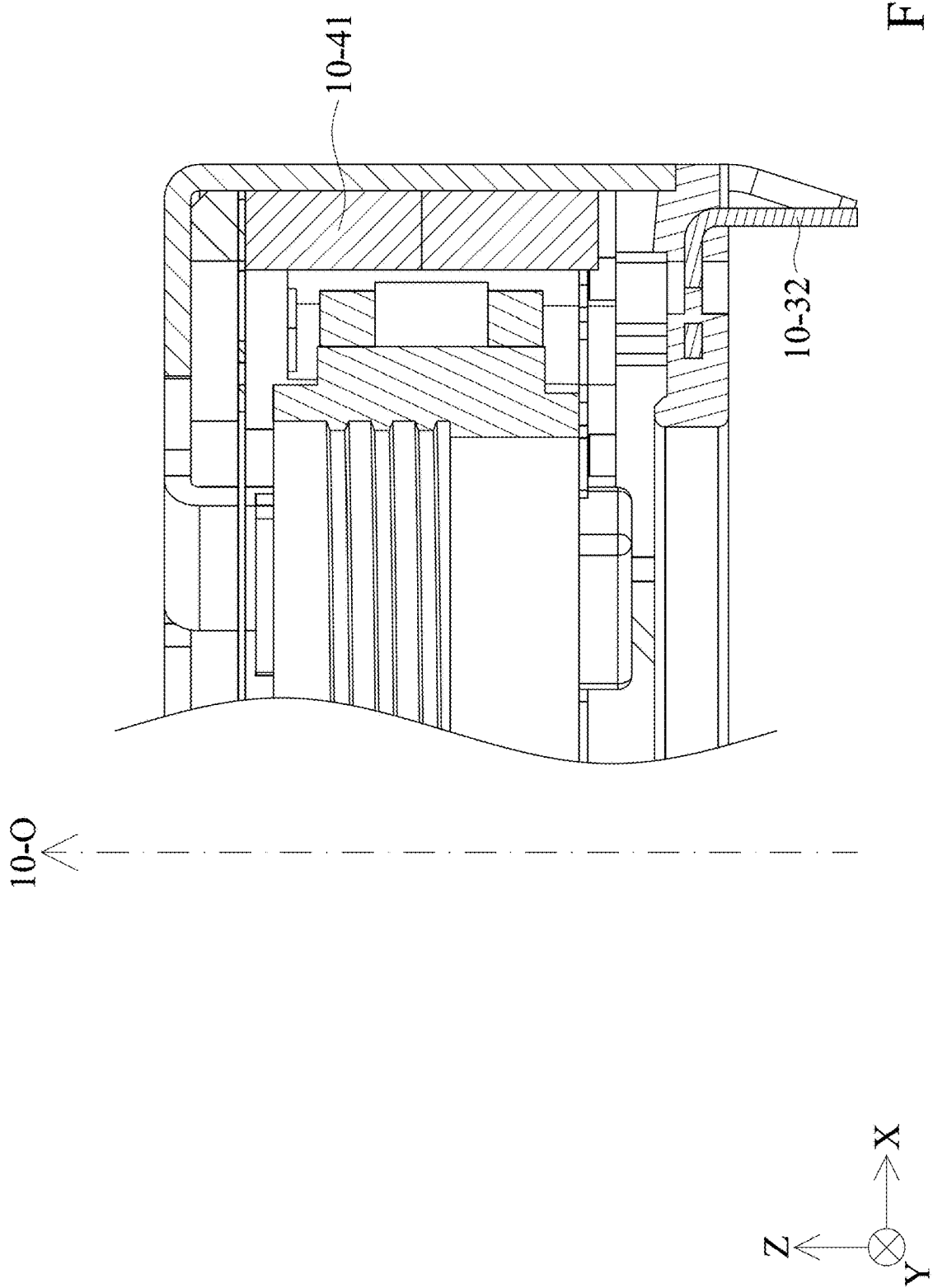

Please refer to FIG. 133, FIG. 133 shows a cross-sectional view of the optical element driving mechanism 10-100 along line 10-A-10-A in FIG. 128. When observed in the direction of the optical axis 10-O, the outer electrical connection part 10-32 partially overlaps one of the driving magnetic elements 10-1141. In this way, it facilitates the assembly of the optical element driving mechanism 10-100, and the effect of miniaturization is achieved.

Figure 134:
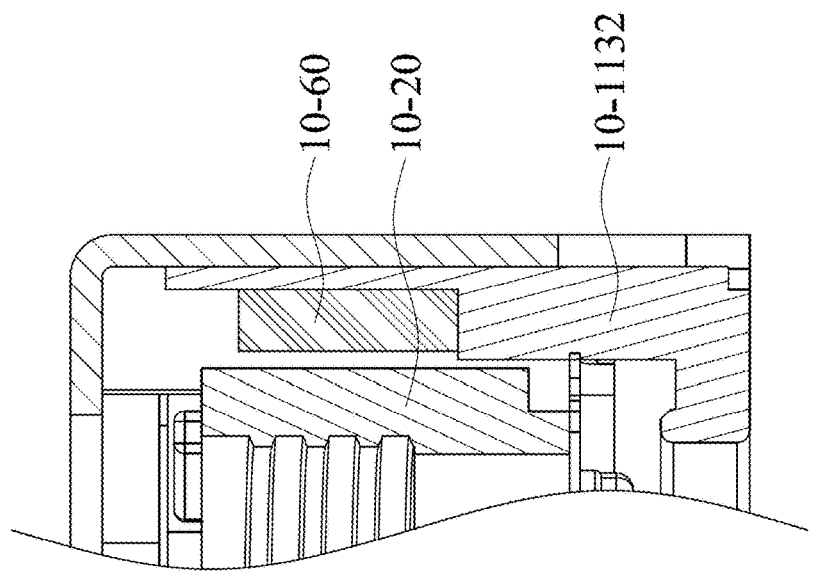
Figure 135:
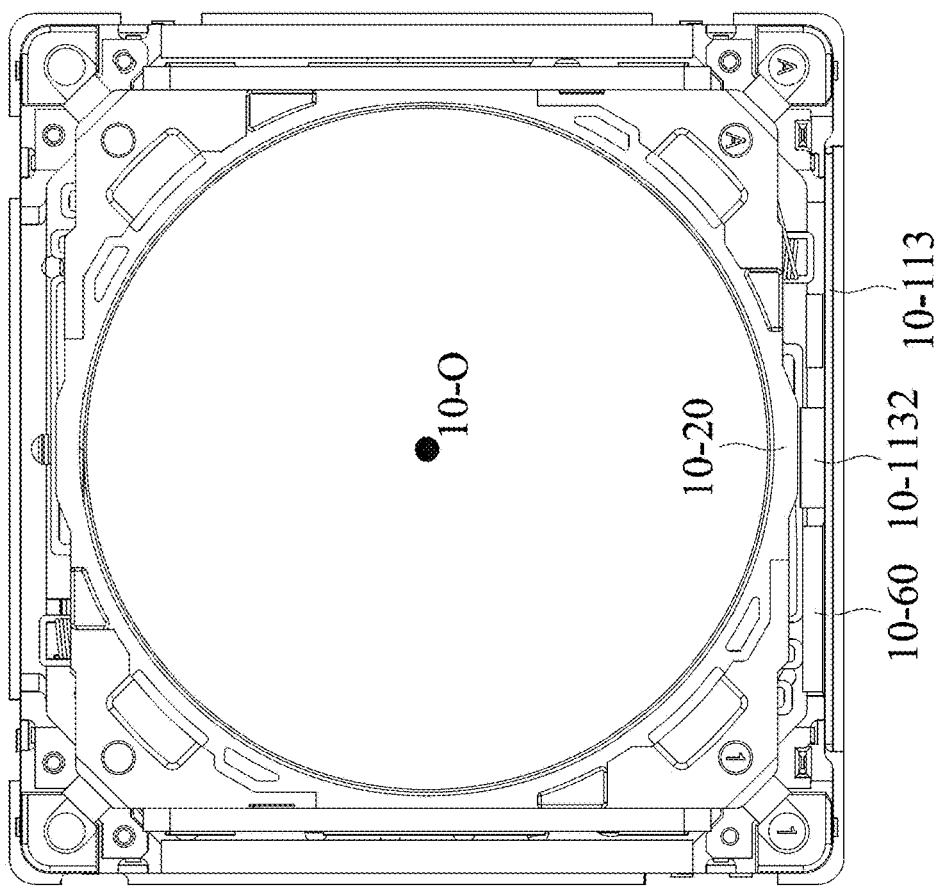

Please refer to FIGS. 134 and 135, FIG. 134 shows a cross-sectional view of the optical element driving mechanism 10-100 along line 10-B-10-B in FIG. 128, and FIG. 135 shows a top view of the movable part 10-20, the standing wall 10-113 and the position sensing assembly 10-60. A shortest distance between the protruding part 10-1132 of the standing wall 10-113 and the movable part 10-20 is shorter than a shortest distance between the position sensing assembly 10-60 and the movable part 10-20. In other words, the protruding part 10-1132 is closer to the movable part 10-20 than the position sensing assembly 10-60 is. In this way, when the movable part 10-20 moves in the direction perpendicular to the optical axis 10-O, the movable part 10-20 will contact the protruding part 10-1132 without contacting the position sensing assembly 10-60 to protect the position sensing assembly 10-60, and to prevent damage due to contact between the position sensing assembly 10-60 and the movable part 10-20. Without affecting other elements, the extended length of the protruding part 10-1132 along the first side 10-111 is longer, the structural strength of the standing wall 10-113 is stronger.

Figure 136:
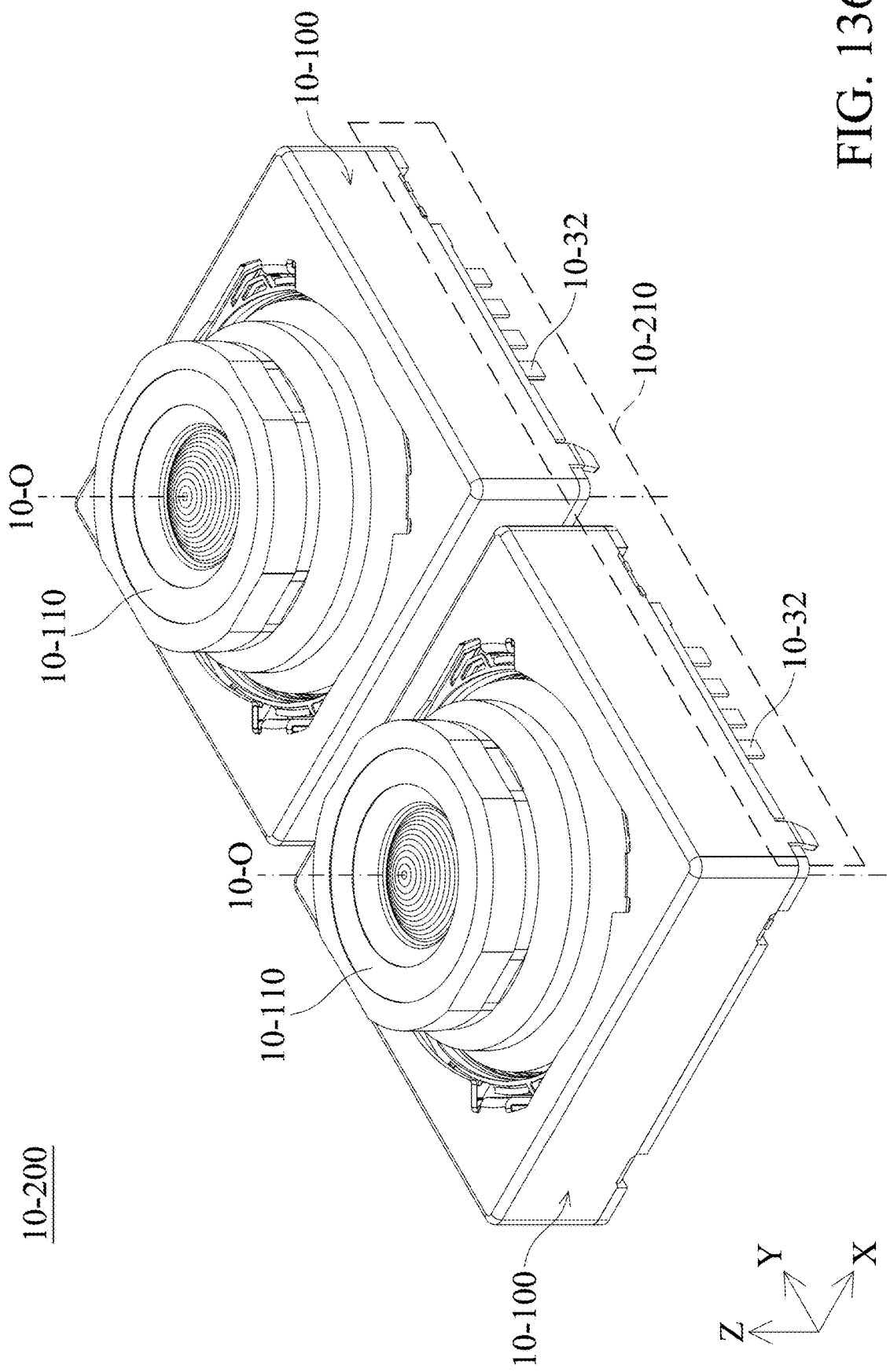
Figure 137:
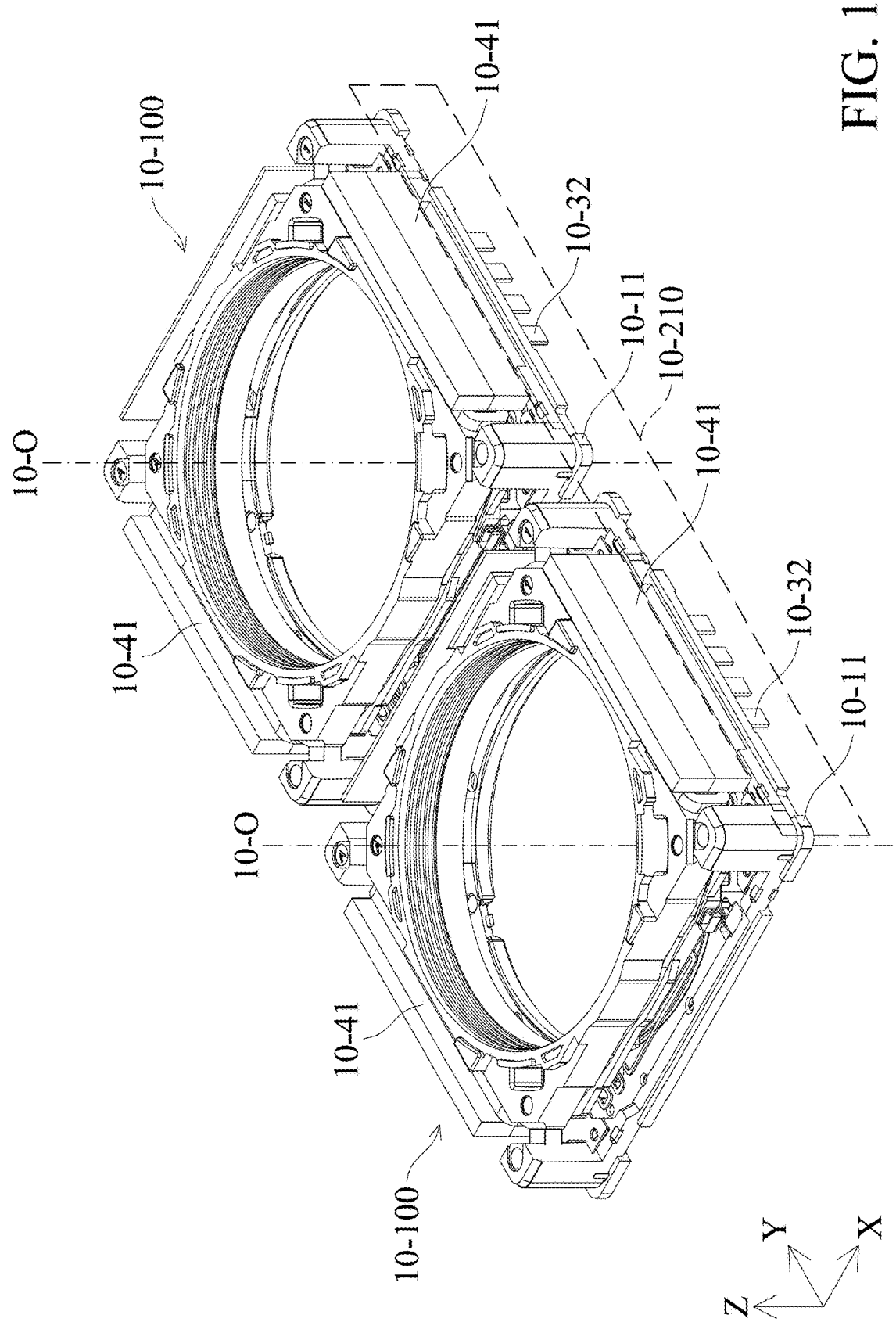

FIG. 136 shows a perspective view of an optical element driving system 10-200 according to an embodiment of the present disclosure, and FIG. 137 shows a perspective view of the optical element driving system 10-200 omitting the outer frames 10-13 and the optical elements 10-110. As shown in FIGS. 136 and 137, the optical element driving system 10-200 includes at least two optical element driving mechanisms 10-100. Since the metallic members 10-30 of the optical element driving mechanisms 10-100 extend from the second sides 10-112 of the bases 10-11 of the optical element driving mechanisms 10-100 to the first sides 10-111 of the bases 10-11, and each one of the inner electrical connection part 10-31 of the metallic members 10-30 is electrically connected to each one of the outer electrical connection part 10-32 of the metallic members 10-30, so that some of the elements may be disposed on the first sides 10-111 (such as the position sensing assembly 10-60), and each one of the outer electrical connection part 10-32 of the optical element driving mechanisms 10-100 may be on a same side 10-210 of the optical element driving system 10-200. Therefore, the driving magnetic elements 10-1141 which are disposed on the second sides 10-112 and the opposite side of the second sides 10-112 are on a same side of the optical element driving system 10-200 and on the opposite side of it, respectively. Moreover, the driving magnetic elements 10-1141 are not disposed on the adjacent sides of the bases 10-11 of the optical element driving mechanisms 10-100. In other words, the driving magnetic elements 10-1141 are not provided between the optical element driving mechanisms 10-100. In this way, it facilitates the assembly of the optical element driving system 10-200, and magnetic interference between the driving magnetic elements 10-1141 of the adjacent optical element driving mechanisms 10-100 is prevented, and the focusing speed and positioning accuracy of the optical element driving system 10-200 are improved, and miniaturization of the optical element driving system 10-200 is achieved.

Figure 138:
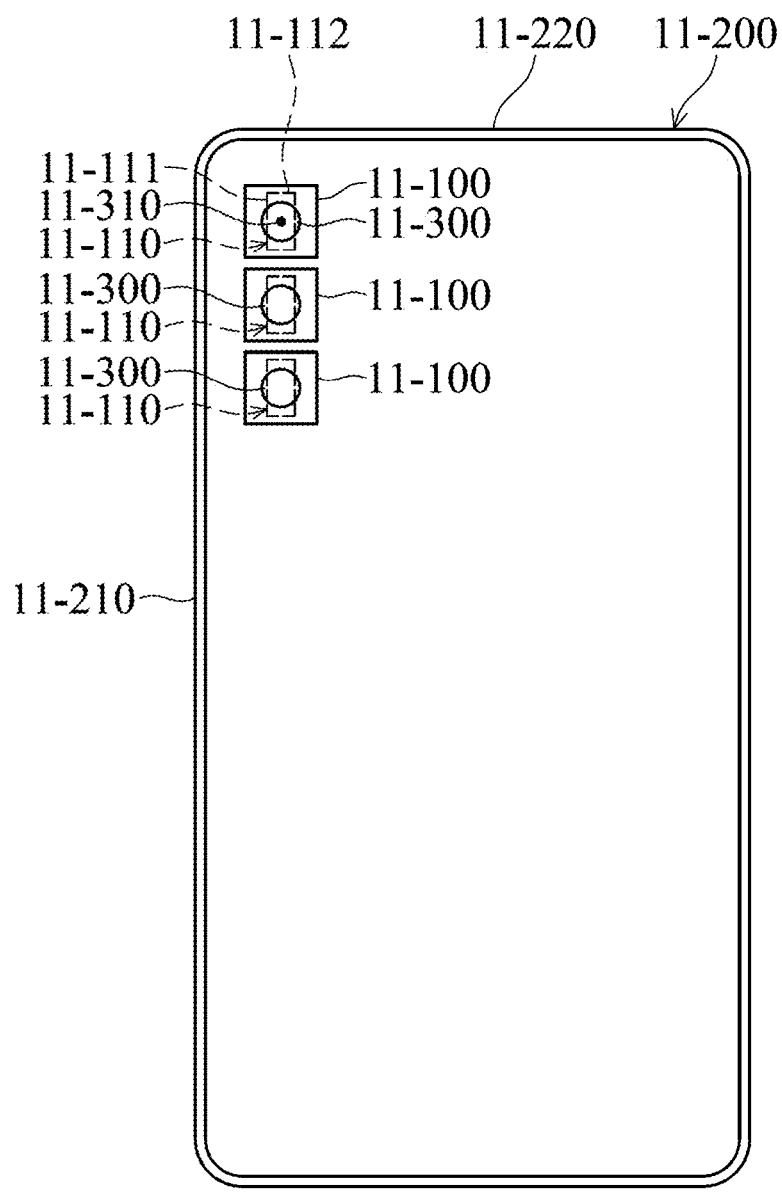
Figure 139:
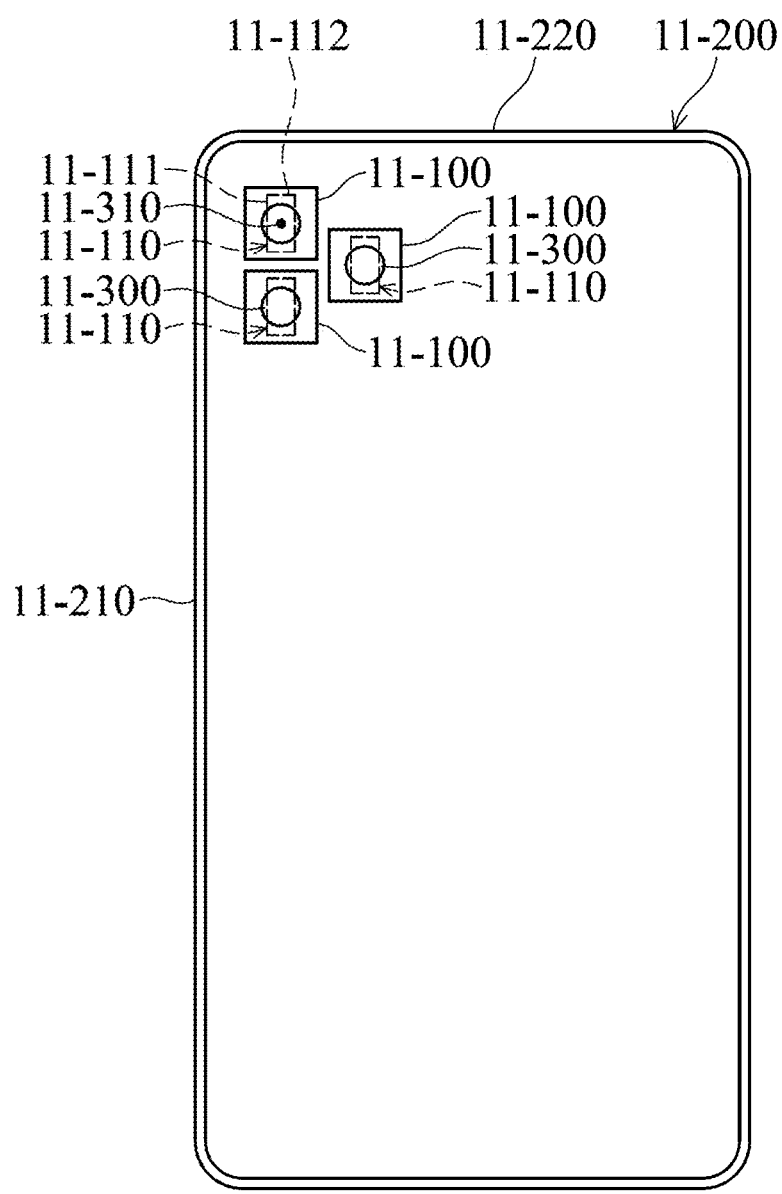
Figure 140:
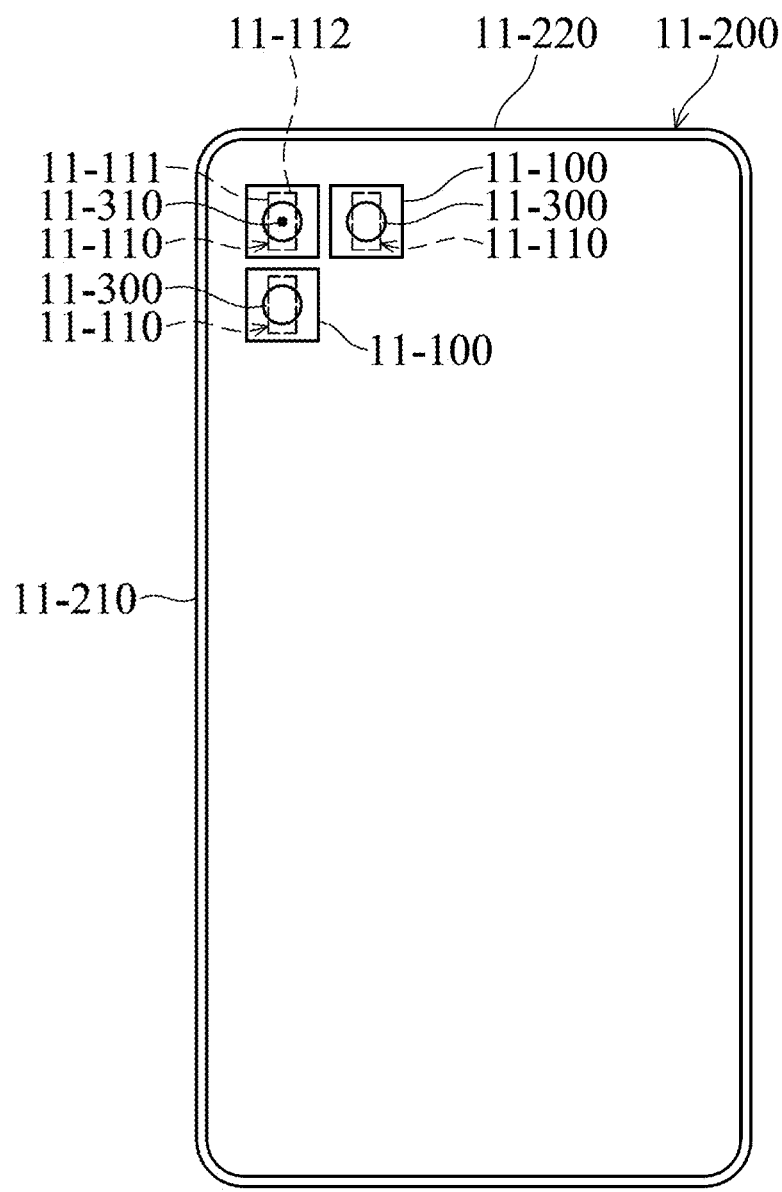

Referring to FIGS. 138-140, in some embodiments, an optical member driving mechanism 11-100 is disposed on a portable device 11-200 (such as a smartphone) and configured to drive at least one optical member 11-300 to move relative to the portable device 11-200, wherein the optical member 11-300 can be a lens having an optical axis 11-310. The optical member driving mechanism 11-100 includes at least one fixed portion, at least one movable portion, at least one driving assembly, and at least one image sensor 11-110. It should be noted that, in these embodiments, the fixed portion, movable portion, and the driving assembly are the same as the fixed portion 3-100, the movable portion 3-200, and the driving assembly 3-500 shown in FIGS. 23 and 24, the features thereof are not repeated in the interest of brevity.

The image sensor 11-110 substantially has a rectangular structure, and includes an image sensor long side 11-111 and an image sensor short side 11-112. The portable device 11-200 also substantially has a rectangular structure, and includes a portable device long side 11-210 and a portable device short side 11-220. The image sensor long side 11-111 is substantially parallel to the portable device long side 11-210.

In the embodiments of FIGS. 138-140, the optical member driving mechanism 11-110 includes a plurality of fixed portions, a plurality of movable portions, a plurality of driving assemblies, and a plurality of image sensors 11-110. Each of the image sensors 11-110 substantially has the rectangular structure, and includes the image sensor long side 11-111 and the image sensor short side 11-112. The image sensor long sides 11-111 are substantially parallel to the portable device long side 11-210.

Since the image sensor long sides 11-111 are substantially parallel to the portable device long side 11-210, the efficiency of photographing can be enhanced, and the undesired crop can be prevented. Furthermore, the structures of the aforementioned embodiments can be applied on these optical member driving mechanisms 11-100, so as to achieve the purpose of reducing electromagnetic interference, miniaturization, or improving structural strength.

Although the embodiments and their advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein can be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A driving mechanism for moving an optical element, comprising:
   a fixed part;
   a movable part for holding the optical element, wherein the optical element defines an optical axis, and the movable part is movable relative to the fixed part;
   a driving assembly for driving the movable part to move relative to the fixed part; and
   a circuit board disposed on the fixed part, having a conductive portion and a trace, wherein the conductive portion is exposed to an outer surface of the circuit board, and the trace is embedded in the circuit board, wherein the conductive portion at least partially overlaps the trace when viewed in a horizontal direction perpendicular to the optical axis.

2. The driving mechanism as claimed in claim 1, further comprising a conductive element electrically connecting the conductive portion to the driving assembly, wherein an external circuit applies a current signal through the circuit board and the conductive element to the driving assembly for moving the movable part relative to the fixed part.

3. The driving mechanism as claimed in claim 2, wherein the conductive element comprises a sheet spring electrically connected to the conductive portion by soldering, welding, or conductive glue.

4. The driving mechanism as claimed in claim 2, wherein the conductive element is not exposed to an inner surface of the circuit board, and the inner and outer surfaces are on opposite sides of the circuit board.

5. The driving mechanism as claimed in claim 2, further comprising a position sensor disposed on an inner surface of the circuit board for detecting the movement of the movable part relative to the fixed part, and the position sensor at least partially overlaps the conductive element when viewed in a direction parallel to the optical axis.

6. The driving mechanism as claimed in claim 1, further comprising a position sensor disposed on an inner surface of the circuit board and an object disposed on the movable part, wherein the displacement of the movable part relative to the fixed part is obtained by the position sensor detecting the object, and the movable part has a recess extending from a bottom surface toward a top surface of the movable part, wherein the object is inserted in the recess from the bottom surface toward the top surface of the movable part.

7. The driving mechanism as claimed in claim 6, wherein the object is exposed to the bottom surface of the movable part.

8. The driving mechanism as claimed in claim 6, wherein the recess penetrates through the movable part, and a glue is disposed in the recess.

9. The driving mechanism as claimed in claim 6, wherein the recess does not penetrate through the movable part, and a glue is disposed in the recess.

10. The driving mechanism as claimed in claim 1, wherein the fixed part has a polygonal structure, and the circuit board is arranged through at least two sides of the polygonal structure.

11. The driving mechanism as claimed in claim 10, wherein the circuit board has an L-shaped structure.

12. The driving mechanism as claimed in claim 10, wherein when viewed along the optical axis, the circuit board and the movable part do not overlap.

13. The driving mechanism as claimed in claim 1, wherein the fixed part has a base and a housing connected to each other, and the base has a first protrusion and a second protrusion located on the same side of the base, wherein the first protrusion contacts the circuit board, and the second protrusion is spaced apart from the circuit board.

14. The driving mechanism as claimed in claim 13, wherein the first protrusion has a first flat outer surface perpendicular to the horizontal direction, and the second protrusion has a second flat outer surface perpendicular to the horizontal direction, wherein the first flat outer surface contacts the circuit board, and the first and second flat outer surfaces are located in different positions in the horizontal direction.

15. The driving mechanism as claimed in claim 1, wherein the circuit board is a multilayer circuit board.

16. The driving mechanism as claimed in claim 1, wherein the driving assembly comprises a coil disposed on the movable part and at least a magnetic element disposed on the fixed part.

\* \* \* \* \*